(12) United States Patent
Toda et al.

(10) Patent No.: US 7,755,016 B2
(45) Date of Patent: Jul. 13, 2010

(54) PHYSICAL INFORMATION ACQUISITION METHOD, PHYSICAL INFORMATION ACQUISITION DEVICE, AND SEMICONDUCTOR DEVICE

(75) Inventors: Atsushi Toda, Kanagawa (JP); Genta Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 563 days.

(21) Appl. No.: 11/458,871

(22) Filed: Jul. 20, 2006

(65) Prior Publication Data

US 2007/0201738 A1 Aug. 30, 2007

(30) Foreign Application Priority Data

Jul. 21, 2005 (JP) .......................... P2005-211002
May 12, 2006 (JP) .......................... P2006-133412

(51) Int. Cl.
- G01J 5/50 (2006.01)
- H04N 5/335 (2006.01)
- H04N 9/04 (2006.01)
- H01L 27/146 (2006.01)

(52) U.S. Cl. ............... 250/208.1; 250/226; 250/339.05; 348/272; 348/273; 348/279

(58) Field of Classification Search ............... 250/208.1, 250/226, 338.1, 339.01, 339.05; 348/272, 348/273, 278, 279, 280
See application file for complete search history.

(56) References Cited

U.S. PATENT DOCUMENTS

| 6,211,521 B1* | 4/2001 | Bawolek et al. | 250/339.02 |
| 6,825,470 B1* | 11/2004 | Bawolek et al. | 250/339.05 |
| 7,394,059 B2* | 7/2008 | Fukuyoshi et al. | 250/226 |
| 2003/0112353 A1* | 6/2003 | Morris | 348/310 |
| 2005/0133690 A1* | 6/2005 | Higashitsutsumi | 250/208.1 |
| 2007/0146512 A1* | 6/2007 | Suzuki et al. | 348/272 |
| 2007/0201738 A1* | 8/2007 | Toda et al. | 382/144 |
| 2008/0203305 A1* | 8/2008 | Suzuki | 250/338.1 |
| 2010/0038543 A1* | 2/2010 | Toda et al. | 250/339.05 |

FOREIGN PATENT DOCUMENTS

JP 06-121325 A 4/1994

(Continued)

Primary Examiner—John R Lee
(74) Attorney, Agent, or Firm—Sonnenschein Nath & Rosenthal LLP

(57) ABSTRACT

A physical information acquisition device uses a device including a detection unit for detecting electromagnetic waves, and a unit signal generating unit for generating and outputting the corresponding unit signal based on the amount of electromagnetic waves detected by the detection unit for detecting a physical quantity distribution in which the unit components are disposed on the same substrate in a predetermined sequence, for acquiring physical information for a predetermined application based on the unit signal. The physical information acquisition device includes a first detection unit which detects first wavelength region components following second wavelength region components different from the first wavelength region components being separated from the first wavelength region components beforehand; a second detection unit which detects wavelength region components for correction including at least the second wavelength region components; and a signal processing unit for obtaining physical information relating to the first wavelength region components from which at least a part of influence of the second wavelength region components is eliminated using the unit signal detected by the first detection unit, and the unit signal detected by the second detection unit.

8 Claims, 101 Drawing Sheets

FOREIGN PATENT DOCUMENTS

| | | |
|---|---|---|
| JP | 09-130678 A | 6/1997 |
| JP | 09-166493 A | 6/1997 |
| JP | 10-210486 A | 8/1998 |
| JP | 2000-059798 A | 2/2000 |
| JP | 2002-369049 A | 12/2002 |
| JP | 2003-070009 A | 3/2003 |
| JP | 2004-103964 A | 4/2004 |

* cited by examiner

PHOTOABSORPTION SPECTRUM OF SEMICONDUCTOR

PHOTOABSORPTION OF SEMICONDUCTOR (DEPTH DIRECTION)

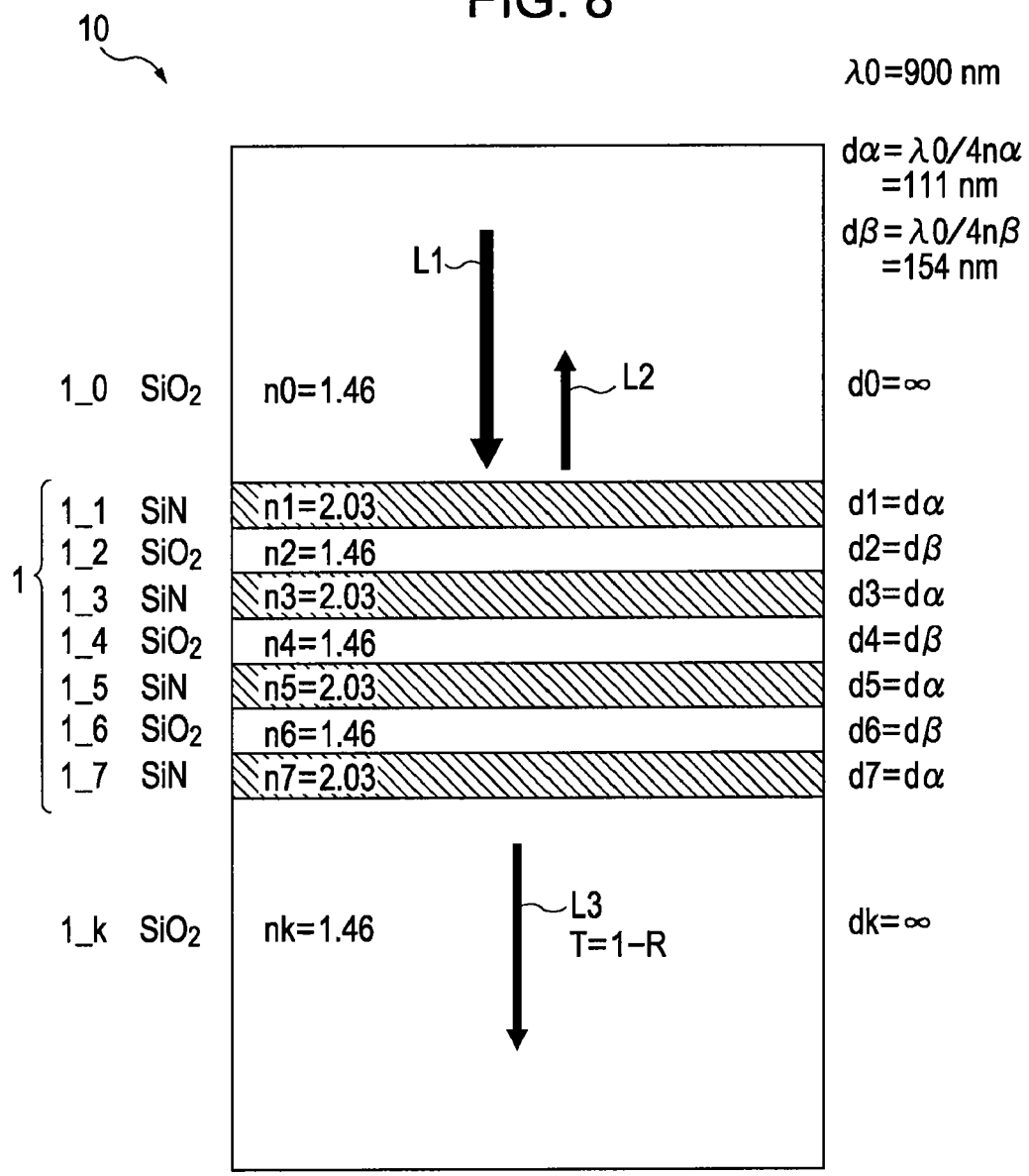

SPECTRAL IMAGE SENSOR 11 (SECOND MODIFICATION)

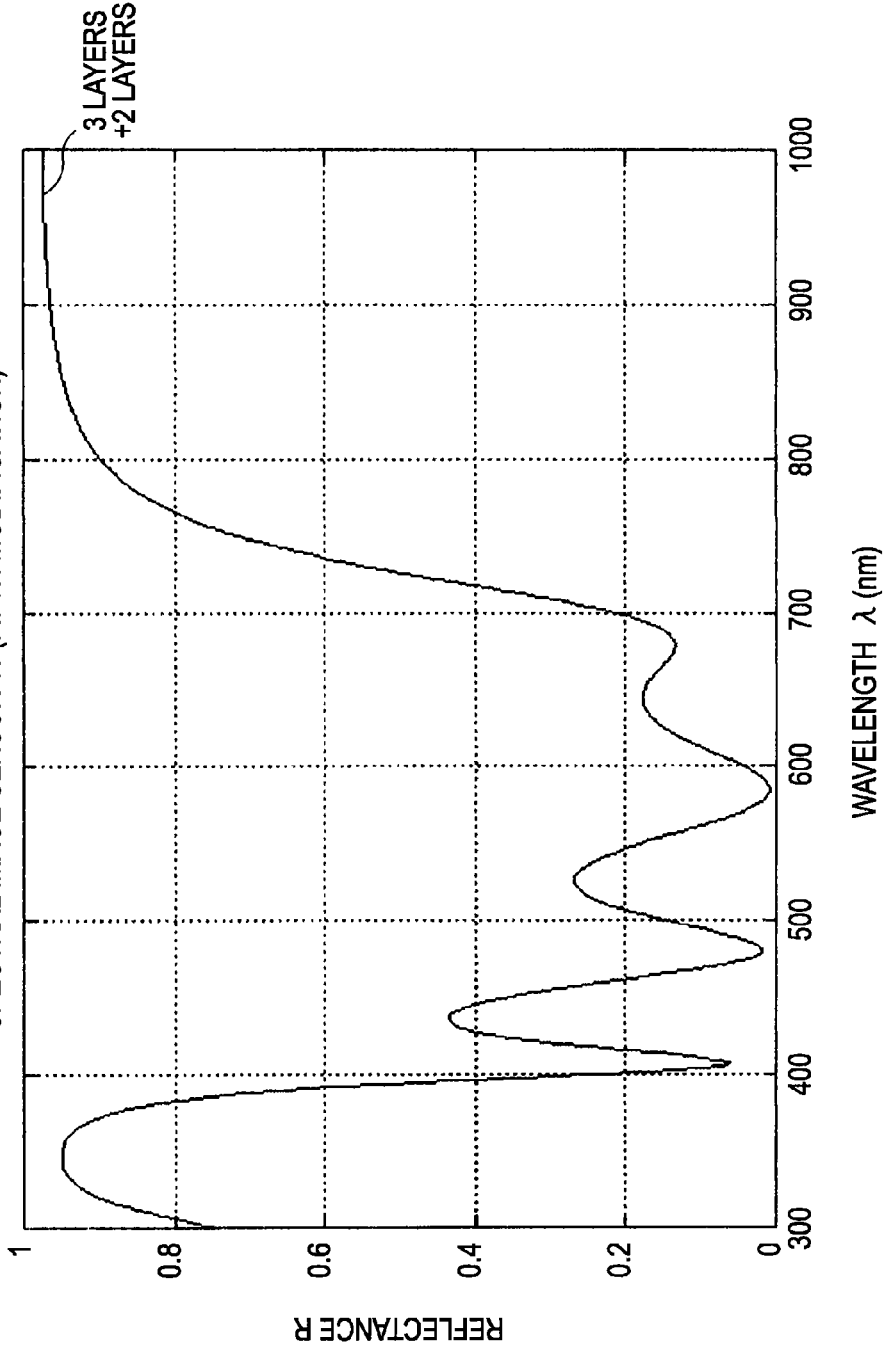

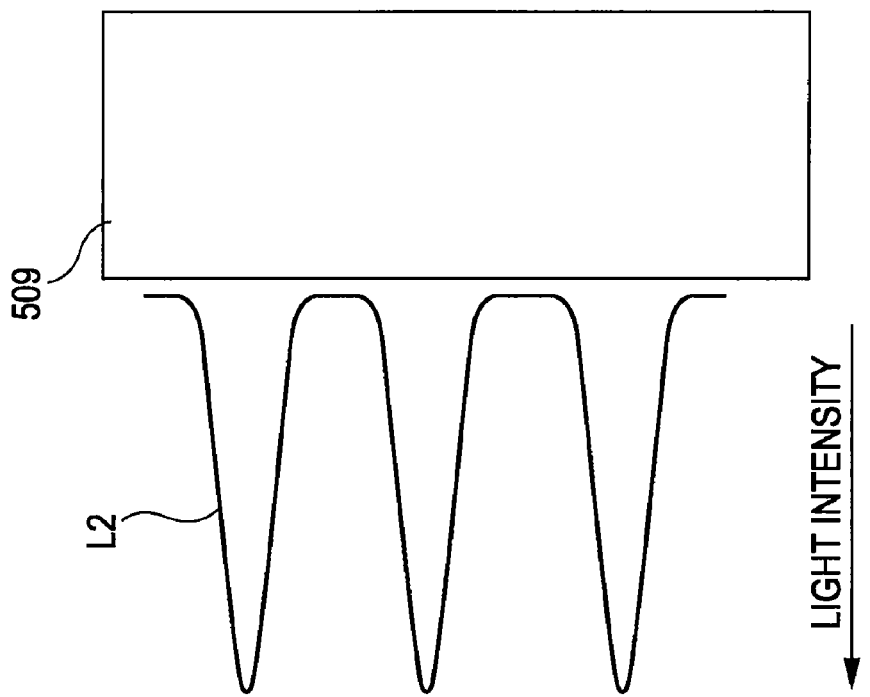
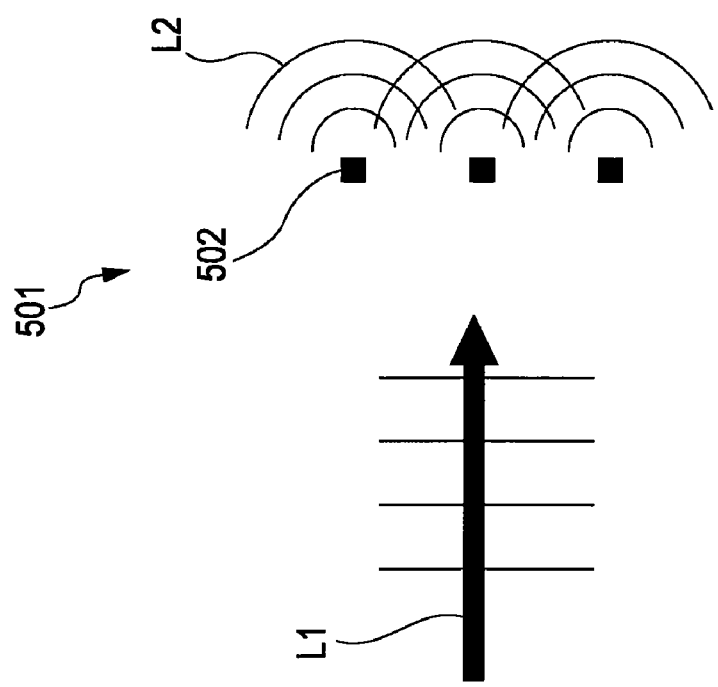

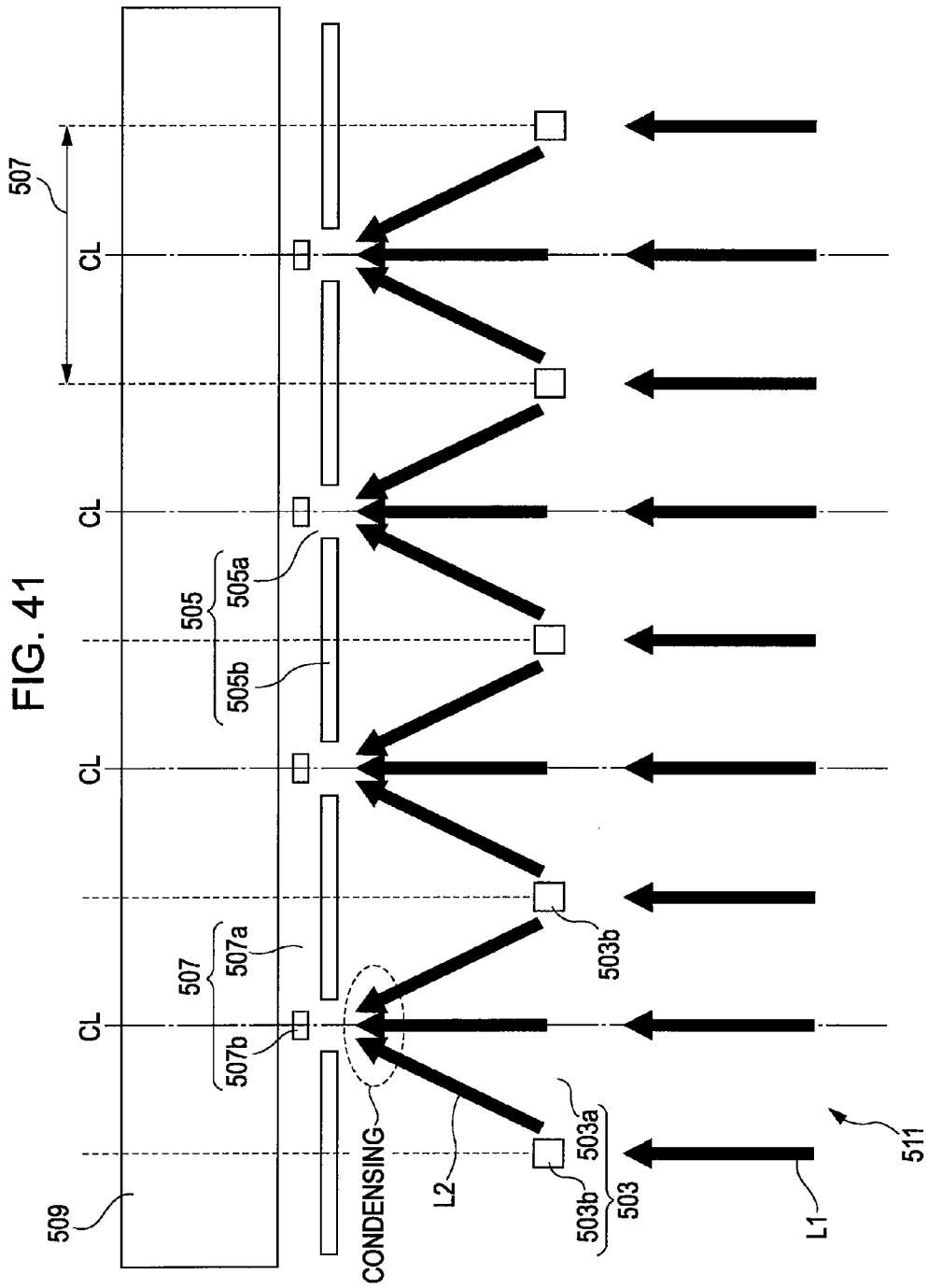

FIG. 44

| WAVELENGTH | REFRACTIVE INDEX | EXTINCTION COEFFICIENT |
|---|---|---|
| 460 nm (BLUE) | 4.74 | 0.333 |
| 540 nm (GREEN) | 4.24 | 0.124 |
| 640 nm (RED) | 3.96 | 0.054 |
| 780 nm (INFRARED) | 3.76 | 0.019 |
| 880 nm (INFRARED) | 3.70 | 0.019 |

CONTOUR MAP OF EY
SIMULATION OF BLUE LIGHT (460 nm)
cT=10

CONTOUR MAP OF EY
SIMULATION OF INFRARED LIGHT (880 nm)
cT=20

ONE PIXEL

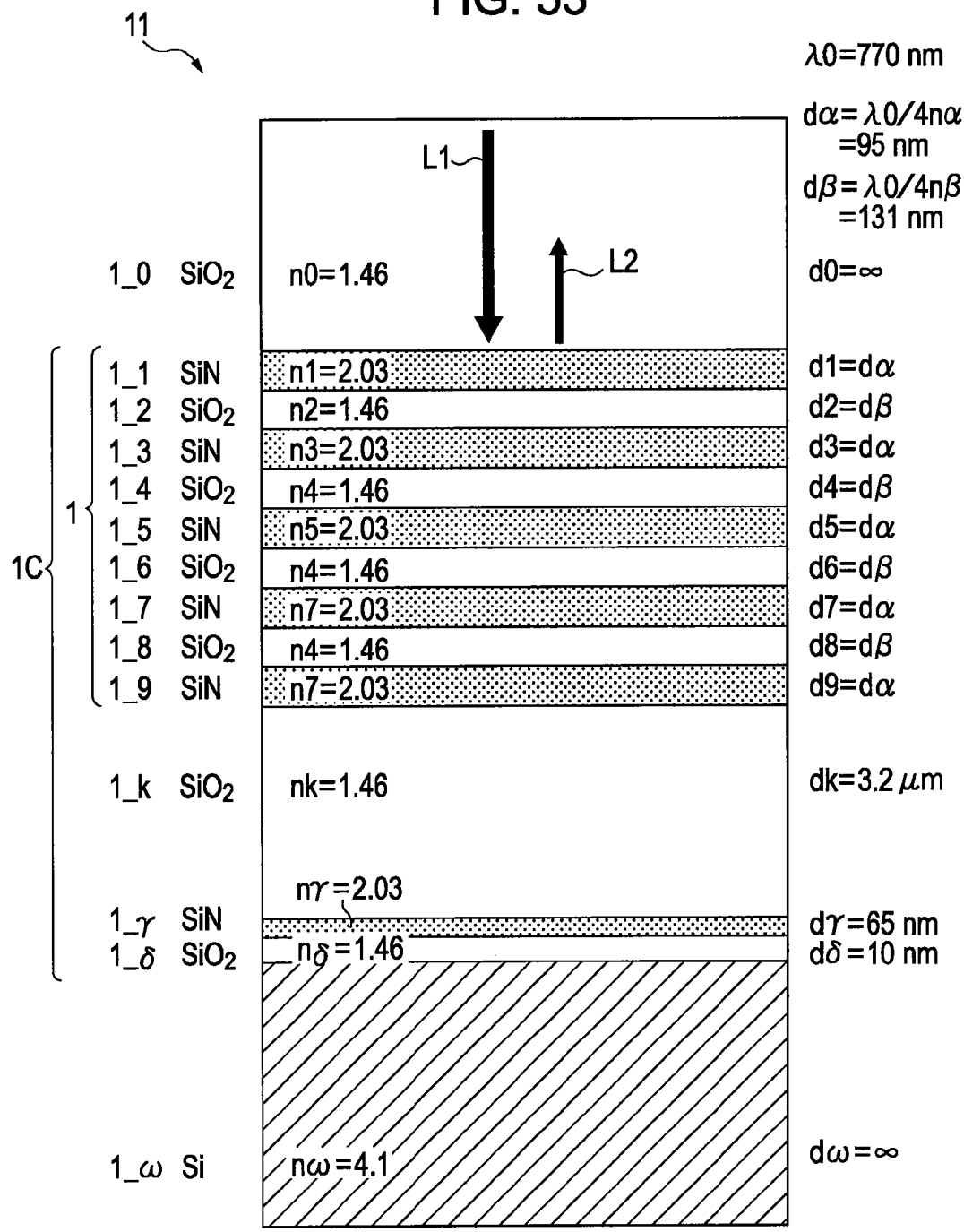

ICX456AQ

CALCULATION OF COLOR DIFFERENCE ΔEa*b*

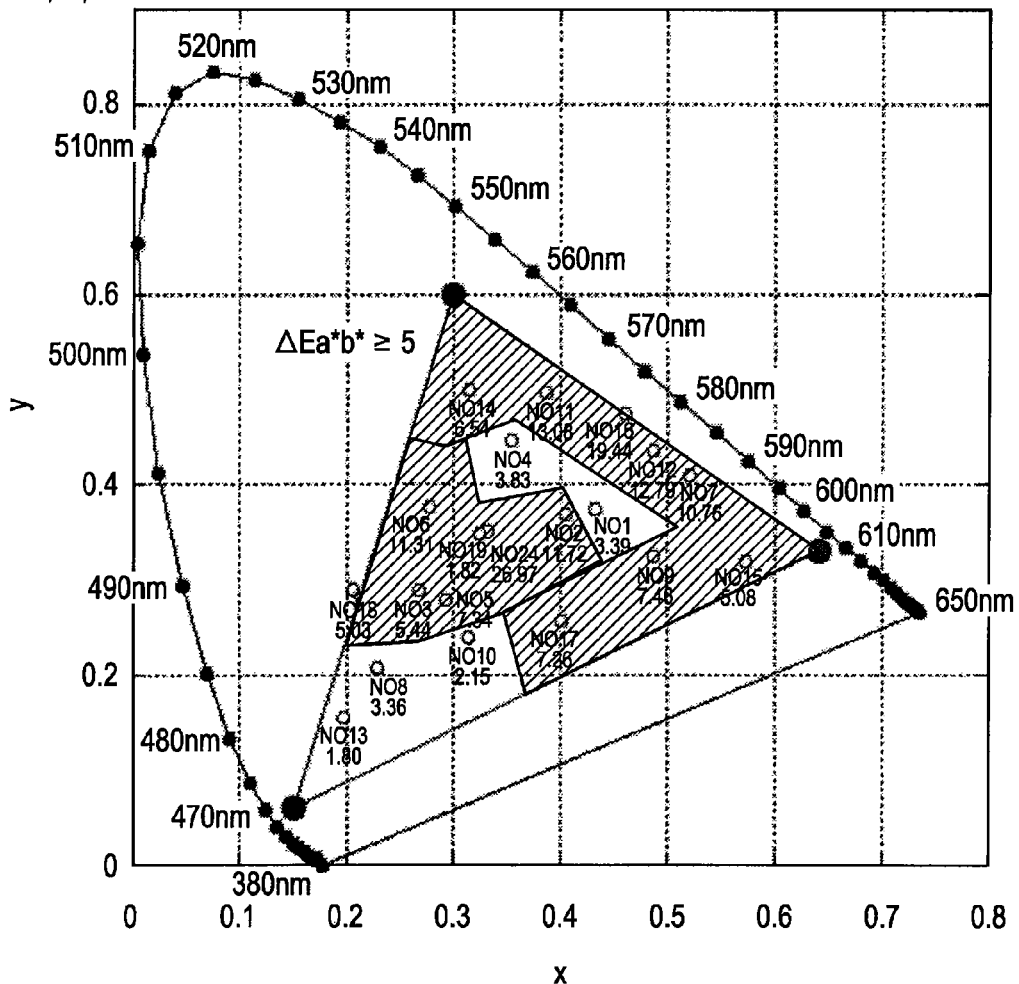

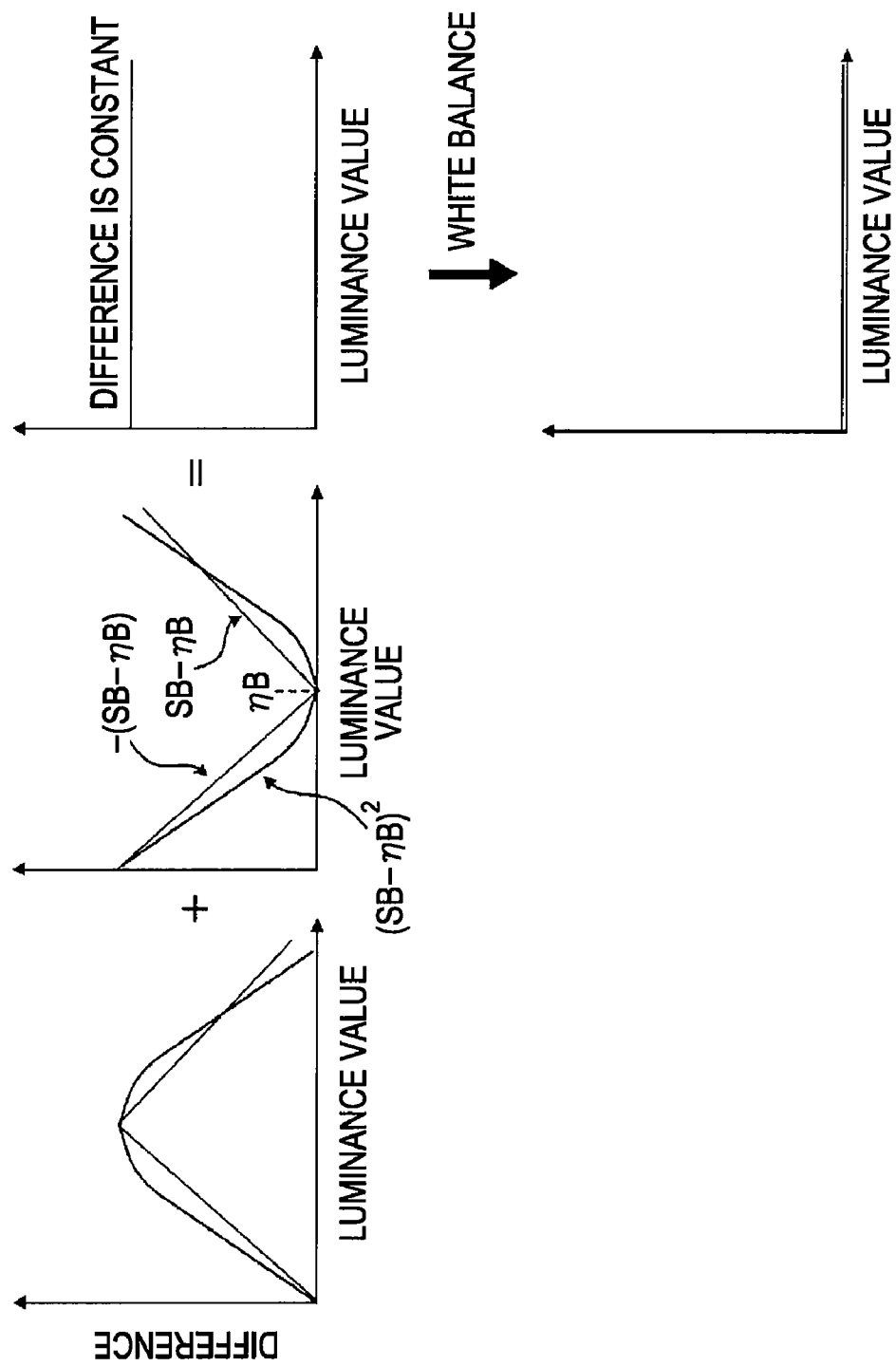

XCL-X700   MONOCHROME CAMERA

1/2 INCH TYPE, ALL PIXELS RETRIEVAL (PROGRESSIVE)
NUMBER OF EFFECTIVE PIXELS           1034×779
NUMBER OF IMAGE CAPTURING PIXELS     1024×768
PIXEL SIZE    6.25um□

MACBETH CHART

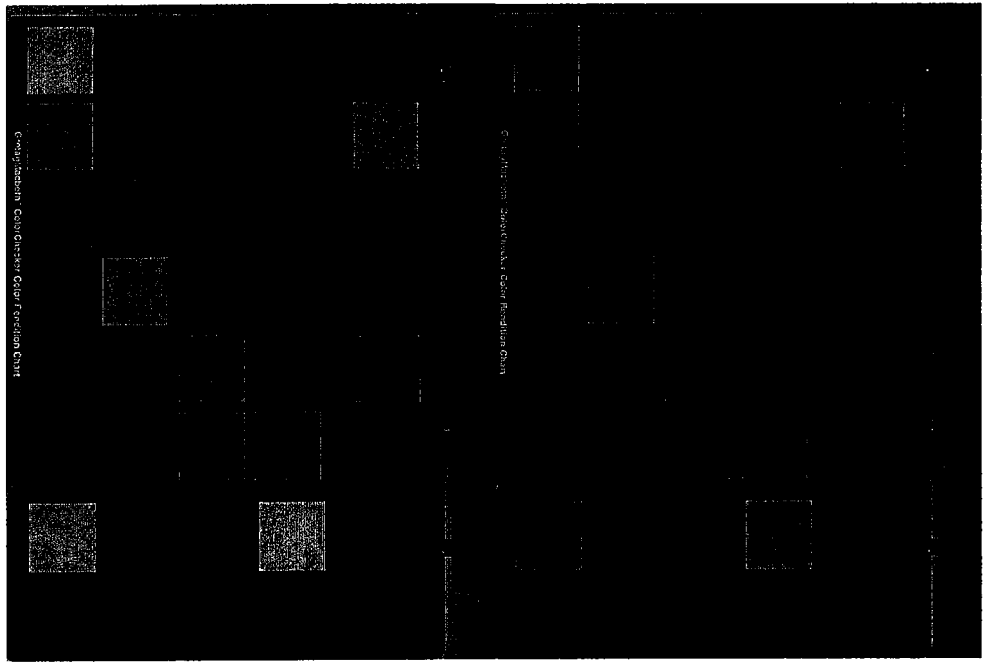
FIG. 87A G (WITHOUT IR CUT)
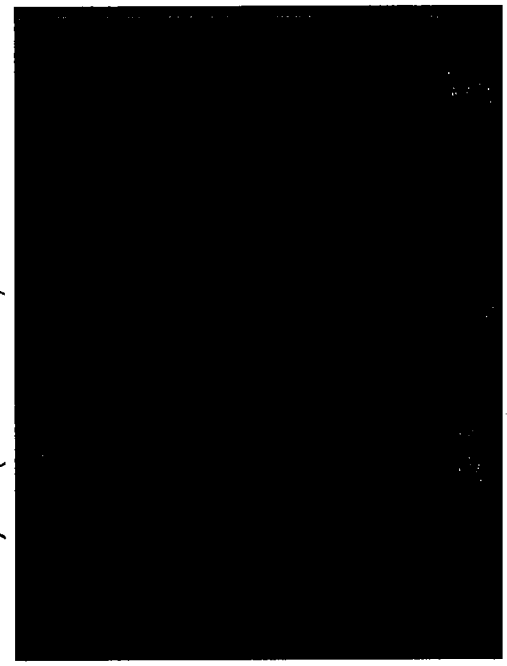
FIG. 87B G (WITH IR CUT)
FIG. 87C
IR FILTERED IMAGE OF GREEN FILTER
= G (WITHOUT IR CUT) – G (WITH IR CUT)
<IMAGE CAPTURING CONDITIONS>
| | |
|---|---|
| LIGHT SOURCE | 20-W INCANDESCENT LAMP + FLUORESCENT LIGHT |
| CAMERA | XCL-X700 |
| LENS | F2.8 |
| DIAPHRAGM | f2.8 |
| SHUTTER SPEED | 1/2.8 SEC |

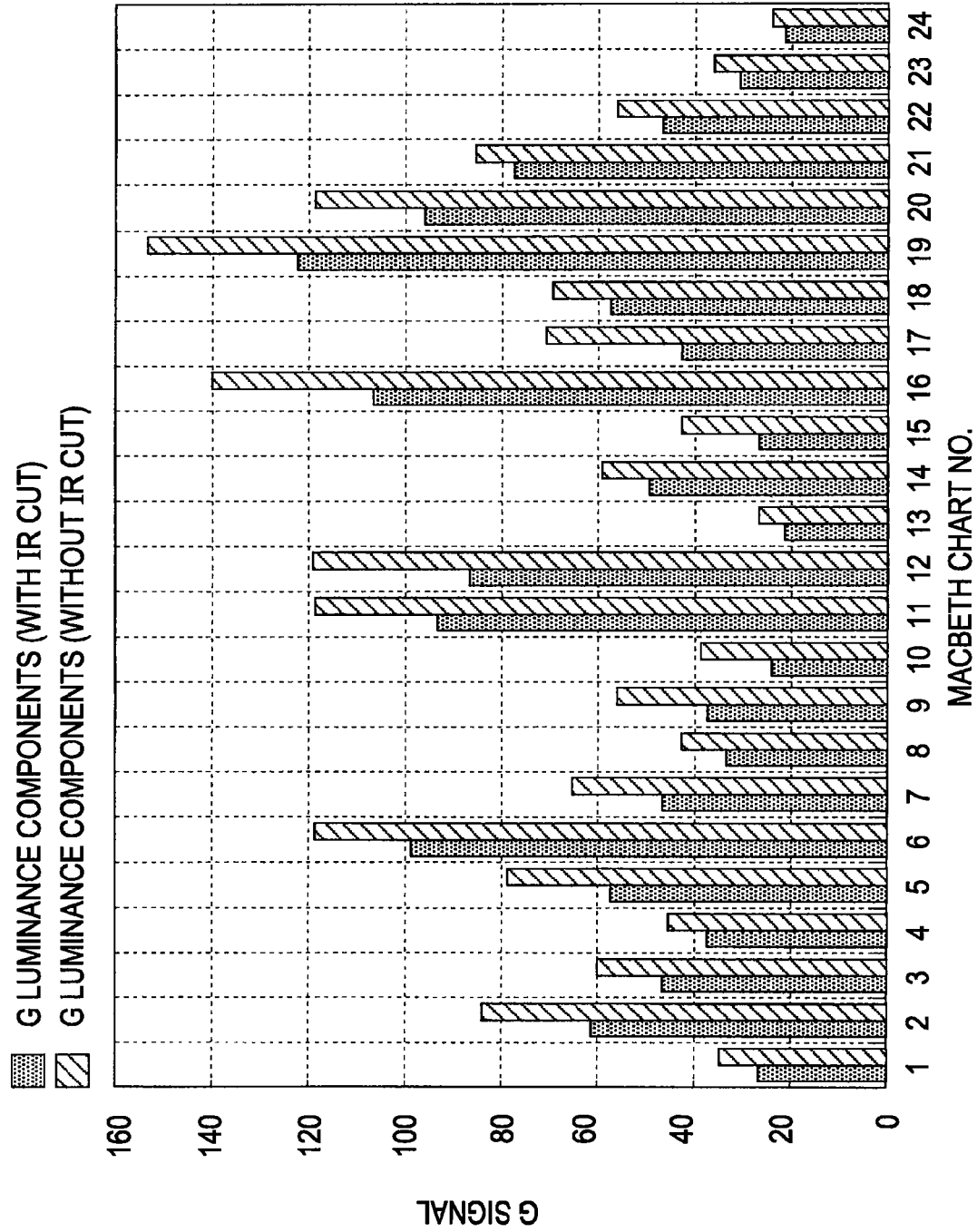

IMAGE Br OF BLACK FILTER BK

IR FILTERED IMAGE OF GREEN FILTER G
= G (WITHOUT IR CUT) IMAGE − G (WITH IR CUT) IMAGE

<IMAGE CAPTURING CONDITIONS>
LIGHT SOURCE   20-W INCANDESCENT LAMP + FLUORESCENT LIGHT
CAMERA         XCL-X700
LENS           F2.8
DIAPHRAGM      f2.8
SHUTTER SPEED  1/2.8 SEC

BLACK CORRECTION IMAGE Brcorr
= IMAGE Br OF BLACK FILTER BK × COEFFICIENT

COEFFICIENT $\alpha G = 0.18$

IR FILTERED IMAGE OF GREEN FILTER G
= G (WITHOUT IR CUT) IMAGE − G (WITH IR CUT) IMAGE

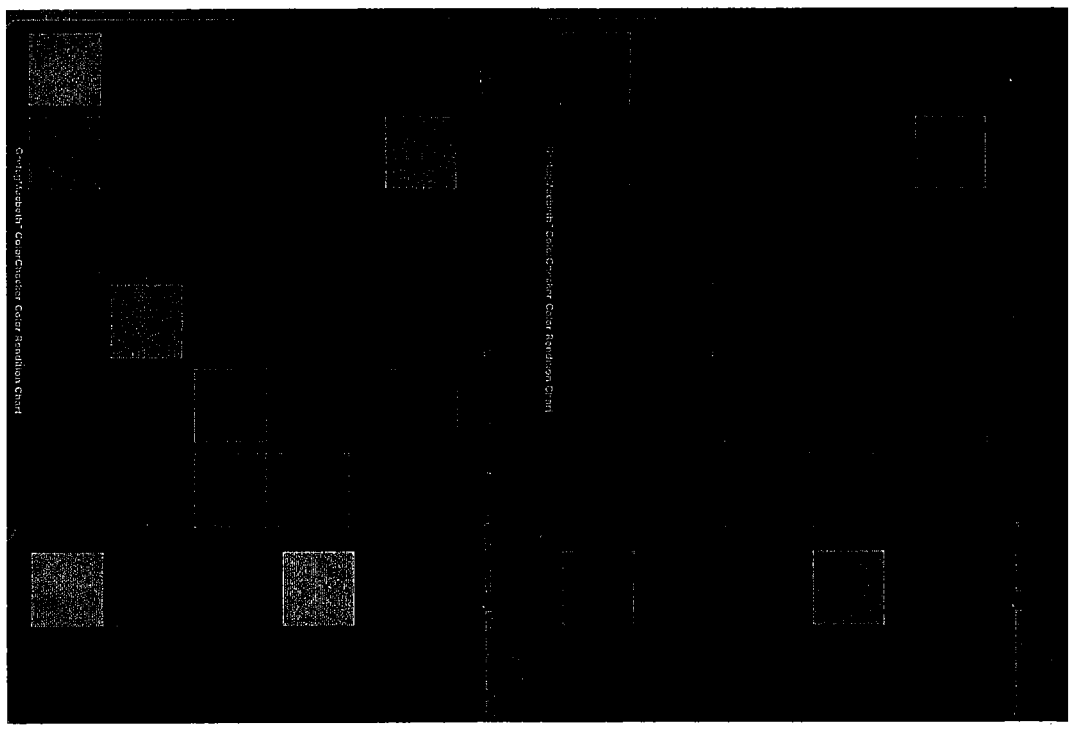
FIG. 91A
G (WITHOUT IR CUT)
FIG. 91B
G (WITH IR CUT)
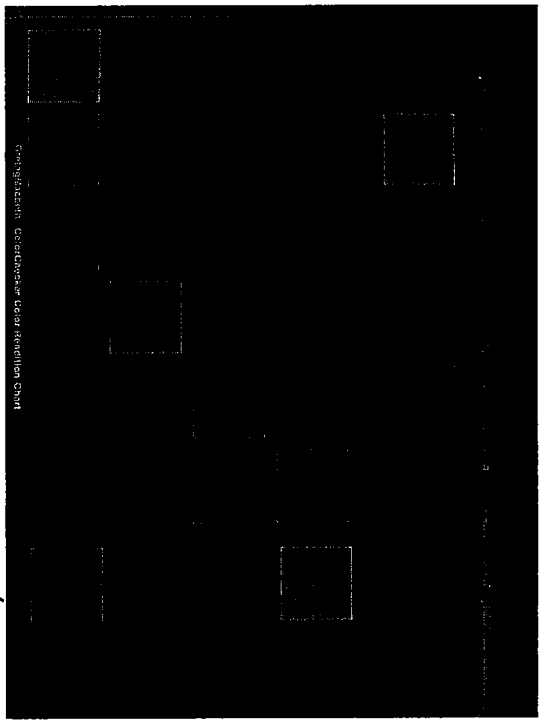
FIG. 91C
GREEN CORRECTED IMAGE G*
= G (WITHOUT IR CUT) IMAGE − BLACK CORRECTION IMAGE Brcorr
BLACK CORRECTION IMAGE Brcorr
= IMAGE Br OF BLACK FILTER BK × COEFFICIENT 0.18

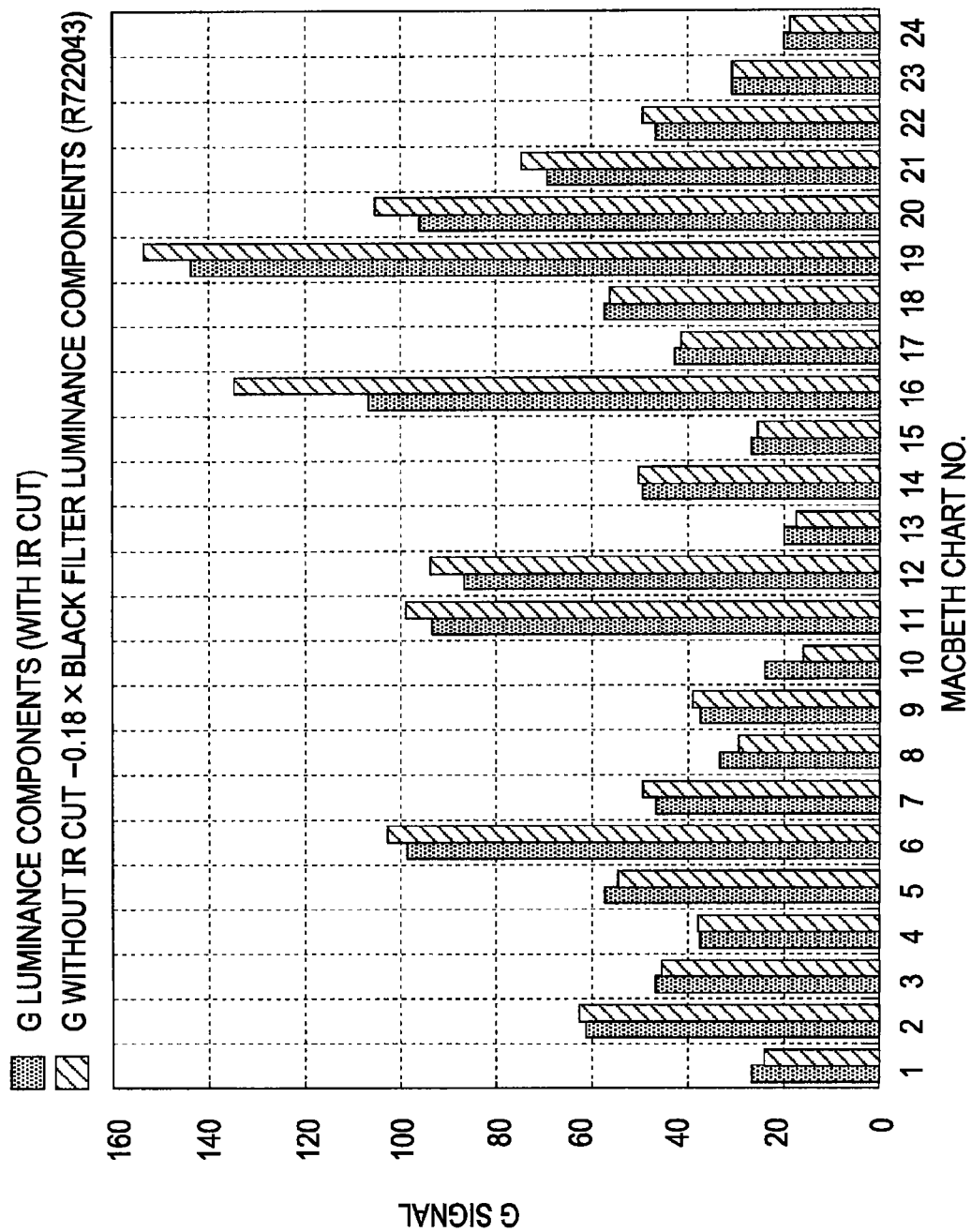

GREEN CORRECTED IMAGE G**

GREEN IMAGE G (WITH IR CUT)

GREEN CORRECTED IMAGE G**
= G (WITHOUT IR CUT) IMAGE $(1 - \varepsilon G \times Br) - \alpha G \times Br$
= G (WITHOUT IR CUT) IMAGE $- \alpha G \times$ BLACK CORRECTION IMAGE Br
$- \varepsilon G \times$ G (WITHOUT IR CUT) IMAGE $\times$ BLACK CORRECTION IMAGE Br COEFFICIENT $\alpha G = 0.11$
COEFFICIENT $\varepsilon G \approx 0.0012$

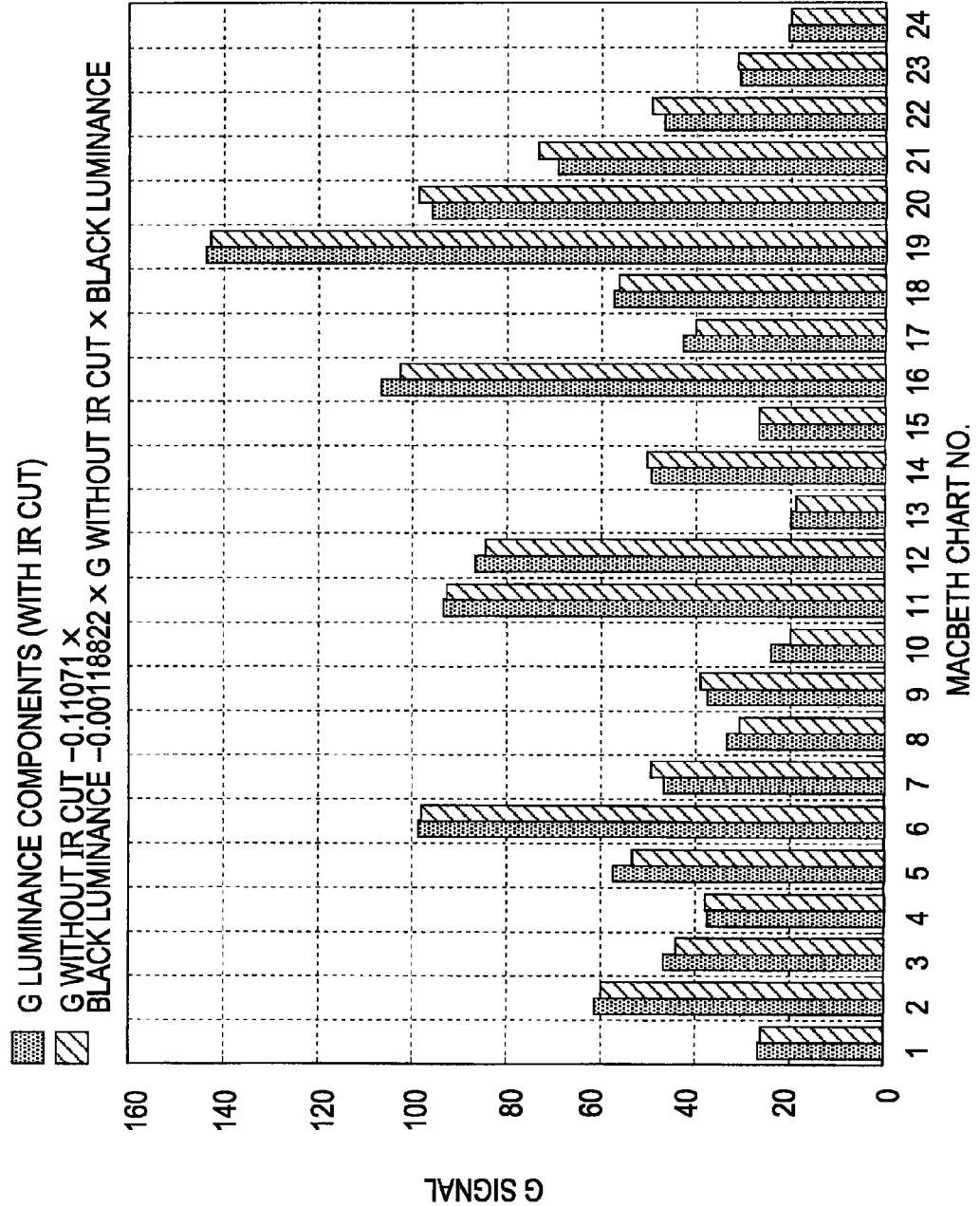

FIG. 100

| | DAYLIGHT COLOR FLUORESCENT | DAYTIME WHITE FLUORESCENT | LAMP-BULB COLOR FLUORESCENT | HALOGEN 3000K | HALOGEN 2800K | HALOGEN 2600K |
|---|---|---|---|---|---|---|
| MLT CORRECTION NON-LINEAR | ΔEab = 2.00 max 4.56 | ΔEab = 1.4 max 3.05 | ΔEab = 1.65 max 7.36 | ΔEab = 3.07 max 6.52 | ΔEab = 4.06 max 9.88 | ΔEab = 6.14 max 11.57 |
| WITHOUT MLT CORRECTION | ΔEab = 2.44 | ΔEab = 2.08 | ΔEab = 1.72 | ΔEab = 7.55 | ΔEab = 8.00 | ΔEab = 10.49 |

FIG. 101

HALOGEN LIGHT SOURCE (3000K)

ACTUAL MEASUREMENT

| | C5000 ACTUAL MEASUREMENT OF S/N RATIO (dB) | MLT ACTUAL MEASUREMENT OF S/N RATIO (dB) BEFORE CORRECTION | MLT ACTUAL MEASUREMENT OF S/N RATIO (dB) AFTER CORRECTION | MLT ACTUAL MEASUREMENT OF S/N RATIO (dB) AFTER NON-LINEAR CORRECTION |
|---|---|---|---|---|
| R | 19.603 | 26.325 | 19.907 | 19.626 |
| G | 23.241 | 25.837 | 21.245 | 21.071 |
| B | 19.498 | 22.808 | 19.612 | 19.295 |
| AVERAGE | 20.781 | 24.99 | 20.255 | 19.997 |

DIFFERENCE AS TO C5000: −0.784 dB

ESTIMATION

| | C5000 ESTIMATION OF S/N RATIO (dB) | MLT ESTIMATION OF S/N RATIO (dB) BEFORE CORRECTION | MLT ESTIMATION OF S/N RATIO (dB) AFTER CORRECTION | MLT ESTIMATION OF S/N RATIO (dB) AFTER NON-LINEAR CORRECTION |
|---|---|---|---|---|
| R | 18.592 | 26.299 | 19.072 | 19.072 |
| G | 22.585 | 25.611 | 20.428 | 20.428 |
| B | 18.602 | 22.344 | 18.795 | 18.689 |
| AVERAGE | 19.926 | 24.751 | 19.432 | 19.396 |

DIFFERENCE AS TO C5000: −0.530 dB

FIG. 102
FLUORESCENT LIGHT

ACTUAL MEASUREMENT

|   | C5000 ACTUAL MEASUREMENT OF S/N RATIO (dB) | MLT ACTUAL MEASUREMENT OF S/N RATIO (dB) BEFORE CORRECTION | MLT ACTUAL MEASUREMENT OF S/N RATIO (dB) AFTER CORRECTION | MLT ACTUAL MEASUREMENT OF S/N RATIO (dB) AFTER NON-LINEAR CORRECTION |
|---|---|---|---|---|
| R | 18.366 | 21.273 | 19.802 | 19.784 |
| G | 24.706 | 25.262 | 24.521 | 24.359 |
| B | 23.994 | 24.325 | 24.222 | 24.07 |
| AVERAGE | 22.355 | 23.62 | 22.848 | 22.738 |

DIFFERENCE AS TO C5000: +0.383 dB

ESTIMATION

|   | C5000 ESTIMATION OF S/N RATIO (dB) | MLT ESTIMATION OF S/N RATIO (dB) BEFORE CORRECTION | MLT ESTIMATION OF S/N RATIO (dB) AFTER CORRECTION | MLT ESTIMATION OF S/N RATIO (dB) AFTER NON-LINEAR CORRECTION |
|---|---|---|---|---|
| R | 17.243 | 21.487 | 24.323 | 24.323 |
| G | 24.401 | 26.177 | 24.786 | 24.786 |
| B | 23.808 | 25.151 | 25.259 | 24.904 |
| AVERAGE | 21.817 | 24.272 | 24.789 | 24.671 |

DIFFERENCE AS TO C5000: +2.854 dB

PHYSICAL INFORMATION ACQUISITION METHOD, PHYSICAL INFORMATION ACQUISITION DEVICE, AND SEMICONDUCTOR DEVICE

CROSS REFERENCES TO RELATED APPLICATIONS

The present application claims priority to and contains subject matter related to Japanese Patent Application JP 2005-211002 filed in the Japanese Patent Office on Jul. 21, 2005 and Japanese Patent Application JP 2006-133412 filed in the Japanese Patent Office on May 12, 2006, the entire contents of which are incorporated herein by reference.

BACKGROUND OF THE INVENTION

1. Field of the Invention

The present invention relates to a physical information acquisition method, a physical information acquisition device, and a semiconductor device. In more detail, the present invention relates to a signal acquisition technique appropriate for applying to a solid image capturing apparatus and so forth which use a semiconductor device for physical quantity distribution detection which is configured of multiple unit components, having sensitivity as to electromagnetic waves to be input from the outside such as light, radiation, or the like, being arrayed, and can read out a physical quantity distribution converted into an electric signal by the unit components as an electric signal. Particularly, the present invention relates to an arrangement for eliminating influence of unnecessary wavelength (a typical example is infrared light and ultraviolet light as to visible light) region components which filter in a principal wavelength region (a typical example is a visible light region).

2. Description of the Related Art

Physical quantity distribution detecting semiconductor devices, which are configured of a plurality of unit components (e.g., pixels) having sensitivity as to change in physical quantity such as electromagnetic waves to be input from the outside such as light, radiation, or the like being arrayed in a line shape, or in a matrix form, are employed in various fields.

For example, with the visual equipment field, a CCD (Charge Coupled Device) type for detecting change in light serving as one example of physical quantity (one example of electromagnetic waves) or MOS (Metal Oxide Semiconductor), or CMOS (Complementary Metal-oxide Semiconductor) type solid image capturing apparatuses are employed. These read out a physical quantity distribution converted into an electric signal by unit components (pixels in the case of solid image capturing apparatuses) as an electric signal.

For example, a solid state image capturing device detects electromagnetic waves to be input from the outside such as light, radiation, and so forth using a photodiode serving as an photoelectric conversion device (light receiving device; photo sensor) provided in the image capturing unit (pixel unit) of a device unit to generate and accumulate signal electric charge, and reads out the accumulated signal electric charge (photoelectron) as image information.

Also, recently, arrangements for capturing an image using visible light and capturing an image using infrared light have been proposed (e.g., see U.S. Pat. No. 5,965,875, Japanese Unexamined Patent Application Publication No. 2004-103964, Japanese Unexamined Patent Application Publication No. 10-210486, Japanese Unexamined Patent Application Publication No. 2002-369049, Japanese Unexamined Patent Application Publication No. 06-121325, Japanese Unexamined Patent Application Publication No. 09-166493, Japanese Unexamined Patent Application Publication No. 09-130678, Japanese Unexamined Patent Application Publication No. 2000-59798, and Japanese Unexamined Patent Application Publication No. 2003-70009). For example, the position of the emitting light point of infrared rays is prepared beforehand to trace this, whereby the position of the emitting light point of infrared light present within a visible light image can be detected. Also, even in the event of no visible light, e.g., even in the event of night, a brilliant image can be obtained by illuminating infrared light to capture an image. Further, in addition to visible light, infrared light is employed, whereby sensitivity can be improved.

The arrangements described in U.S. Pat. No. 5,965,875, and Japanese Unexamined Patent Application Publication No. 2004-103964 relate to a single-plate type utilizing the difference of absorption coefficients based on wavelengths in the depth direction of a semiconductor.

Also, the arrangements described in Japanese Unexamined Patent Application Publication No. 10-210486, Japanese Unexamined Patent Application Publication No. 2002-369049, and Japanese Unexamined Patent Application Publication No. 06-121325 relate to a multi-plate type for receiving visible light and infrared light at separate image capturing devices using a wavelength resolution optical system such as a wavelength separating mirror or prism or the like as an input optical system.

Also, the arrangement described in Japanese Unexamined Patent Application Publication No. 09-166493 relates to a single-plate type for receiving visible light and infrared light at the same image capturing device using a rotating type wavelength resolution optical system as an input optical system. For example, insertion/extraction of an infrared light cut filter is performed in a rotating-mechanical manner, and when inserting an infrared cut filter, a visible color image which has no influence from near-infrared light and infrared light is output, but when extracting an infrared light cut filter, an image to which the light intensity of visible light and near-infrared light is added is output.

Also, the arrangement described in Japanese Unexamined Patent Application Publication No. 09-130678 relates to a type for receiving visible light and infrared light at the same image capturing device using a diaphragm optical system having a wavelength resolution function as an input optical system.

Also, the arrangement described in Japanese Unexamined Patent Application Publication No. 2000-59798 is an arrangement wherein a color filter for transmitting near-infrared light is disposed on an image capturing device having sensitivity as to near-infrared light and visible light, and also adjustment means are provided for adjusting the position of the infrared cut filter between a position where incident light to the image capturing device passes through the infrared cut filter and a position where incident light to the image capturing device does not pass through the infrared cut filter, and when sharing the infrared cut filter for photographing using near-infrared light and for photographing using visible light, both of the sensitivity as to a near-infrared light region and the sensitivity as to a visible region of the image capturing device are effectively utilized by switching the position of the infrared cut filter.

Also, the arrangement described in Japanese Unexamined Patent Application Publication No. 2003-70009 is an arrangement wherein correction for reducing the value of a color difference signal and/or luminance signal depending on the influence degree of infrared light as to the value of a color difference signal or luminance signal to eliminate the influence of infrared light. As one example, an arrangement is made wherein in the event that color filters are complementary-color filters of magenta, green, cyan, and yellow, correction is performed as to a color difference signal R-Y, and each color output signal of magenta and yellow.

SUMMARY OF THE INVENTION

FIGS. 1A and 1B are diagrams for describing the arrangement of the sensors described in U.S. Pat. No. 5,965,875 and Japanese Unexamined Patent Application Publication No. 2004-103964, wherein FIG. 1A is a diagram illustrating the photoabsorption spectrum properties of semiconductor layers, and FIG. 1B is a schematic view of the cross-sectional configuration of a device.

According to this arrangement, the photoabsorption coefficient of a Si (Silicon) semiconductor becomes small in the sequence of blue, green, red, and infrared light, as illustrated in FIG. 1A, i.e., with regard to blue light, green light, red light, and infrared light included in an incident light L1, an advantage wherein a wavelength exhibits place dependency in the depth direction of a semiconductor is utilized, layers for detecting each color light of visible light (blue, green, and red) and infrared light are provided in order in the depth direction from the surface of the Si semiconductor, as illustrated in FIG. 1B.

However, with the arrangement described in Japanese Unexamined Patent Application Publication No. 2004-103964 utilizing the difference of absorption coefficients according to a wavelength, the amount of light which can be detected logically is not deteriorated, but a layer for detecting blue light is subjected to a certain amount of absorption when red light or green light passes through, such a light is detected as blue light. Accordingly, even in the event that a blue signal does not actually exist, input of a green or red signal enables a blue signal to be input, i.e., enables a false signal to be generated, and consequently, it is difficult to obtain sufficient color reproducibility.

In order to avoid this situation, signal processing can be made using calculations to perform correction as to the entire three primary colors, which calls for providing additional circuits necessary for calculations, and consequently, the circuit configuration becomes complex and great in scale, and also drives up costs. Further, for example, upon any one of the three primary colors being saturated, it becomes difficult to recognize the original value of the saturated light, and accordingly, the calculations are incorrect, and consequently, the signal is subjected to processing to obtain color that is not the original color.

Also, as illustrated in FIG. 1A, most semiconductors have absorption sensitivity as to infrared light. Accordingly, for example, with a solid state image capturing apparatus (image sensor) or the like using a Si semiconductor, it is usually necessary to insert a glass infrared light cut filter in front of the sensor as an example of subtractive color filters.

Accordingly, ways by which to receive infrared light alone, or visible light and infrared light as a signal to capture an image include removing the infrared light cut filter, or reducing the percentage for cutting infrared light.

However, with such a configuration, infrared light is cast into the photoelectric conversion device along with the visible light, and accordingly, the tone of a visible light image differs from the original one. Accordingly, it is difficult to obtain the respective appropriate images of a visible image and infrared light alone (or mixture of infrared light and visible light) separately at the same time.

Also, apart from the above problems, upon employing an infrared light cut filter like an ordinary solid state image capturing device, visible light is also somewhat cut, resulting in deterioration in sensitivity. Also, employing an infrared light cut filter results in increase in costs.

Also, the arrangements described in Japanese Unexamined Patent Application Publication No. 10-210486, Japanese Unexamined Patent Application Publication No. 2002-369049, and Japanese Unexamined Patent Application Publication No. 06-121325 are wavelength resolution optical systems such as a wavelength separating mirror or prism or the like, which causes the input optical system to become great in scale.

Also, the arrangements described in Japanese Unexamined Patent Application Publication No. 09-166493 and Japanese Unexamined Patent Application Publication No. 2003-70009 are the insertion/extraction mechanism of an infrared light cut filter, which causes the device to become great in scale, and also it is difficult to perform operations of the infrared light cut filter automatically.

Also, the arrangement described in Japanese Unexamined Patent Application Publication No. 09-130678 is a diaphragm optical system having a wavelength resolution function, which causes the device to become great in scale. In addition, this arrangement can obtain both of an infrared image and a visible light image contemporaneously, but only an electric signal in which a visible light image and an infrared image are synthesized can be output from an image sensor, and it is difficult to output a visible light image alone or an infrared image alone.

Also, with the arrangement described in Japanese Unexamined Patent Application Publication No. 2000-59798, a color difference signal or luminance signal is subjected to correction, but the correction is based on estimation, resulting in deterioration in correction accuracy.

The present invention has been made in light of the above situations. According to embodiments of the present invention, there is provided a new arrangement for eliminating influence of unnecessary wavelength region components such as infrared light, ultraviolet light, and so forth which filter in a principal wavelength region such as a visible light region.

According to one embodiment of the present invention, a physical information acquisition method uses a device of which unit components include detection units for detecting electromagnetic waves and a unit signal generating unit for generating and outputting the corresponding unit signal based on the amount of electromagnetic waves detected by the detection unit for detecting a physical quantity distribution in which the unit components are disposed on the same substrate in a predetermined sequence, for acquiring physical information for a predetermined application based on the unit signal; wherein a first of the detection units detects first wavelength region components following second wavelength region components different from the first wavelength region components being separated from the first wavelength region components beforehand, and also a second of the detection units detects wavelength region components for correction including at least the second wavelength region components; and wherein physical information relating to the first wavelength region components from which at least a part of influence of the second wavelength region components is eliminated is obtained using the unit signal detected by the first detection unit, and the unit signal detected by the second detection unit.

According to another embodiment of the present invention, a physical information acquisition device, which uses a device of which unit components include a detection unit for detecting electromagnetic waves, and a unit signal generating unit for generating and outputting the corresponding unit signal based on the amount of electromagnetic waves detected by the detection unit for detecting a physical quantity distribution in which the unit components are disposed on the same substrate in a predetermined sequence, for acquiring physical information for a predetermined application based on the unit signal, includes: a first detection unit for detecting first wavelength region components following second wavelength region components different from the first wavelength region components being separated from the first wavelength region components beforehand; a second detection unit for detecting wavelength region components for correction including at least the second wavelength region components; and a signal processing unit for obtaining physical information relating to the first wavelength region components from which at least a part of influence of the second wavelength region components is eliminated using the unit signal detected by the first detection unit, and the unit signal detected by the second detection unit.

According to another embodiment of the present invention, a physical information acquisition device, which uses a device of which unit components include a detection unit for detecting electromagnetic waves, a unit signal generating unit for generating and outputting the corresponding unit signal based on the amount of electromagnetic waves detected by the detection unit for detecting a physical quantity distribution in which the unit components are disposed on the same substrate in a predetermined sequence, a first detection unit for detecting first wavelength region components following second wavelength region components different from the first wavelength region components being separated from the first wavelength region components beforehand, and a second detection unit for detecting wavelength region components for correction including at least the second wavelength region components, for acquiring physical information for a predetermined application based on the unit signal, includes: a signal processing unit for obtaining physical information relating to the first wavelength region components from which at least a part of influence of the second wavelength region components is eliminated using the unit signal detected by the first detection unit, and the unit signal detected by the second detection unit.

According to another embodiment of the present invention, a semiconductor device, which is a device of which unit components include a detection unit for detecting electromagnetic waves and a unit signal generating unit for generating and outputting the corresponding unit signal based on the amount of electromagnetic waves detected by the detection unit, for detecting a physical quantity distribution in which the unit components are disposed on the same substrate in a predetermined sequence, includes on the same substrate: a first detection unit for detecting first wavelength region components following second wavelength region components different from the first wavelength region components being separated from the first wavelength region components beforehand; and a second detection unit for detecting wavelength region components for correction including at least the second wavelength region components.

BRIEF DESCRIPTION OF THE DRAWINGS

FIG. 8 is a configuration diagram describing the basic concept of a method for designing a layered film;

FIG. 31 is a reflectance spectrum diagram describing the fifth modification of a spectral image sensor corresponding to single wavelength division utilizing a layered film;

FIG. 40 is a diagram for describing a second embodiment of a solid state image capturing device;

FIG. 41 is a conceptual diagram describing the basic configuration of a spectral image sensor utilizing a diffraction grating;

FIG. 44 is a chart illustrating the relation between the refractive index of Si and the wavelength dispersion of an extinction coefficient which are used for a spectral image sensor corresponding to infrared light;

FIG. 53 is a diagram (part one) describing a problem wherein infrared light components are mixed in visible light components;

FIG. 61 is a diagram (part two) describing influence of color reproducibility caused by infrared light components being mixed in visible light components;

FIG. 73 is a diagram (part two) describing the correction technique of the third example of the second specific example;

FIGS. 87A through 87C are diagrams illustrating the image based on unfiltered image data obtained by capturing a Macbeth chart using the experimental camera and a green filter G;

FIG. 88 is a diagram representing a signal level (actual value) for each color chip number of the Macbeth chart which is the image capturing result illustrated in FIGS. 87A through 87C;

FIGS. 91A through 91C are diagrams representing an image illustrating one example of correction advantages as to a G color image employing a black correction image;

FIG. 92 is a diagram representing a signal level (actual value) for each color chip number of the Macbeth chart which illustrates one example of correction advantages as to a G color image employing a black correction image;

FIG. 94 is a diagram representing a signal level (actual value) for each color chip number of the Macbeth chart of a high-precision correction method as to a G color image employing a black correction image;

FIG. 100 is a chart summarizing the measurement result of color difference as to each type of light source;

FIG. 101 is a chart summarizing the estimated values and actual values of noise regarding the halogen light source (color temperature of 3000 K); and FIG. 102 is a chart summarizing the estimated values and actual values of noise regarding fluorescent light.

DESCRIPTION OF THE PREFERRED EMBODIMENTS

Embodiments of the present invention will be described below in detail with reference to the drawings.

<Basic Concept>

Figure 2:
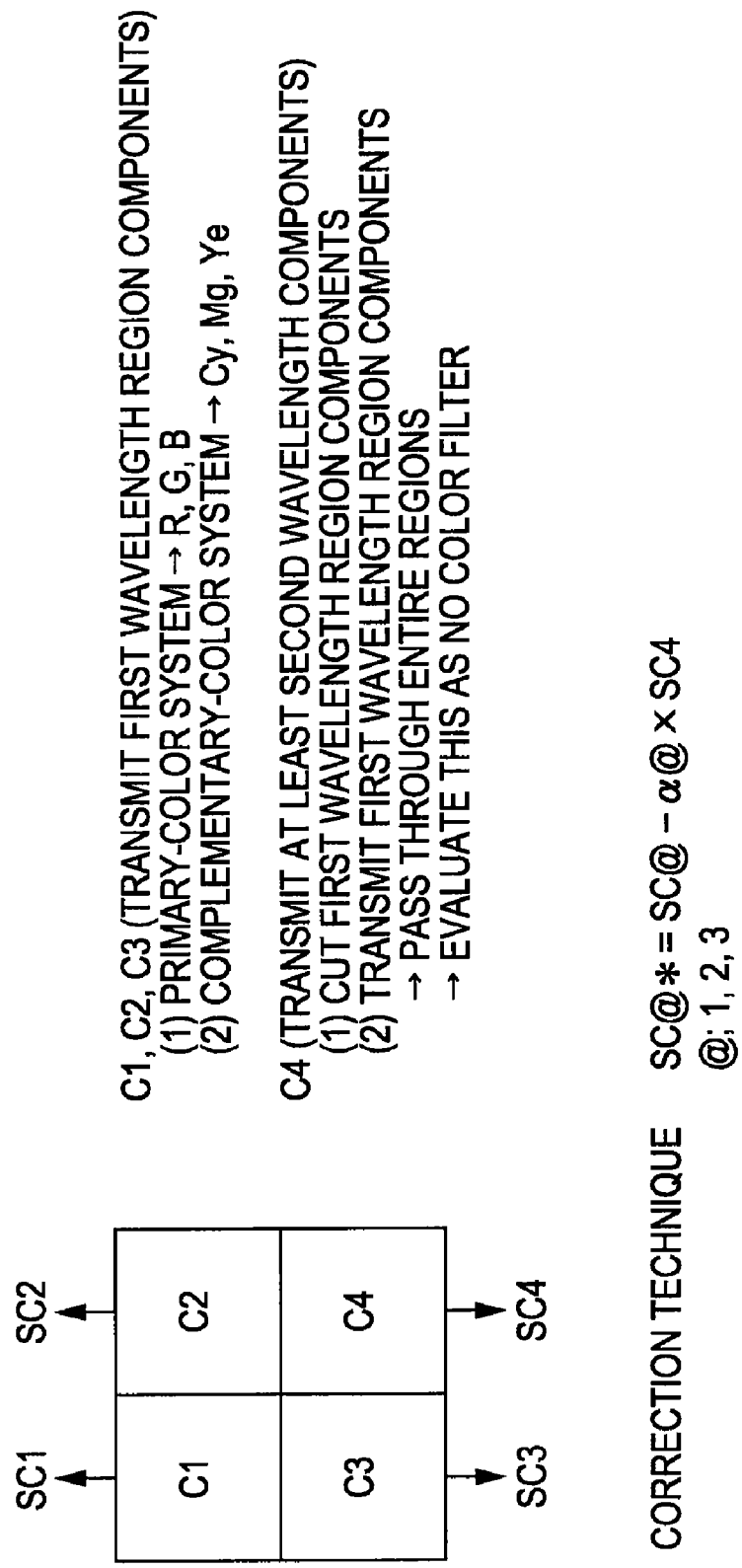
FIG. 2 is a diagram illustrating the basic configuration of a layout example of color separation filters which enables a visible light color image and an infrared light image to be constantly obtained independently using correction computing.

FIG. 2 is a diagram illustrating the basic configuration of a layout example of color separation filters which constantly enable a visible light color image and an infrared light image to be obtained independently using correction computing. Here, four types of color filters having distinct filter properties are disposed regularly (a tetragonal lattice in the present embodiment), which are made up of color filters C1, C2, and C3 for visible light color images (any of these transmits the first wavelength region components) serving as filters for three wavelength regions (color components), and a color filter C4 for infrared light serving as second wavelength region components different from the components of the color filters C1, C2, and C3. The respective components can be detected independently by the corresponding detection unit through the color filters C1, C2, C3, and C4. The detection unit in which the color filters C1, C2, and C3 are disposed is a first detection unit, and the detection unit in which the color filter C4 is disposed is a second detection unit. Also, the detection unit (detection elements) in which the color filters C1, C2, and C3 are disposed is a detection unit for detecting a first wavelength region by further subjecting the first wavelength region to wavelength separation.

Let us say that the color filters C1, C2, and C3 are primary color filters wherein the transmittance of color components within a visible light band is generally one, and the others are generally zero. For example, primary color filters may be employed wherein a blue component B (e.g., transmittance is generally one at wavelength $\lambda=400$ through 500 nm, and generally zero at the others), a green component G (e.g., transmittance is generally one at wavelength $\lambda=500$ through 600 nm, and generally zero at the others), and a red component R (e.g., transmittance is generally one at wavelength $\lambda=600$ through 700 nm, and generally zero at the others), which are three primary colors of visible light VL (wavelength $\lambda=380$ through 780 nm), are taken as the center.

Alternatively, let us say that the color filters C1, C2, and C3 are complementary-color filters having transmittance of generally zero for color components within a visible light band, and generally one for the others. For example, complementary-color filters having transmittance of generally zero as to the three primary color components of visible light may be employed, such as yellow Ye (e.g., transmittance is generally zero at wavelength $\lambda=400$ through 500 nm, and generally one at the others), magenta Mg (e.g., transmittance is generally zero at wavelength $\lambda=500$ through 600 nm, and generally one at the others), cyan Cy (e.g., transmittance is generally zero at wavelength $\lambda=600$ through 700 nm, and generally one at the others), and so forth.

Complementary-color filters have higher sensitivity than primary-color filters, whereby the sensitivity of an image capturing device can be improved by employing complementary-color filters wherein the transmitted light of a visible region is made up of complementary colors as to each of the three primary colors. Inversely, employing primary-color filters provides advantages wherein primary color signals can be obtained without performing difference processing, and the signal processing of a visible light color image can be readily performed.

Note that transmittance of "generally one" shows an ideal state, and it is desirable that the transmittance in the wavelength region is extremely greater than that in the other wavelength regions. A part thereof may include transmittance other than "1". Similarly, transmittance of "generally zero" also shows an ideal state, and it is desirable that the transmittance in the wavelength region is extremely smaller than that in the other wavelength regions. A part thereof may include transmittance other than "zero".

Also, any of primary-color filters and complementary-color filters can be employed as long as filters pass through the wavelength region components of a predetermined color within a visible light region (primary color or complementary color), and whether or not the filters pass through an infrared light region serving as a second wavelength region, i.e., transmittance as to infrared light IR can be ignored.

For example, with the respective color filters currently commonly employed, for example, transmittance is high as to each of R, G, and B, and transmittance is low as to the other colors (e.g., G or B in the case of R) within a visible light band, but regarding the transmittance other than a visible light band is irregular, and is usually higher than the transmittance of the other colors (e.g., G or B in the case of R), e.g., each filter has sensitivity as to an infrared region, and there is transmittance of light in an infrared region. However, even if the transmittance other than a visible light band is high, the present embodiment does not receive influence thereof.

On the other hand, the color filter C4 is preferably a filter for a predetermined wavelength region including at least the components of the second wavelength region (infrared light in the present example), may be a filter (visible light cut filter) serving as a first technique for not passing through principal components passing through the color filters C1, C2, and C3 (i.e., visible light components) but passing through only the second wavelength region (infrared light in the present example), or may be a filter (whole-region passage filter) serving as a second technique for passing through the entire regions components from the first wavelength region (visible light in the present example) to the second wavelength region (infrared light in the present example). In the case of the second technique, in that the entire wavelength components from visible light to infrared light (particularly near-infrared light) are passed through, as a matter of fact, a configuration in which no color filter is provided can be employed as the color filter C4.

For example, in the event that a visible light cut filter is not inserted at the light receiving face side of a detection region which receives infrared light, visible light components are filtered in the detection region side of infrared light, and the visible light image of the filtered components and the original infrared light image are obtained in a mixed manner. In order to eliminate this mixed visible light image, and obtain an infrared light image receiving almost no influence from visible light, for example, it is necessary to reduce the intensity of blue, red, and green to be detected at three color pixels R, G, and B which receive visible light components.

Conversely, for example, providing a green filter passing through red light and green light as a visible light cut filter enables the mixed components of infrared light IR and green visible light LG to be obtained from the detection unit for infrared light, but taking the difference as to the green components obtained from the color pixel G receiving green light components enables an image of only the infrared light IR receiving almost no influence from visible light VL (here, green light G) to be obtained. It is necessary to provide a green filter at the light receiving face side of a detection unit for outside light, but this facilitates processing as compared with the case of subtracting the intensity of blue, red, and green to be detected at the three pixels R, G, and B without providing a green filter.

Also, upon providing a black filter such as passing through infrared light, and absorbing visible light alone as a visible light cut filter, the components of infrared light alone can be obtained from the detection unit for infrared light by this black filter absorbing visible light, and even if difference processing is not performed, an infrared light image of infrared light alone receiving almost no influence of visible light can be obtained.

Note that the pixel detection unit where the color filters C1, C2, and C3 are disposed (e.g., image capturing device such as a photodiode) preferably has sensitivity as to visible light, and has no necessity to have sensitivity as to near-infrared light. On the other hand, it is necessary for the detection unit configured of a pixel photodiode where the color filter C4 is disposed to have sensitivity as to at least near-infrared light in the case of the present example. Also, in the event that the color filter C4 is a visible light cut filter passing through near-infrared light alone, it is unnecessary to have sensitivity as to visible light, but in the event that the color filter C4 is a whole-region passage filter, it is also necessary to have sensitivity as to visible light.

Also, color pixels where the color filter C4 is disposed are employed not only as physical information (infrared light image in the present example) for reproducibility relating to the second wavelength region components to be obtained based on the color pixels where the color filter C4 is disposed but also as correction pixels as to a color signal for visible light color image reproducibility to be obtained based on the color pixels where the color filters C1, C2, and C3 are disposed. Consequently, the color filter C4 serves as a correction color filter as to the color filters C1, C2, and C3.

That is to say, as for reproducibility of a visible light color image, first, the signal components SC1, SC2, and SC3 of the first wavelength region are separated from the second wavelength region (infrared) components which are different from the first wavelength region components based on the color pixels where the color filters C1, C2, and C3 are disposed as a matter of fact, and detection is performed in each independent detection region. Also, the signal component SC4 of a predetermined wavelength region (infrared alone or entire region) including at least the second wavelength region (infrared) components is detected in further another detection region.

The respective signal components SC1, SC2, and SC3 are corrected using the signal component SC4, thereby obtaining respective correction color signals SC1*, SC2*, and SC3* for reproducing an image (here, visible light color image) relating to the first wavelength region components (visible light components) from which influence of the second wavelength region (infrared) components is eliminated.

As for this correction computing, signal components obtained by multiplying the signal component SC4 including at least the second wavelength components by predetermined coefficients CC1, (C2, and (C3 is subtracted from the signal components SC1, SC2, and SC3 of the first wavelength region.

Note that an image relating to the second wavelength region components (here, infrared light image relating to infrared light) can be obtained from the signal component SC4. At this time, in the event that the color filter C4 is a visible light cut filter which does not pass through principal components (i.e., visible light components) passing through the color filters C1, C2, and C3 but the second wavelength region (infrared light in the present example) alone, the signal component SC4 itself represents an infrared light image. On the other hand, in the event that the color filter C4 is a whole-region passage filter passing through the entire region components from the first wavelength region (visible light in the present example) to the second wavelength region (infrared light in the present example), visible light image components to be obtained by the signal components SC1, SC2, and SC3 should be subtracted from the signal component SC4. Note that as for an infrared light image, an image wherein infrared light and visible light are mixed may be obtained.

Thus, upon signal output to be obtained from the four types of wavelength regions (here, respective pixels where the four types of color filters are disposed) being subject to matrix computing, each of a visible light color image and a near-infrared light image can be obtained independently. That is to say, the four types of color filters having different filter properties are disposed at the respective pixels of an image capturing device such as a photodiode, and the output of each pixel where the four types of color filters are disposed is subjected to matrix computing, whereby three primary output for forming a visible color image receiving almost no influence of near-infrared light, and output for forming a near-infrared light image receiving almost no influence of visible light can be obtained independently and also simultaneously.

Particularly, as for a visible light color image, deterioration in color reproducibility due to filtering of infrared light is corrected with computing processing, whereby image capturing having high sensitivity at a dark place and also excellent color reproducibility can be performed. A phenomenon wherein a red signal component close to infrared light becomes great, and a phenomenon wherein luminance at a red portion of an image increases can be absorbed, and also improvement of color reproducibility and sensitivity rise at the time of low illumination can be balanced without employing a special image capturing device and mechanism.

Also, it becomes unnecessary to insert an expensive glass optical member having certain thickness and weight serving as one example of a subtractive filter in front of a sensor on the optical path of an image-forming optical system. The optical system can be reduced in weight and sized, and costs can be greatly reduced by eliminating the necessity of an expensive infrared light cut filter. It is needless to say that the insertion/extraction mechanism of an infrared light cut filter is unnecessary, which prevents the device from becoming great in scale.

High sensitivity can be also realized by eliminating the necessity of an infrared light cut filter. Performing color image capturing without an infrared light cut filter enables current signal processing circuits to be combined, and also enables the light of a near-infrared region to be used effectively, whereby high sensitivity can be realized, and at that time, excellent color reproducibility can be obtained even when low illumination.

Deterioration in color reproducibility of a visible light color image due to infrared light components to be filtered in visible light components can be readily corrected with computing processing. Also, as for the correction computing, correction is made not by simple estimation such as the arrangement described in Japanese Unexamined Patent Application Publication No. 2003-70009 but by actually measuring infrared light components, and using the information thereof, whereby correction can be made for the appropriate amount depending on the intensity of infrared light under an actual image capturing environment, and consequently, correction accuracy is extremely in a good condition. Also, it is unnecessary for a user to adjust the amount of correction corresponding to an image capturing environment, thereby obtaining ease of use.

<Image Capturing Apparatus>

Figure 3:
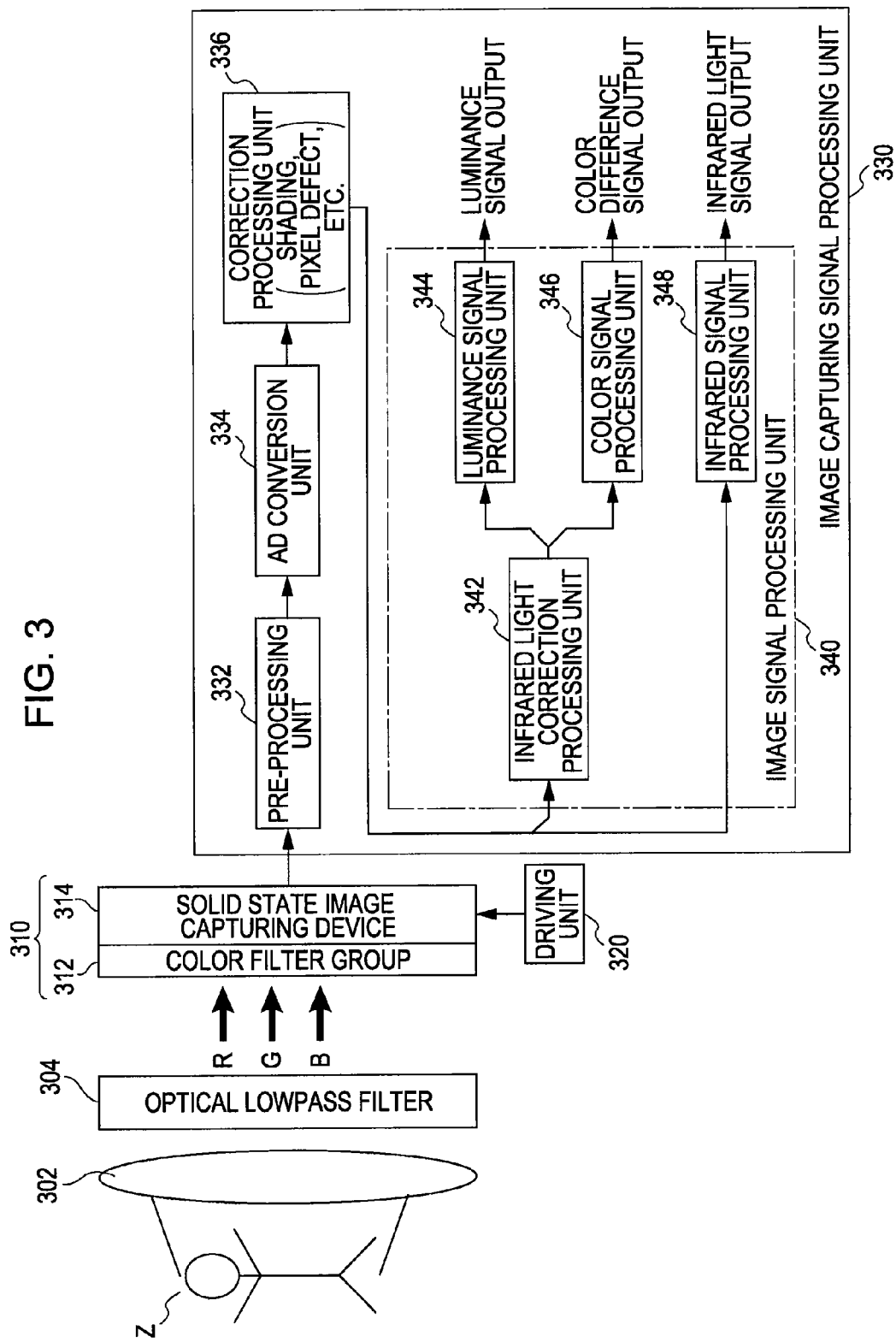
FIG. 3 is a diagram illustrating the schematic configuration of an image capturing apparatus according to an embodiment of the present invention.

FIG. 3 is a diagram illustrating the schematic configuration of an image capturing apparatus serving as one example of a physical information acquisition device according to an embodiment of the present invention. This image capturing apparatus 300 is an image capturing apparatus for obtaining a visible light color image and a near-infrared light image independently.

Specifically, the image capturing apparatus 300 includes a taking lens 302 for guiding light L which holds the image of a subject Z to the image capturing unit side to form an image, an optical lowpass filter 304, an image capturing unit 310 having a color filter group 312 and a solid state image capturing device (image sensor) 314, a driving unit 320 for driving the solid state image capturing device 314, respective image capturing signals SIR (infrared light components) output from the solid state image capturing device 314, and an image capturing signal processing unit 330 for processing SV (visible light components).

The optical lowpass filter 304 is for shielding high-frequency components exceeding Nyquist frequency to prevent loop distortion. A common image capturing apparatus uses the optical lowpass filter 304 and an infrared light cut filter together, but the present configuration includes no infrared light cut filter. Also, in the event of employing a configuration wherein a visible light color image and a near-infrared light image are independently obtained, an arrangement is sometimes employed wherein an optical member for wavelength separation (referred to as wavelength separating optical system) is provided for separating the light L1 to be cast through the taking lens 302 into an infrared light IR serving as one example of invisible light and a visible light VL, but the present configuration includes no wavelength separating optical system for performing wavelength separation in such an incident system.

The solid state image capturing device 314 is an image capturing device made up of a photoelectric conversion pixel group formed in a two-dimensional matrix form. Note that the specific configuration of the solid state image capturing device 314 to be employed for the present embodiment will be described later.

Electric charge corresponding to the infrared light IR for holding the image of the subject Z, and electric charge corresponding to the visible light VL occur on the image capturing face of the solid state image capturing device 314. Operation such as accumulation operation of electric charge, readout operation of electric charge, and so forth is controlled by a sensor driving pulse signal to be output to the driving unit 320 from an unshown system control circuit.

The electric charge signals read out from the solid state image capturing device 314, i.e., the infrared light image capturing signal SIR holding an infrared light image, and the visible light image capturing signal SVL holding a visible image are transmitted to the image capturing signal processing unit 330, and are subjected to predetermined signal processing.

For example, the image capturing signal processing unit 330 includes a pre-processing unit 332 for subjecting the sensor output signals (visible light image capturing signal SVL and infrared light image capturing signal SIR) output from the solid state image capturing device 314 to pre-processing such as black-level adjustment, gain adjustment, gamma correction, or the like, an AD conversion unit 334 for converting the analog signal output from the pre-processing unit 332 into a digital signal, a correction processing unit 336 for correcting shading which occurs at the taking lens 302, the pixel defect of the solid state image capturing device 314, and so forth, and an image signal processing unit 340.

The image signal processing unit 340 serving as the feature portion of the present embodiment includes an infrared light correction processing unit 342 for generating a correction visible light image capturing signal SVL* by subjecting the visible light image capturing signal SVL to correction using the infrared light image capturing signal SIR. Also, the image signal processing unit 340 includes a luminance signal processing unit 344 for generating a luminance signal based on the correction visible light image capturing signal SVL* output from the infrared light correction processing unit 342, a color signal processing unit 346 for generating a color signal (primary-color signal or color-difference signal) based on the correction visible light image capturing signal SVL* output from the infrared light correction processing unit 342, and an infrared signal processing unit 348 for generating an infrared light signal representing an infrared light image based on the infrared light image capturing signal SIR.

The image capturing signal output from the solid state image capturing device 314 is amplified into a predetermined level by the pre-processing unit 332 of the image capturing signal processing unit 330, and is converted into a digital signal from the analog signal by the AD conversion unit 334. Also, the digital image signal of visible light components of which infrared light components are suppressed by the infrared light correction processing unit 342, and is further separated into color separation signals of R, G, and B as necessary (particularly, in the event of employing complementary-color filters as the color filters C1, C2, and C3) by the luminance signal processing unit 344 and the color signal processing unit 346, following which are converted into a luminance signal, a color signal, or a picture signal obtained by synthesizing the luminance signal and color signal, and are output. Also, the infrared signal processing unit 348 subjects the infrared light image capturing signal SIR to correction using the visible light image capturing signal SVL as necessary (in the event that a black filter is not used as the color filter C4).

Note that with the infrared light correction processing unit 342, the placement position thereof is not restricted to such a configuration as long as the infrared light correction processing unit 342 can subject the visible light image capturing signal SVL to correction using the infrared light image capturing signal SIR. For example, an arrangement may be made wherein the infrared light correction processing unit 342 is provided between the AD conversion unit 334 and the correction processing unit 336 for shading correction or pixel defect correction are provided, and correction for suppressing influence of infrared light is performed prior to shading correction and pixel defect correction.

Alternatively, an arrangement may be made wherein the infrared light correction processing unit 342 is provided between the pre-processing unit 332 and the AD conversion unit 334, infrared light suppressing processing is performed following pre-processing such as black-level adjustment, gain adjustment, gamma correction, or the like, or wherein the infrared light correction processing unit 342 is provided between the solid state image capturing device 314 and the pre-processing unit 332, infrared light suppressing processing is performed prior to pre-processing such as black-level adjustment, gain adjustment, gamma correction, or the like.

With such a configuration, with the image capturing apparatus 300, the taking lens 302 takes in an optical image representing the subject Z including the infrared light IR, the image capturing unit 310 takes in an infrared light image (near-infrared light optical image) and a visible light image (visible light optical image) without separation, the image capturing signal processing unit 330 converts these infrared light image and visible light image into picture signals respectively, following which subjects the picture signals to predetermined signal processing (e.g., color signal separation to R, G, and B components, or the like), and outputs these as a color image signal or infrared light image signal, or a mixed image signal in which both are synthesized.

For example, the taking lens 302 is a lens made up of an optical material such as quartz, sapphire, or the like which can transmit light of which wavelength is around 380 nm through around 2200 nm, which takes in an optical image including the infrared light IR, and while condensing this forms an image on the solid state image capturing device 314.

Also, the image capturing apparatus 300 according to the present embodiment has features in that a detection unit (image sensor), which is optimized so as to detect the wavelength components of the original detection target, is provided in the image capturing unit 310. Particularly, with the present embodiment, the solid state image capturing device 314, which is optimized so as to detect the visible light VL, is provided to detect short wavelength sides within the visible light VL and the infrared light IR.

Now, the term "image sensor which is optimized" means to have a configuration wherein a region corresponding to wavelength separation is provided, in which other than the wavelength components of the original detection target, are not included in the image capturing signal of the wavelength components of the original detection target, as much as possible.

The present embodiment has features in that the image sensor side has a configuration corresponding to wavelength separation even if a wavelength separating optical system has no wavelength separation on the optical path, whereby the optical system can be reduced in size.

The configuration of such an image capturing apparatus differs from a configuration wherein as described in Japanese Unexamined Patent Application Publication No. 10-210486 and Japanese Unexamined Patent Application Publication No. 06-121325, a visible light image and an infrared light image are individually obtained by the respective wavelength components separated by the wavelength separating optical system being cast into the respective individual sensors having the same configuration.

Also, the configuration of the above image capturing apparatus differs from an arrangement wherein as described in Japanese Unexamined Patent Application Publication No. 10-210486, the individual images of R, G, and B are obtained regarding the visible light VL by further separating the visible light components which transmitted a cold mirror into a red component, a green component, and a blue component at three dichroic mirrors, and casting each of these into an individual sensor. With the method in Japanese Unexamined Patent Application Publication No. 10-210486, it is necessary to provide three sensors regarding the visible light VL, which improves sensitivity, but also poses a problem such as increase in costs. The configuration according to the present embodiment does not have such a problem.

Also, the configuration of the above image capturing apparatus differs from a configuration wherein as described in Japanese Unexamined Patent Application Publication No. 2002-369049, a visible light image and an infrared light image are individually obtained by performing wavelength separation with a two-step process on the optical path, and casting each separated component into an individual sensor having the same configuration. With the method in Japanese Unexamined Patent Application Publication No. 2002-369049, wavelength separation is performed with a two-step process on the optical path, which creates a drawback wherein the optical system becomes great in scale. In addition, problems such as sensitivity, blurring, and so forth are included. The configuration according to the present embodiment does not have such a problem.

For example, with the configuration of the present embodiment, it becomes unnecessary to insert an infrared light cut filter serving as one example of a subtractive filter in front of the solid state image capturing device 314 at the time of image capturing of the visible light VL using the image capturing unit 310. Costs can be greatly reduced by eliminating the necessity of such an expensive infrared light cut filter. Also, an optical system can be reduced in weight and also in size by eliminating the necessity of an infrared light cut filter having thickness and weight. It is needless to say that the insertion/extraction mechanism of an infrared light cut filter is unnecessary, which prevents the device from becoming great in scale. The configuration of the present embodiment is cost-wise advantageous as compared with the case of employing an existing glass infrared light cut filter, and also can provide an image capturing apparatus such as a digital camera and so forth which has become compact and excels in portability and so forth.

Also, with a configuration wherein an infrared light cut filter is inserted in front of the solid state image capturing device 314, interface between the air and the glass occurs on the way to the optical path by inserting a glass substrate in front of an image capturing device such as CCD, CMOS, or the like. Accordingly, even the light of the visible light VL which is desired to be transmitted is also reflected at the interface thereof, which poses a problem of leading to deterioration in sensitivity. Further, upon the number of such an interface increasing, an angle to be refracted in oblique incidence (within glass) differs depending on a wavelength, leading to defocus due to change in the optical path. Conversely, employing no infrared light cut filter on the optical path of the front side of the solid state image capturing device 314, enables an advantage wherein such defocus is eliminated to be obtained.

Note that in order to further improve wavelength separation performance, weak infrared light cut filters may be inserted entirely, though a problem such as increase in size of the optical system, and so forth occurs. For example, up to a level having almost no problem as to the visible light VL may be cut by inserting an infrared light cut filter of 50% or less.

Either way, image capturing of the visible light VL alone and image capturing of the infrared light IR alone, or image capturing of the visible light VL alone and image capturing in which the infrared light IR and the visible light VL are mixed can be performed contemporaneously.

According to the present embodiment, influence of the infrared light IR is not received at the time of image capturing of a monochrome image or a color image during the day, and also image capturing using the infrared light IR can be performed during the night or the like. The other images can be output contemporaneously as necessary. Even in such a case, the image of the infrared light IR alone which receives no influence from the visible light VL can be obtained.

For example, the monochrome image of the visible light VL alone which almost completely receives no influence from the infrared light IR can be obtained. The present embodiment differs from the arrangement described in Japanese Unexamined Patent Application Publication No. 2002-142228, it is unnecessary to perform computing processing among the components of the infrared light IR at the time of obtaining the monochrome image of the visible light VL which almost completely receives no influence from the infrared light IR.

Further, as for one example of an optical member for separating the visible light VL into predetermined wavelength region components, color filters having predetermined wavelength transmission properties in a visible light region are provided corresponding to pixels (unit pixel matrix), whereby the image of the particular wavelength region alone within a visible light region which almost completely receives no influence from the infrared light IR can be obtained.

Also, color filters each having different wavelength transmission properties in a visible light region are arrayed regularly on multiple photodiodes making up a unit pixel matrix by integrally matching the position thereof to the photodiode corresponding to each wavelength (by color), whereby the visible light region can be separated by wavelength (by color). The color image (visible light color image) of the visible light VL alone which almost completely receive no influence from the infrared light IR can be obtained by performing synthetic processing based on the respective pixel signals to be obtained from these pixels by color.

In the event of obtaining the color image of the visible light VL which almost completely receives no influence from the infrared light IR, correction computing for subtracting signal components obtained by multiplying the signal components SIR including at least infrared light region components by a predetermined coefficient a from the visible light region signal components SV, which is different from a simple matrix computing such as the arrangement described in Japanese Unexamined Patent Application Publication No. 2002-142228, whereby the infrared light components included in a visible region pixel signal can be suppressed with high precision.

Also, infrared light components are actually measured, and visible light components are subjected to correction using that information, which is different from simple estimation correction such as the arrangement described in Japanese Unexamined Patent Application Publication No. 2003-70009, whereby correction can be performed depending on the actual situation with high precision.

Thus, the monochrome image or color image of the visible light VL, and the "image relating to the infrared light IR" can be independently obtained all the time. The term "the image relating to the infrared light IR" means the image of the infrared light IR alone which almost completely receives no influence from the visible light VL, or the image wherein the infrared light IR and the visible light VL are mixed.

An arrangement may be made wherein image capturing of the visible light VL alone (monochrome image capturing or color image capturing) which almost completely receives no influence from the infrared light IR, and image capturing wherein the infrared light IR and the visible light VL are mixed can be performed contemporaneously. Also, an arrangement may be made wherein image capturing of the infrared light IR alone which almost completely receives no influence of the visible light VL can be performed by performing synthetic processing (specifically, difference processing) between the components of the visible light VL alone (monochrome image components or color image components) and the components wherein the infrared light IR and the visible light VL are mixed.

Note that the above term "almost completely receives no influence" may be "receives somewhat influence" conclusively in light of human vision generally as long as the degree of influence is that it is difficult to sense apparent difference by human vision. That is to say, as for the infrared light IR side, it is desirable to obtain an infrared image (one example of physical information) of which influence of a passage wavelength region (visible light VL) can be ignored from the perspective of human vision, and as for the visible light VL side, it is desirable to obtain an ordinary image (one example of physical information) of which influence of reflective wavelength region components (infrared light IR) can be ignored from the perspective of human vision.

Note that in the event of employing no black filter as the color filter C4, the correction pixels where the color filter C4 is disposed have sensitivity as to a wide wavelength area from visible light to infrared light, and accordingly, the pixel signals thereof are readily saturated as compared with the other pixels for visible light image capturing where the color filters C1, C2, and C3 are disposed.

In order to avoid this problem, it is desirable for the driving unit 320 to control the detection time of the second detection unit where the color filter C4 is disposed. For example, with image capturing at a bright place, it is desirable to read out a pixel signal from the correction pixel detection unit in shorter a cycle than an ordinary cycle using an electronic shutter function or the like, and transmit this to the pre-processing unit 332. In this case, an advantage can be obtained as to saturation by transmitting the signal in higher a rate than 60 frame/sec.

Alternatively, it is desirable to read out electric charge from the correction pixel detection unit in shorter time (accumulation time) than 0.01667 sec. In this case, accumulation of electric charge may be read out effectively in a short period of time by discharging an electric charge signal to the substrate side using overflow. Further preferably, an advantage can be obtained as to saturation by transmitting the signal in higher a rate than 240 frame/sec. Alternatively, it is desirable to simply read out electric charge from the correction pixel detection unit in shorter time (accumulation time) than 4.16 ms. Either way, it is desirable to prevent the pixel signal to be output from the correction pixel detection unit from saturation. Note that thus, pixels of which electric charge is read out in a short period of time (accumulation time) so as to prevent saturation may be correction pixels alone, or may be all of the pixels.

Further, a weak signal may be converted into a strong signal to improve an S/N ratio by integrating the signal read out in a short period of time twice or more. For example, according to such an arrangement, even if image capturing is performed at a dark place or bright place, appropriate sensitivity and a high S/N ratio can be obtained, leading to expand a dynamic range.

<Image Capturing Apparatus; Corresponding to CCD>

Figure 4A:
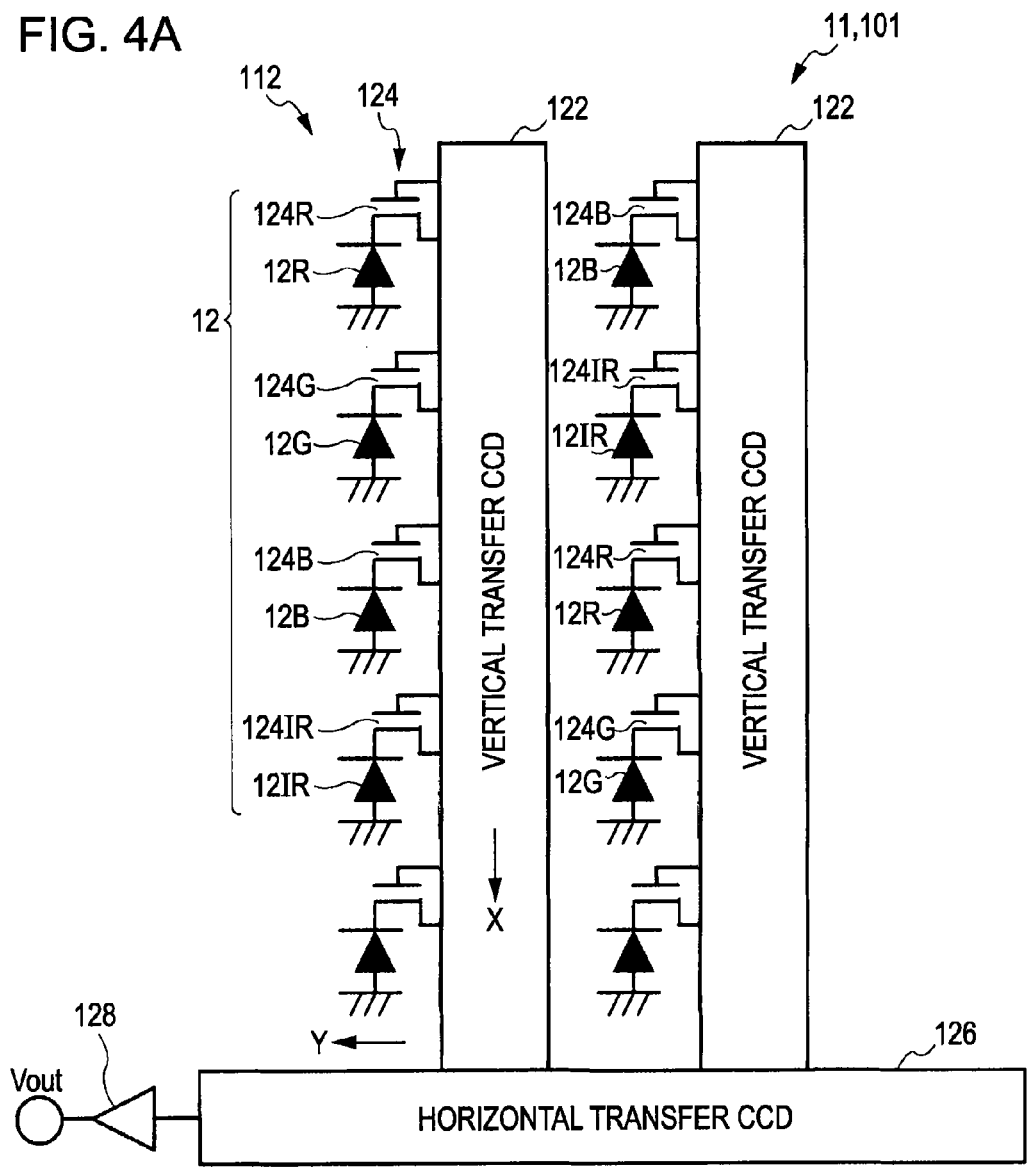
FIGS. 4A and 4B are circuit diagrams of an image capturing apparatus in the case of applying the layout of the color separation filters illustrated in FIG. 2 to an interline-transfer-type CCD solid state image capturing device.
Figure 4B:
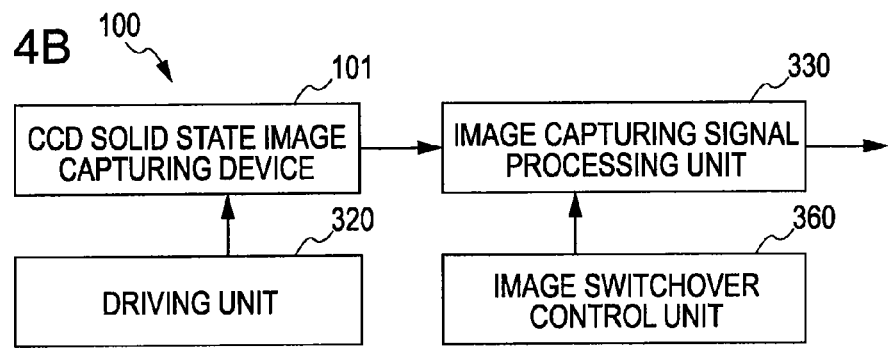

FIGS. 4A and 4B circuit diagrams of an image capturing apparatus in the case of applying the layout of the color separation filters illustrated in FIG. 2 to an interline-transfer-type CCD solid state image capturing device (IT_CCD image sensor).

Now, FIGS. 4A and 4B illustrate a configuration wherein the infrared light IR is detected while separating the inside of a visible light band into the respective color components of R, G, and B, which is a configuration wherein blue light B, green light G, and red light R within the visible light VL, and the infrared light IR are each detected independently, and substantially, which is a configuration wherein within one unit pixel matrix 12 pixels (photoelectric conversion devices) 12B, 12G, and 12R are formed by wavelength, and also a pixel 12IR having no wavelength separation configuration is included, and the pixel 12IR is used as a correction pixel as to the other pixels.

For example, as illustrated in FIG. 4A, with a CCD solid state image capturing device 101, in addition to the unit pixel matrix 12, a plurality of vertical transfer CCDs 122 are arrayed in the vertical transfer direction. The electric charge transfer direction of the vertical transfer CCDs 122, i.e., the readout direction of a pixel signal is the vertical direction (X direction in the drawing).

Further, MOS transistors making up readout gates 124 (124B, 124G, 124R, and 124IR by wavelength) stand between the vertical transfer CCD 122 and each unit pixel matrix 12, and also an unshown channel stop is provided at the interface portion of each unit cell (unit component).

Note that as can be understood from FIGS. 4A and 4B, the one unit pixel matrix 12 is configured so as to detect the blue light B, green light G, red light R, and infrared light IR independently, and substantially, which is a configuration wherein the pixels 12B, 12G, 12R, and 12IR are formed by wavelength (color) within the one unit pixel matrix 12. An image capturing area 110 is configured of the plurality of vertical transfer CCDs 122, which are provided for each vertical row of sensor units 112 made up of the unit pixel matrices 12, for subjecting the signal electric charge read out by the readout gates 124 from each sensor unit to vertical transfer, and the sensor units 112.

Now, as for the array of the color filters 14, for example, let us say that the sequence in the vertical direction (X direction) of the vertical transfer CCD 122 at the light receiving face side of a silicon substrate $1\_\omega$ is blue, green, red, IR (correction pixel), blue, green, red, IR (correction pixel) and so on, and similarly, the sequence in the same line direction (Y direction) of the plurality of vertical transfer CCDs 122 is blue, green, red, IR (correction pixel), blue, green, red, IR (correction pixel), and so on. Also, it is effective to employ a pixel array in light of deterioration in resolution by providing correction pixels (detailed description will be made later).

The signal electric charge accumulated in the unit pixel matrices 12 (each of the pixels 12B, 12G, 12R, and 12IR) of the sensor units 112 is read out by the vertical transfer CCD 122 of the same vertical row by a drive pulse φROG corresponding to a readout pulse ROG being applied to the readout gates 124. The vertical transfer CCD 122 is subjected to transfer driving by a drive pulse φVx based on vertical transfer clock Vx such as three phases through eight phases, for example, and transfers the readout signal electric charge in the vertical direction for each portion equivalent to one scan line (one line) during a part of a horizontal blanking period in order. This vertical transfer for each one line is particularly referred to as "line shift".

Also, with the CCD solid state image capturing device 101, a horizontal transfer CCD 126 (H register unit, horizontal transfer unit) is provided for the worth of one line, which is adjacent to each of the transfer destination side end portion of the plurality of vertical transfer CCDs 122, i.e., the vertical transfer CCD 122 of the last line, and extends in a predetermined (e.g., horizontal) direction. This horizontal transfer CCD 126 is subjected to transfer driving by drive pulses φH1 and φH2 based on two-phase horizontal transfer clocks H1 and H2 for example, and transfers the signal electric charge for the worth of one line transferred from the plurality of vertical transfer CCDs 122 to the horizontal direction in order during a horizontal scan period following a horizontal blanking period. Accordingly, a plurality (two) of horizontal transfer electrodes corresponding to two-phase driving are provided.

The transfer destination end portion of the horizontal transfer CCD 126 is provided with an output amplifier 128 including an electric-charge voltage conversion unit having a floating diffusion amplifier (FDA) configuration, for example. The output amplifier 128 is one example of a physical information acquisition unit, which converts the signal electric charge subjected to horizontal transfer by the horizontal transfer CCD 126 into a voltage signal sequentially at the electric-charge voltage conversion unit, amplifies this to a predetermined level, and outputs this. With this voltage signal, a pixel signal is exhausted as CCD output (Vout) depending on the incident amount of light from a subject. Thus, the interline-transfer-type CCD solid state image capturing device 101 is configured.

The pixel signal exhausted from the output amplifier 128 as CCD output (Vout) is input to the image capturing signal processing unit 330, as illustrated in FIG. 4B. An image switchover control signal from an image switchover control unit 360 serving as one example of a signal switchover control unit is configured so as to be input to the image capturing signal processing unit 330.

The image switchover control unit 360 instructs switchover regarding whether the output of the image capturing signal processing unit 330 is changed to either of the monochrome image or color image of the visible light VL which almost completely receive no influence from the infrared light IR, and the image of the infrared light IR which almost completely receive no influence from the visible light VL, or both of these, or the mixed image of the visible light VL and the infrared light IR, i.e., the pseudo monochrome image or pseudo color image to which the luminance of the infrared light IR is added. That is to say, the image switchover control unit 360 controls simultaneous image capturing output between the image of the visible light VL and the image according to the infrared light IR, and switchover image capturing output.

This command may be provided with external input which operates the image capturing apparatus, or the image switchover control unit 360 may issue the command of switchover by automatic processing depending on the visible light luminance including no infrared light IR of the image capturing signal processing unit 330.

Now, the image capturing signal processing unit 330 performs, for example, synchronization processing for synchronizing the image capturing data R, G, B, and IR of each pixel, pinstriped noise correction processing for correcting pinstriped noise components caused by smear phenomenon or blooming phenomenon, white balance control processing for controlling white balance (WB) adjustment, gamma correction processing for adjusting gradation degree, dynamic range enlargement processing for enlarging a dynamic range using pixel information of two screens having different electric charge accumulation time, YC signal generation processing for generating luminance data (Y) and color data (C), or the like. Thus, a visible light band image (so-called ordinary image) based on the primary-color image capturing data (each pixel data of R, G, B, and IR) of red (R), green (G), and blue (B) can be obtained.

Also, the image capturing signal processing unit 330 generates an image relating to the infrared light IR using the pixel data of the infrared light IR. For example, with the pixel 12IR which serves as a correction pixel as to the pixels 12R, 12G, and 12B for visible light image acquisition, in the event that the color filter 14C is not inserted such that not only the infrared light IR but also the visible light VL contribute to a signal simultaneously, an image having high sensitivity can be obtained by using the pixel data from the pixel 12IR. Also, an image of the infrared light IR alone can be obtained by taking the difference as to each color component to be obtained from the pixels 12R, 12G, and 12B.

In the event of inserting the green filter 14G as to the pixel 12IR as the color filter 14C, an image in which the infrared light IR and the green visible light LG are mixed is obtained from the pixel 12IR, but an image of the infrared light IR alone is obtained by taking the difference as to the green components to be obtained from the pixel 12G. Alternatively, in the event of providing a black filter 14BK as to the pixel 12IR as the color filter 14C, an image of the infrared light IR alone can be obtained using the pixel data from the pixel IR.

The respective images thus generated are transmitted to an unshown display unit, presented as a visible image to an operator, stored or saved in a storage device such as a hard disk device or the like without any change, or transmitted to the other functional units as processed data.

<Image Capturing Apparatus; Corresponding to CMOS>

Figure 5A:
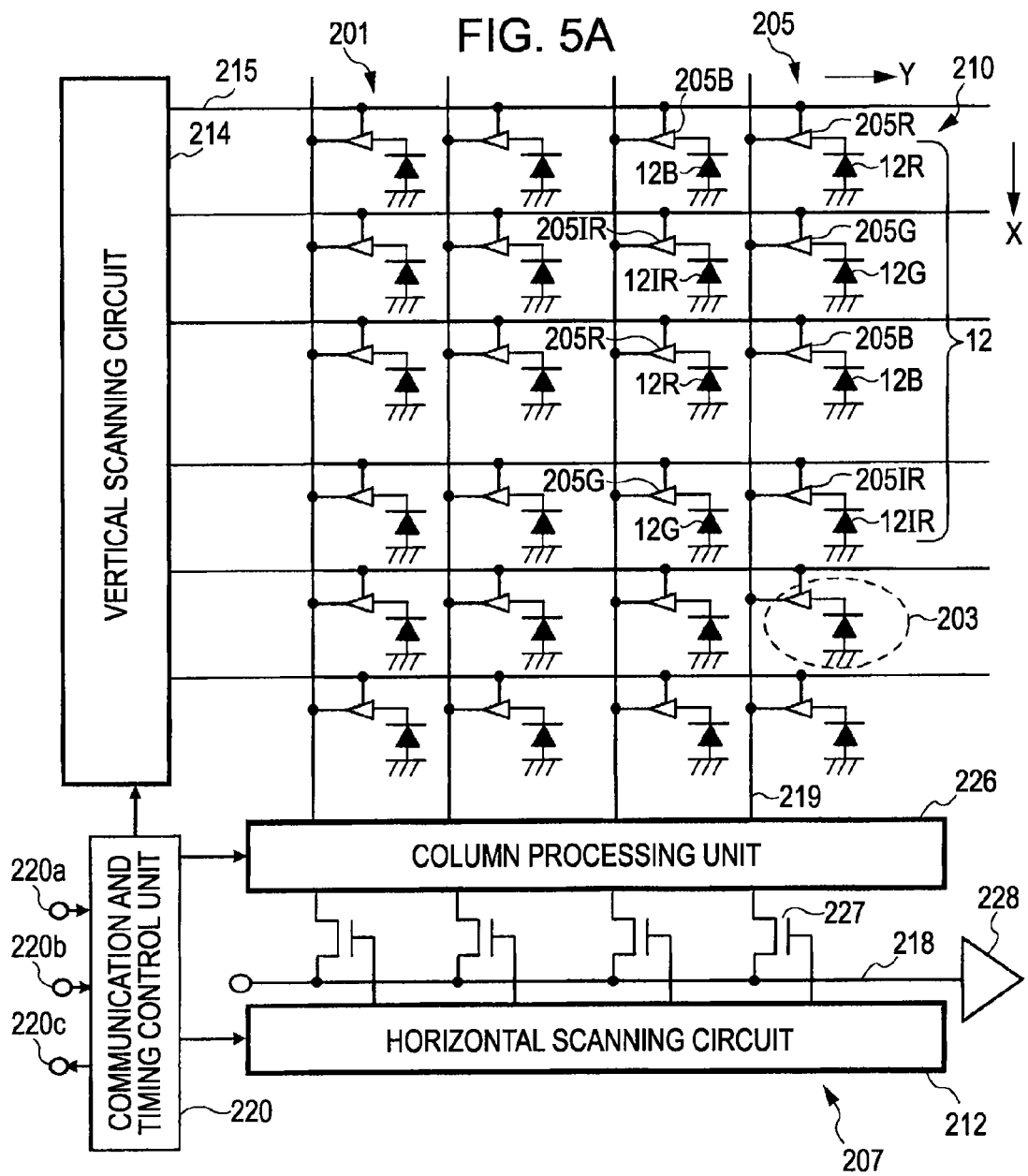
FIGS. 5A and 5B circuit diagrams of an image capturing apparatus in the case of applying the layout of the color separation filters illustrated in FIG. 2 to a CMOS solid state image capturing device.
Figure 5B:
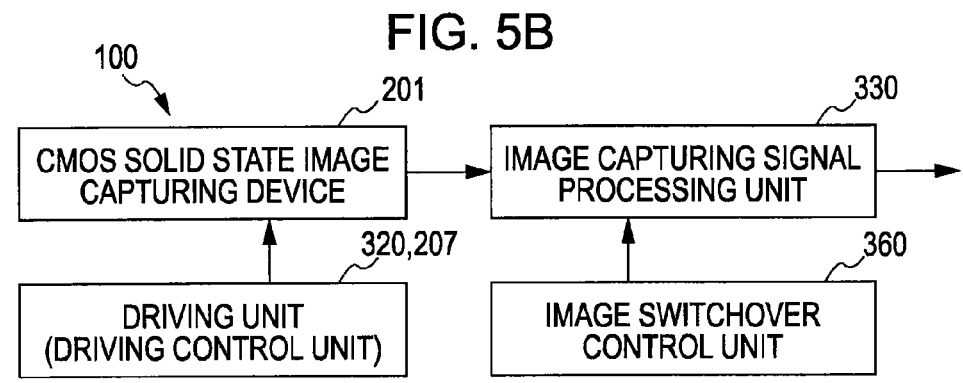

FIGS. 5A and 5B are circuit diagrams of an image capturing apparatus in the case of applying the layout of the color separation filters illustrated in FIG. 2 to a CMOS solid state image capturing device (CMOS image sensor).

Now, FIGS. 5A and 5B illustrate a configuration wherein the infrared light IR is detected while separating the inside of a visible light band into the respective color components of R, G, and B, which is a configuration wherein blue light B, green light G, and red light R within the visible light VL, and the infrared light IR are each detected independently, and substantially, which is a configuration wherein within one unit pixel matrix 12, pixels (photoelectric conversion devices) 12B, 12G, and 12R are formed by wavelength, and also a pixel 12IR having no wavelength separation configuration is included, and the pixel 12IR is used as a correction pixel as to the other pixels.

In the event of applying the layout of the color separation filters illustrated in FIG. 2 to a CMOS, a configuration is employed wherein one cell amplifier is assigned to each of the pixels (photoelectric conversion devices) 12B, 12G, 12R, and 12IR within the unit pixel matrix 12. Accordingly, this case takes a configuration such as FIG. 5A. A pixel signal is amplified by a cell amplifier, following which is output through a noise cancel circuit or the like.

For example, a CMOS solid state image capturing device 201 has a pixel unit wherein multiple pixels including light receiving elements (one example of an electric charge generating unit) for outputting a signal corresponding to the amount of incident light are arrayed with lines and rows (i.e., in a two-dimensional matrix form), the signal output from each pixel is a voltage signal, and a CDS (Correlated Double Sampling) processing function unit, a digital conversion unit (ADC; Analog Digital Converter), and so forth are provided in parallel with rows, i.e., form a so-called typical column type.

Specifically, as illustrated in FIGS. 5A and 5B, the CMOS solid state image capturing device 201 includes a pixel unit (image capturing unit) 210 wherein multiple pixels 12 are arrayed with lines and rows, a driving control unit 207 which is provided at the outside of the pixel unit 210, a column processing unit 226, and an output circuit 228.

Note that the preceding and subsequent stages of the column processing unit 226 can be provided with an AGC (Automatic Gain Control) circuit and so forth having a signal amplifying function can be provided at the same semiconductor region as the column processing unit 226 as necessary. In the event of performing AGC at the preceding stage of the column processing unit 226, this serves as an analog amplifier, and in the event of performing AGC at the subsequent stage of the column processing unit 226, this serves as a digital amplifier. Upon simply amplifying n-bit digital data, gradation is sometimes deteriorated, and accordingly, it can be conceived to preferably perform digital conversion following amplification of analog data.

The driving control unit 207 includes a control circuit function for sequentially reading out the signals of the pixel unit 210. For example, the driving control unit 207 includes a horizontal scan circuit (row scan circuit) 212 for controlling a row address and row scanning, a vertical scan circuit (line scan circuit) 214 for controlling a line address and line scanning, and a communication and timing control unit 220 having functions such as an interface function as to the outside and a function for generating an internal clock, and so forth.

The horizontal scan circuit 212 has a function as a readout scan unit for reading out a count value from the column processing unit 226. These respective components of the driving control unit 207 are integrally formed at semiconductor regions such as single crystal silicon or the like using the same technology as the semiconductor integration circuit manufacturing technology along with the pixel unit 210, and are configured as a solid state image capturing device (image capturing device) serving as one example of a semiconductor system.

In FIGS. 5A and 5B, a part of lines and rows are omitted for the sake of facilitation of description, but actually, several tens through several thousands of the pixels 12 are disposed at each of the lines and each of the rows. The pixels 12 are typically made up of the unit pixel matrices 12 serving as light receiving elements (electric charge generating unit), and intra-pixel amplifiers (cell amplifiers; pixel signal generating unit) 205 (205B, 205G, 205R, and 205IR by wavelength) including a semiconductor device for amplification (e.g., transistor).

Also, as can be understood from FIGS. 5A and 5B, the one unit pixel matrix 12 is configured so as to detect the blue light B, green light G, red light R, and infrared light IR independently, and substantially, which is a configuration wherein the pixels 12B, 12G, 12R, and 12IR are formed by wavelength (color) within the one unit pixel matrix 12.

Now, as for the array of the color filters 14, for example, let us say that the sequence in the X direction at the light receiving face side of a silicon substrate $1\_\omega$ is blue, green, red, IR (correction pixel), blue, green, red, IR (correction pixel) and so on, and similarly, the sequence in the Y direction orthogonal to the X direction is blue, green, red, IR (correction pixel), blue, green, red, IR (correction pixel), and so on. Also, it is effective to employ a color array in light of deterioration in resolution by providing correction pixels (detailed description will be made later).

As for the intra-pixel amplifiers 205, amplifiers having a floating diffusion amplifier configuration are employed, for example. As for one example, an intra-pixel amplifier configured of four versatile transistors serving as a CMOS sensor of a transistor for readout selection serving as one example of an electric charge readout unit (transfer gate unit/readout gate unit), a reset transistor serving as one example of a reset gate unit, a transistor for vertical selection, and a transistor for amplification having a source follower configuration serving as one example of a detection element for detecting electrical change of floating diffusion can be employed, as to an electric charge generating unit.

Alternatively, as described in Japanese Patent No. 2708455, an intra-pixel amplifier configured of three transistors of a transistor for amplification connected to a drain line (DRN) for amplifying signal voltage corresponding to signal electric charge generated by an electric charge generating unit, a reset transistor for resetting the intra-pixel amplifier 205, and a transistor for readout selection (transfer gate unit) to be scanned by a vertical shift resistor via a transfer wiring (TRF) can be employed.

The pixels 12 are connected to the vertical scan circuit 214 via a line control line 215 for line selection, and the column processing unit 226 via a vertical signal line 219, respectively. Here, the line control line 215 denotes the entire wiring entering to the pixel from the vertical scan circuit 214. As for one example, this line control line 215 is disposed in the direction parallel with a long scatterer 3.

The horizontal scan circuit 212 and the vertical scan circuit 214 are configured, for example, including a shift register and a decoder so as to start address selection operation (scanning) in response to the control signal given from the communication and timing control unit 220. Accordingly, the line control line 215 includes various types of pulse signal for driving the pixels 12 (e.g., reset pulse RST, transfer pulse TRF, DRN control pulse DRN, etc.).

The communication and timing control unit 220 includes, though not illustrated in the drawing, the function block of a timing generator TG (one example of the readout address control device) for supplying clock necessary for operation of each unit or a predetermined timing pulse signal, and the function block of communication interface for receiving a master clock CLK0 via a terminal 220a, also receiving data DATA for instructing an operation mode and the like via a terminal 220b, and further outputting data including the information of the CMOS solid state image capturing device 201 via a terminal 220c.

For example, the communication and timing control unit 220 outputs a horizontal address signal to a horizontal decoder, and also a vertical address signal to a vertical decoder, and each of the decoders selects the corresponding line or row in response to the address signal, and drives the pixels 12 and the column processing unit 226 via a driving circuit.

At this time, the pixels 12 are disposed in a two-dimensional matrix form, so it is desirable to realize speeding up of readout of a pixel signal or pixel data by performing vertical scan reading for accessing and taking in the analog pixel signal in increments of line (in parallel with rows), which is generated by the intra-pixel amplifier (pixel signal generating unit) 205 and output in the row direction via the vertical signal line 219, and then performing horizontal scan reading for accessing a pixel signal (e.g., digitalized pixel data) in the line direction serving as the direction where vertical rows are arrayed, and reading out the pixel signal to the output side. It is needless to say that random access for reading out the necessary information alone of the pixels 12 can be performed by directly specifying the address of the pixels 12 to intend to read regardless of scan reading.

Also, the communication and timing control unit 220 supplies a clock CLK1 having the same frequency as the master clock CLK0 to be input via the terminal 220a, a clock obtained by dividing the clock CLK1 into two, and a low-speed clock obtained by further dividing the clock CLK1 to each unit within the device such as the horizontal scan circuit 212, vertical scan circuit 214, column processing unit 226, and so forth, for example.

The vertical scan circuit 214 is a circuit for selecting a line of the pixel unit 210, and supplying a pulse necessary for line thereof. For example, the vertical scan circuit 214 includes a vertical decoder for stipulating a readout line in the vertical direction (selecting the line of the pixel unit 210), and a vertical driving circuit for supplying a pulse to the line control line 215 as to the pixels 12 on the readout address (line direction) stipulated by the vertical decoder to drive vertical readout. Note that the vertical decoder selects a line for electronic shutter in addition to a line for reading out a signal.

The horizontal scan circuit 212 is a circuit for sequentially selecting unshown column circuits within the column processing unit 226 in sync with the low-speed clock CLK2, and guiding signal thereof to the horizontal signal line (horizontal output line) 218. For example, the horizontal scan circuit 212 includes a horizontal decoder for stipulating the readout row in the horizontal direction (selecting each column circuit within the column processing unit 226), and a horizontal driving circuit for guiding each signal of the column processing unit 226 to the horizontal signal line 218 using a selection switch 227 in accordance with the readout address stipulated by the horizontal decoder. Note that the number of the horizontal signal line 218 is determined by the number of bits n (n is a positive integer) which can be handled by a column AD circuit for example, e.g., if the number of bits is 10 (=n) bits, the ten horizontal signal lines 218 corresponding to this number of bits are disposed.

With the CMOS solid state image capturing device 201 thus configured, the pixel signal output from the pixels 12 is supplied to the column circuit of the column processing unit 226 via the vertical signal line 219 for each vertical row. Here, the signal electric charge accumulated in the unit pixel matrix 12 (respective pixels 12B, 12G, 12R, and 12IR) is read out via the vertical signal line 219 of the same vertical row.

Each of the column circuits of the column processing unit 226 receives the pixel signal for the worth of one row, and processes signal thereof. For example, each of the column circuits has an ADC (Analog Digital Converter) for converting an analog signal into, for example, 10-bit digital data using, for example, the low-speed clock CLK2.

Also, devising a circuit configuration enables the pixel signal of the voltage mode input via the vertical signal line 219 to be subjected to processing for taking difference between the signal level (noise level) immediately after pixel reset and a true signal level $V_{sig}$ (corresponding to the amount of receiving light). Thus, noise signal components such as fixed pattern noise (FPN) and reset noise can be removed.

The analog pixel signal (or digital pixel data) processed at this column circuit is propagated to the horizontal signal line 218 via a horizontal selection switch 217 to be driven by the horizontal selection signal from the horizontal scan circuit 212, and further is input to the output circuit 228. Note that 10 bits are one example, so the other number of bits may be employed, such as less than 10 bits (e.g., 8 bits), greater than 10 bits (e.g., 14 bits), or the like.

According to such a configuration, the pixel signal regarding each vertical row is sequentially output for each line from the pixel unit 210 where the unit pixel matrix 12 (pixels 12B, 12G, 12R, and 12IR) serving as an electric charge generating unit is disposed in a matrix form. Consequently, one sheet of image, i.e., a frame image corresponding to the pixel unit 210 where light receiving elements are disposed in a matrix form is illustrated with the group of pixel signals of the entire pixel unit 210.

The output circuit 228 is a circuit corresponding to the output amplifier 128 in the CCD solid state image capturing device 101, and the image capturing signal processing unit 330 is provided at subsequent stage thereof, as with the CCD solid state image capturing device 101, as illustrated in FIG. 5B. An image switchover control signal from the image switchover control unit 360 is input to the image capturing signal processing unit 330, as with the case of the CCD solid state image capturing device 101.

Thus, the image capturing data (each pixel data of R, G, B, and IR) of the primary colors of red (R), green (G), and blue (B), or the image of a visible light band (so-called ordinary image) based on the image data for the visible light VL can be obtained, and also an image relating to the infrared light IR can be obtained by using the pixel data of the infrared light IR.

<Signal Readout Method>

Figure 6A:
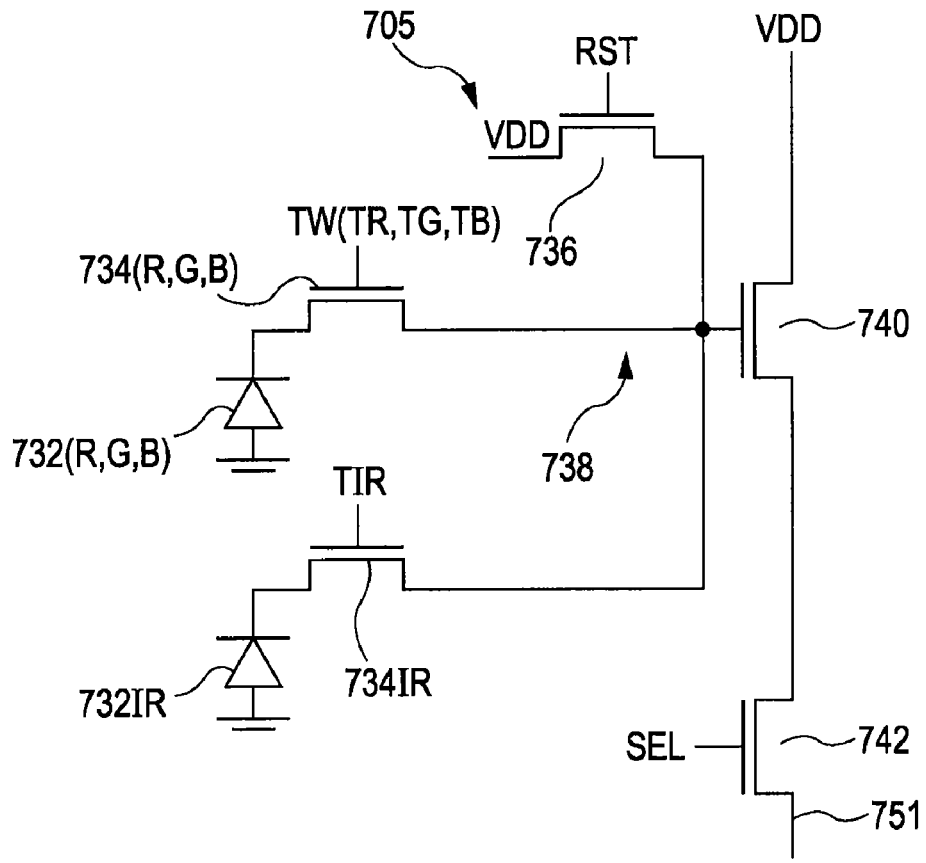
FIGS. 6A and 6B is a diagram for describing one example of the signal acquisition method in the case of employing an image sensor having a configuration for separating and obtaining a visible light image and an infrared light image.
Figure 6B:
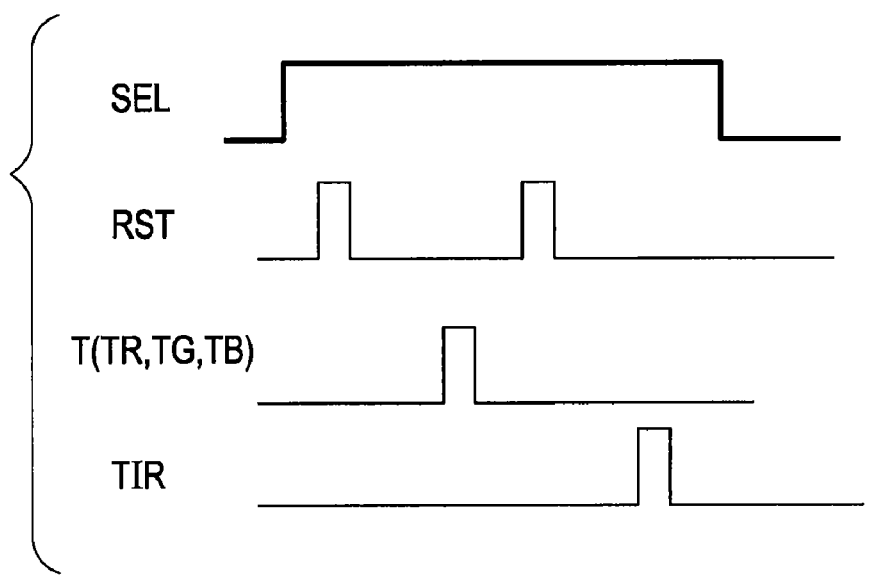

FIGS. 6A and 6B are diagrams for describing one example of the signal acquisition method in the case of employing an image sensor having a configuration for separating and obtaining a visible light image and an infrared light image. The case of a CMOS configuration is shown, here. Note that FIG. 6A is a circuit diagram, and FIG. 6B is a signal timing chart.

Transfer gates 743 (R, G, and B) and 734IR are provided as to each of photoelectric conversion devices 732 (by color of R, G, and B in the case of color, the following is the same) and 732IR provided in a light receiving portion by wavelength. Each of the photoelectric conversion devices 732 (R, G, and B) and 732IR is connected to the intra-pixel amplifier 705 through each of the corresponding transfer gates 734 (R, G, and B) and 734IR, and an amplifying transistor 740 and a reset transistor 736. The amplifying transistor 740 is connected to a vertical signal line 751 via a vertical selection transistor 742.

A pixel signal is output in accordance with each timing illustrated in FIG. 6B illustrating a reset state and a signal readout state. Here, in a state in which a selection pulse SEL is supplied to the vertical selection transistor 742 of the vertical line to be read out, prior to supplying readout pulses T (R, G, and B) and TIR to the transfer gates 734 (R, G, and B) and 734IR to read out each corresponding signal electric charge, a floating diffusion 738 is reset by supplying a reset pulse RST to a reset transistor 736. Thus, a pixel signal can be read out in the sequence of the infrared light IR components, and the visible light VL components (components by color) (or vice versa thereof).

<Image Capturing Device; First Embodiment Using Dielectric Layered Film>

Figure 7A:
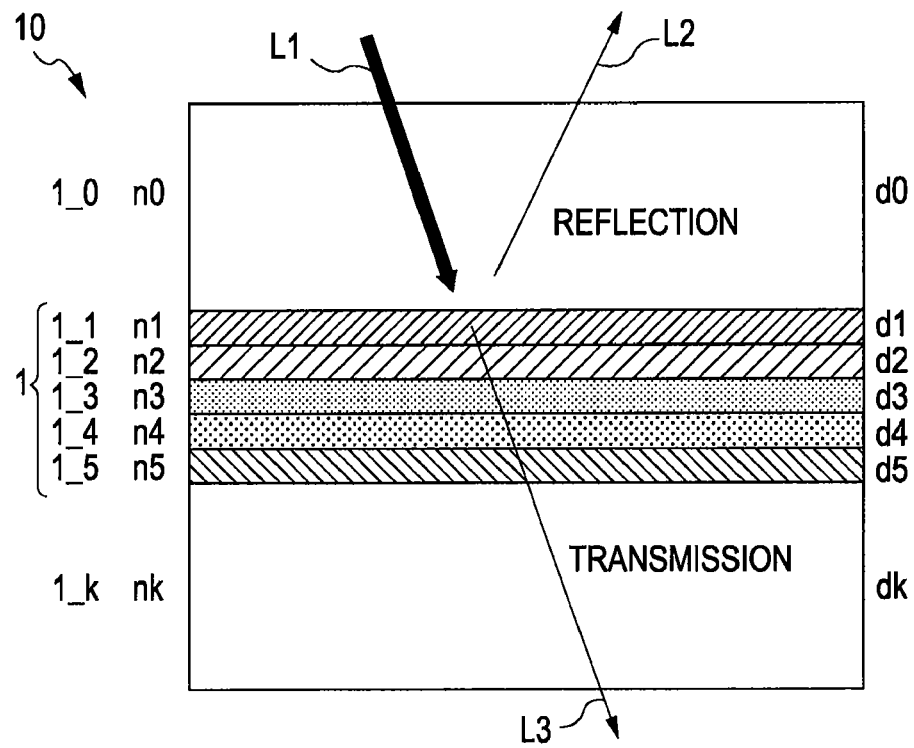
FIGS. 7A and 7B are diagrams for describing a first embodiment of a solid state image capturing device 314.
Figure 7B:
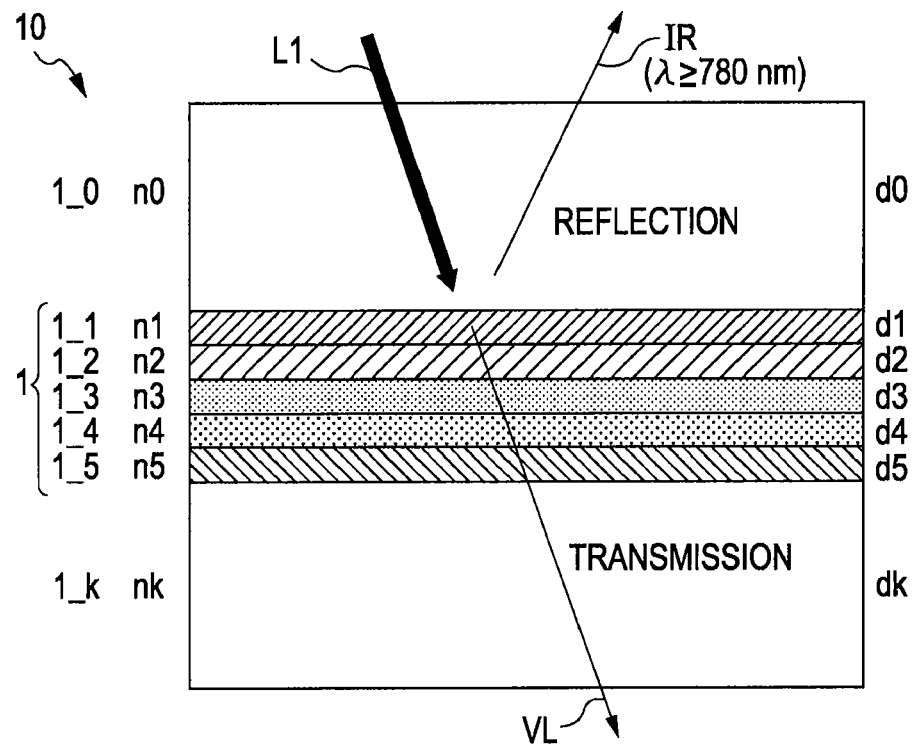

FIGS. 7A and 7B are diagrams for describing a first embodiment of the solid state image capturing device 314. The solid state image capturing device 314 of this first embodiment has features in that the concept of wavelength separation for subjecting electromagnetic waves to dispersion of light for each predetermined wavelength using a dielectric layered film. Now, description will be made regarding subjecting light serving as one example of electromagnetic waves to dispersion for each predetermined wavelength as an example.

Specifically, the present embodiment utilizes the configuration proposed in Japanese Patent Application No. 2004-358139 by the present assignee, which is a spectral image sensor (spectral detection unit) having a configuration corresponding to wavelength separation utilizing a dielectric layered film serving as a layered member having a configuration wherein multiple layers having predetermined thickness with adjacent layers having a different diffractive index are layered at the incident face side where the electromagnetic waves of the solid state image capturing device 314 are case, and properties wherein of light (electromagnetic waves) to be cast in, wavelength components (infrared light IR components in the present example) which are other than the original detection target are reflected, and the remaining components (visible light VL components in the present example) are passed through. The basic configuration of the sensor may be any type of a CCD type, CMOS type, and the other types.

Conversely, it can be conceived that the above properties possessed by the layered member are properties for passing through the wavelength components (visible light VL components in the present example) of the original detection target of incident light (electromagnetic waves), and the remaining components (infrared light IR components in the present example) are reflected.

With the first embodiment, an image sensor having a spectral image sensor configuration at the detection unit side of the visible light VL utilizing a dielectric layered film which is optimized for detection of the visible light VL. The infrared light IR is optically eliminated using a dielectric layered film, and photoelectrons alone of the visible light VL components alone which are cast into the detection unit of the visible light VL are converted into electric signals. An arrangement is made wherein spectral filters utilizing a dielectric layered film at visible light detection pixels (specifically, each color pixel of R, G, and B) are integrally formed on the one image sensor without performing wavelength separation on the optical path, and spectral filters utilizing a dielectric layered film are not formed at infrared light detection pixels, whereby a visible light image and an infrared light image can be independently simultaneously obtained. Thus, a visible light image and an infrared light image can be obtained independently with little influence being received from the infrared light IR.

<Concept of Wavelength Separation Utilizing a Dielectric Layered Film>

A dielectric layered film 1 is, as illustrated in FIG. 7A, a layered member having a configuration wherein the refractive index nj (j is a positive integer exceeding one; the following is the same) between adjacent layers differs (refractive index difference δn), and multiple layers having a predetermined thickness dj are layered. Thus, as described later, the dielectric layered film 1 can have properties for reflecting predetermined region components within electromagnetic waves, and passing through the remaining components.

With regard to how to count the number of layers of the respective dielectric layers 1_j making up the dielectric layered film 1, the thick layers at both sides thereof (the n0'th layer 1_0 and the k'th layer 1_k) are not counted as the number of layers, e.g., counting is performed from the first layer to the k'th layer in sequence. Substantially, the dielectric layered film 1 is made up of the basic layers 1_1 through 1_n (n=5 in the drawing) excluding the thick layers (the 0'th layer 1_0 and the k'th layer 1_k) at both sides.

Upon light being cast into the dielectric layered film 1 having such a configuration, reflectance (or transmittance) has certain dependency as to a wavelength λ due to interference at the dielectric layered film 1. Greater the reflectance difference δn of light is, stronger advantage thereof becomes.

Particularly, in the event that this dielectric layered film 1 has a periodic configuration or a certain condition (e.g., the condition d through λ/4n of the thickness d of each layer), upon incident light L1 such as white light or the like being cast in, only the reflectance of the light of a certain wavelength area (certain wavelength region light) is effectively raised to cause most components to change to reflected light components L2, i.e., transmittance is reduced, and also, the reflectance of light of wavelength regions other than that is reduced, thereby causing most components to change to transmitted light components L3, i.e., transmittance can be increased.

Here, the wavelength λ is the center wavelength of a certain wavelength area, and n is the refractive index of layer thereof. With the present embodiment, a spectral filter 10 is realized by utilizing the wavelength dependence of reflectance (or transmittance) due to this dielectric layered film 1.

FIG. 7B illustrates a case wherein the infrared light IR and the visible light VL are subjected to dispersion of light. The dielectric layered film 1 is formed so as to have high reflectance as to the infrared light IR of the wavelength λ of an infrared region which is longer wavelength side than the visible light VL (principally, longer wavelength side than 780 nm), whereby the infrared light IR can be cut.

Note that the member (layered member) of the respective dielectric layers 1_j makes up the dielectric layered film 1 using multiple layers, and accordingly, the number of types of the member is at least two types, and in the event of more than two layers, any of the respective dielectric layers 1_j may be made up of a different layer material, or two types (or greater than this) may be layered alternately, or in an arbitrary sequence. Also, while the dielectric layered film 1 is made up of basic first and second layer materials, a part thereof is may be substituted with a third (or greater than this) layer material. Specific description will be made below.

<<Design Method of Dielectric Layered Film; Example of Infrared Light Cut>>

<Design Method of Thickness dj>

Figure 9:
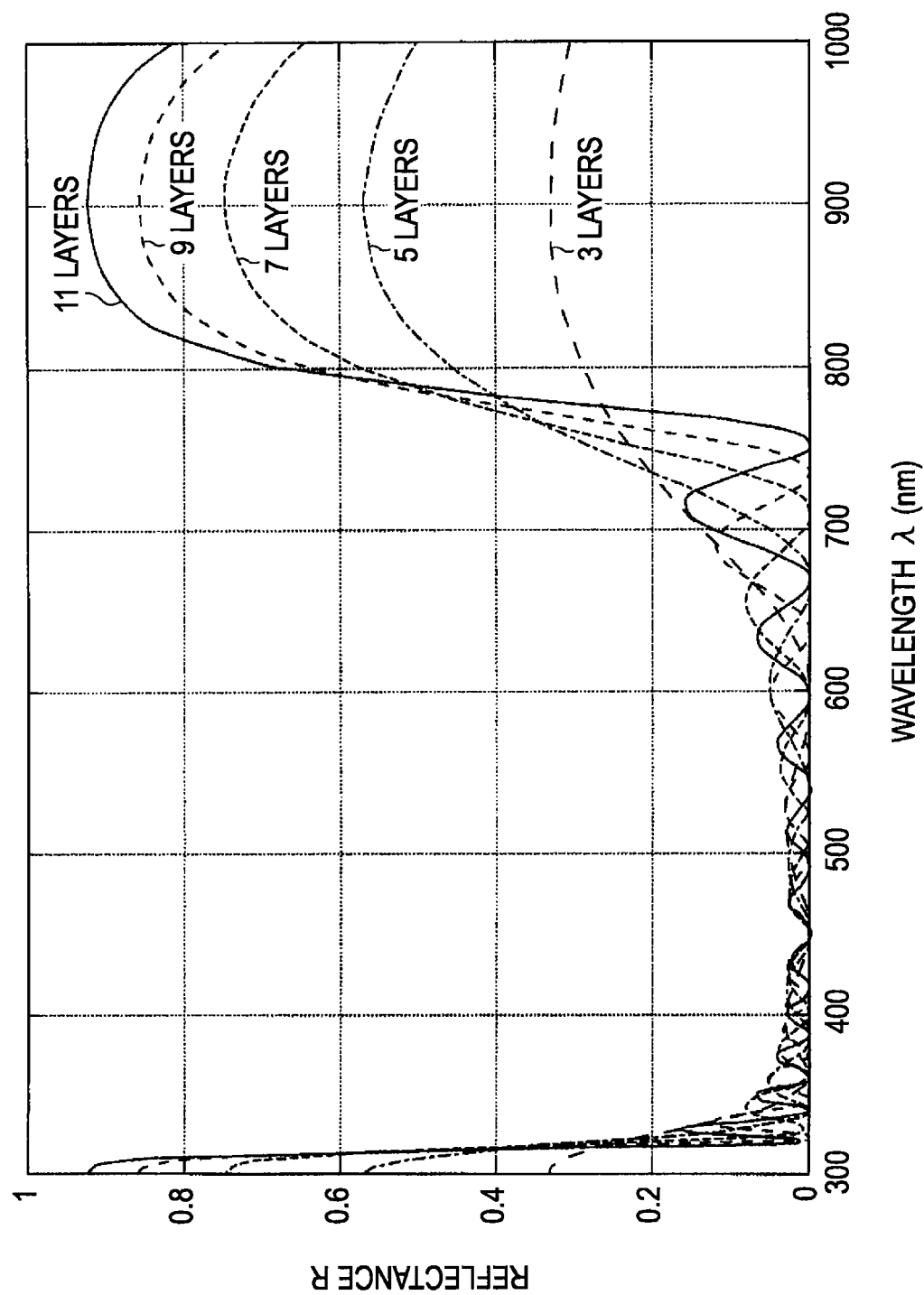
FIG. 9 is a reflectance spectrum diagram describing the basic concept of a method for designing a layered film.
Figure 10:
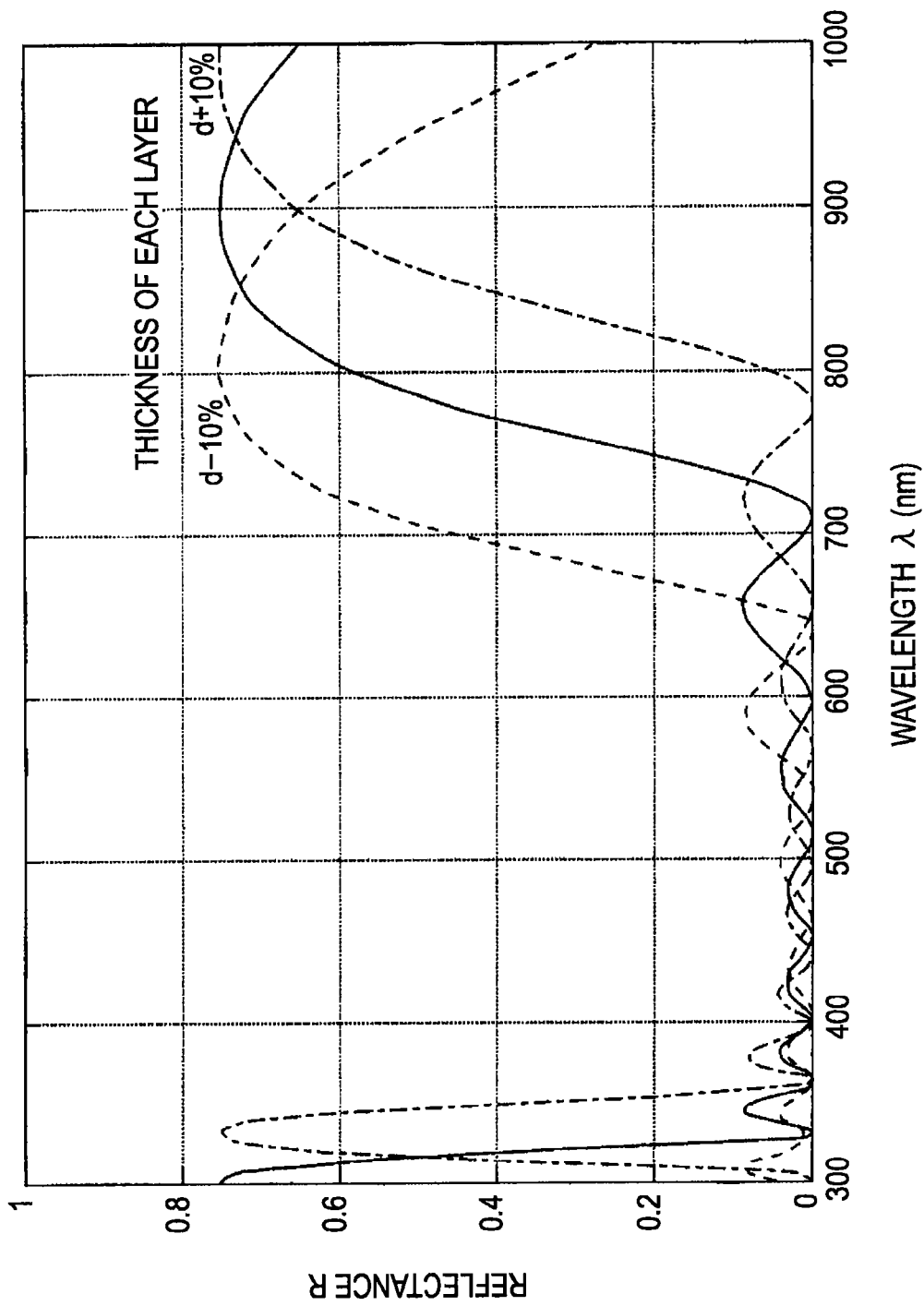
FIG. 10 is a reflectance spectrum diagram describing the basic concept of a method for designing a layered film.
Figure 11A:
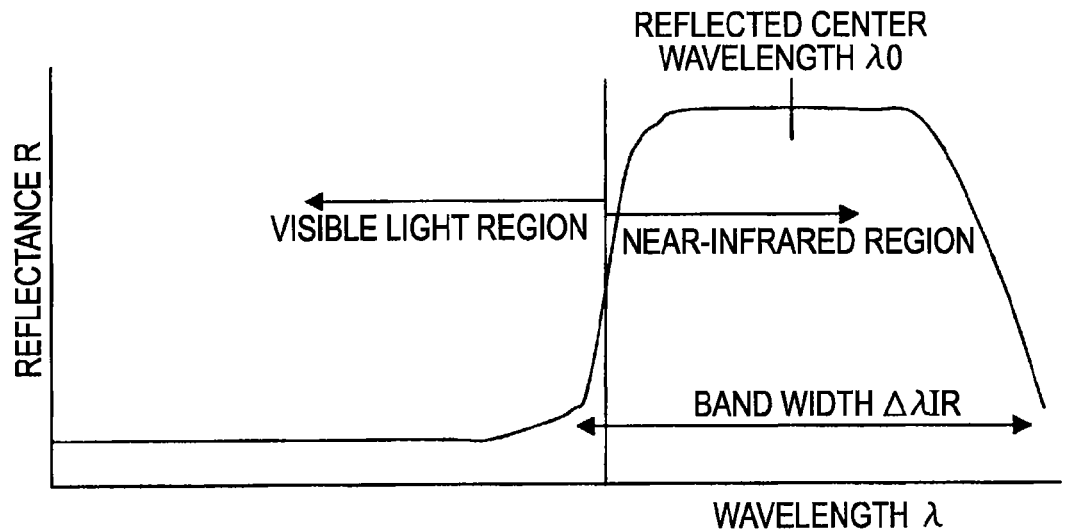
FIGS. 11A and 11B are diagrams describing the conditions of a reflected center wavelength λ (diagram illustrating the concept of reflectance spectrums)
Figure 11B:
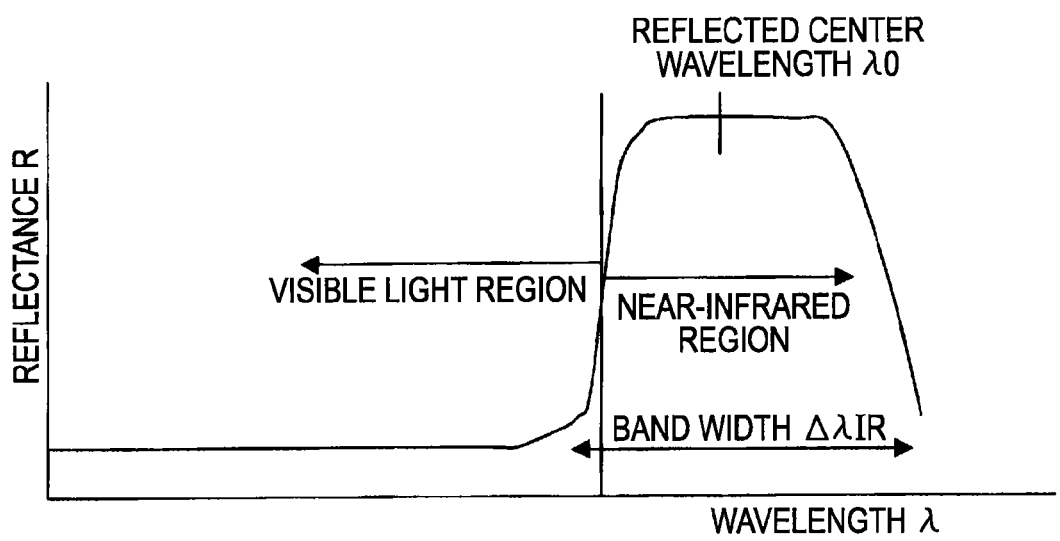

FIGS. 8 through 10 are diagrams for describing the basic concept of a method for designing the dielectric layered film 1. Now, description will be made regarding a design example such that while the dielectric layered film 1 is made up of basic first and second layer materials, the infrared light IR is selectively reflected.

A configuration diagram thereof is illustrated in FIG. 8, and the dielectric layered film 1 employed for the present embodiment is configured so as to be sandwiched with the thick silicon oxide SiO2 (hereinafter, referred to as SiO2) of both sides (hereinafter, light incident side is referred to as the 0'th layer, and the opposite side is referred to as the k'th layer), and layered with multiple dielectric layers 1_j made up of the first and second layered members. With the example illustrated, let us say that as for the first and second layered members making up the dielectric layers 1_j, a common material is employed for any of both, two types of materials are employed such that silicon nitride Si3N4 (hereinafter, referred to as SiN) is the first layered member, and silicon oxide SiO2 is the second layered member, and these are layered alternately. Also, with the configuration of the dielectric layered film 1, a case wherein above and below thereof have a sufficient thick silicon oxide SiO2 layer (d0=dk=∞) is assumed.

With such a dielectric layered film 1, reflectance can be effectively increased by satisfying the following Expression (1).

[Expression 1]

$$dj = \lambda 0/4nj \quad (1)$$

Here, dj (hereafter, j represents layer number) is the thickness of the respective dielectric layers 1_j making up the dielectric layered film 1, nj is the refractive index of the respective dielectric layers 1_j, and λ0 is the center wavelength of a reflected wavelength region (hereinafter, referred to as reflected center wavelength).

With regard to how to count the number of layers of the respective dielectric layers 1_j making up the dielectric layered film 1, the thick silicon oxide of both sides thereof is not counted as the number of layers, e.g., counting is performed in sequence from the first layer toward the k'th layer side, such as three layers for SiN layer/SiO2 layer/SiN layer, and five layers for SiN layer/SiO2 layer/SiN layer/SiO2 layer/SiN layer. FIGS. 5A and 5B illustrate a seven-layer configuration.

Also, let us say that the reflected center wavelength λ0 of the infrared light IR serving as a reflected wavelength region is 900 nm, the refractive index nα of silicon nitride SiN making up the odd layers is 2.03, the refractive index nβ of silicon oxide SiO2 making up the 0'th, even, and k'th layers is 1.46, and the refractive index difference δn is 0.57.

Also, in accordance with the above Expression (1), let us say that the thickness dα (=d1, d3, and so on; j=odd number) of silicon nitride SiN layer is 111 nm, and the thickness dβ (=d2, d4, and so on; j=even number) of silicon oxide SiO2 layer is 154 nm.

FIG. 9 illustrates the result of a reflectance R obtained by changing the number of layers, and computing with the effective Fresnel-coefficient method (reflectance spectrum diagram) regarding the configuration in FIG. 8 employing a common material, and thus, the number-of-layers dependent properties of reflectance spectrums can be understood.

As a result of FIG. 9, it can be understood that as the number of layers increases, the reflectance R increases centered on the reflected center wavelength λ0=900 nm of the infrared light IR. Further, it can be understood that a wavelength of 900 nm is thus selected as the reflected center wavelength λ0, thereby almost dividing into the infrared light IR and the visible light VL. Here, it can be understood that employing five layers or more causes the reflectance R to be 0.5 or more, and particularly, employing seven layers or more causes the reflectance R to exceed 0.7, which is preferable.

FIG. 10 is a reflectance spectrum diagram describing the fluctuation dependency (relation as to irregularities) of the thickness of the dielectric layers 1_j. Here, the case of seven layers is taken as an example, which illustrates the result (reflectance spectrum diagram) calculated by changing the thickness dj of each dielectric layer 1_j by ±10%.

Conditional expression (1) is an ideal calculated value using the Fresnel-coefficient method, but actually, the conditions of Expression (1) are loose and broad. For example, even if the error of the thickness dj is ±10%, it can be understood from the calculation using the Fresnel-coefficient method that reflectance can be effectively increased.

For example, as illustrated in FIG. 9, even if there is a difference of irregularities in the thickness dj, it can be understood that the reflectance R can be increased effectively. For example, it can be understood that the sufficient reflectance R can be obtained, such as 0.5 or more at the reflected center wavelength λ0=900 nm of the infrared light IR, and also even with the entire infrared light IR (principally, longer wavelength side than 780 nm), it can be understood that reflection is strong. Accordingly, in actuality, even in light of irregularities, a sufficient advantage for increasing the reflectance effectively can be obtained as long as the thickness dj of the dielectric layers 1_j is in a range of the following Expression (2).

[Expression 2]

$$0.9 \times \lambda 0/4n \leq dj \leq 1.1 \times \lambda 0/4n \quad (2)$$

<Design Method of Reflected Center Wavelength λ0>

FIGS. 11A through 13 are diagrams describing the conditions of the reflected center wavelength λ0. The numerical conditions of the thickness dj depend on the bandwidth δλIR of the infrared reflected region of a spectrum. Such as the concept of reflection spectrums being illustrated in FIG. 11A, in the event that the bandwidth δλIR of an infrared reflected region is wide, unless the center wavelength ko is brought to the long wavelength side, reflection at the visible light VL becomes marked. Such as the concept of reflection spectrums being illustrated in FIG. 11B, inversely, in the event that the bandwidth δλIR of an infrared reflected region is narrow, unless the center wavelength λ0 is brought to the short wavelength side, reflection at an infrared region close to the visible light VL will not occur. The wavelength separation performance between the visible light VL and the infrared light IR is excellent.

Figure 1A:
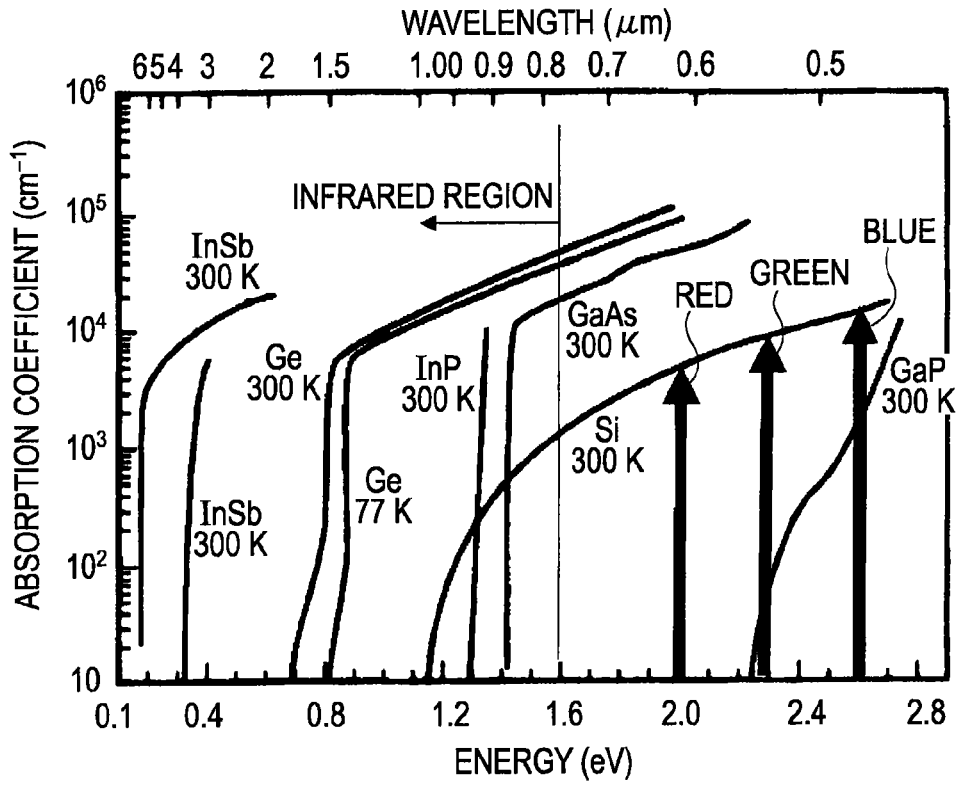
FIG. 1 is a diagram describing the arrangements of the sensors described in U.S. Pat. No. 5,965,875 and Japanese Unexamined Patent Application Publication No. 2004-103964.
Figure 1B:
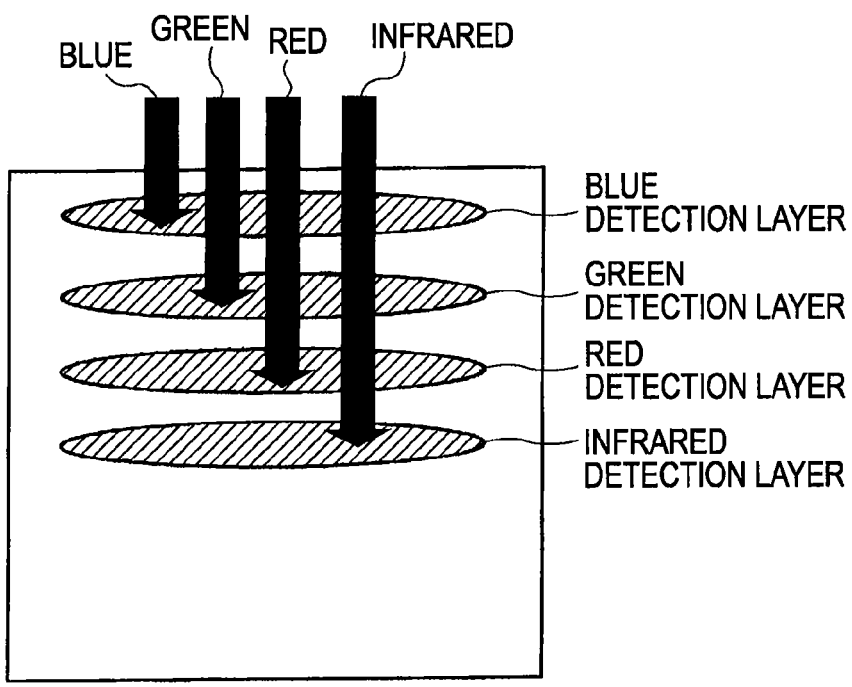

Incidentally, according to the graph of the absorption spectrum of silicon Si illustrated in FIG. 1, of an infrared region, it can be understood that if the infrared light IR in a range of 0.78 μm≦λ≦0.95 μm can be reflected, this is enough for an infrared cut advantage. This is because little light on the longer wavelength side from wavelength of 0.95 μm is absorbed within the silicon Si, and subjected to photoelectric conversion. Accordingly, the reflected center wavelength λ0 should be selected so as reflect the infrared light IR having a wave length region of a range of 0.78 μm≦λ≦0.95 μm.

Also, it can be conceived that even with the visible light VL, of a red (R) region, the light in a range of 640 through 780 nm is low in visibility, and accordingly, even if the light is reflected or not reflected, the light has particularly no influence on the performance of an image capturing device. Accordingly, even if reflection occurs at a wavelength region of 640 through 780 nm, there is no inconvenience.

Further, when the refractive index difference δn of the dielectric layered film 1 is great, the bandwidth δλIR of an infrared reflected region becomes wide, and inversely, when the refractive index difference δn is small, the bandwidth δλIR of an infrared reflected region becomes narrow. Accordingly, the bandwidth δλIR of an infrared reflected region becomes narrow in the event of a SiN/SiO2 multi-layered film, and becomes wide in the event of a Si/SiO2 multi-layered film.

Figure 12:
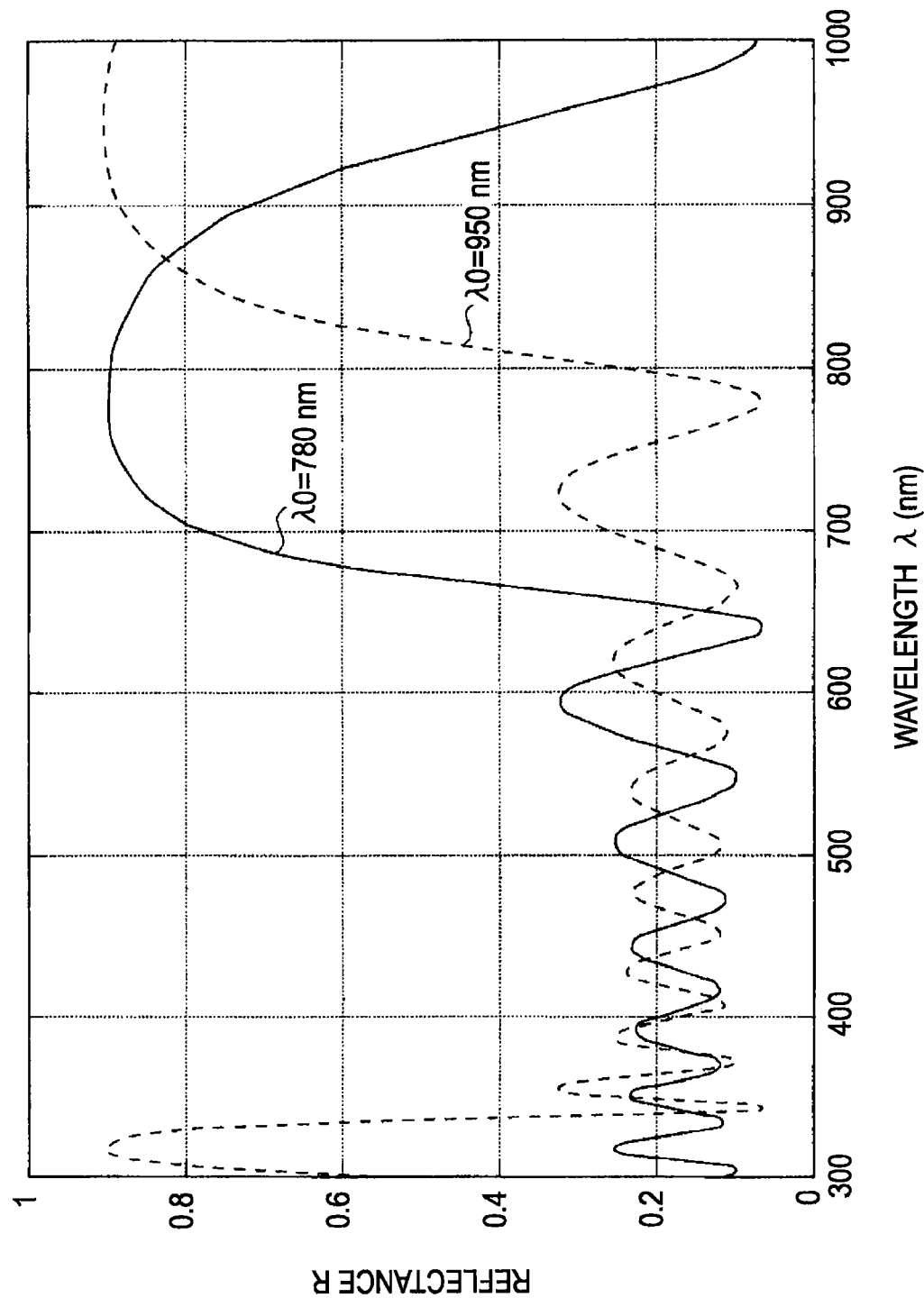
FIG. 12 is a reflectance spectrum diagram describing the conditions of the reflected center wavelength λ.

Accordingly, in the event of a SiN/SiO2 multi-layered film (refractive index difference δn=0.57), it can be understood that the above conditions are satisfied as long as a range of 780 nm≦λ0≦950 nm based on calculation between 780 nm illustrated in the reflection spectrum diagram in FIG. 12 and the reflected center wavelength λ0 of 950 nm. Incidentally, FIG. 12 is a layered configuration such as later-described FIG. 17, which is the results calculated by changing only the film thickness dj of the dielectric layers 1_j so as to satisfy λ0=780 nm and λ0=950 nm.

Figure 13:
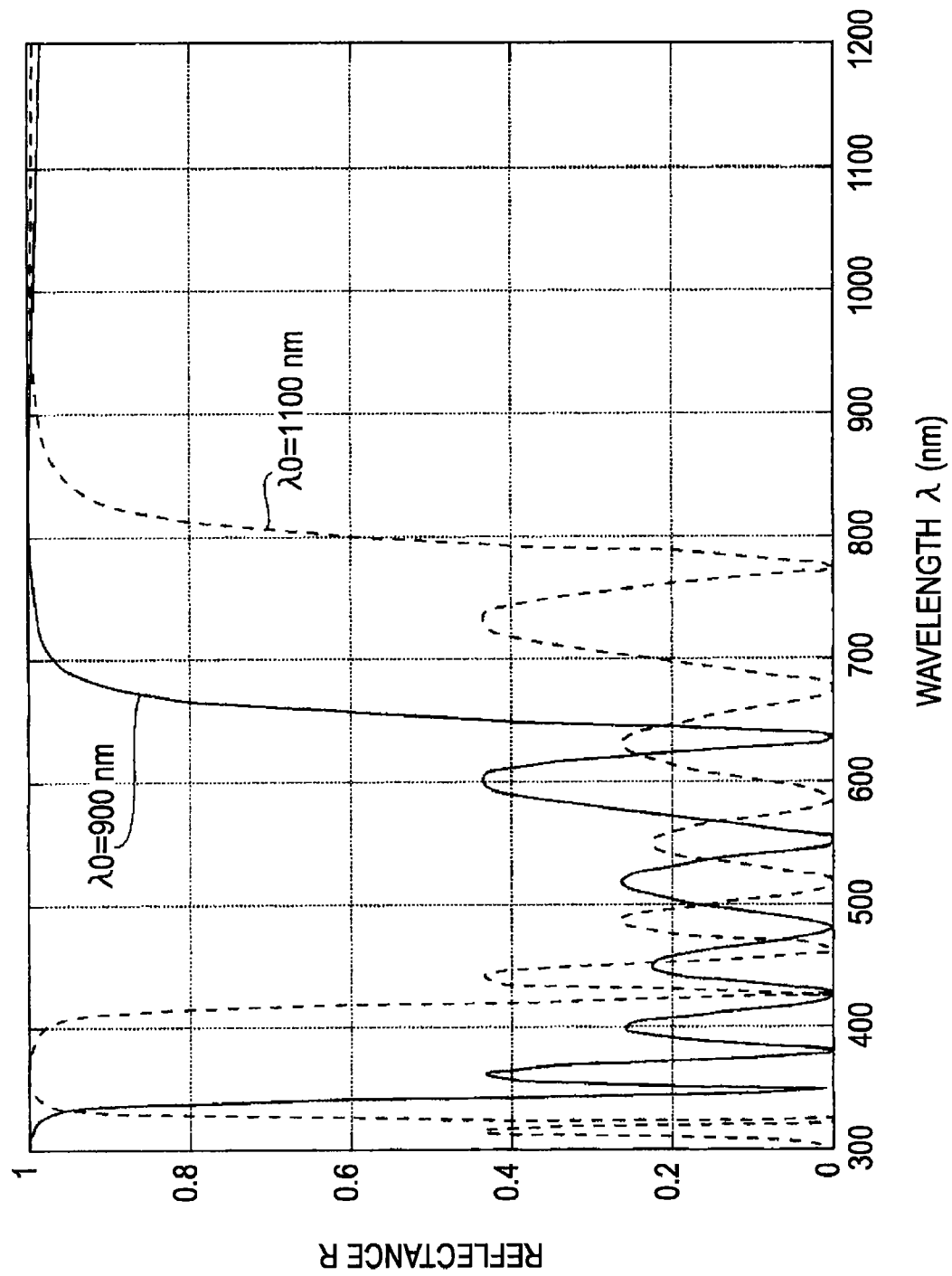
FIG. 13 is a reflectance spectrum diagram describing the conditions of the reflected center wavelength λ.

Similarly, in the event of a Si/SiO2 multi-layered film (refractive index difference δn=2.64), the above conditions are almost satisfied as a range of long as 900 nm≦λ0≦1100 nm, such as illustrated in the reflection spectrum diagram in FIG. 13.

As described above, with a combination of silicon nitride SiN or silicon Si and silicon oxide SiO2, the reflected center wavelength λ0 should satisfy the following Expression (3-1). Preferably, it is desirable for the reflected center wavelength λ0 to satisfy the following Expression (3-2). These mean that it is ideal to set the reflected center wavelength λ0 to near 900 nm.

[Expression 3]
$$\left.\begin{array}{ll} 780\ nm \leq \lambda 0 \leq 1100\ nm & (3-1) \\ 850\ nm \leq \lambda 0 \leq 1000\ nm & (3-2) \end{array}\right\} \quad (3)$$

It is needless to say that the materials described above are only one example, and the advantage as described above is not always restricted to a combination of silicon oxide SiO2 and silicon nitride SiN layer. It is estimated by calculation that the same advantage can be obtained by selecting a material of which refractive index difference is 0.3 or more, further preferably, 0.5 or more.

For example, a SiN film may have somewhat irregularities in constitution thereof according to manufacturing conditions. Also, as for the dielectric layers 1_j making up the dielectric layered film 1, in addition to silicon oxide SiO2 and silicon nitride SiN, oxide such as alumina A1203, zirconia ZrO2 (refractive index of 2.05), titanium oxide TiO2 (refractive index of 2.3 through 2.55), magnesium oxide MgO, zinc oxide ZnO (refractive index of 2.1), and so forth, or a high polymer material such as polycarbonate PC (refractive index of 1.58), acrylic resin PMMA (refractive index of 1.49), and so forth, or a semiconductor material such as silicon carbide SiC (refractive index of 2.65), germanium Ge (refractive index of 4 through 5.5) can be employed.

The spectral filter 10 having features which are not included in the past glass filter can be configured by employing a high polymer material. That is to say, a plastic filter can be provided, which excels in light weight and durability (high temperature, high humidity, and impact).

<<Dielectric Layered Film Utilizing Demultiplexing Image Sensor>>

FIGS. 14 through 18 are diagrams describing one embodiment of a spectral image sensor 11 appropriate for application to the solid state image capturing device 314 utilizing the dielectric layered film 1. This spectral image sensor 11 is configured by using the basic design method of the spectral filter 10 utilizing the dielectric layered film 1. Now, description will be made regarding a design example of the spectral image sensor 11 so as to cut the infrared light IR and receive the visible light VL by forming the dielectric layered film 1 such as selectively reflecting the infrared light IR on a semiconductor device layer.

Note that with the basic configuration of the spectral image sensor 11, the spectral filter 10 is formed on the light receiving portion of a semiconductor device layer. This configuration alone provides the spectral image sensor 11 corresponding to single wavelength demultiplexing (i.e., for monochrome image capturing), but can become a spectral image sensor corresponding to color image capturing by providing a predetermined color (e.g., any of R, G, and B) of a color separating filter corresponding to each light receiving portion of the spectral image sensor 11.

Here, when manufacturing the dielectric layered film 1 described with FIGS. 8 through 10 on a semiconductor device layer on which a detection device such as silicon (Si) photodetector or the like is formed, having greater refractive index than that of the respective dielectric layers 1_j making up the dielectric layered film 1, the distance from the semiconductor device layer to the dielectric layered film 1, i.e., the thickness dk of silicon oxide SiO2 making up the k'th dielectric layer 1_k is important.

Figure 14:
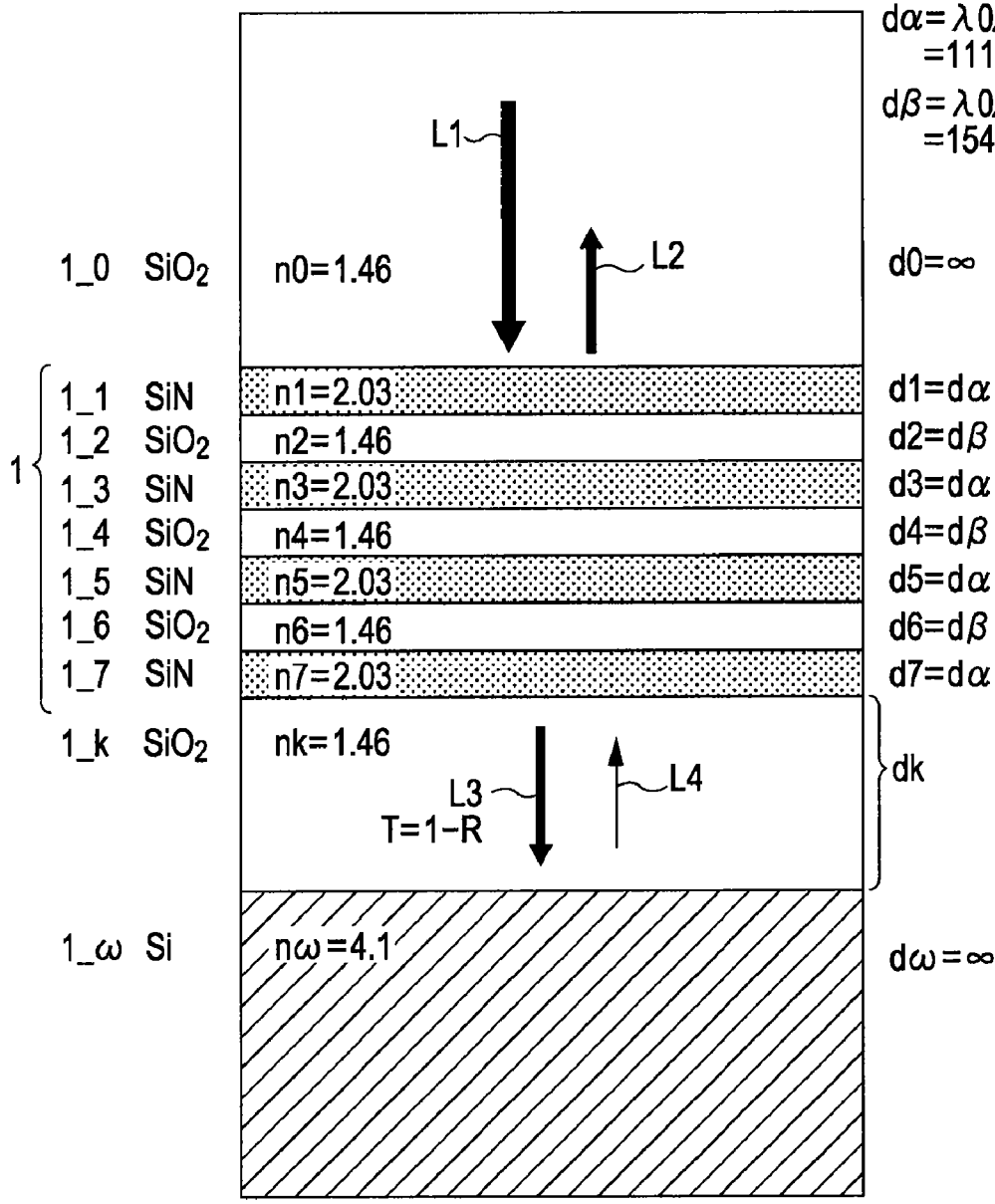
FIG. 14 is a configuration diagram describing a first embodiment of a spectral image sensor corresponding to single wavelength division utilizing a layered film.

This means, as illustrated in the configuration diagram in FIG. 14, that the spectrum of total reflected light LRtotal is changed due to cross protection as to reflected light L4 from the surface of a silicon substrate 1_ω serving as the surface of a semiconductor device layer (photodetector, etc.) made up of silicon Si (refractive index of 4.1) for example.

Figure 15:
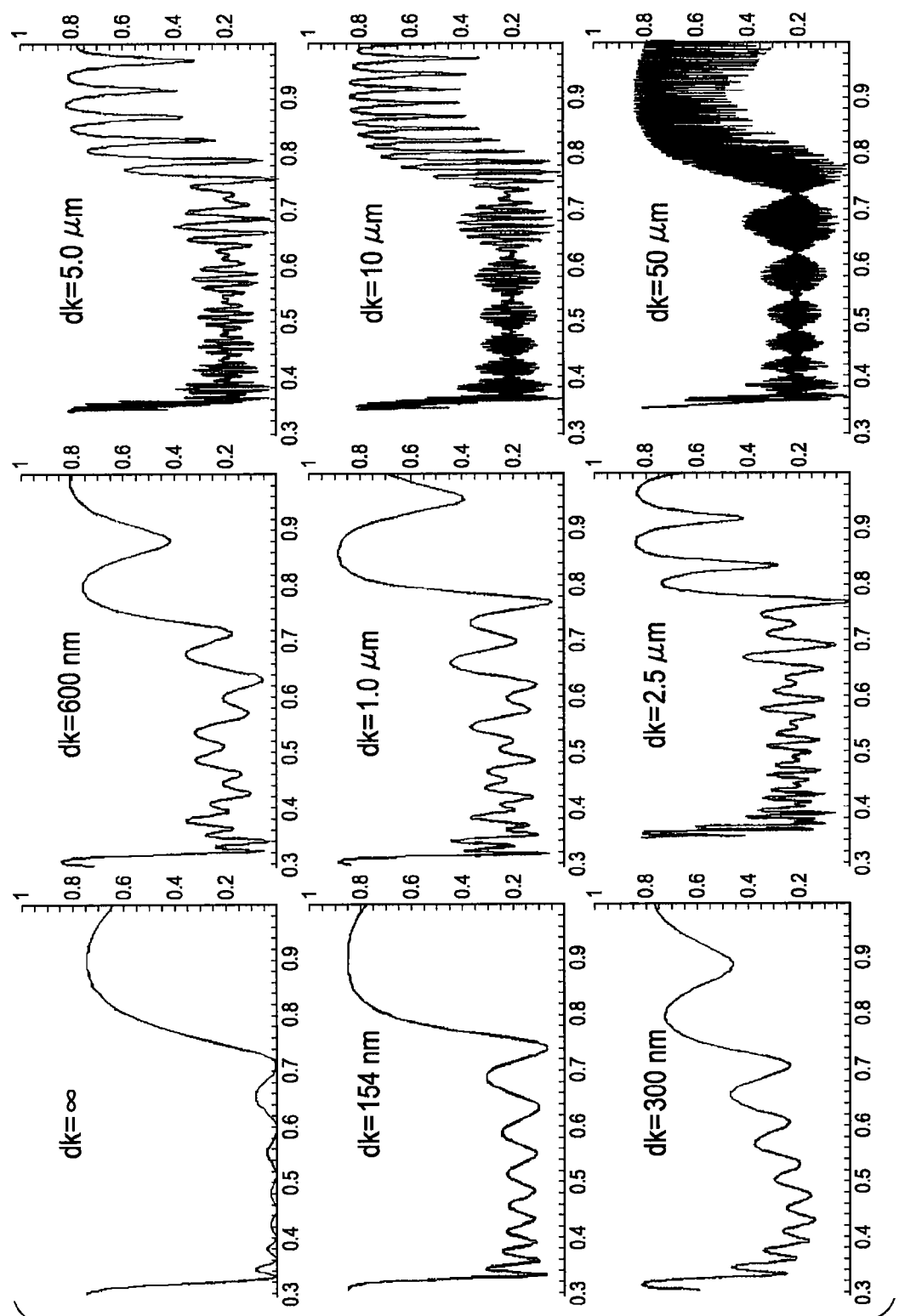
FIG. 15 is a reflectance spectrum diagram describing thickness dependency according to the first embodiment of a spectral image sensor corresponding to single wavelength division utilizing a layered film.

FIG. 15 is a reflection spectrum diagram describing the fluctuation dependency of the thickness dk of a silicon oxide SiO2 layer making up the dielectric layer 1_k of the total reflected light LRtotal. Here, the result computed by changing the thickness dk of the dielectric layer 1_k regarding the dielectric layered film 1 having a seven-layer configuration illustrated in FIG. 8. With the respective diagrams within FIG. 15, the horizontal axis is the wavelength λ (μm), and the vertical axis is the reflectance R.

As can be understood from the respective diagrams within FIG. 15, when the thickness dk is 0.154 pm, i.e., when the thickness dk is a value satisfying Conditional expression (1) as to the reflected center wavelength λ0 of the infrared light IR, it can be understood that a reflectance spectrum receives little influence, and strongly reflects the infrared light IR (wavelength λ≧780 nm). Conversely, with the spectrum of the thickness dk of 0.3 through 50 μm, it can be understood that another vibration occurs as compared with the reflectance spectrum of the thickness dk of ∞. Thus, it can be understood that there is a wavelength region where infrared reflection deteriorates in a dip shape.

However, upon the thickness dk reaching 2.5 μm or more, the half value width of an infrared dip becomes 30 nm or less, and particularly upon the thickness dk reaching 5.0 μm or more, half value width thereof becomes 20 nm or less, and accordingly, the half value width becomes narrow sufficiently as to common broad natural light, so an averaged reflectance can be obtained. Further, with regard to the spectrum of the thickness dk of 0.3 through 1.0 μm, it can be understood that the reflectance at the visible light VL is also high. With these points in mind, it can be the that the thickness dk of around 0.154 μm, i.e., the value when satisfying Conditional expression (1) is preferably the most appropriate.

Figure 16:
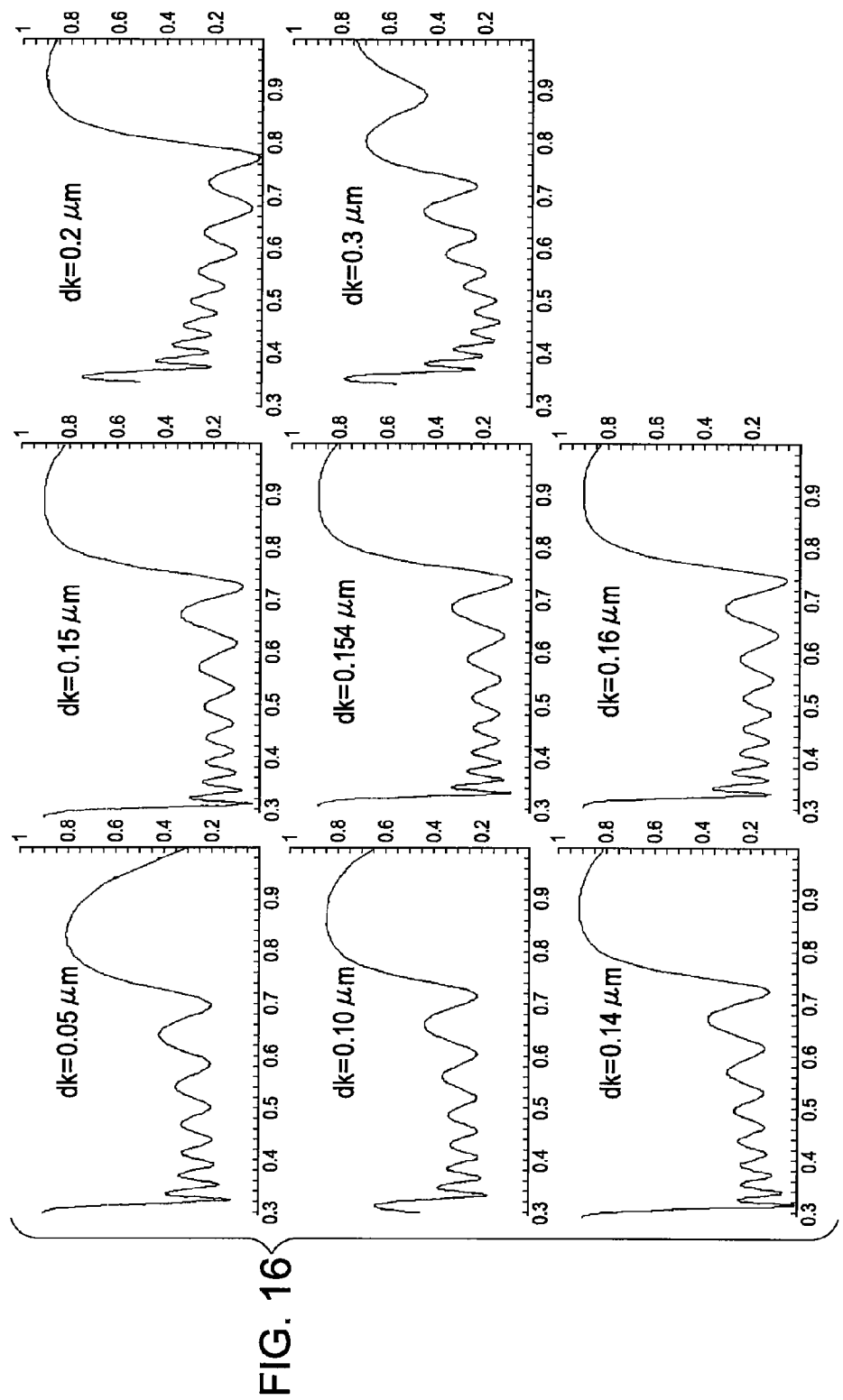
FIG. 16 is a diagram (reflectance spectrum diagram; details) describing the first embodiment of a spectral image sensor corresponding to single wavelength division utilizing a layered film.

FIG. 16 is a reflection spectrum diagram describing the fluctuation dependency of the thickness dk of a silicon oxide SiO2 layer making up the dielectric layer 1_k, and particularly, illustrates the result calculated by changing the value of the thickness dk at around 0.154 μm. With the respective diagrams within FIG. 16, the horizontal axis is the wavelength λ (μm), and the vertical axis is the reflectance R.

As can be understood from this result, it can be understood that the reflectance at the infrared light VL can be suppressed in a range of the thickness dk=0.14 through 0.16 μm centered on the thickness dk=0.154 μm satisfying Conditional expression (1).

Figure 17:
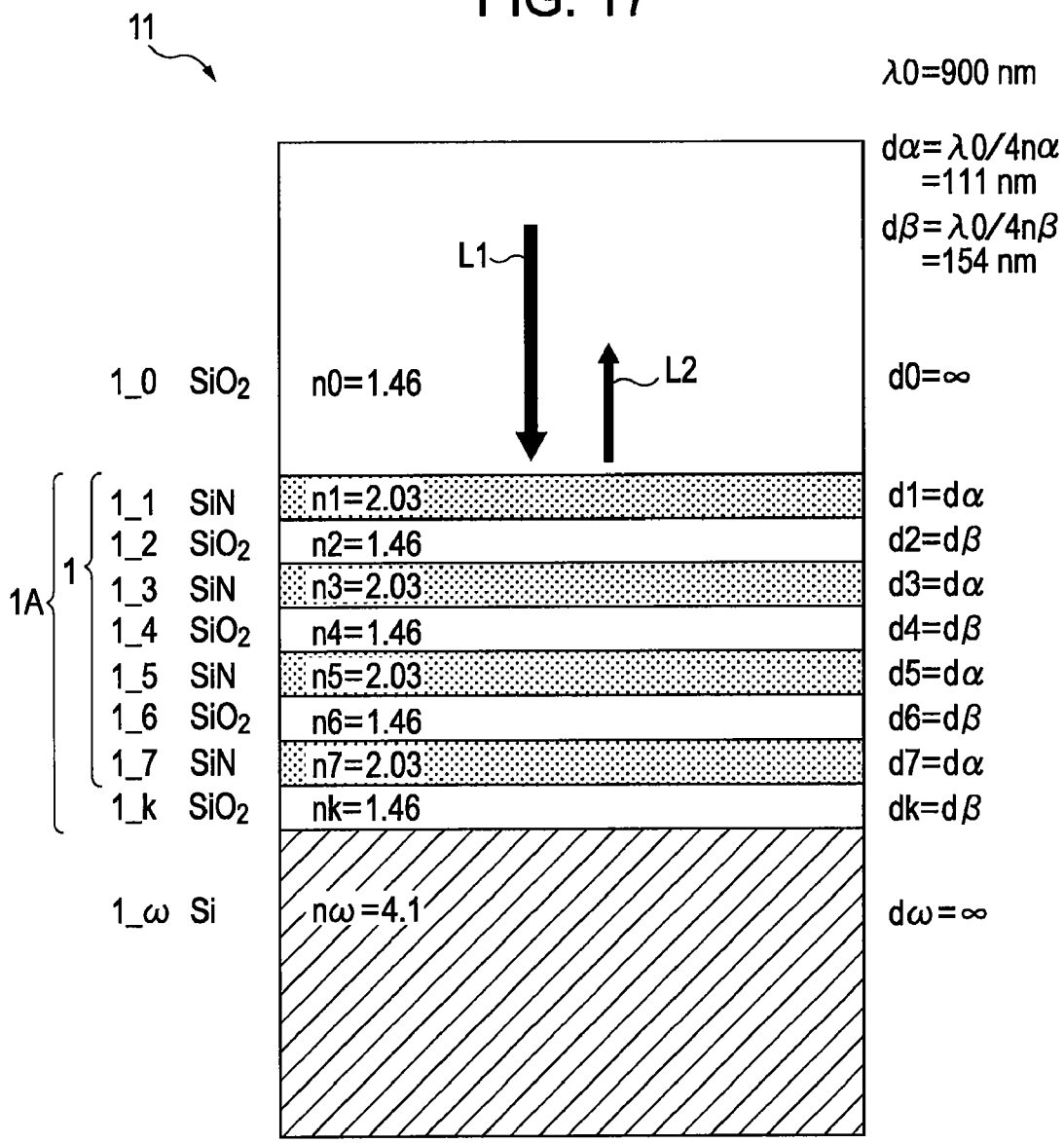
FIG. 17 is a configuration diagram describing the first embodiment of a spectral image sensor corresponding to single wavelength division utilizing a layered film.
Figure 18:
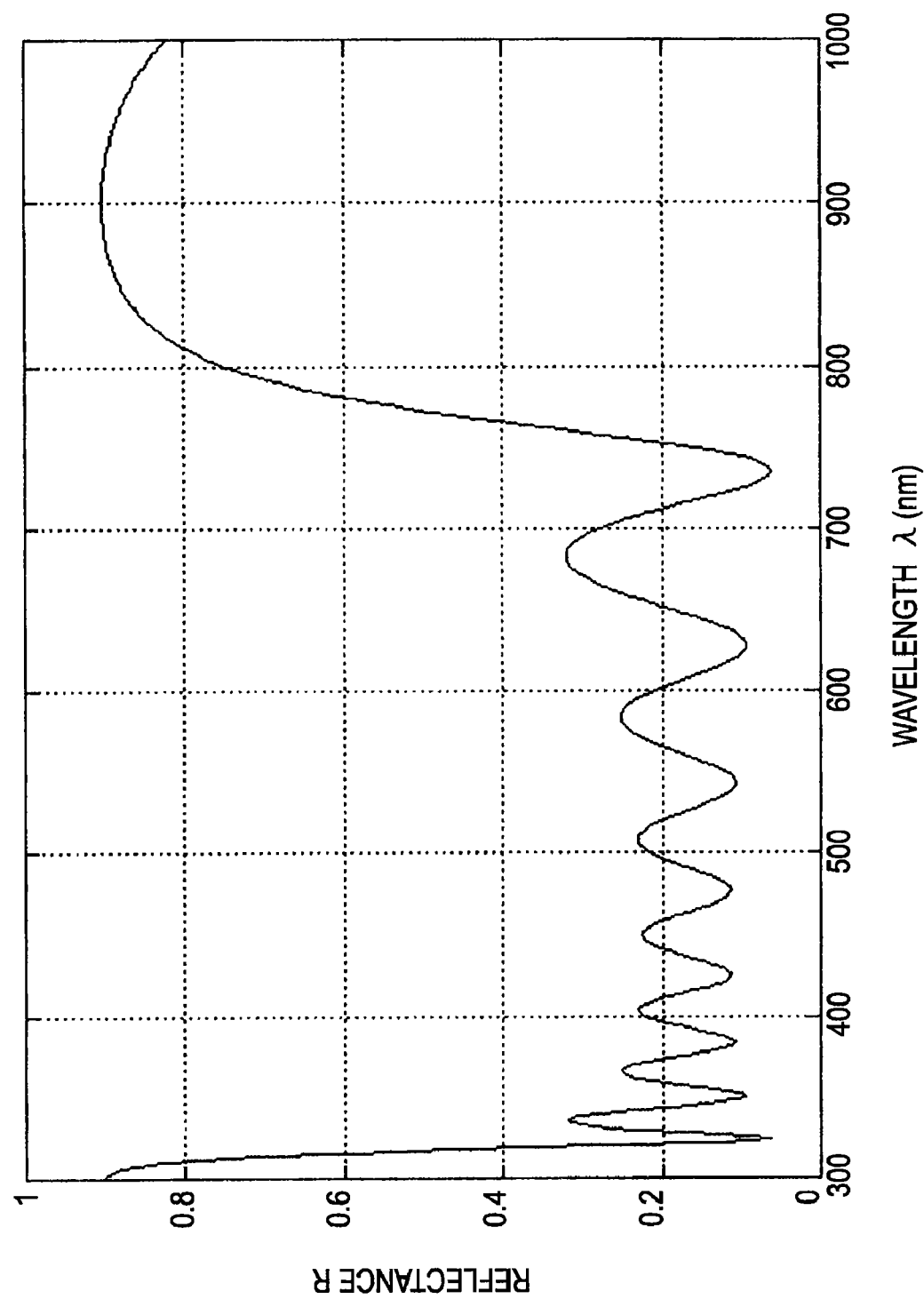
FIG. 18 is a reflectance spectrum diagram describing the first embodiment of a spectral image sensor corresponding to single wavelength division utilizing a layered film.

In the light of the above description, the most appropriate configuration of the spectral image sensor 11 is, as illustrated in the configuration diagram in FIG. 17, substantially, a spectral image sensor having a dielectric layered film 1A of an eight-layer configuration including the dielectric layer 1_k of the k'th layer, and the calculation results of reflection spectrum thereof is such as the reflection spectrum diagram illustrated in FIG. 18. In other words, the dielectric layered film 1A has a configuration wherein a layer made up of silicon oxide SiO2 serving as a second layered member is provided for the worth of four cycles on the silicon substrate 1_ω.

<Modification Utilizing a Dielectric Layered Film>

FIGS. 19 through 31 are diagrams illustrating the modifications of the spectral filter 10 and the spectral image sensor 11 utilizing a dielectric multi-layered film. The above configuration of the spectral filter 10 shows the basic configuration utilizing the dielectric layered film 1, and the other various modifications can be employed. Similarly, the above configuration of the spectral image sensor 11 shows the basic configuration wherein the spectral filter 10 utilizing the dielectric layered film 1 is formed on a light receiving portion such as a CMOS, CCD, or the like, and the other various modifications can be employed. For example, though details are omitted, with regard to the modifications of the spectral filter 10 and the spectral image sensor 11, various configurations can be employed such as proposed in Japanese Patent Application No. 2004-358139 by the present assignee.

Figure 19:
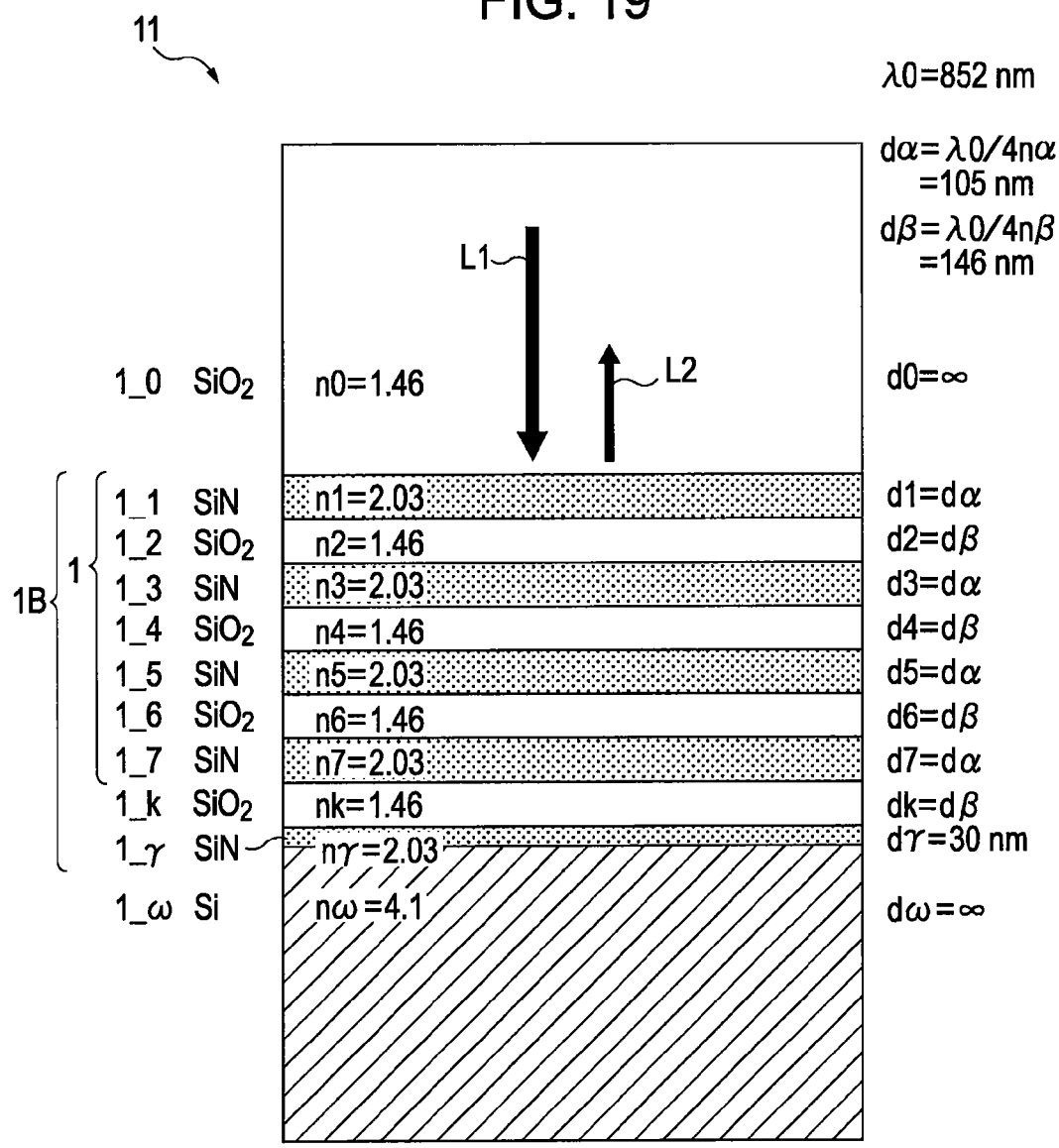
FIG. 19 is a configuration diagram describing a first modification of a spectral image sensor corresponding to single wavelength division utilizing a layered film.

For example, as with a first modification illustrated in FIG. 19, the reflection within a visible light region can be reduced by adding a third layer 1_γ (e.g., silicon nitride SiN layer) having an intermediate refractive index as to the refractive index nk of the dielectric layer 1_k of the k'th layer and the refractive index nω (=4.1) of the silicon substrate 1_ω between the dielectric layer 1_k of the k'th layer and the silicon substrate 1_ω), which is the first modification of the spectral image sensor 11.

Note that with the configuration illustrated in FIG. 19, when designing the constants of the first layer through the seventh layer of the dielectric layered film 1, in response to the above modification, the reflected center wavelength λ0 of the infrared light IR is changed to not 900 nm but 852 nm at further lower side, the thickness dα of silicon nitride SiN (=d1, d3, and so on; j=odd number) is set to 105 nm, and the thickness dα of silicon oxide SiO2 layer (=d2, d4, and so on; j=even number) is set to 146 nm.

This is because the reflectance at the visible light is reduced, and also the reflectance at the boundary of around 780 nm between the visible light and the infrared light is also reduced simultaneously by newly inserting a thin SiN layer (30 nm), so it is necessary to supplement this deterioration worth by shifting the entirety to the short wavelength side, i.e., effectively cut the infrared light around the boundary. Of course, the reflected center wavelength λ0 of the infrared light IR may be stayed at 900 nm.

Note that the third layered member added with the first modification is the same as silicon nitride SiN serving as the first layered member, but the other members may be employed as long as a member has greater refractive index than the silicon substrate 1_ω).

Figure 20:
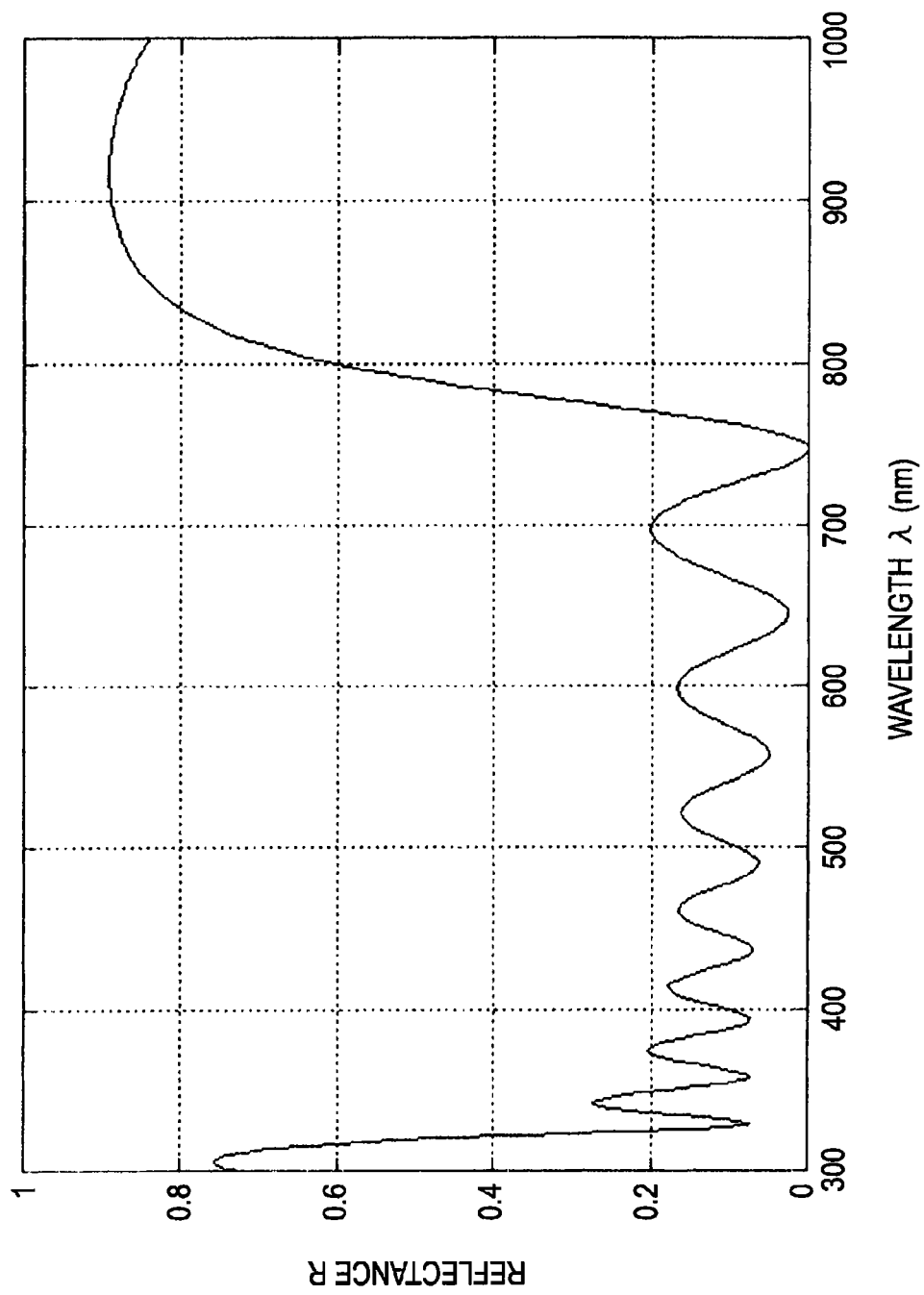
FIG. 20 is a reflectance spectrum diagram describing the first modification of a spectral image sensor corresponding to single wavelength division utilizing a layered film.

The spectral image sensor 11 having the first modification of the dielectric layered film 1 substantially includes a dielectric layered film 1B of a nine-layer configuration in total of the dielectric layered film 1 made up of seven layers, including two layers of the dielectric layer 1_k of the k'th layer (silicon oxide SiO2) and the silicon nitride SiN layer 1_γ. The calculation result of reflectance spectrums thereof is such as illustrated in FIG. 20.

Figure 21:
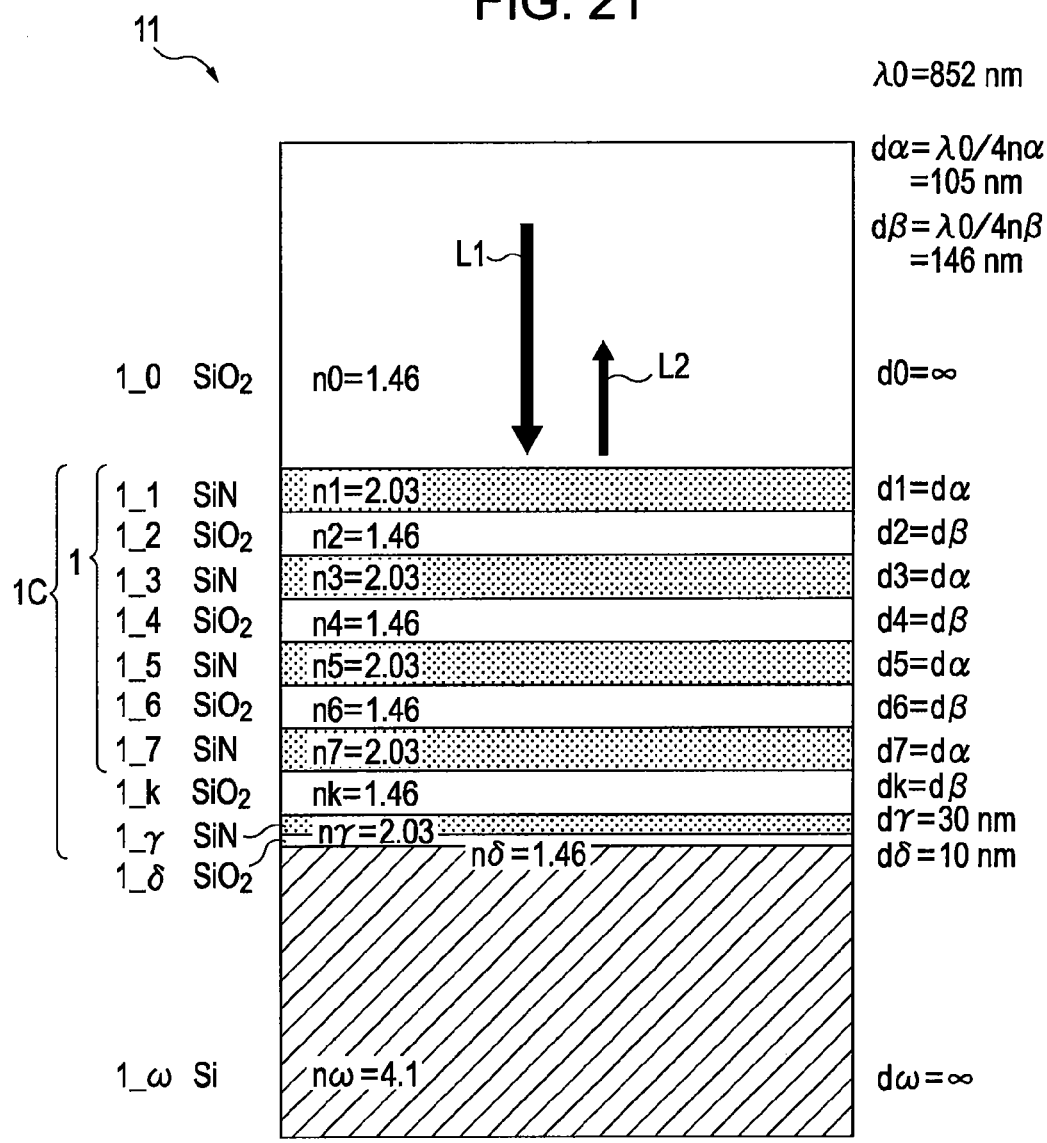
FIG. 21 is a configuration diagram describing a second modification of a spectral image sensor corresponding to single wavelength division utilizing a layered film.

Also, as a second modification illustrated in FIG. 21, a dark current can be further reduced by layering a fourth layer 1_δ (e.g., silicon oxide SiO2 layer) having smaller refractive index than the third layered member which is added in the first modification between the third layered member and the silicon substrate 1_ω, which is the second modification of the spectral image sensor 11.

Specifically, a silicon oxide SiO2 layer 1_δ serving as a fourth layer is employed between the silicon nitride SiN layer 1_γ having the thickness dγ which is the third layered member and the silicon substrate 1_ω, and thickness dδ thereof is set to 0.010 μm. The calculation result of reflectance spectrums thereof is such as illustrated in FIG. 22.

Note that the fourth layered member added with the second modification is the same as silicon oxide SiO2 serving as the second layered member, but the other members may be employed as long as a member has smaller refractive index than the third layered member (silicon nitride SiN in the present example).

The spectral image sensor 11 having the second modification of the dielectric layered film 1 substantially includes a dielectric layered film 1C of a ten-layer configuration in total of the dielectric layered film 1 made up of seven layers, including three layers of the dielectric layer 1_k of the k'th layer (silicon oxide SiO2), the silicon nitride SiN layer 1_γ, and the silicon oxide SiO2 layer 1_δ. In other words, the dielectric layered film 1C has a configuration wherein a layer made up of silicon oxide SiO2 serving as the second layered member is provided for the worth of five cycles on the silicon substrate 1_ω).

Figure 22:
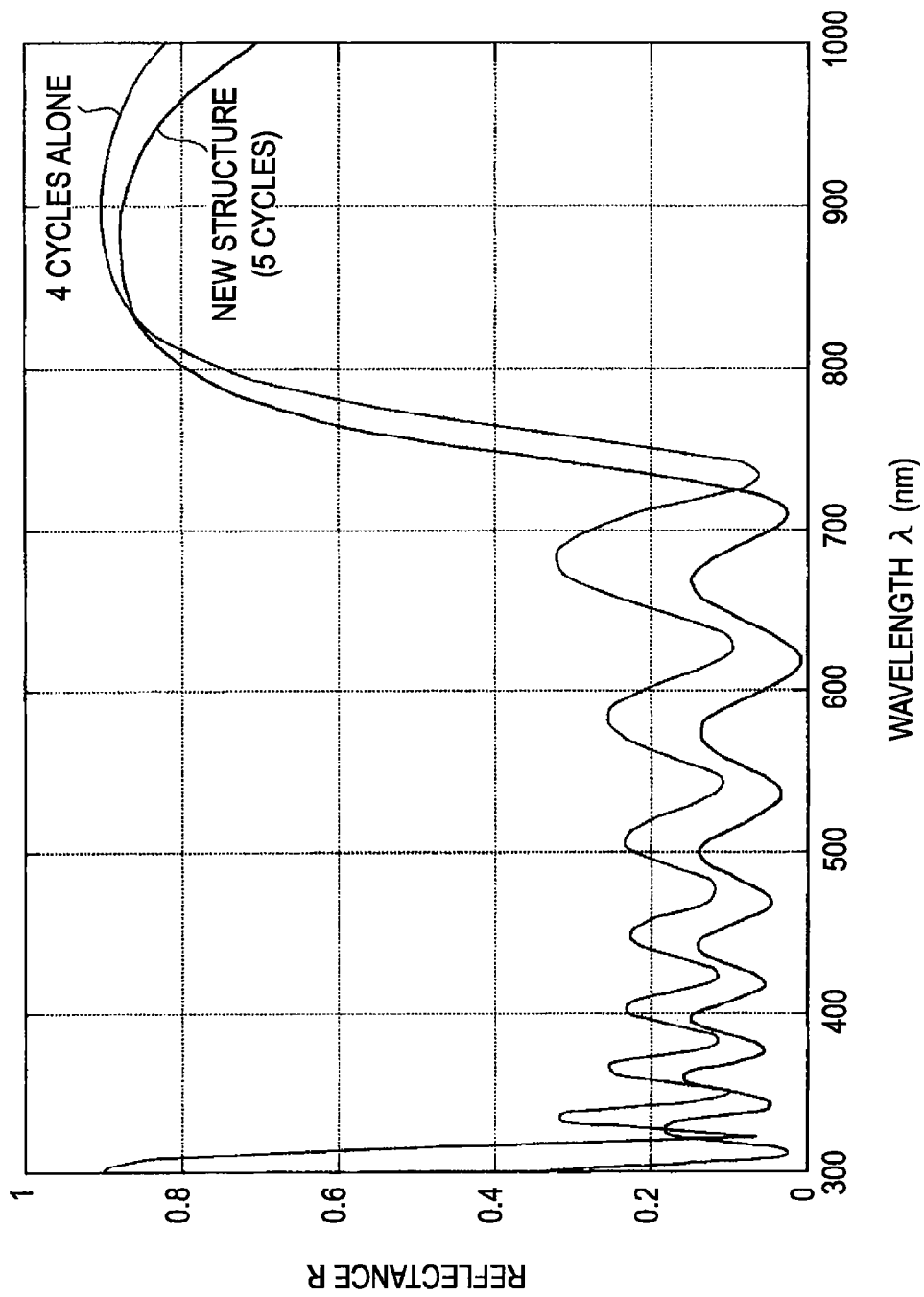
FIG. 22 is a reflectance spectrum diagram describing the second modification of a spectral image sensor corresponding to single wavelength division utilizing a layered film.

There is a difference between the first modification and the second modification regarding whether or not the silicon oxide SiO2 layer 1_δ exists, but as can be understood from FIGS. 20 and 22, either of these can sufficiently reduce the reflectance at the visible light VL. Also, an advantage wherein a dark current can be reduced can be obtained by adding the silicon oxide SiO2 layer 1_δ, such as the second modification. Note that in order not to reduce the advantage obtained by adding the silicon nitride SiN layer 1_γ by adding the silicon oxide SiO2 layer 1_δ, it is desirable to set the relation between both thicknesses to dδ<<dγ.

Thus, the reflection at the visible light VL can be suppressed by adding the thin silicon nitride SiN layer 1_γ serving as a member an intermediate refractive index nγ (=nSiN) as to the refractive index nk (=nSiO2) and the refractive index nω (=nSi) between the silicon oxide SiO2 of the k'th layer and the silicon substrate 1_ω) as an intermediate layer.

Figure 23:
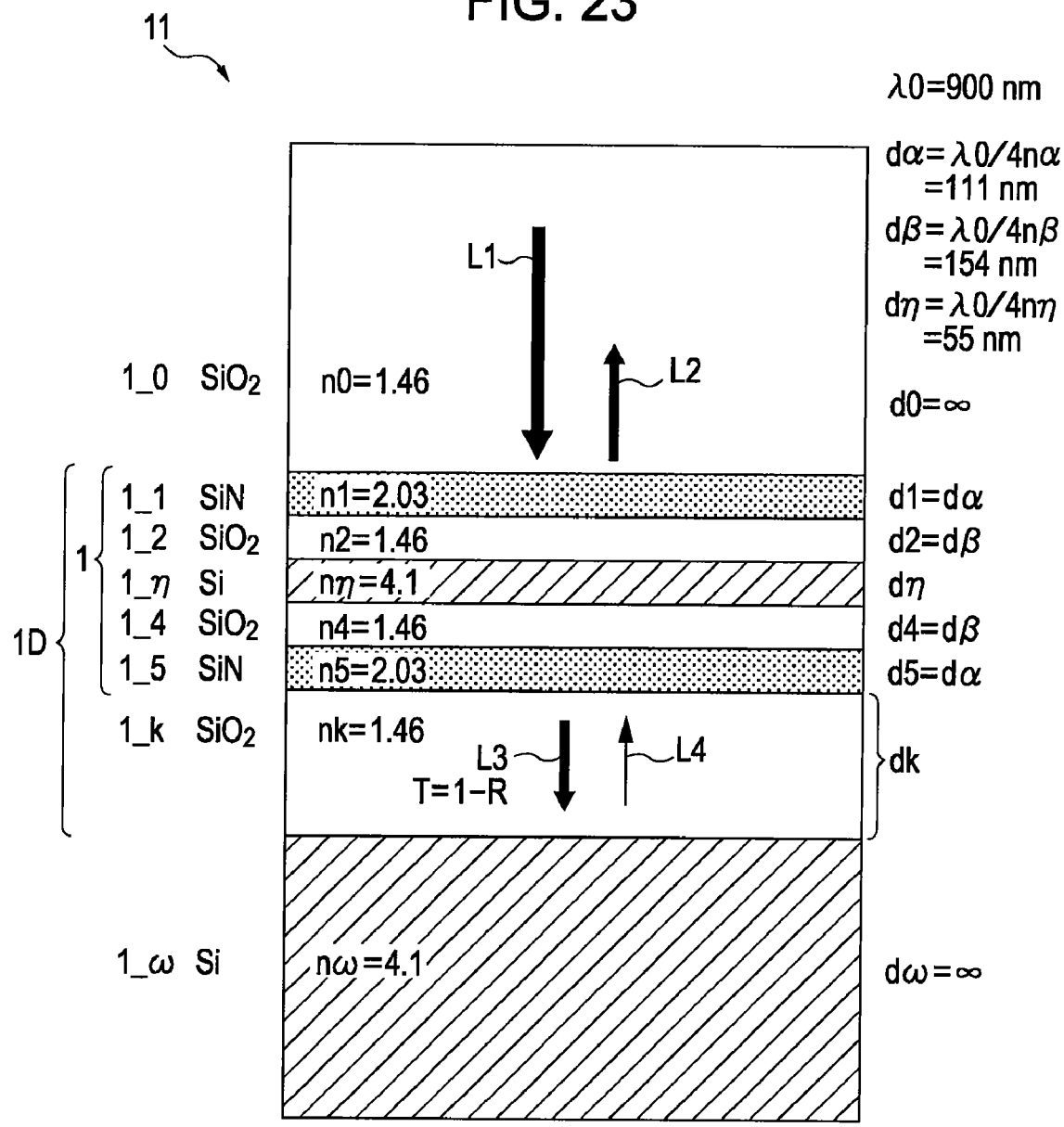
FIG. 23 is a configuration diagram describing a third modification of a spectral image sensor corresponding to single wavelength division utilizing a layered film.
Figure 24:
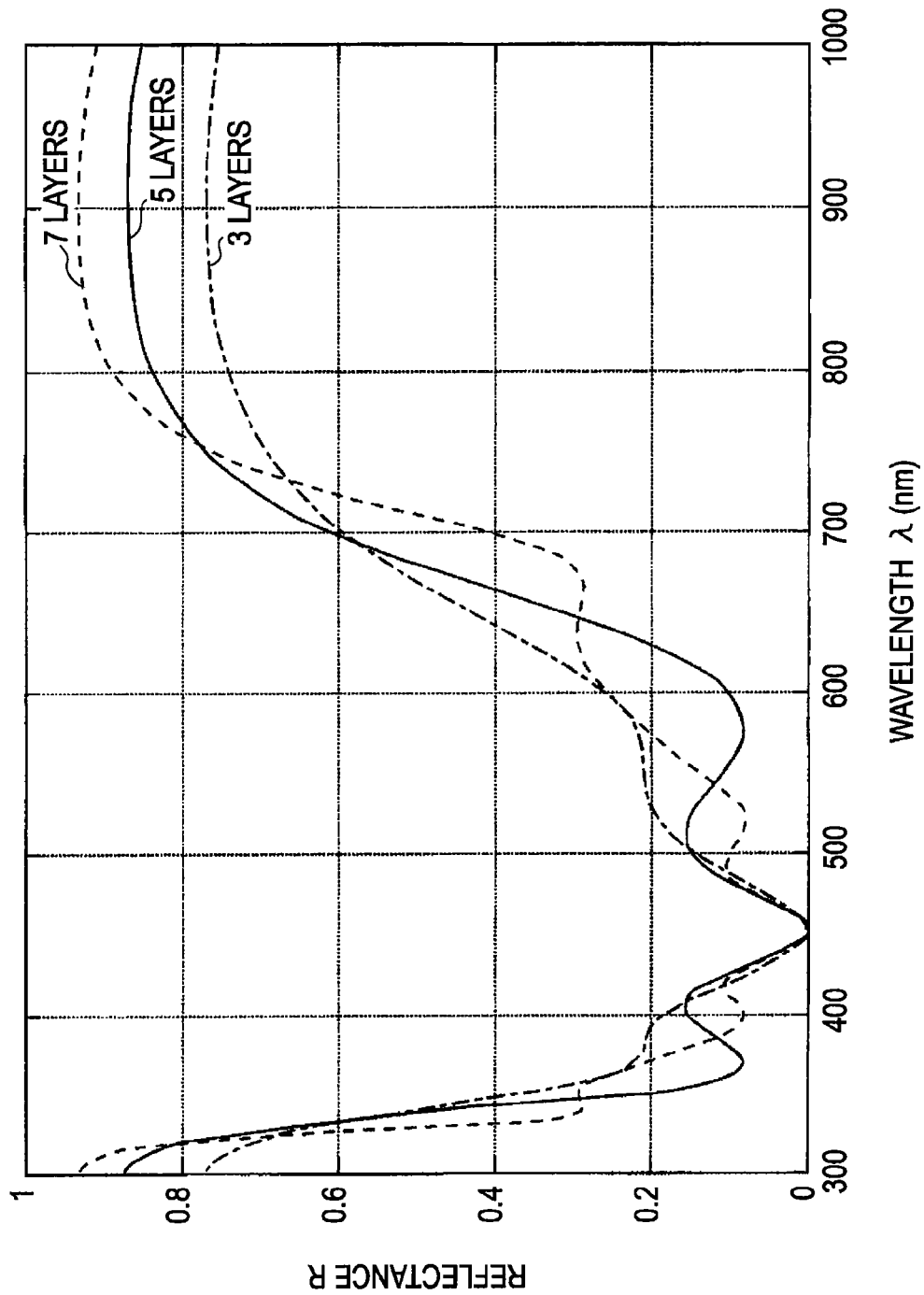
FIG. 24 is a reflectance spectrum diagram describing the third modification of a spectral image sensor corresponding to single wavelength division utilizing a layered film.

Also, the number of layers of the dielectric layers 1_j making up the dielectric layered film 1 can be reduced by adding a fifth layer 1_η (e.g., silicon Si layer having a thickness dη of 61 nm and refractive index of 4.1 which is higher than silicon nitride SiN and silicon oxide SiO2) having greater refractive index than the basic first and second layered members making up the dielectric layered film 1 to the inside of the dielectric layered film 1 of the spectral image sensor 11, such as a third modification illustrated in FIG. 23.

For example, with the example illustrated in the configuration diagram in FIG. 23, only one layer of a silicon Si layer having a refractive index of 4.1, which is higher than silicon nitride SiN and silicon oxide SiO2, and a thickness dη of 61 nm is added as the fifth layered member instead of silicon nitride SiN (instead of a dielectric layer 1_3 of the intermediate third layer).

Note that in FIG. 23, when designing the constants of the respective layers of the dielectric layered film 1, the reflected center wavelength λ0 of the infrared light IR is set to 900 nm, the thickness dα (=d1, d3, and so on; j=odd number) of a silicon nitride SiN layer is set to 111 nm, the thickness dβ (=d2, d4, and so on; j=even number) of a silicon oxide SiO2 layer is set to 154 nm, and only one layer of a silicon Si layer of a thickness dη of 55 nm is added as the fifth layered member instead of a silicon nitride SiN layer. The calculation result of reflectance spectrums thereof is such as the reflectance spectrum diagram illustrated in FIG. 24.

The fifth layered member added in the third modification is the same as the silicon substrate 1_ω) serving as a semiconductor device layer, but the other members may be employed as the fifth layered member as long as a member has greater refractive index than the dielectric layer 1_j other than the fifth layered member serving as the dielectric layered film 1.

Note that when manufacturing a dielectric layered film 1D on a semiconductor device layer (silicon substrate 1_ω), the distance from the semiconductor device layer to the dielectric layered film 1D, i.e., the thickness dk of a silicon oxide SiO2 layer serving as the dielectric layer 1_k of the k'th layer is important.

This means, as illustrated in the configuration diagram in FIG. 23, that the spectrum of total reflected light LRtotal is changed due to cross protection as to reflected light LR from the surface of the silicon substrate 1_ω) serving as the surface of a semiconductor device layer (photodetector, etc.) made up of silicon Si (refractive index of 4.1) for example.

Figure 25:
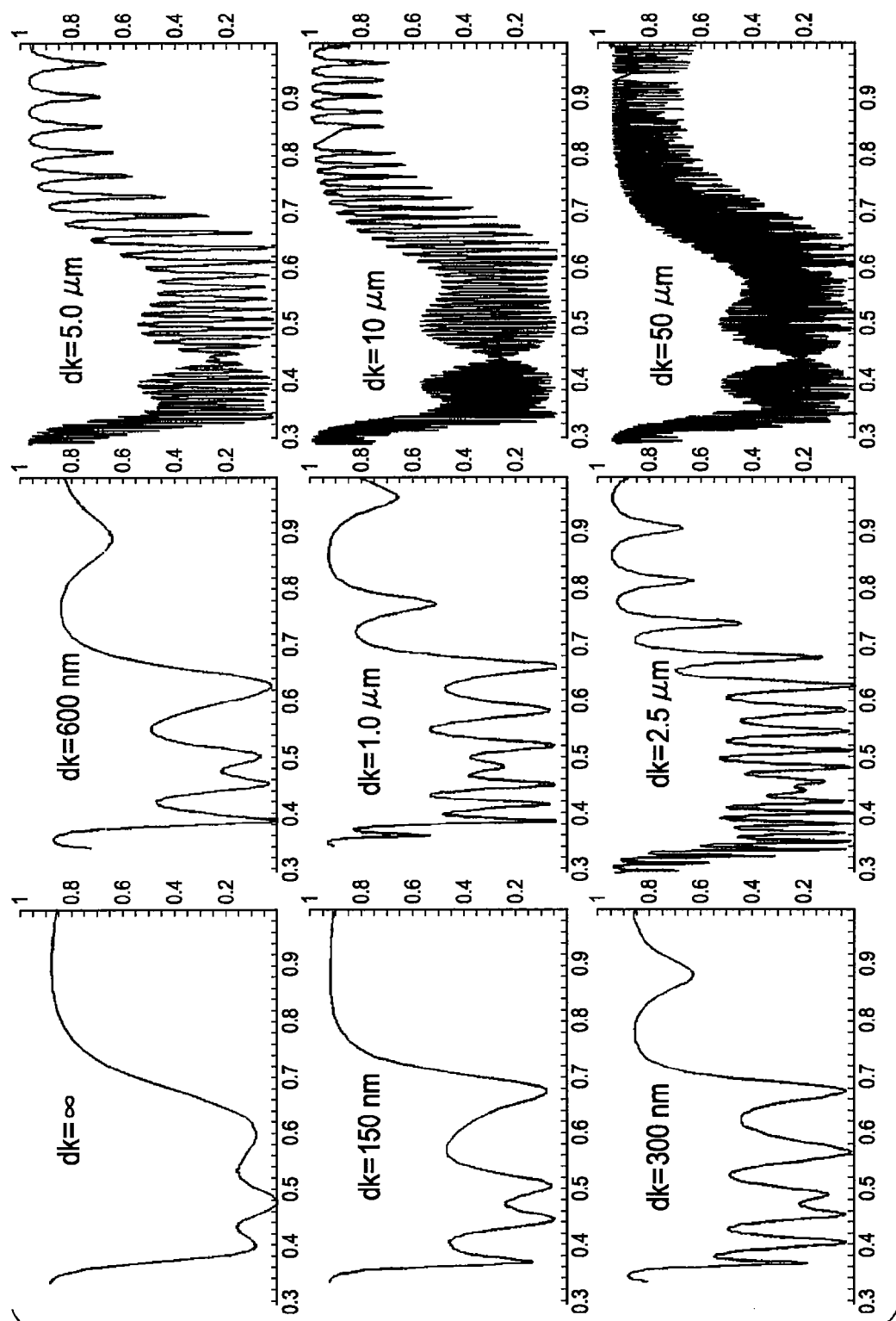
FIG. 25 is a reflectance spectrum diagram describing thickness dependency according to the third modification of a spectral image sensor corresponding to single wavelength division utilizing a layered film.

FIG. 25 is a reflectance spectrum diagram describing the fluctuation dependency of the thickness dk of the silicon oxide SiO2 layer serving as the dielectric layer 1_k of the total reflected light LRtotal regarding the dielectric layered film iD of a five-layer configuration. With the respective diagrams within FIG. 25, the horizontal axis is the wavelength λ (μm), and the vertical axis is the reflectance R.

As can be understood from the respective diagrams within FIG. 25, when the thickness dk is 0.15 μm, i.e., when the thickness dk is a value 0.154 μm satisfying Conditional expression (1) as to the reflected center wavelength λ0 of the infrared light IR, it can be understood that a reflectance spectrum receives little influence, and strongly reflects the infrared light IR (wavelength λ≧780 nm). Conversely, with the spectrum of the thickness dk of 0.3 through 50 μm, it can be understood that another vibration occurs as compared with the reflectance spectrum of the thickness dk of ∞. Thus, it can be understood that there is a wavelength region where infrared reflection deteriorates in a dip shape.

Figure 26:
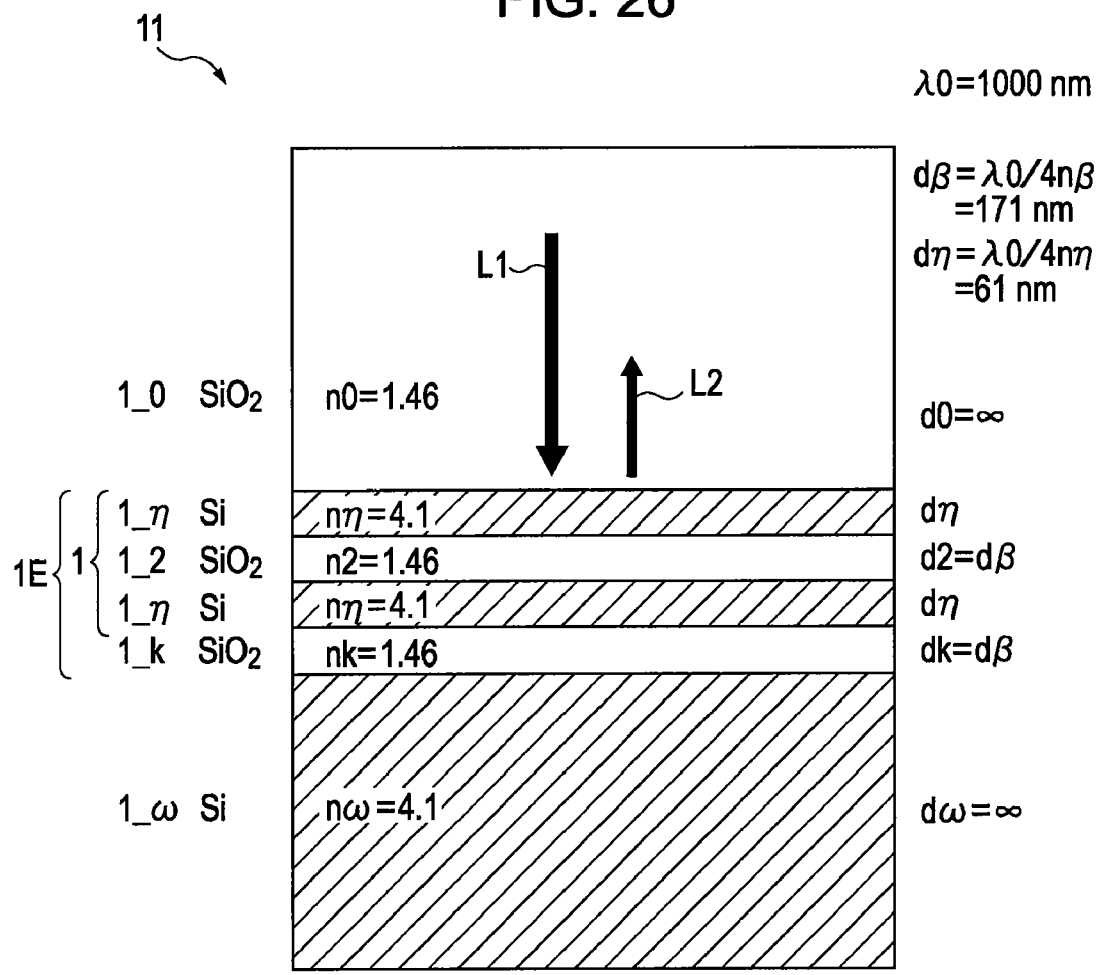
FIG. 26 is a configuration diagram describing a fourth modification (first thereof) of a spectral image sensor corresponding to single wavelength division utilizing a layered film.
Figure 28:
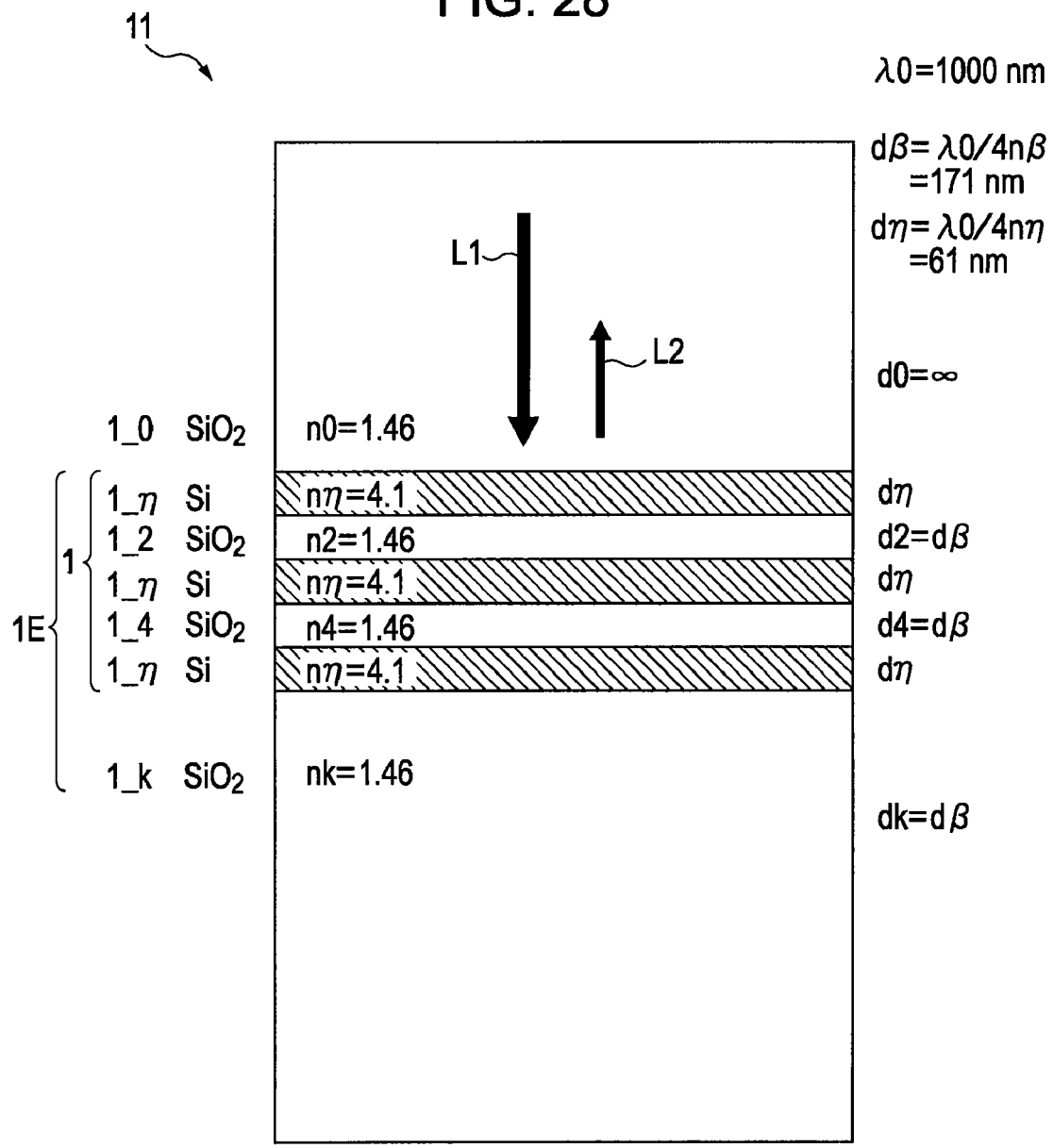
FIG. 28 is a configuration diagram describing a fourth modification (second thereof) of a spectral image sensor corresponding to single wavelength division utilizing a layered film.

Also, when reducing the number of layers in the third modification, the number of layers can be further reduced by adding multiple fifth layers 1_η (e.g., silicon Si layers having a thickness dη of 61 nm and refractive index of 4.1 which is higher than silicon nitride SiN and silicon oxide SiO2) having greater refractive index than the basic first and second layered members making up the dielectric layered film 1 to the inside of the dielectric layered film 1 of the spectral image sensor 11, such as the fourth modification illustrated in FIGS. 26 and 28. This arrangement has features in that the refractive index difference of the adjacent layers in the basic layers is great.

For example, with the example illustrated in the configuration diagram in FIG. 26 (fourth modification; first thereof), a dielectric layered film 1E is configured of the basic layers as a three-layer configuration, two silicon Si layers having a high refractive index of 4.1, which is higher than silicon nitride SiN and silicon oxide SiO2, and a thickness dη of 61 nm are provided as fifth layered members instead of silicon nitride SiN. In other words, the dielectric layered film 1E has a configuration wherein a layer made up of silicon oxide SiO2 serving as a second layered member is provided for the worth of two cycles on the silicon substrate 1_ω). The calculation result of reflectance spectrums thereof is such as the reflectance spectrum diagram illustrated in FIG. 27.

Note that when designing the constants of the respective layers of the dielectric layered film 1, the reflected center wavelength λ0 of the infrared light IR is set to 1000 nm, the thickness dη (=d1, d3) of the silicon Si layers made up of the fifth layered members is set to 61 nm, and the thickness dβ (=d2) and dk of the silicon oxide layers is set to 171 nm.

Also, with the example illustrated in the configuration diagram in FIG. 28 (fourth modification; second thereof), a dielectric layered film 1E is configured of the basic layers as a five-layer configuration, three silicon Si layers having a high refractive index of 4.1, which is higher than silicon nitride SiN and silicon oxide SiO2, and a thickness dη of 61 nm are provided as fifth layered members instead of silicon nitride SiN. The calculation result of reflectance spectrums thereof is such as the reflectance spectrum diagram illustrated in FIG. 29. As can be understood from comparison as to FIG. 27, it can be understood that the reflectance at an infrared light region can approximate 1.0 by increasing the number of the fifth layered members.

Figure 30:
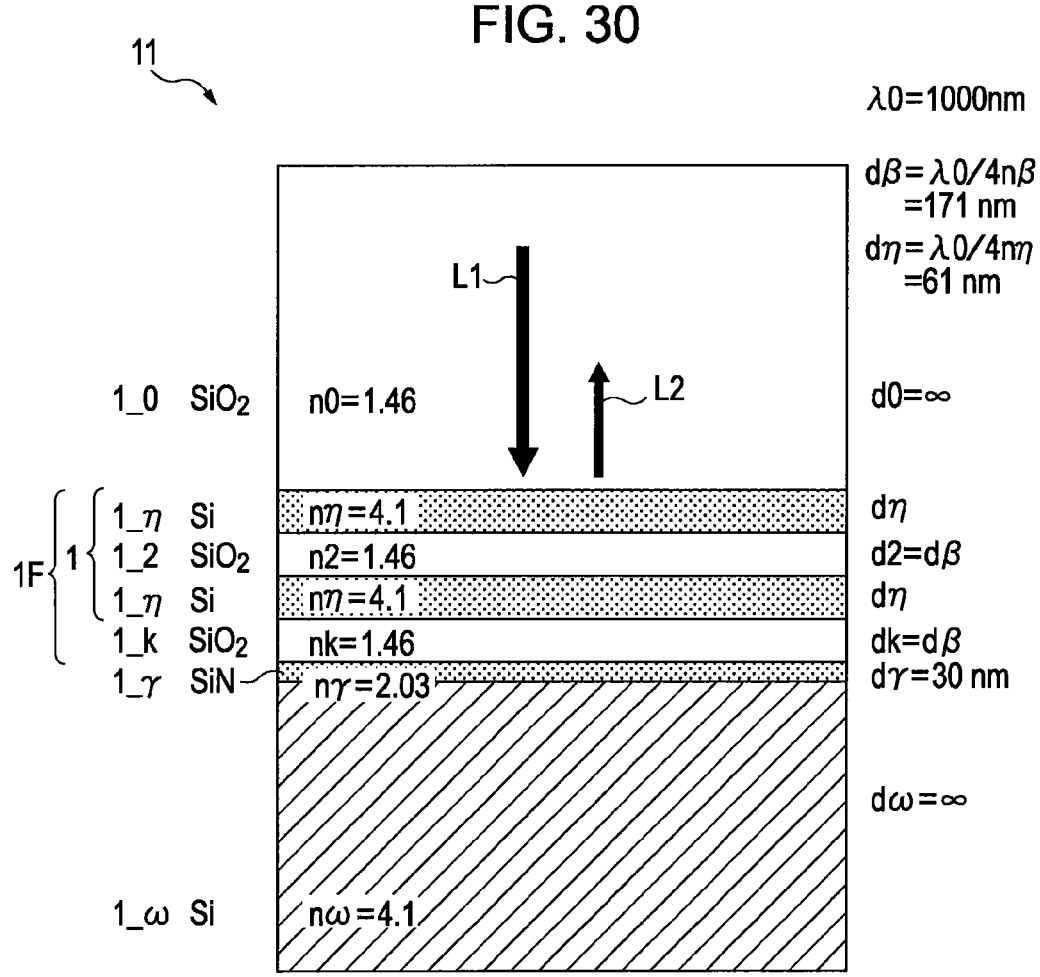
FIG. 30 is a configuration diagram describing a fifth modification of a spectral image sensor corresponding to single wavelength division utilizing a layered film.

Also, with the third or fourth modification, the first modification is applied to the spectral image sensor 11 simultaneously, whereby reflection within a visible light region can be reduced as well as reduction of the number of layers, such as the fifth modification illustrated in FIG. 30. Particularly, though the reflectance at blue B components (wavelength of around 420 nm) and green G components (wavelength of around 520 nm) somewhat increases, the reflectance at red R components (wavelength of around 600 nm) can be sufficiently reduced, which is suitable for separation from the infrared light IR.

For example, with the configuration illustrated in FIG. 30, the thickness dγ is configured of layering relatively thin silicon nitride SiN layer 1_γ as the third layered member between the silicon oxide SiO2 at the k'th layer and the silicon substrate 1_ω. Here, the thickness dγ is set to 0.030 μm. The calculation result of reflectance spectrums thereof is such as the reflectance spectrum diagram illustrated in FIG. 31. The spectral image sensor 11 having the dielectric layered film 1 of this modification substantially includes a dielectric layered film 1F of a five-layer configuration in total of the dielectric layered film 1 made up of three layers, including two layers of the dielectric layer 1_k of the k'th layer (silicon oxide SiO2 layer) and the silicon nitride SiN layer 1_γ.

Note that the third layered member added with the present fifth modification is the same as silicon nitride SiN serving as the first layered member, but the other members may be employed as long as a member has greater refractive index than the silicon substrate 1_ω.

Note that though illustration is omitted, with the third or fourth modification, the first and second modifications are applied to the spectral image sensor 11 simultaneously, whereby reflection within a visible light region can be reduced, and a dark current can be reduced as well as reduction of the number of layers.

With the above description, the spectral image sensor 11 is configured using the spectral filter 10 which utilizes the dielectric layered film 1, but the spectral image sensor 11 is not restricted to this as long as a member having properties for reflecting a predetermined wavelength region components within electromagnetic waves, and passing the remaining components is provided at the incident face side where the electromagnetic waves of a detection unit are cast.

For example, a spectral filter can be formed even utilizing a single layer film of a predetermined thickness regardless of the dielectric layered film 1. This is because, upon the film thickness of a single layer film being changed, an advantage is obtained wherein predetermined wavelength region components within electromagnetic waves are reflected, and the remaining components are passed through.

<<Specific Example of Manufacturing Process>>

FIG. 32 is a diagram illustrating a specific process example for manufacturing a spectral image sensor having a sensor configuration utilizing the layered film described with the above embodiment. This FIG. 32 is a manufacturing process example of a spectral image sensor including a light receiving portion for the infrared light IR and a light receiving portion for the visible light VL.

Figure 32A:
FIG. 32 is a diagram illustrating a specific process example for manufacturing a spectral image sensor having a sensor configuration utilizing a layered film.
Figure 32B:
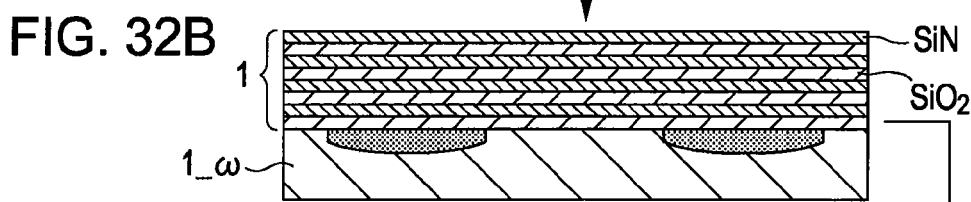

When manufacturing this configuration, first of all, a common CCD, and a circuit having a CMOS configuration are formed (FIG. 32A). Subsequently, a SiO2 film and SiN are sequentially layered on a Si photodiode using the CVD (Chemical Vapor Deposition) method or the like (FIG. 32B).

Figure 32C:
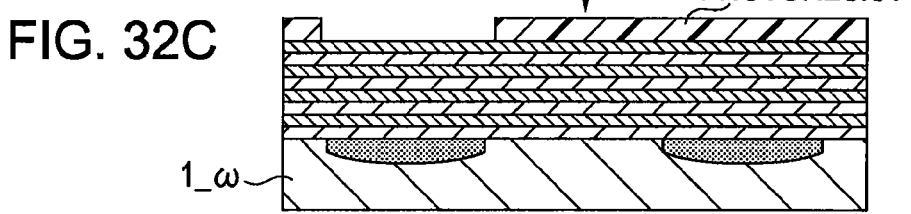
Figure 32D:
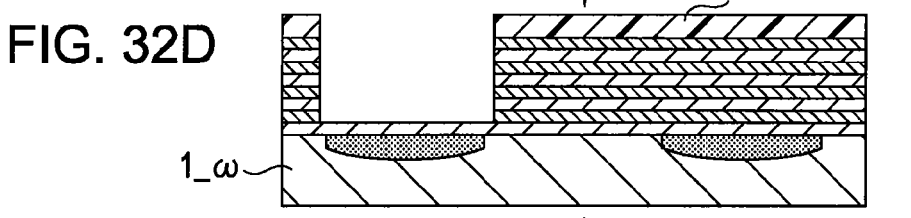
Figure 32E:
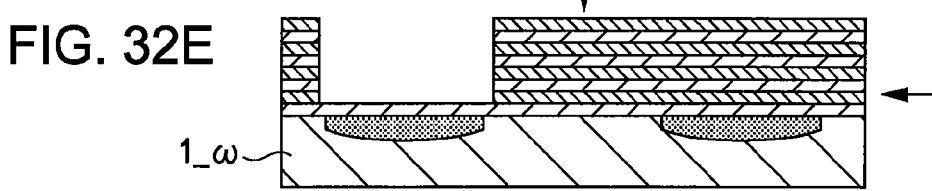

Subsequently, an opening portion which reaches the light receiving portion for the infrared light IR, and the SiO2 film at the lowest layer is provided, for example, by subjecting only one of four pixels to etching using lithography technology, the RIE (Reactive Ion Etching) method, or the like (FIG. 32E). The light receiving portion for the infrared light IR is also used as a correction pixel as to the other color pixels for visible light color image capturing.

Figure 32F:
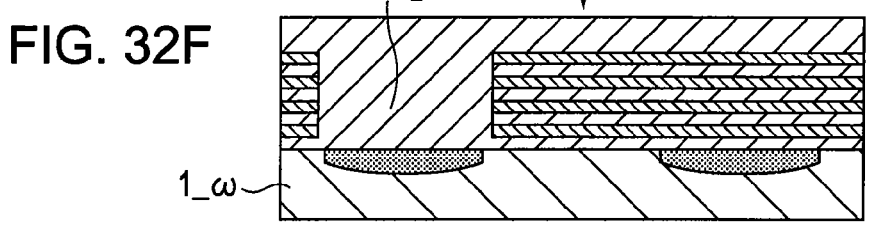

Subsequently, a SiO2 film is layered and smoothed on the dielectric layered film 1 of which a part is provided with an opening portion using, for example, the CVD method or the like again for the sake of protecting the dielectric layered film 1 and the like (FIG. 32F). Of course, this process is not indispensable.

Note that at this time, a photoresistor where an opening portion is provided in the light receiving portion for the infrared light IR may be employed so as not to subject three pixels for the visible light VL (for R, G, and B components) to etching (FIGS. 32C and 32D). In this case, it is necessary to remove the photoresistor prior to layering the SiO2 film on the dielectric layered film 1 (FIGS. 32D and 32E).

Also, though an illustration is omitted, a color filter and a micro lens are formed further on the above thereof so as to correspond to a pixel. At this time, for example, let us say that a black filter is disposed in the light receiving portion for the infrared light IR, and primary-color filters are disposed in the detection unit for visible light, and thus, the pixel of the black filter receives infrared light, and the other three color pixels receive the three primary colors of red, green, and blue of visible light.

Thus, the dielectric multi-layered film of a SiN layer and a SiO2 layer are formed on the detection unit of the three primary-color visible light pixels, but this dielectric multi-layered film is not formed on the detection unit of the black filter pixel. Three primary-color visible light images and an infrared light image can be captured simultaneously by employing the image capturing device manufactured with such a configuration.

Further, in the event that a little infrared light IR is filtered in a photoelectric conversion device for the visible light VL (photodiode or the like), weak infrared light cut filters may be inserted entirely. For example, the infrared light IR is condensed at the photoelectric conversion device for the infrared light IR (photodiode or the like) even if the visible light VL is cut to an almost satisfactory level by inserting an infrared light cut filter of 50% or less, whereby sufficient sensitivity can be obtained.

Note that with such a manufacturing process, up to near the Si substrate surface is subjected to etching, i.e., an opening portion which reaches the light receiving portion for the infrared light IR, and the SiO2 film at the lowest layer is provided (FIG. 32E), so damage due to etching sometimes results in a problem. In this case, damage can be reduced by increasing the thickness d of the SiO2 layer immediately above the Si substrate.

Here, upon the dk reaching 2.5 μm or more, the half value width of the dip in an infrared light region of reflectance spectrums becomes narrow as illustrated in FIG. 15, and thus, the reflectance averaged as to common broad natural light can be obtained, and consequently, reflection of infrared light can be performed. Accordingly, it is desirable to set the thickness dk of the dielectric layer $1\_k$ of the k'th layer to 2.5 μm or more. It is further desirable to set this to the thickness of 5 μm or more.

Also, in the event that metal wiring for the photodiode, intra-pixel amplifier, or the like to be formed on the silicon substrate $1\_\omega$, i.e., a wiring layer serving as a signal line for reading out a pixel signal serving as a unit signal output from the intra-pixel amplifier serving as a unit signal generating unit from an image capturing unit (detection region) is formed on the immediately above the silicon substrate $1\_\omega$, the dielectric layered film 1 is formed not immediately above the silicon substrate $1\_\omega$ but at the position isolated to some extent on the silicon substrate $1\_\omega$, i.e., the dielectric layered film 1 is formed above the metal wiring, whereby the process can be readily performed, and an advantage wherein cost is kept low can be obtained. Detailed description will be made later, but a certain degree of good results can be obtained by increasing the number of layers making up the dielectric layered film 1. Description will be made below regarding a spectral image sensor which considers metal wiring.

<<Demultiplexing Image Sensor Utilizing Dielectric Layered Film; Sixth Modification>>

FIGS. 33 through 39 are diagrams describing a sixth modification of a spectral image sensor 11 corresponding to single wavelength division utilizing the dielectric layered film 1. The sixth modification has features in that taking the technique described with FIGS. 14 through 18 as the basic, in light of metal wiring, the dielectric layered film 1 is formed on the silicon substrate $1\_\omega$, which is above the silicon substrate $1\_\omega$ with some degree of distance, integrally with the detection unit such as a photodiode or the like.

Figure 33:
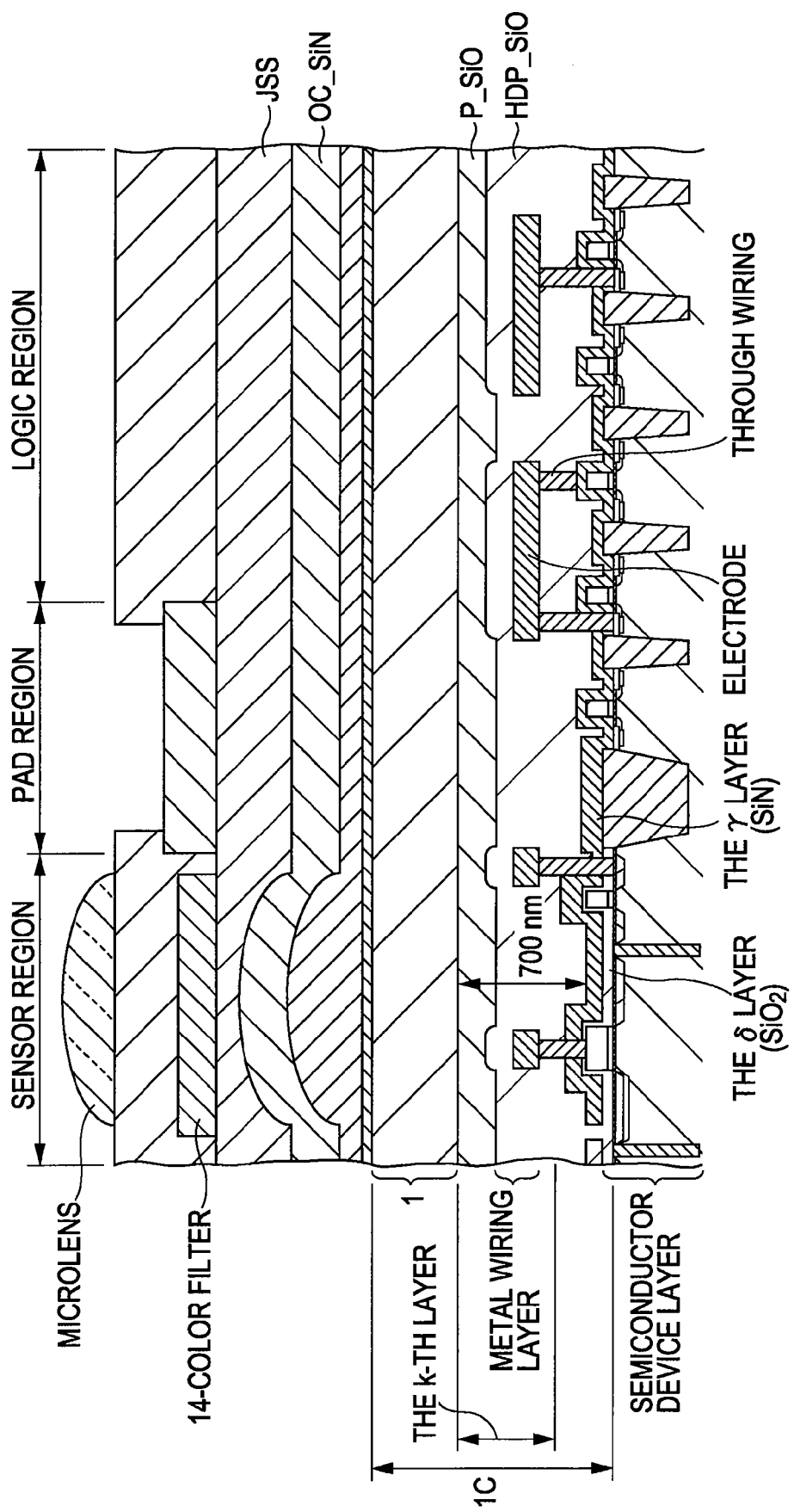
FIG. 33 is a configuration diagram describing a sixth modification of a spectral image sensor corresponding to single wavelength division utilizing a layered film.

For example, as illustrated in FIG. 33, in light of a CMOS configuration, in the event that one wiring layer is provided on a semiconductor device layer on which a detection unit such as a photodiode or the like is formed, and thickness thereof is around 0.7 μm, when a multi-layered film configuration is integrally formed generally 0.7 μm above than the silicon substrate 1_ω on which a photodiode and the like is formed, the dielectric layered film 1 should be formed following the process of the wiring layer of the first layer. Thus, a wiring layer can be provided within the k'th layer having the thickness dk of generally equal to 0.7 μm.

Figure 34:
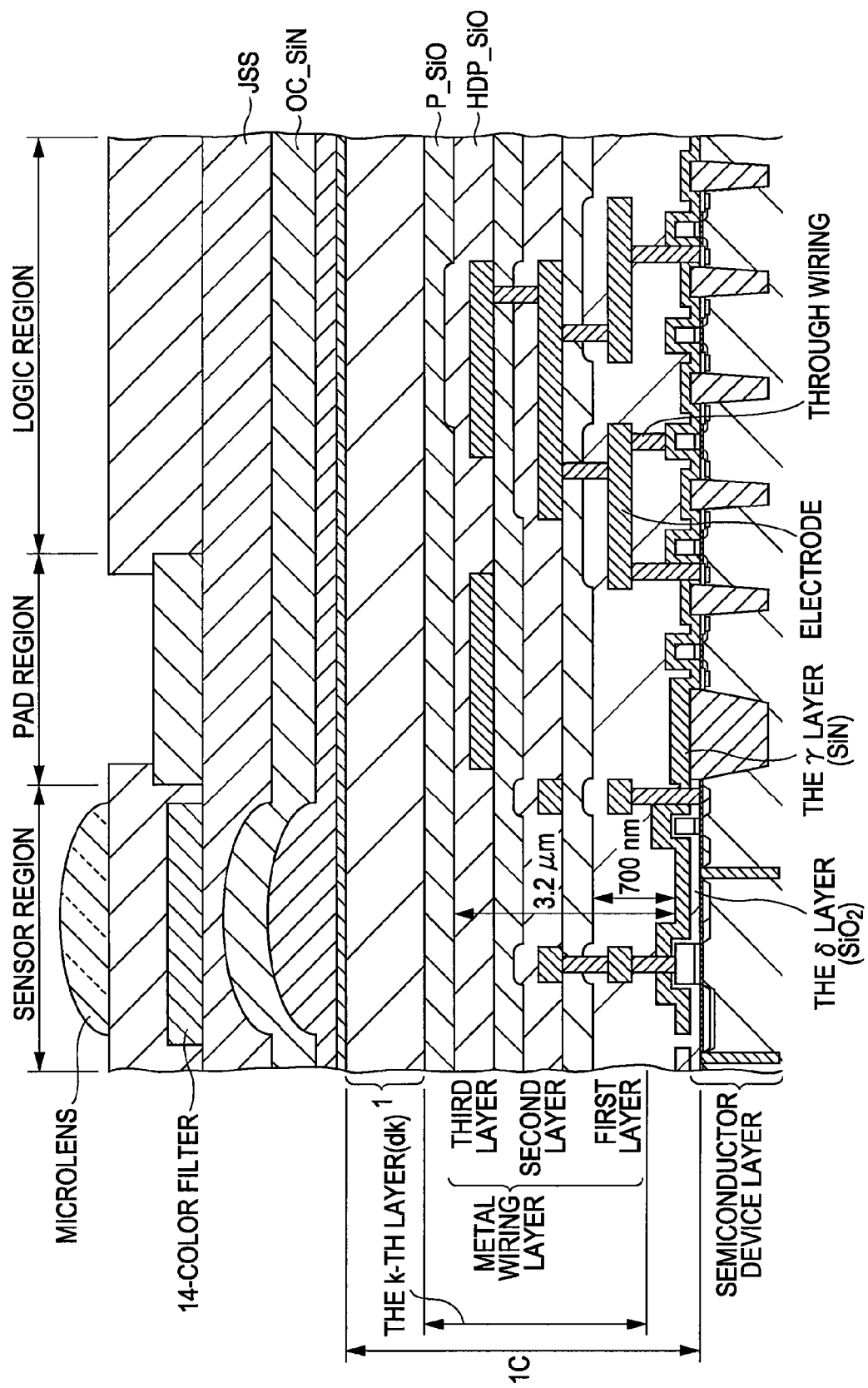
FIG. 34 is a configuration diagram describing the sixth modification of a spectral image sensor corresponding to single wavelength division utilizing a layered film.

Also, as illustrated in FIG. 34, in the event that three wiring layers are provided on a semiconductor device layer, and total thickness thereof is around 3.2 μm, when integrally forming a multi-layered film configuration generally above 3.2 μm than the silicon substrate 1_ω on which a photodiode and so forth are formed, the dielectric layered film 1 should be formed following the process of the wiring layer of the third layer which is the uppermost layer. Thus, a wiring layer can be provided within the k'th layer having the thickness dk equal to 3.2 μm.

The reason why "generally 3.2 μm" has been described here is that as illustrated in the drawing, with the present example, a SiO2 layer (δ layer) having a thickness of around 10 nm is provided on the silicon substrate 1_ω, and a SiN layer (γ layer) having a thickness of around 65 nm is provided on the above thereof, and "3.2 μm" means the thickness of the k layer except for these γ and δ layers.

The color filters 14, micro lens, and so forth should be formed following this dielectric layered film 1 being formed.

Figure 35:
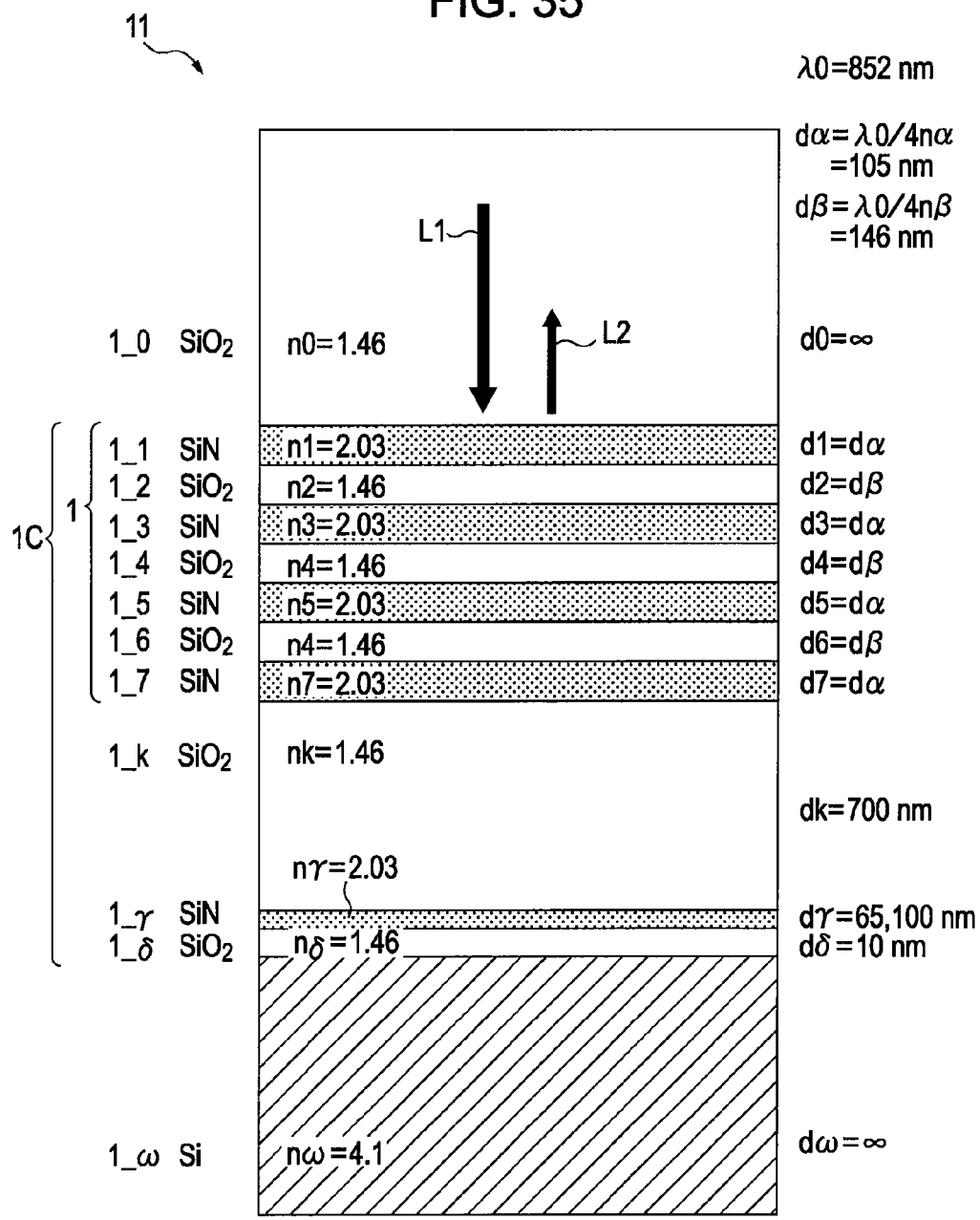
FIG. 35 is a configuration diagram describing the sixth modification of a spectral image sensor corresponding to single wavelength division utilizing a layered film.
Figure 36:
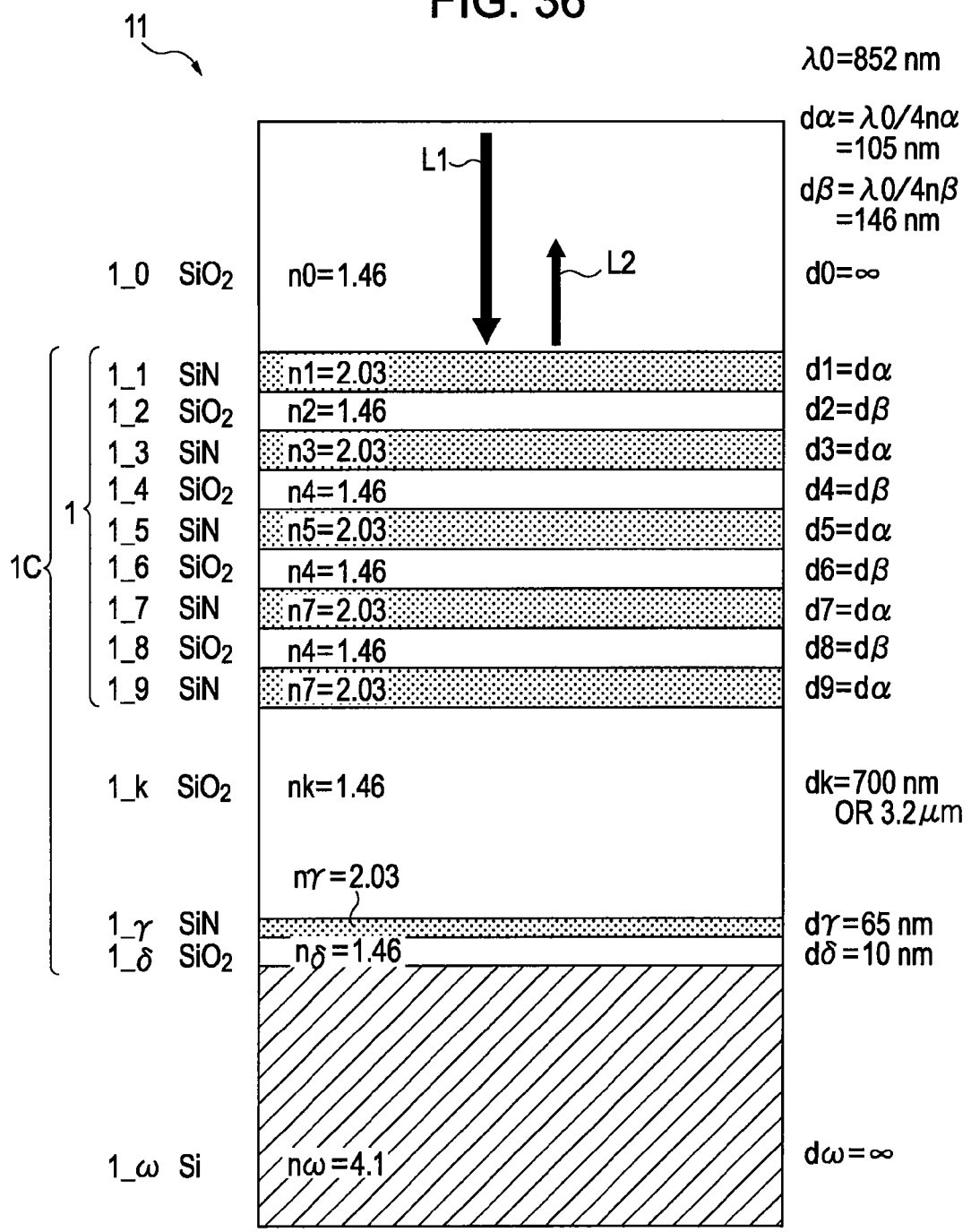
FIG. 36 is a configuration diagram describing the sixth modification of a spectral image sensor corresponding to single wavelength division utilizing a layered film.

FIGS. 35 and 36 are diagrams illustrating the concept of the layered configuration of such a spectral image sensor 11. Now, the configuration of the second modification illustrated in FIG. 21 is utilized wherein in addition to the basic layers 1_1 through 1_n, the third layer 1_γ and the fourth layer 1_δ are provided between the dielectric layer 1_k of the k'th layer and the silicon substrate 1_ω. Also, as with the second modification, the reflected center wavelength λ0 of the infrared light IR is set to 852 nm.

For example, in FIG. 35, while the seven-layer configuration illustrated in FIG. 21 is employed as the basic layer, the dielectric layered film 1C having three layers of the dielectric layer 1_k of the k'th layer (silicon oxide SiO2 layer), the silicon nitride SiN layer 1_γ, and the silicon oxide SiO2 layer 1_δ is taken as the base, the thickness of the dielectric layer 1_k of the k'th layer is set to 700 nm. Also, the relatively thin silicon nitride SiN layer 1_γ having a thickness dγ of 65 nm or 100 nm is layered as a third layered member between the silicon oxide SiO2 of the k'th layer and the silicon substrate 1_ω, and further, the silicon oxide SiO2 layer 1_δ serving as a fourth layer having smaller refractive index than the third layered member is layered with a thickness dδ of 10 nm between this added third layered member and the silicon substrate 1_ω, thereby forming the dielectric layered film 1C.

Also, in FIG. 36, while the dielectric layered film 1 serving as the base has a nine-layer configuration, the thickness of the dielectric layer 1_k of the k'th layer is set to 700 nm or 3.2 μm. Also, the relatively thin silicon nitride SiN layer 1_γ having a thickness dγ of 65 nm is layered as a third layered member between the silicon oxide SiO2 of the k'th layer and the silicon substrate 1_ω, and further, the silicon oxide SiO2 layer 1_δ serving as a fourth layer having smaller refractive index than the third layered member is layered with a thickness dδ of 10 nm; thereby forming the dielectric layered film 1C.

Figure 37:
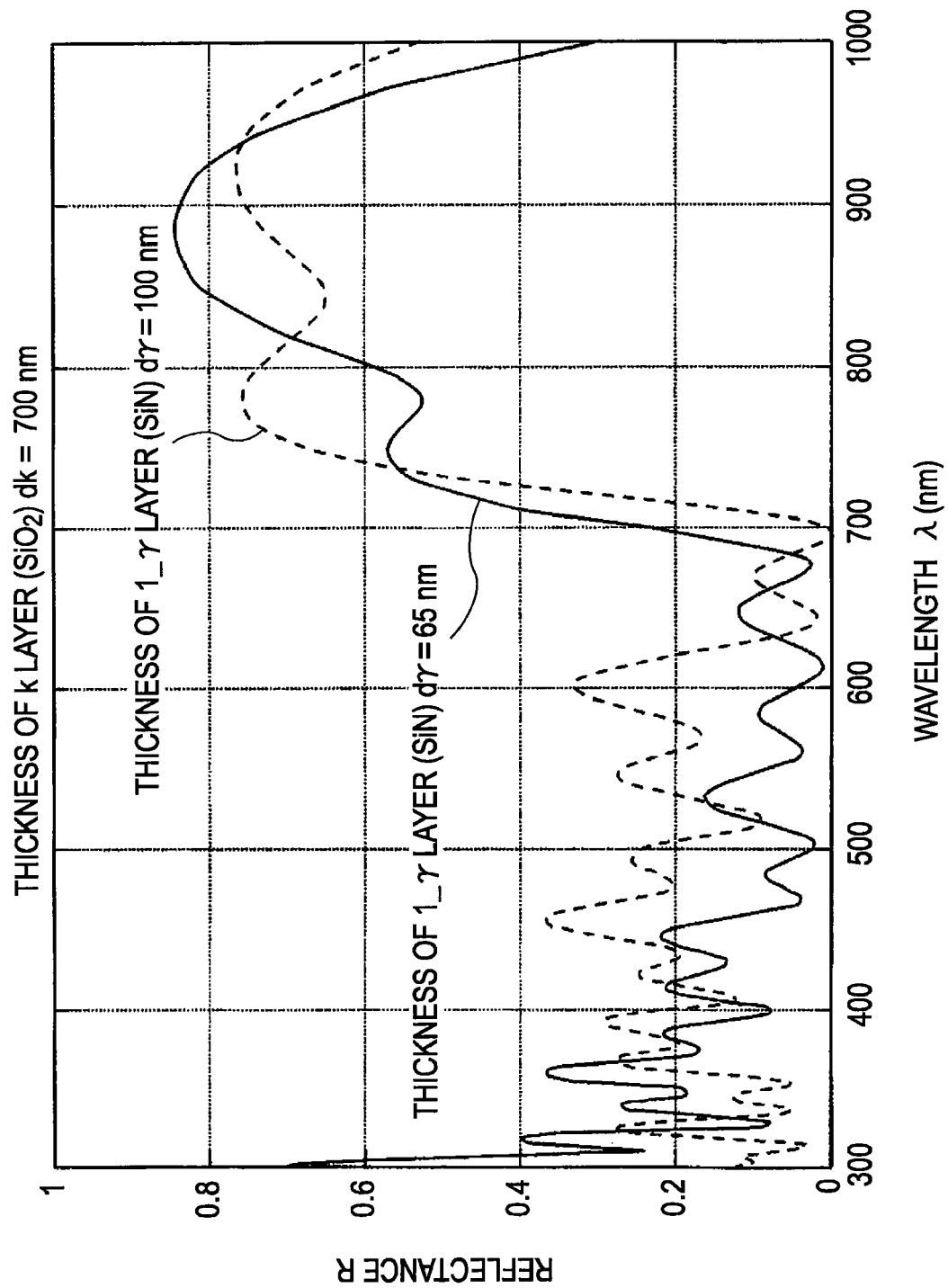
FIG. 37 is a diagram describing the sixth modification of a spectral image sensor corresponding to single wavelength division utilizing a layered film.
Figure 38:
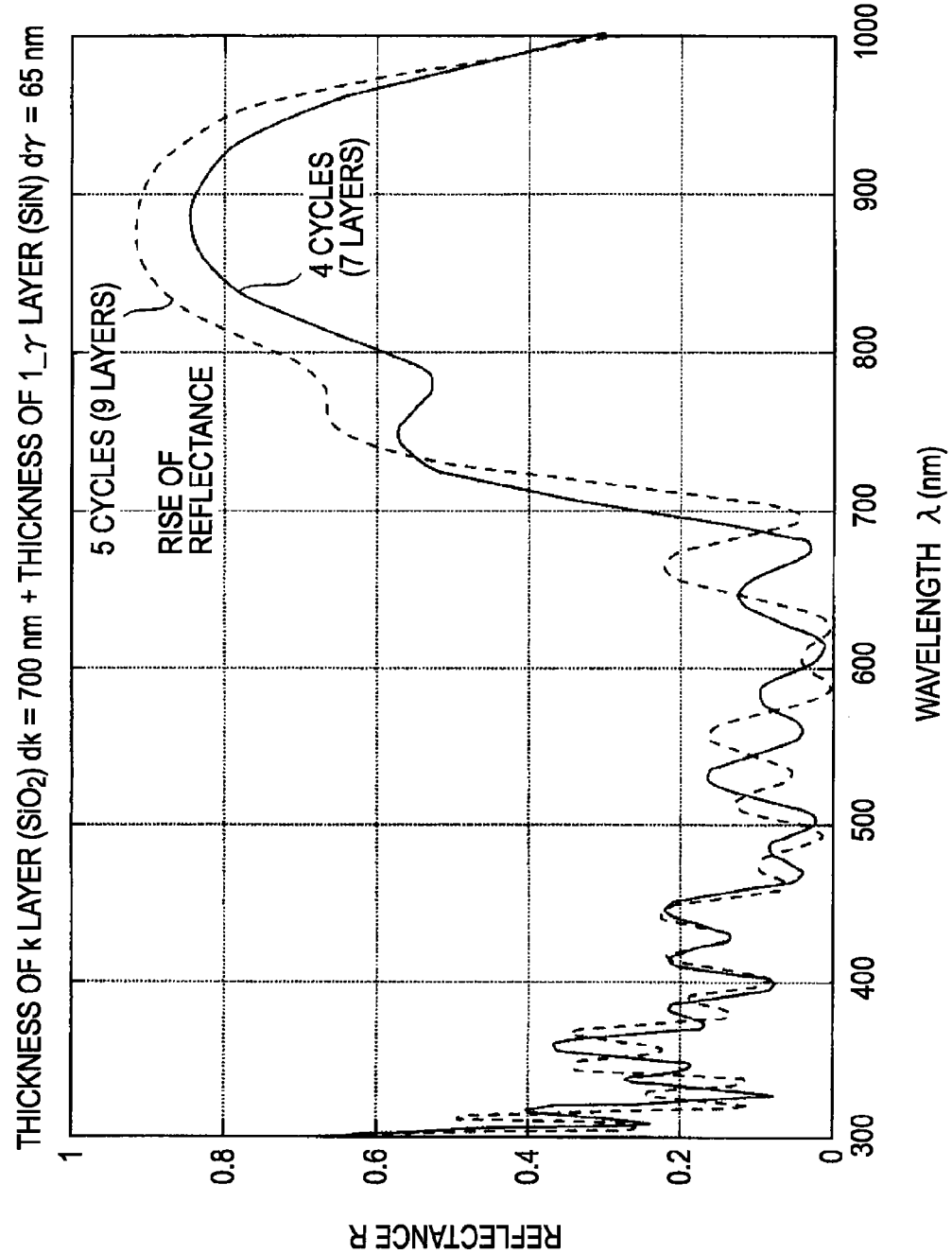
FIG. 38 is a reflectance spectrum diagram describing the sixth modification of a spectral image sensor corresponding to single wavelength division utilizing a layered film.
Figure 39:
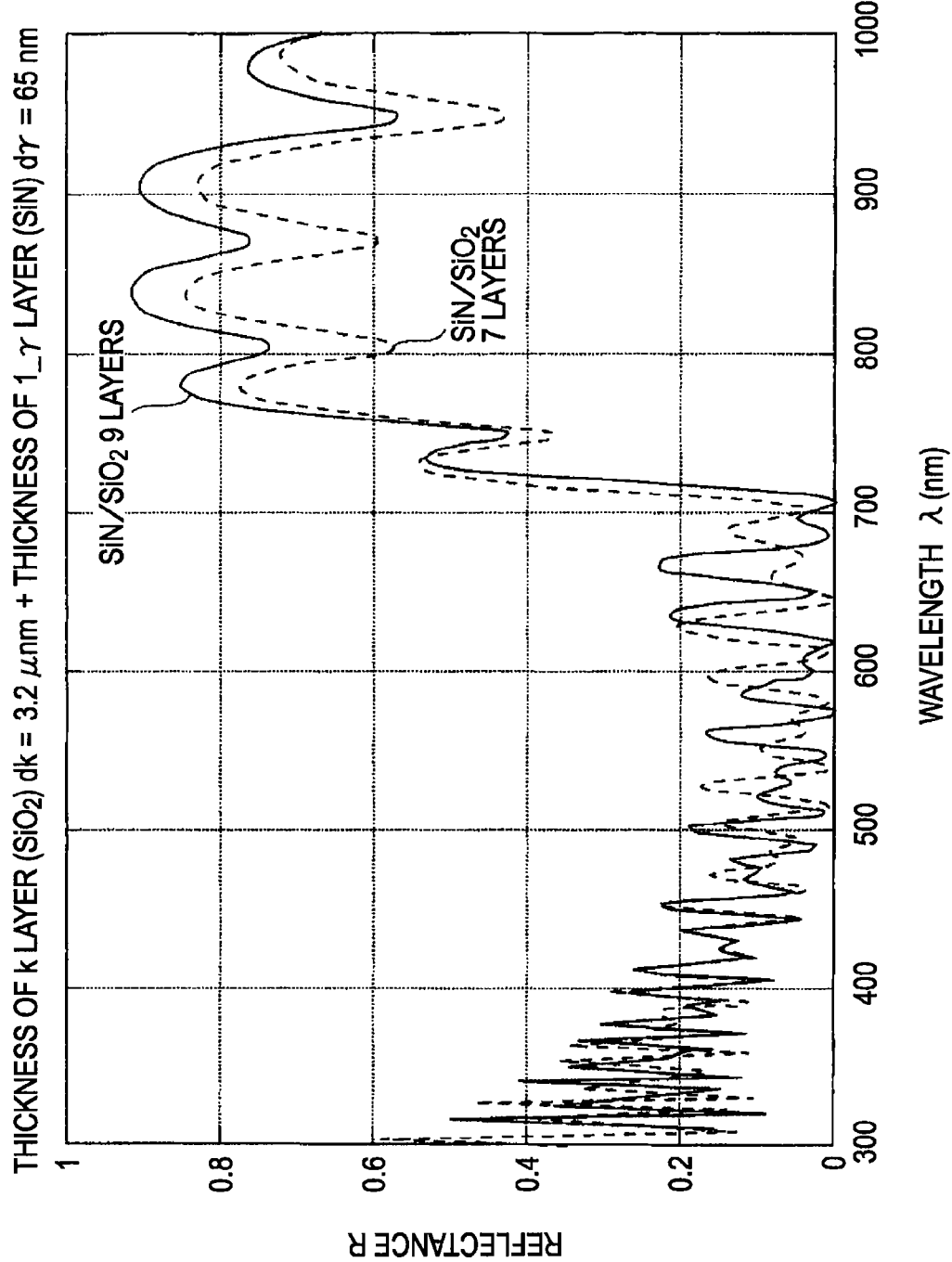
FIG. 39 is a reflectance spectrum diagram describing the sixth modification of a spectral image sensor corresponding to single wavelength division utilizing a layered film.

The calculation results of these reflectance spectrums is such as illustrated in FIGS. 37 through 39. As can be understood from FIGS. 33 and 34, the dielectric layered film 1 is formed 0.7 μm or 3.2 μm above the silicon substrate 1_ω, thereby facilitating the wiring process. Note that accurately, the SiO2 layer serving as the fourth layer and the SiN layer serving as the third layer are provided immediately above the silicon substrate 1_ω in that order having thickness of 10 nm and 65 nm (or 100 nm) respectively, and accordingly, the position where the dielectric layered film 1 is formed is above those in total.

Here, with the dielectric layered film 1 having the SiN film and the SiO2 film, the case of seven layers and the case of nine layers have been shown, but it can be understood from FIG. 37 that if the silicon nitride SiN layer 1_γ is excessively thickened, the dip in an infrared light reflected region is great, and consequently, reflection is greatly deteriorated. In addition, if the thickness dγ of the SiN layer serving as the third layered member is thick, reflection in a visible light region is raised. This can be conceived that as described with the second modification, the third layered member, which is provided as an intermediate layer, aims at reducing the reflection in a visible light region, and if the thickness dγ of the dielectric layer 1_γ which is provided as an intermediate layer is thin, sufficient room is provided, otherwise, little room is provided.

Also, as can be understood from FIG. 38, it can be understood that upon the number of multi-layered configuration being increased up to 9 layers, the reflectance R in an infrared light region exceeds 0.9, the reflection performance at an infrared light region can be further improved as compared with the case of 7 layers. Also, as can be understood from FIG. 39, it can be understood that with a 7-layer configuration wherein the thickness dk of the dielectric layer 1_k of the k'th layer is 3.2 μm, the dips in an infrared light reflected region are great, and consequently, reflection is greatly deteriorated. However, even with regard to this case, it can be understood that upon the number of layers being increased up to 9 layers, these dips become small, the reflection performance at an infrared light region can be further improved.

Thus, forming the dielectric layered film 1 following the past wiring process being performed facilitates manufacturing, and consequently, eliminates the necessity of the study of a new process, and is advantageous cost-wise. That is to say, manufacturing the CMOS configuration such as FIGS. 33 and 34 facilitates the process, and also an effective advantage can be obtained. If a wiring process is performed following the dielectric layered film 1 being formed, a great difference is provided such that it becomes difficult in a process manner to perform removal of the dielectric layered film 1 and so forth.

<Image Capturing Device; Second Embodiment Using Diffraction Grating>

FIG. 40 is a diagram for describing a second embodiment of the solid state image capturing device 314. The solid state image capturing device 314 of this second embodiment has features in that the concept of wavelength separation for spectrally separating electromagnetic waves for each predetermined wavelength using diffraction grating. Now, description will be made regarding spectrally separating light serving as one example of electromagnetic waves for each predetermined wavelength.

Specifically, the present embodiment is an embodiment utilizing the configuration which the present assignee has proposed in Japanese Patent Application No. 2004-250049, a diffraction grating 501 is, as illustrated in FIG. 40A, has a configuration wherein scatterers 502 made up of a shielding member for cutting off (shielding in the case of light) electromagnetic waves (e.g., light) are arrayed periodically, upon incident light L1 being cast in, diffracted waves L2 are generated by light being scattered at each of the scatterers 502. Also, interference occurs among the diffracted waves L2 by the scatterers 502 including a great deal of the diffracted waves L2 periodically.

Thus, as illustrated in FIG. 40B, light intensity becomes strong at a place where the phases of the respective diffracted waves L2 are matched, and inversely, becomes weak at a place where the phases are shifted for the worth of a half wavelength. Consequently, interference fringes are generated straddle between the surface of a Si (silicon) substrate 509 and the inside of the Si substrate.

The present embodiment realizes a spectral image sensor by utilizing that the pattern of this interference fringe exhibits wavelength dispersibility which is changed by a wavelength λ.

<<Basic Configuration of Demultiplexing Image Sensor Utilizing Diffraction Grating>>

Figure 42:
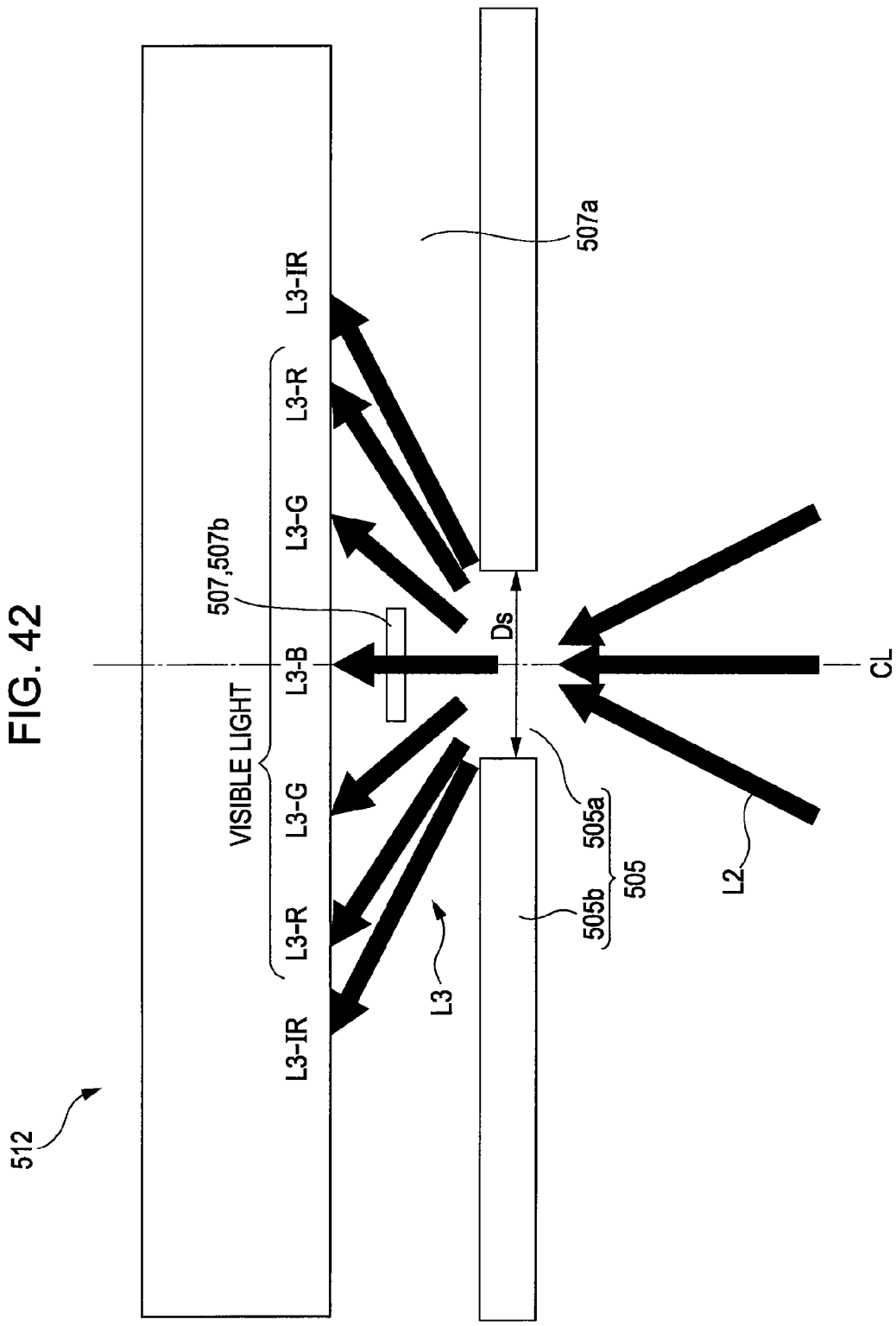
FIG. 42 is a diagram enlarging and illustrating one photodiode group of the spectral image sensor illustrated in FIG. 41.

FIG. 41 is a conceptual diagram describing the basic configuration of a demultiplexing image sensor (spectral image sensor) utilizing a diffraction grating. FIG. 42 is a diagram enlarging and illustrating one photodiode group 512 of the spectral image sensor 511 illustrated in FIG. 41.

Here, the photodiode group 512 is equivalent to one photodiode corresponding to one pixel in the past image capturing device. The present embodiment has features in that multiple photoelectric conversion devices by wavelength (by color) for detecting different wavelengths (color components) spectrally separated utilizing a diffraction advantage caused by the electromagnetic waves passing through an opening portion are provided within the photodiode group 512, thereby realizing high resolution and high pixilation. The configuration according to the present embodiment is a configuration wherein the entire color components for color separation are assigned to one photodiode group 512 making up one pixel, and is different from a configuration wherein any of color components for color separation is assigned to a photoelectric conversion device by color making up one pixel.

The spectral image sensor 511 wherein the photodiode group 512 made up of multiple photoelectric conversion devices illustrated in FIG. 41 are arrayed has features in that electromagnetic waves are divided into multiple wavelength components utilizing a diffraction advantage, a wavelength dispersion portion for having the respective wavelength components cast into adjacent different positions within the incident face is made up of scatterers 503 (first scatterer), slits 505 (second scatterer), and scatterers 507 (third scatterer).

Specifically, the scatterers 503 made up of long-shaped (linear or rod-shaped) opening portions 503a for passing through electromagnetic waves (e.g., light) at the incident light L1 side, and light shielding portions 503b in a long shape (line shape or rod shape) which are portions for cutting off (shielding in the case of light) electromagnetic waves (e.g., light), which are alternately arrayed, are disposed such that the light shielding portions 503b are in parallel, periodically, and arrayed in a predetermined direction (e.g., horizontal direction; X direction in the drawing) within the light receiving face. The horizontal direction (X direction in the drawing) corresponds to the readout direction of a pixel signal from the photoelectric conversion device by color included in the photodiode group 512.

Here, the term "linear" means a shape of which cross-sectional area is boundlessly close to zero as to the wavelength of light, and the term "rod-shaped" means a shape of which cross-sectional area is limited, but both are common in that both are in a slender shape, i.e., a long shape.

Also, with the spectral image sensor 511, a slit-shaped light scatterer (hereinafter, referred to as slits) 505 making up the principal portion of the diffraction grating 501 is provided such that a long opening portion (gap of slit) 505a for passing through electromagnetic waves (e.g., light), and a light shielding portion 505b which is a portion for cutting off (shielding in the case of light) electromagnetic waves (e.g., light) surrounding the opening portion 505a are disposed on the fringe where the diffracted waves L2 between the scatterer 503 and the Si substrate 509 are gathered.

With the slits 505, the cycle of the opening portions 505a (the interval of the adjacent opening portions 505a) and the cycle of the scatterers 503 (the interval of the light shielding portions 503b of the adjacent scatterers 503; the interval of the opening portions of the scatterer 503) are equal, and also these are disposed in parallel. In addition, the opening portion 505a is disposed at the position (vertical as to the photodiode group 512 surface) on a generally center line CL0 passing through the center point between the adjacent scatterers 503.

Further, with the spectral image sensor 511, the scatterers 507 wherein the different long light shielding portions 507b are disposed periodically in parallel while sandwiching the opening portion 507a is provided between the slits 505 and the photodiode group 512. The scatterers 507 are set such that the cycle of the scatterers 507 (the interval of the adjacent light shielding portions 507b), and the cycle of the scatterers 503 (the interval of the adjacent light shielding portions 503b; of the scatterers 503) or the cycle of the opening portions 505a of the slits 505 (the interval of the adjacent opening portions 505a of the slits 505) become equal. In addition, the light shielding portions 507b of the scatterers 507 are arranged so as to be disposed at the position (vertical as to the photodiode group 512 surface) on a generally center line CL0 passing through the center point between the scatterers 503.

With the spectral image sensor 511 having such a configuration, the respective scatterers 503 are disposed periodically, and places where the diffracted waves L2 are condensed appear such as FIG. 41. Particularly, in the event that the respective scatterers 503 are disposed in the horizontal direction periodically, and also in parallel with an equal interval, the diffracted waves L2 are gathered together on the center line CL0 between the respective scatterers 503.

Also, the diffracted waves L2 are condensed in a long shape, or the interference fringe (light intensity distribution) between the diffracted waves L2 becomes a long shape by employing the long-shaped scatterers 503. Accordingly, upon considering the device configuration, the photoelectric conversion devices (photodetectors) to be provided within the photodiode group 512 can be configured in a long shape, thereby providing an advantage wherein it is easy to design.

In addition, FIG. 41 illustrates the basic configuration of the spectral image sensor paying attention to a condensing advantage, but subsequently, as the diffracted waves L2 are further advanced, the incident light L1 is spectrally separated by the advantage of the slits 505 and another one set of scatterers 507 as illustrated in FIG. 42.

Accordingly, condensing and spectral separation can be realized with a combination of these two advantages. At this time, the slits 505 are disposed between the scatterers 503 and the photodiode group 512 which are the peripheries where the diffracted waves L2 gather together such that the long-shaped opening portions 505a (gap of slits) are periodical in the horizontal direction and also in parallel, whereby the incident light L1 can be spectrally separated in a well controlled manner, such as blue light L3-B, green light L3-G, red light L3-R, and infrared light L3-IR (collectively referred to spectral components L3).

With the spectral image sensor 511 illustrated in FIG. 41 in which the photodiode group 512 made up of multiple photoelectric conversion devices are arrayed, a long-shaped (linear or rod-shaped) scatterers 503 are disposed so as to array in a predetermined direction (e.g., horizontal direction; X direction in the drawing) within the light receiving face in parallel periodically. The horizontal direction (X direction in the drawing) corresponds to the readout direction of a pixel signal from the photoelectric conversion device by color included in the photodiode group 512.

Also, particularly, if the cycle of the opening portions 505a of the slits 505 (the interval of the adjacent opening portions 505a) and the cycle of the scatterers 503 (the interval of the adjacent light shielding portions 503b) are equal, and also these are disposed in parallel, periodicity and symmetry improves in the entire configuration (particularly, relation between the scatterers 503 and the slits 505), and the interference properties of light improves. Consequently, spectral properties improve.

Also, the light (diffracted waves L2) diffracted at the scatterers 503 is condensed around center point thereof (the center between the light shielding portions 503b). Thus, the opening portions 505a of the slits 505 are arranged so as to be disposed at the position (vertical as to the photodiode group 512 surface) generally on the center line CL0 passing through the center point between the scatterers 503, thereby performing spectral separation effectively.

Also, it has been found that the visible light (blue light L3-B, green light L3-G, and red light L3-R) and the infrared light L3-IR can be separated spectrally by setting the slit width Ds to 800 nm±300 nm.

Further, it has been also found that another one set of scatterers 507 may be disposed or may not be disposed between the slits 505 and the photodiode group 512 on the center line CL0 of the opening portions 505a of the slits 503 in some cases.

Here, it has turned out by the optical field computation of the FDTD (Finite Difference Time Domain) method in accordance with the Maxwell equation that another set of scatterers 507 is disposed on the center line CL0 of the opening portions 505a of the slits 503 and also between the slits 503 and the photodiode group 512, and thus, as illustrated in the enlarged view in FIG. 42, the light at the long wavelength side (green light through red light) is condensed at a position apart from the scatterers 507 by diffraction, but the light at the short wavelength side (particularly, blue light) is condensed on the center line CL0 of the photodiode group 512 at the rear side of scatterer thereof.

Here, the diffracted waves L2 are condensed in a long shape, or the interference fringe (light intensity distribution) between the diffracted waves L2 becomes a long shape by employing the long-shaped scatterers 507. Accordingly, upon considering the device configuration, the photoelectric conversion devices (photodetectors) to be provided within the photodiode group 512 can be configured in a long shape, thereby providing an advantage wherein it is easy to design. Also, the scatterers 507 are disposed periodically in parallel, thereby improving periodicity and symmetry in the entire configuration, and also improving the interference properties of light. Consequently, spectral properties improve. A combination of both provides a configuration wherein spectral properties are excellent, and it is easy to design.

Also, if the cycle of the scatterers 503 (the interval of the adjacent light shielding portions 503b) and the cycle of the scatterers 507 (the interval of the adjacent light shielding portions 507b) are equal, and also these are disposed in parallel, periodicity and symmetry improve in the entire configuration (particularly, relation between the scatterers 503 and the scatterers 507), and the interference properties of light improves. Consequently, spectral properties improve.

Further, if the cycle of the opening portions 505a of the slits 503 (the interval of the adjacent opening portions 505a) and the cycle of the scatterers 507 (the interval of the adjacent light shielding portions 507b) are equal, and also these are disposed in parallel, periodicity and symmetry improves in the entire configuration (particularly, relation between the slits 503 and the scatterers 507), and the interference properties of light improves. Consequently, spectral properties improve.

Particularly, if the cycle of the scatterers 503 (the interval of the adjacent light shielding portions 503 b), the cycle of the opening portions 505a of the slits 503 (the interval of the adjacent opening portions 505a), and the cycle of the scatterers 507 (the interval of the adjacent light shielding portions 507b) are equal, and these are disposed in parallel, the positional relations of all of the scatterers can be matched, and accordingly, the maximum advantage can be obtained in periodicity and symmetry. Consequently, the interference properties of light improve greatly, and also spectral properties improve greatly.

The present embodiment has features in that the spectral image sensor 511 is realized by utilizing such a method for performing spectral separation using diffraction properties. Such a configuration may be a configuration wherein scatterers are embedded in a transparent oxide film or nitrogen film which are parent materials. That is to say, it is desirable that scatterers are embedded in a predetermined transparent member (parent material) to be integrally formed with a semiconductor substrate. In this case, it is desirable to select a member of which refractive index is higher than that in a parent member as a scatterer.

Here, there are two reasons regarding why an oxide film and a nitrogen film are suitable for a parent member. One reason is in that these films are films employed for a common semiconductor process, which are inexpensive and low costs. The other reason is in that these films are low in a refractive index as compared with silicon, so these films can obtain a great refractive index difference by being combined with silicon, and consequently, diffraction is effectively generated.

Also, as for a transparent parent material, it is desirable to employ an oxide film or nitrogen film. Here, SiOx is preferably employed as an oxide film, and particularly SiO2 is preferably employed. Also, SiNx is preferably employed as a nitrogen film. This is because of SiOx, particularly SiO2 which is completely oxidized is chemically stable, and also its refractive index is the lowest. SiNx is also the same, and Si3N4 is chemically most stable.

Also, it is desirable that scatterers are made up of silicon Si which is excellent in matching of a process, but scatterers may be made up of the other members, silicon nitride SiN can be employed, for example. At this time, both of the scatterers 503 and 507 may be made up of the same member, or may be made up of a different member. SiNx is a material employed for a common semiconductor process, and provides an advantage of inexpensive and low costs.

Also, scatterers may be made up of germanium. This refractive index is higher than that in silicon Si, and an advantage wherein scattering effects and diffraction effects are improved can be obtained.

Note that scatterers may be a metal, or compounds thereof as long as a different refractive index is employed. That is to say, a transition metal, a transition metal silicide, a transition metal nitriding compound, a transition metal nitriding oxidation compound, a noble metal, a noble-metal silicide, a refractory metal, a refractory metal silicide, or the like may be employed. Specifically, Al, Cu, Ni, Cr, W, WSi, WSi2, Ti, TiSi2, TiSi, TiN, TiON, Ta, TaN, NiSi, NiSi2, Hf, HfN, HfSi2, Ag, Au, Pt, CoSi2, RuN, RuOx, RuOxN, or the like can be employed. Of these, inexpensive and low cost scatterers can be obtained by particularly employing Al, Cu, Ni, or the like.

Note that a sensor configuration utilizing a diffraction grating is effective even if all of the p-type semiconductors and n-type semiconductors are reversed. An n-type substrate may be employed for the sake of suppressing noise signals. In this case, such a configuration may be manufactured following the depth of 2 μm or more from the surface being subjected to p-type formation by subjecting an n substrate to thermal diffusion processing of III family dopant such as Al, B, and so forth. Further, p-type formation may be performed by subjecting the depth of 0.1 μm or less of the outermost semiconductor surface to thermal diffusion of III family dopant such as Al, B, and so forth for the sake of suppressing leak current.

Of course, the cycle of the positions of the scatterers 503 (the interval in the lateral direction from the center point of a light scatterer to the center point the next same light scatterer) corresponds to the array pitch of the photodiode group 512 (the pixel pitch of the past configuration), so consequently, a pixel pitch is adjustable by changing the cycle of the positions of the scatterers 503. In the event of realizing a high-density image capturing device, this cycle should be decreased, and inversely, in the event of realizing a low-density image capturing device, this cycle should be increased.

For example, even if the cycle of the positions of the scatterers 503 is 0.5 through 5 μm, the same advantage can be obtained. The lower limit of 0.5 μm is set based on the diffraction limited of visible light. That is to say, in the event of visible light, the diffraction limited is 0.3 μm or more. It is necessary to set a cycle configuration to greater a value than at least this value, and accordingly, the lower limit is set to 0.5 μm. However, it is not inconvenient to set the low limit to 0.3 μm which is the original limit.

On the other hand, the upper limit of 5 μm is set based on an order where a diffraction phenomenon markedly occurs. Of course, even if the upper limit is 5 μm or more, a diffraction phenomenon occurs, so the upper limit is not restricted to a particular value. In this point, it is not inconvenient that the term "preferably 5 μm or less" is employed here.

Also, though it is not necessarily to specify the cycle, the cycle is preferably a range of 1 through 2 μm, and further preferably 1.5 μm, as described above. Here, the lower limit of 1 μm is set based on the cycle configuration of a common diffraction grating of visible light, and facilitation of manufacturing two or more photoelectric conversion devices during one cycle. On the other hand, the upper limit of 2 μm is set based on the results of simulation wherein it is confirmed that manufacturing up to 2 μm is currently easy.

Also, the scatterers 503 and 507 should be scatterers capable of obtaining diffraction effects and light harvesting, and either of the scatterers 503 and 507 should have a common thickness of 0.01 μm or more. Here, the lower limit of 0.01 μm is set based on the minimum value wherein scattering and diffraction of light can occur. Generally, if there are scatterers which are equivalent to around 1/10 of the wavelength of light, scattering and diffraction of light can occur.

Also, the thickness of the scatterer 503 is preferably 0.1 μm or more, further preferably in a range of 0.2±0.05 μm from the relation of the refractive index of SiO2 which is a parent member. Here, the lower limit of 0.1 μm is set based on the thickness wherein scattering and diffraction are effectively generated. Also, the center value of 0.2 μm is set based on the simulation results wherein particularly excellent spectral properties are exhibited, and range 0.05 μm thereof is set in light of manufacturing irregularities.

Also, with both of the scatterers 503 and 507, the width of the lateral direction thereof should be 0.05 μm or more to effectively serve as the scatterers 503 and 507. Here, the lower limit of 0.05 μm is set based on the minimum value wherein scattering and diffraction of light can occur. Generally, if there are scatterers which are equivalent to around 1/10 of the wavelength of light, scattering and diffraction of light can occur. Note that with this width in the lateral direction, the lower limit is preferably set to 0.01 μm in light of matching as to the thickness of the scatterers, but in light of a process, the lower limit depends on regarding whether or not a 0.05-μm width can be realized at the latest process. Accordingly, the lower limit is set to 0.05 μm in light of being capable of scattering and diffraction of light, and the minimum process width.

Also, the width d of scatterers is particularly preferably in a range of 0.05 μm≦d≦0.3 μm (0.1-0.05/+0.2 μm). Here, as for generally the center value of 0.1 μm, spectral properties are excellent as a result of a simulation, so that this value 0.1 μm is set as the center value. Also, the range of −0.05 μm is restricted considering the lower limit, and on the other hand, the upper limit is set to +0.2 μm in light of easy-to-manufacturing mass productivity process (0.25-μm process).

Also, the width (slit width Ds) of the opening portions 505a of the slits 503 is 0.1 μm or more, and preferably 0.4 μm or less. Here, the lower limit of 0.1 μm is set based on the minimum value wherein diffraction effectively occurs, and the upper limit of 0.4 μm is set based on in that the slit width which effectively spectrally separates visible light (λ≦780 nm), particularly red light of 640 nm and green light of 540 nm is 0.4 μm or less. Note that this does not mean that spectral separation is not performed at 0.5 μm, but spectral separation is preferably performed at 0.4 μm or less.

Also, particularly in order to improve spectral properties, this slit width Ds should be in a range of 0.3±0.1 μm. Here, as for the center value of 0.3 μm, spectral properties are excellent as a result of a simulation, so that this value 0.3 μm is set as the center value. Range±0.1 μm thereof is set based on the conditions wherein spectral separation can be effectively performed using diffraction particularly in the case of visible light similarly as a result of a simulation. Note that in the case of infrared spectral separation, the value here results in a great difference.

Also, the thickness of the slits 503 is preferably 0.01 μm or more to obtain spectral effects. Here, the lower limit of 0.01 μm is set based on the minimum value wherein a slit function works. That is to say, function thereof means the thickness wherein light shielding effects, if any, appears. Also, a particularly effective advantage can be obtained in a range of 0.125±0.1 μm. Here, as for the center value of 0.125 μm, excellent spectral properties can be obtained as a result of a simulation, so the center value is set to 0.125 μm, the lower limit of −0.1 μm of range±0.1 μm thereof is set based on the determination wherein the shielding effects of blue light is sufficiently obtained, and the upper limit of +0.1 μm is set for the sake of ease of manufacturing.

<<Configuration of Spectral Separation of Infrared Light and Visible Light>>

Figure 43:
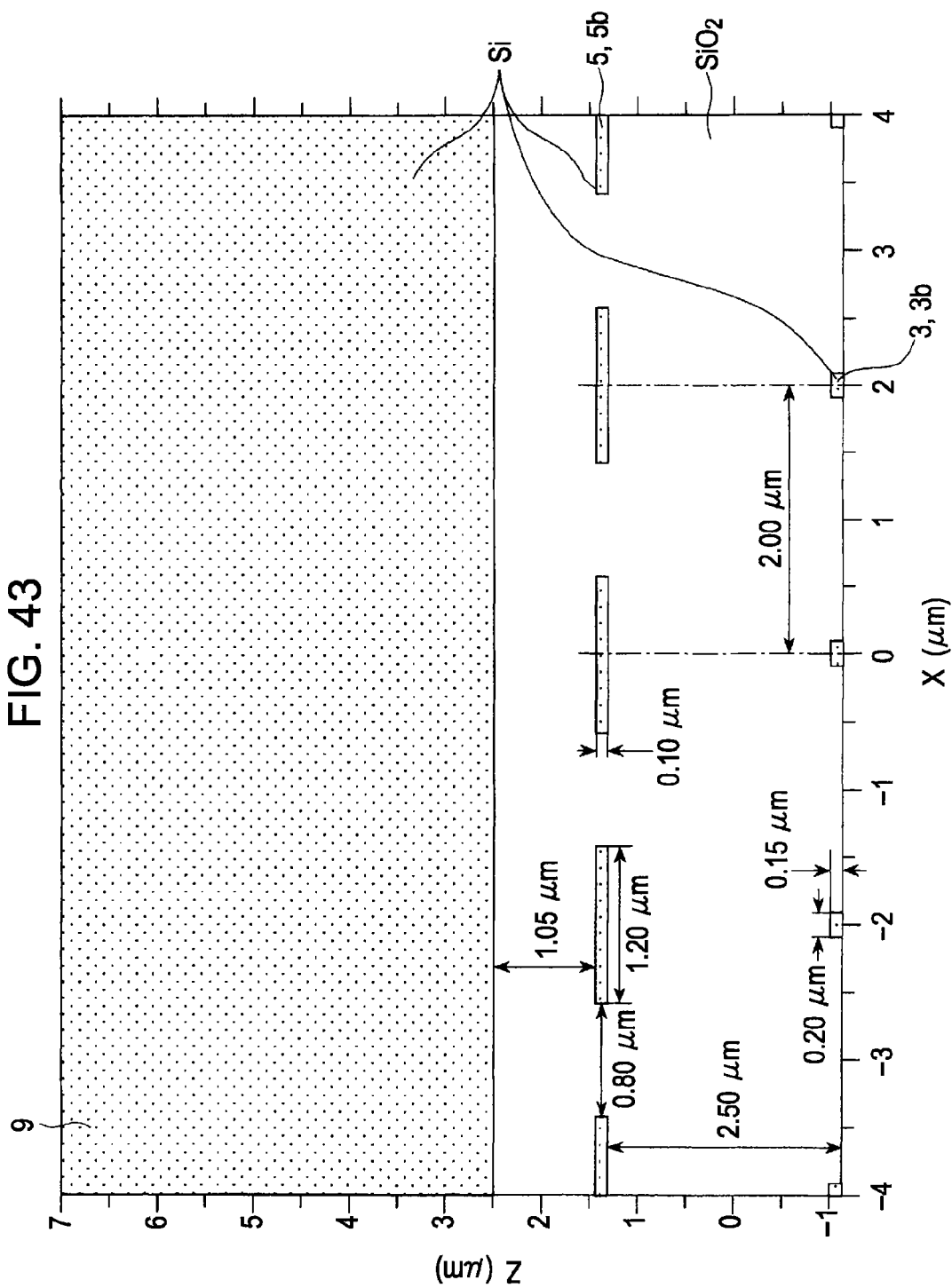
FIG. 43 is a diagram describing another embodiment (corresponding to infrared light) of a spectral image sensor in which a diffraction grating is disposed at the incident face side of a Si substrate.

FIG. 43 is a diagram describing a demultiplexing image sensor corresponding to infrared light separation where the diffraction grating 501 is disposed at the incident face side of the Si substrate 509 (corresponding to the photodiode group 512 of the spectral image sensor 510), and illustrates the cross-sectional configuration of the spectral image sensor 511 for spectrally separating infrared light and visible light. The hatching portion illustrates a Si material, a white portion other than that portion illustrates an oxide film SiO2. With the spectral image sensor 511 according to the present embodiment, an oxide film SiO2 is formed on the Si substrate 509 as a whole.

Also, the spectral image sensor 511 according to the present embodiment for spectrally separating into two wavelength components of infrared light and visible light differs from the spectral image sensor 511 for spectrally separating the inside of a visible light band into multiple (three of blue, green, and red in the previous example) wavelength components, and has features in that the scatterers 507 are not provided between the slits 503 and the photodiode group 512.

In the case of providing no scatterer 507, green light and blue light are mixed, so when detecting visible light, an arrangement is made wherein a single photoelectric conversion device for detecting visible light is provided within the photodiode group 512 in addition to the photoelectric conversion devices for detecting infrared light, and monochrome images are obtained without spectrally separating the inside of a visible light band. In order to capture color images, color separating filters should be used, for example, subtractive filters (color separating filters) of red, green, and blue for separating visible light into each of the three-primary-color light of blue, green, and red are each inserted in front of each of the photoelectric conversion devices (photodetectors) for three-primary-color utilizing the same method as the past configuration.

The respective long-shaped scatterers 503 are disposed at the incident face side of the Si substrate 509 (corresponding to the photodiode group 512 ) in the lateral direction (X direction in the drawing) periodically in parallel, each of the thicknesses is 0.15 μm, the cycle of the positions of the respective scatterers 503, i.e., the interval in the lateral direction (X direction in the drawing) from the center point of the one scatterer 503 to the center point of the next scatterer 503 is 0.2 μm.

With the spectral image sensor 511, at the position of 2.50 μm in the depth direction (Z direction in the drawing) from surface thereof (the incident side of the incident light L1 of the scatterers 503) and also at the position of 1.05 μm from the Si substrate 509, i.e., between the scatterers 503 and the Si substrate 509 (corresponding to the photodiode group 512) is provided with the slits 505 having a 0.1-μm thickness and 0.80-μm slit width Ds. Consequently, the width of the light shielding portions 505b serving as portions for cutting off (shielding in the case of light) electromagnetic waves (e.g., light), which surrounds the opening portions 505a, is 1.20 μm.

With the slits 505, the opening portions 505a each having the slit width Ds are disposed in the lateral direction (X direction in the drawing) periodically in parallel, and further the opening portions 505a each having the slit width Ds are provided at the position (vertical as to the Si substrate 509 and the photodiode group 512 surface) on generally the center line CL0 passing through the center point between the scatterers 503, and disposed in parallel with the long-shaped scatterers 503. That is to say, the cycle of the opening portions 505a (the interval of the adjacent opening portions 505a) of the slits 503 and the cycle (the interval of the adjacent light shielding portions 503b) and phase of the scatterers 503 are equal, and also these are disposed in parallel.

FIG. 44 is a chart illustrating the relation between the refractive index of Si (silicon) and the wavelength dispersion of an extinction coefficient which are used for the spectral image sensor 511 corresponding to infrared light. Here, let us say that typical wavelengths of blue, green, and red are 460 nm, 540 nm, and 640 nm, respectively. Also, the refractive index dispersion of an oxide film SiO2 is extremely small, and accordingly, let us say that the refractive index of 1.4, and the extinction coefficient of 0 are applied to any wavelength.

<Simulation of Demultiplexing Technique; Infrared Light and Visible Light>

FIGS. 45 through 49 are computing simulation diagrams (the results of optical field computation using the FDTD method) describing a spectral method of infrared light and visible light when the light of each wavelength components is cast into the spectral image sensor 511 having the configuration illustrated in FIG. 43 from the light receiving face (the lower side in the drawing). In FIG. 45 through FIG. 49, the horizontal dashed line of z=2.5 μm represents the interface (sensor surface) between the photodiode group 512 and the silicon oxide film SiO2.

Figure 45:
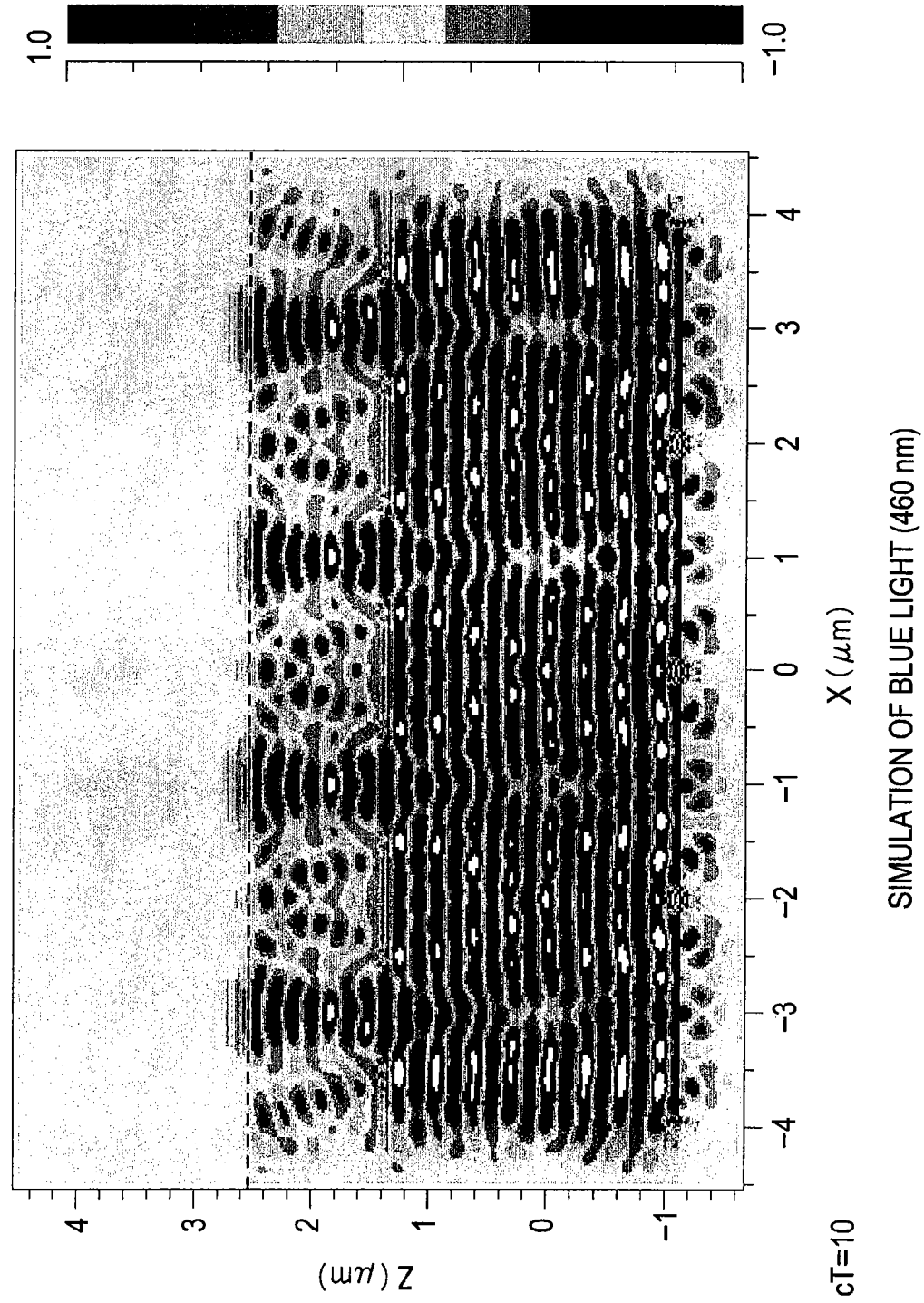
FIG. 45 is a computing simulation diagram describing a spectral method in the event that blue light (wavelength of 460 nm) is cast into the light receiving face of the spectral image sensor having the configuration illustrated in FIG. 43.
Figure 46:
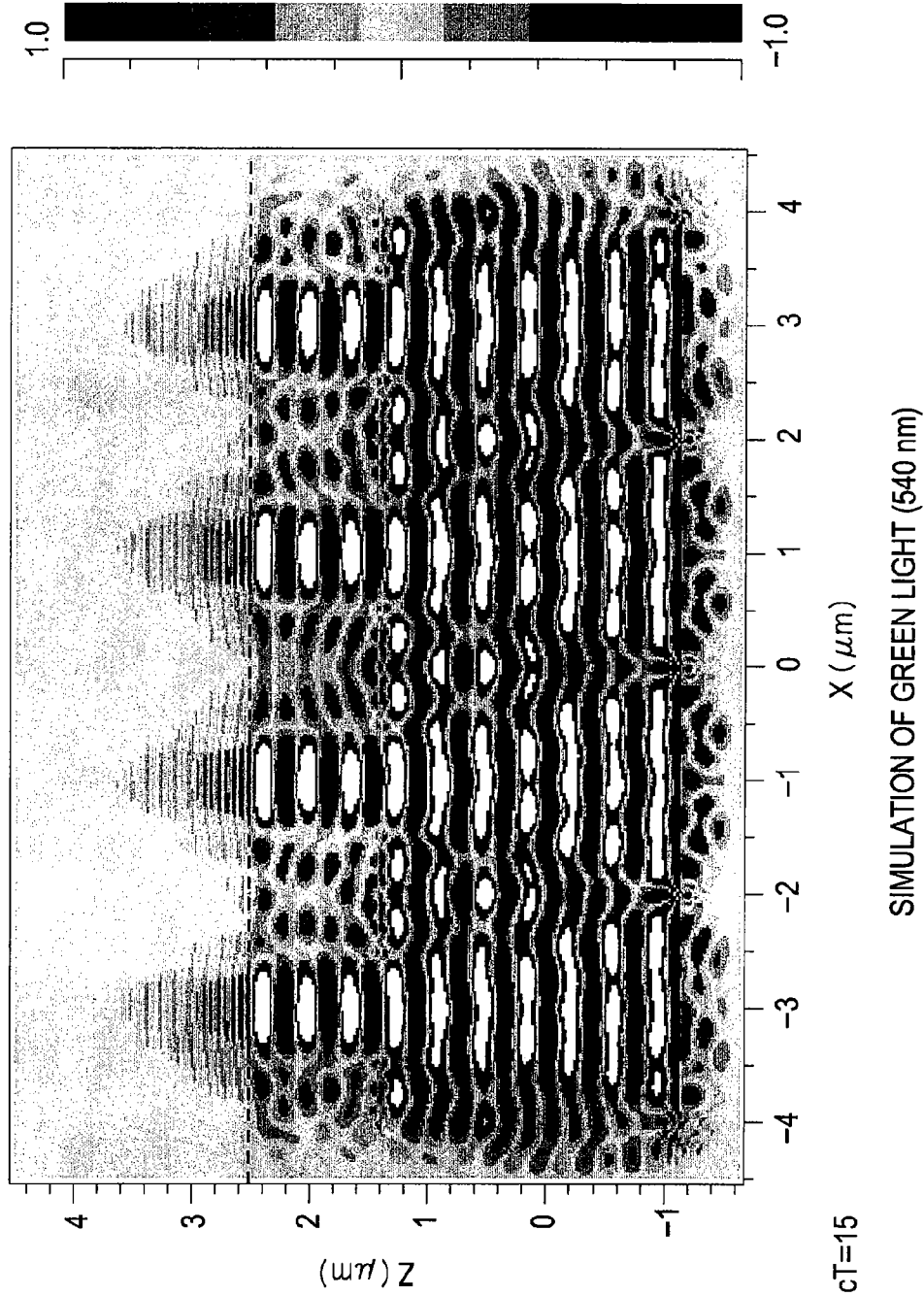
FIG. 46 is a computing simulation diagram describing a spectral method in the event that green light (wavelength of 540 nm) is cast into the light receiving face of the spectral image sensor having the configuration illustrated in FIG. 43.
Figure 47:
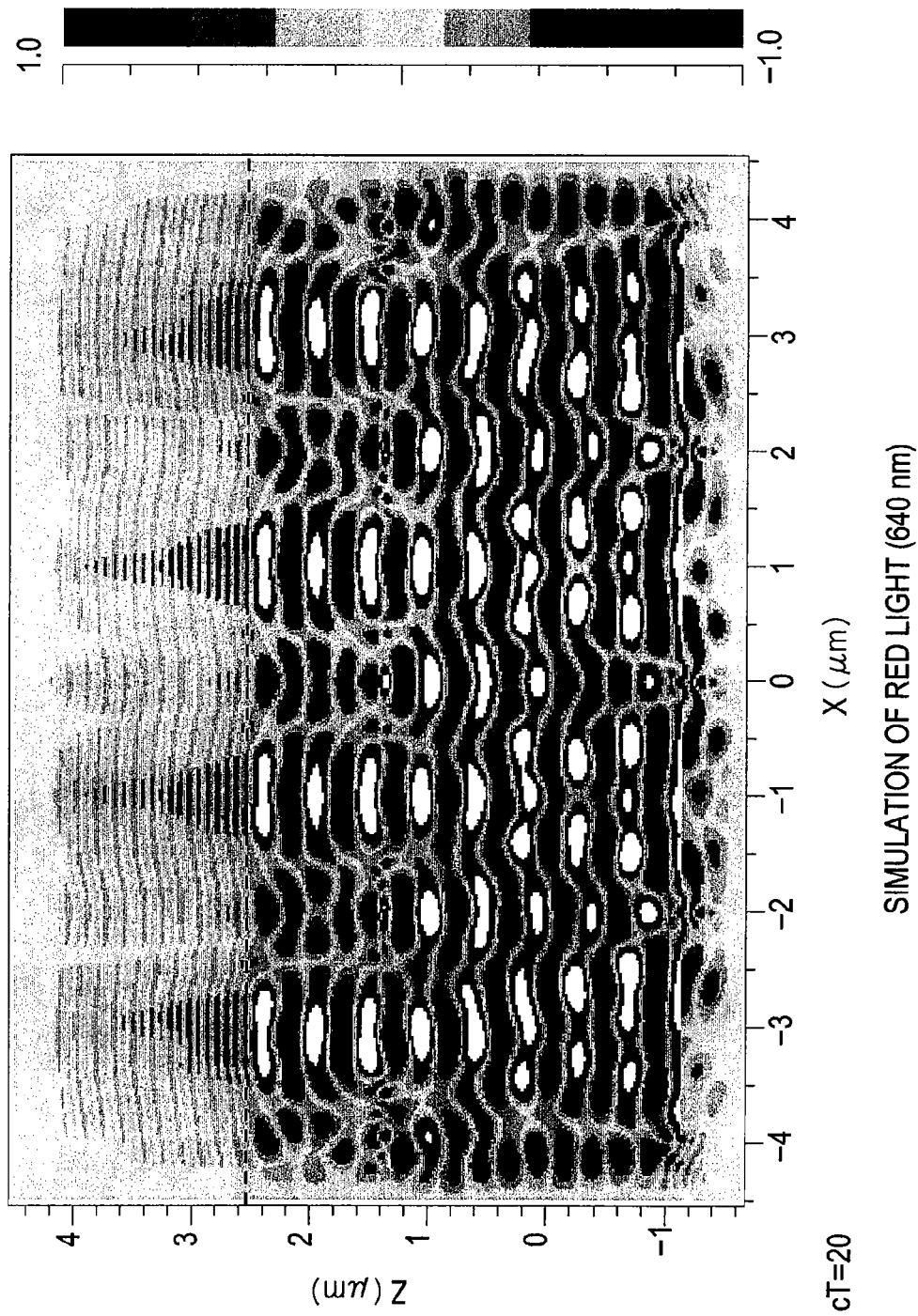
FIG. 47 is a computing simulation diagram describing a spectral method in the event that red light (wavelength of 640 nm) is cast into the light receiving face of the spectral image sensor having the configuration illustrated in FIG. 43.

Here, FIG. 45 is a computing simulation result when casting blue light (wavelength of 460 nm), FIG. 46 is when casting green light (wavelength of 540 nm), and FIG. 47 is when casting red light (wavelength of 640 nm), respectively. It can be understood from these drawings that with regard to visible light (any of blue light, green light, and red light), light intensity is strong at the positions of X=−3.0, −1.0, 1.0, and 3.0 μm up to Z=2.5 through 3.5 μm (depth of 1.0 μm from the surface of the photodiode group 512), i.e., near the sensor surface through a somewhat deep region.

Figure 48:
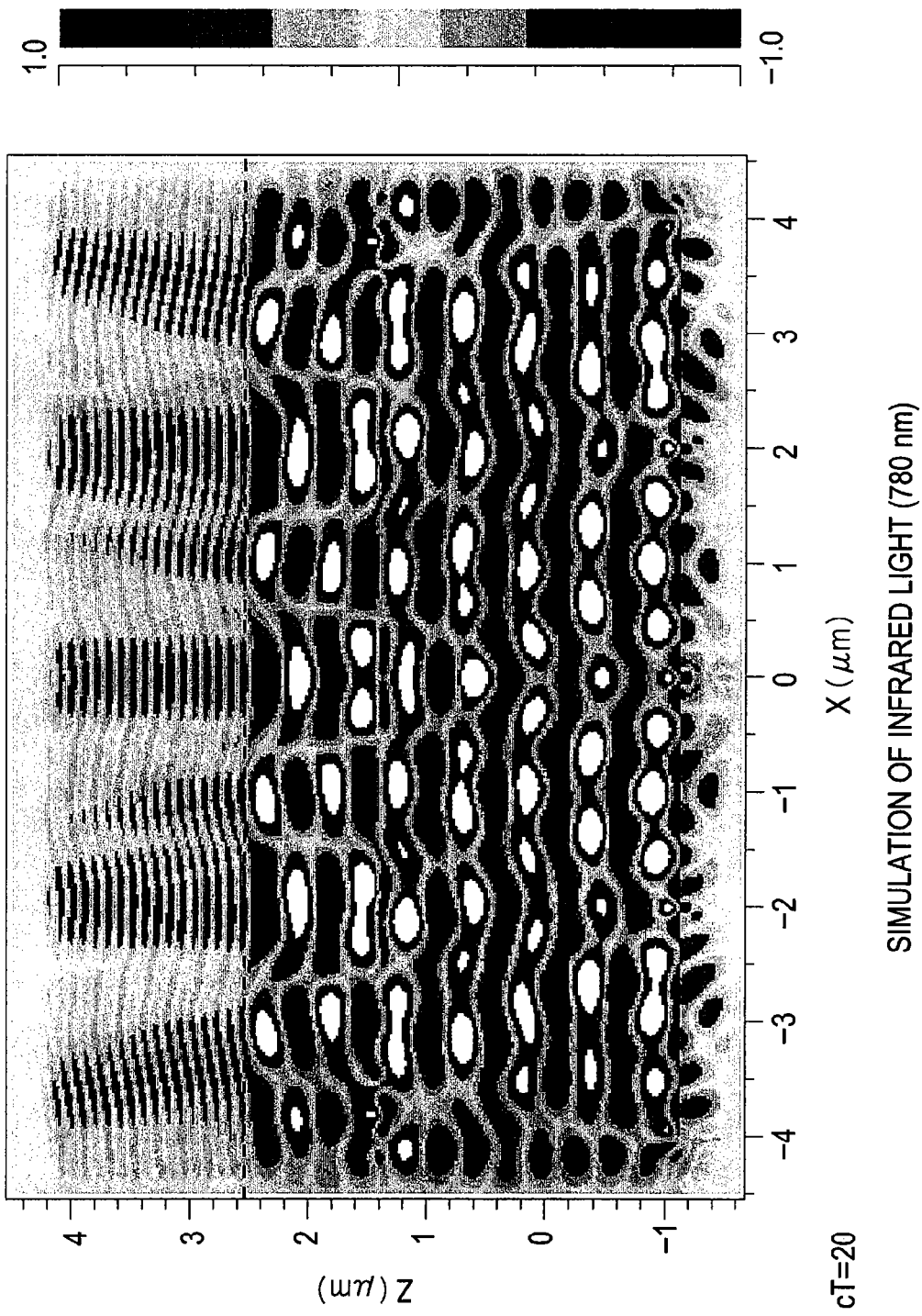
FIG. 48 is a computing simulation diagram describing a spectral method in the event that infrared light (wavelength of 780 nm) is cast into the light receiving face of the spectral image sensor having the configuration illustrated in FIG. 43.
Figure 49:
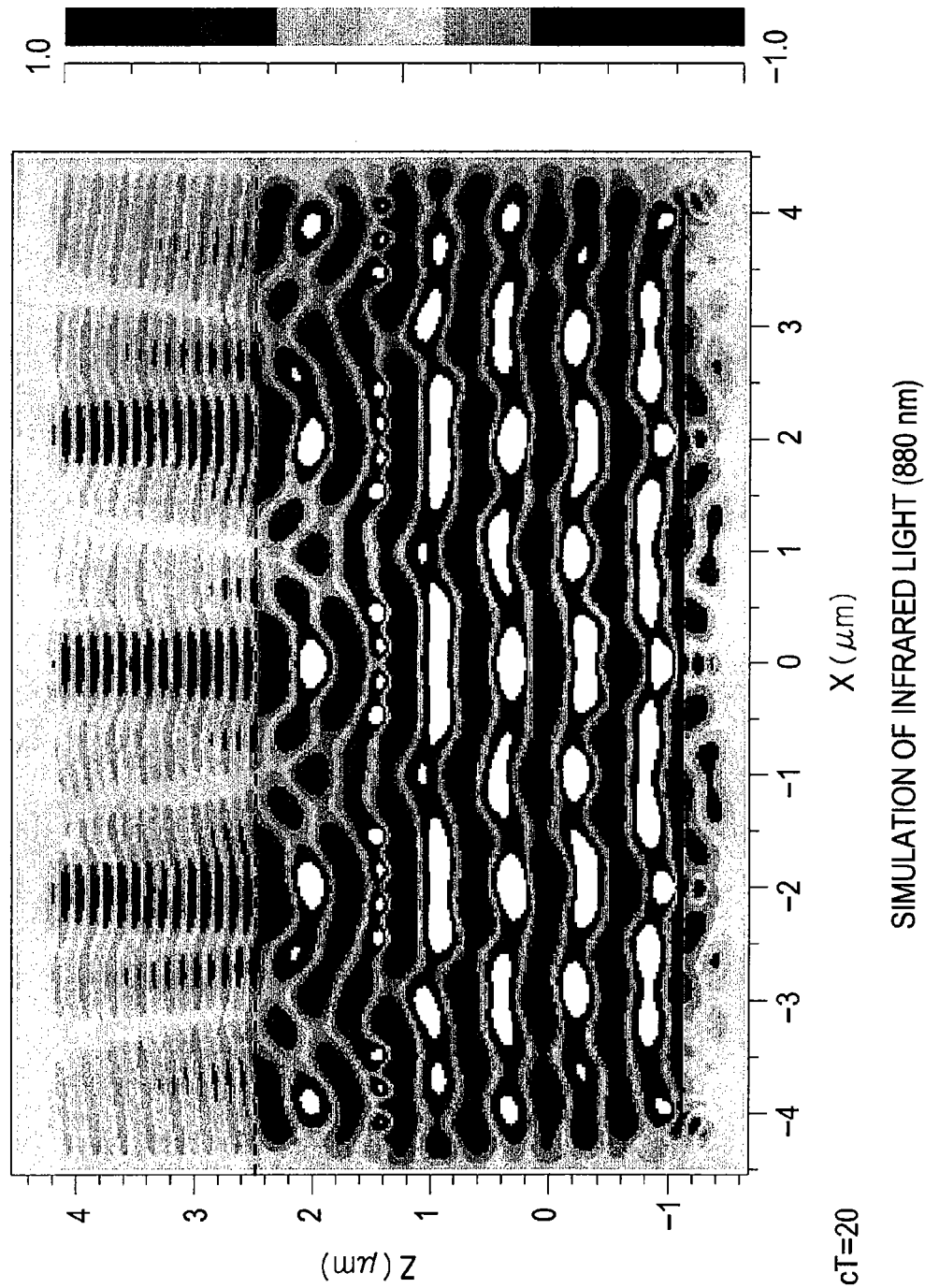
FIG. 49 is a computing simulation diagram describing a spectral method in the event that infrared light (wavelength of 880 nm) is cast into the light receiving face of the spectral image sensor having the configuration illustrated in FIG. 43.

Also, FIG. 48 is a computing simulation result when casting infrared light (wavelength of 780 nm), and FIG. 49 is when casting infrared light (wavelength of 880 nm), respectively. Here, a wavelength of 780 nm is around the interface between visible light and infrared light. It can be understood from FIG. 49 that with regard to infrared light (wavelength of 880 nm), light intensity is strong at the positions of X=−2.0, 0, and 2.0 μm up to Z=2.5 through 4.5 μm (depth of 2.0 μm from the surface of the photodiode group 512), i.e., near the sensor surface through a somewhat deep region.

That is to say, it can be understood that with the relation between visible light (blue light, green light, and red light) and infrared light included in the incident light L1, visible light and infrared light are cast into the spectral image sensor 511 illustrated in FIG. 43, thereby exhibiting place dependency depending on a wavelength in the width direction (X direction in the drawing), and also exhibiting place dependency depending on a wavelength in the depth direction.

It can be understood that in FIG. 49 illustrating a wavelength of 780 nm which is around the interface between visible light and infrared light, light intensity is strong at the positions of X=−3.0, −2.0, −1.0, 0, 1.0, 2.0, and 3.0 μm up to Z=2.5 through 4.5 μm (depth of 2.0 μm from the surface of the photodiode group 512), i.e., near the sensor surface through a somewhat deep region. That is to say, both properties of FIGS. 45 through 47 illustrating visible light (blue light, green light, and red light), and FIG. 49 illustrating infrared light (wavelength of 880 nm) are exhibited.

<Appropriate Example of Detection Position; Infrared Light and Visible Light>

Figure 50:
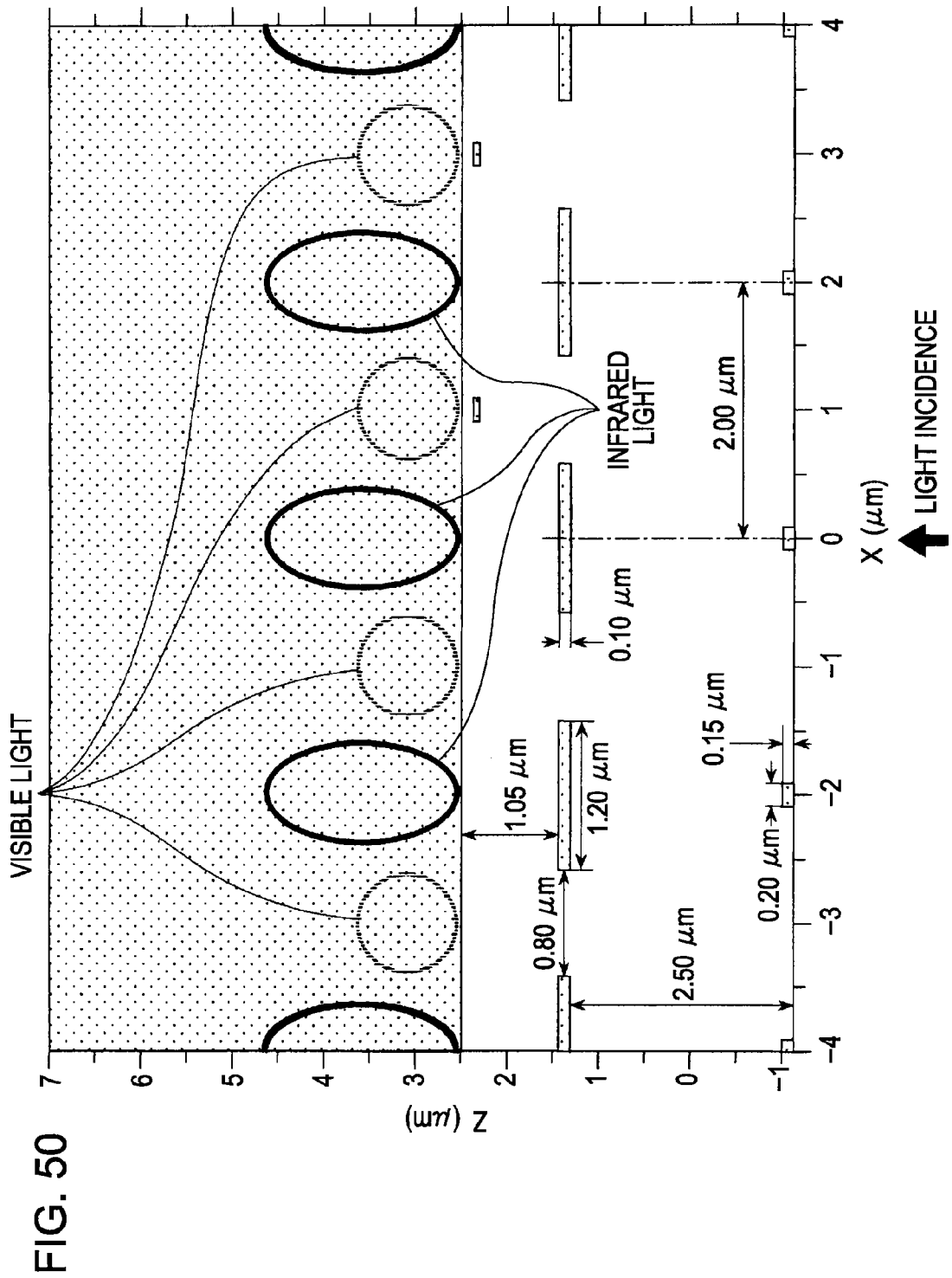
FIG. 50 is a diagram describing an appropriate example of a detection position in dispersion of light between visible light and infrared light based on simulation results.

FIG. 50 is a diagram describing an appropriate example of a detection position in spectral separation of light between visible light and infrared light based on the above simulation results.

For example, upon configuring a spectral image sensor 511 so as to detect light at areas such as examples illustrated in FIG. 50, a visible light band made up of three primary colors of red, green, and blue, and infrared light (wavelength of 880 nm) can be spectrally separated and detected.

That is to say, it is desirable to detect visible light (blue light of a wavelength of 460 nm, green light of a wavelength of 540 nm, and red light of a wavelength of 640 nm) at X=−3.0, −1.0, 1.0, and 3.0 μm in Z=2.5 through 3.5 μm (the depth of 1.0 μm from the surface of the photodiode group 512 ), and detect infrared light (wavelength of 880 nm) at X=−2.0, 0, 2.0 μm in Z=2.5 through 4.5 μm (the depth of 2.0 μm from the surface of the photodiode group 512).

That is to say, it is desirable to set the maximum depth of pn junction in a range of each Z direction. Specifically, the maximum depth of a pn junction portion making up a photoelectric conversion device 12W for visible light is arranged to be set in a range of a depth of 1.0 μm from the surface of the photodiode group 512, and the maximum depth of a pn junction portion making up a photoelectric conversion device 12IR for infrared light is arranged to be set in a range of a depth of 2.0 μm from the surface of the photodiode group 512, thereby improving the detection efficiency of each wavelength components.

At this time, in order to prevent color mixture among the photodiode group 512, the width in the lateral direction (X direction) of each of the photodiode group 512 is preferably the interval of 2.0 μm or less in the lateral direction (X direction in the drawing) of each of the scatterers 503. Also, the width in the lateral direction (X direction) of a pn junction portion making up a photoelectric conversion device by wavelength (visible light and infrared light) to be provided within the photodiode group 512 is preferably 1.0 μm or less, further preferably 0.3 μm or less. These values are values which facilitates mass production in a semiconductor process.

Here, the lateral width of a pn junction portion is set to 0.5 μm based on the maximum value from 2.0 μm /2=1.0 μm in the case of considering two spectral separations of infrared light and visible light. Further, 0.3 μm is set assuming that this value is mass-producible corresponding to the current 0.25 μm process. Upon taking into consideration in that this size is 0.5 μm in the event of spectrally separating only the inside of a visible light band, it is generally desirable to set this size to 0.5 (when a visible light band alone) through 1.0 (when corresponding to infrared light) μm or less.

<Sensor Configuration Corresponding to Infrared Light Detection Position>

Figure 51:
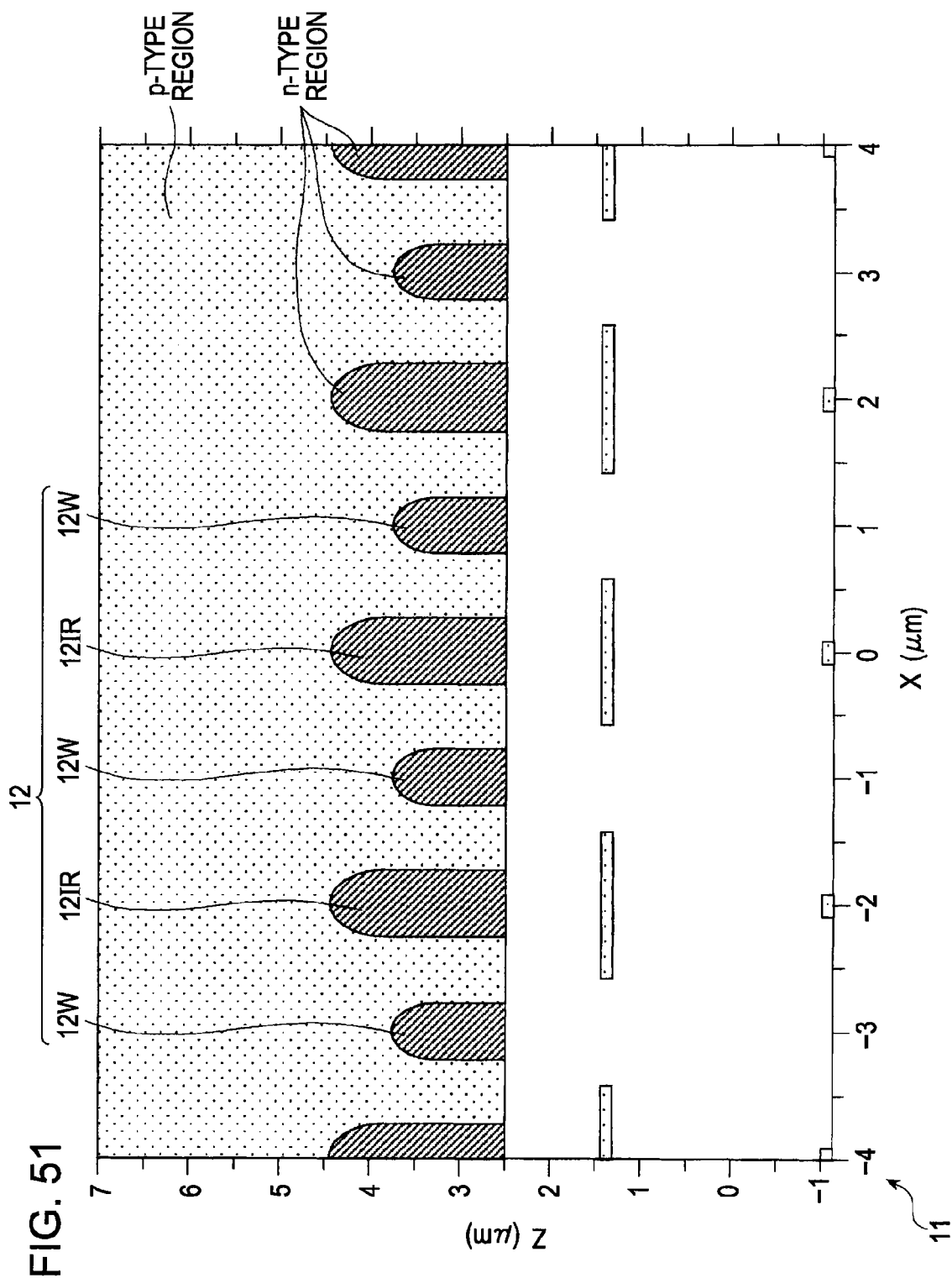
FIG. 51 is a cross-sectional view illustrating one configuration example of a sensor configuration corresponding to infrared light corresponding to the detection position in FIG. 50.

FIG. 51 is a cross-sectional view illustrating one configuration example of a sensor configuration corresponding to infrared light corresponding to the detection position in FIG. 50. This spectral image sensor 511 dopes n-type impurities at the respective detection positions in the width direction (X direction in the drawing) and in the depth direction (Z direction in the drawing) corresponding to each of visible light (blue light, green light, and red light) and infrared light for each of the photodiode group 512 within the p-type Si substrate 509.

Thus, an n-type Si region 591 for each of visible light and infrared light is formed, where photoelectric conversion devices (photodiodes) 512W and 512IR for each wavelength component are provided. The photoelectric conversion devices 512W and 512IR have a configuration wherein visible light, infrared light, visible light, infrared light, and so on are arrayed in the lateral direction (X direction) in this sequence even at the light receiving face side of the Si substrate 509, and also even within the Si substrate 509.

Here, electrons and positive holes are generated by light being absorbed at a depletion layer around the interface between the n-type and p-type Si semiconductors, and also signal electric charge is pooled by the interface of a depletion layer moving electrons and positive holes to the n-type and p-type semiconductors respectively. This signal electric charge can be detected as an electric signal by being read out from each of the photoelectric conversion devices 512W and 512IR.

That is to say, with each of the photodiode group 512, detection regions for detecting visible light and infrared light independently are provided at each of the detection positions in the width direction (X direction in the drawing) and in the depth direction (Z direction in the drawing). According to such a configuration, it is unnecessary to use an infrared light cut filter such as employed for a common image sensor (or a ratio to cut infrared light can be reduced), thereby increasing the amount of light to be cast in per unit area. Accordingly, conversion efficiency between light and an electric signal improves, whereby high sensitivity properties can be also obtained regarding visible light. In addition, it is unnecessary to use an infrared light cut filter, thereby realizing low costs.

This configuration is a configuration wherein the one photodiode group 512 detects visible light (blue light, green light, and red light) and infrared light independently, so one unit of wavelength spectral separation (wavelength spectral separation units) can be realized by the one photodiode group 512 making up one pixel. That is to say, this configuration is substantially a configuration wherein photoelectric conversion devices are formed by wavelength within the photodiode group 512, so it is not necessary to prepare the photodiode group 512 corresponding to pixels by wavelength such as for visible light and for infrared light.

Accordingly, this configuration needs only the one photodiode group 512 per one wavelength spectral separation unit, whereby a monochrome image using visible light and an infrared image using infrared light can be captured simultaneously. Thus, the position of the emitting light point of infrared rays is prepared beforehand to trace this, whereby the position of the emitting light point of infrared light present within a visible light image (monochrome image) can be detected.

Also, for example, if primary-color filters of R, G, and B are provided, color signals of R, G, and B can be obtained according to a filter color from the photoelectric conversion device 512W, and consequently, a visible light color image can be obtained.

Note that the photoelectric conversion device 512IR serving as an infrared light image capturing region also serves as a correction pixel as to the visible light image obtained from the photoelectric conversion device 512W serving as a visible light image capturing region. Also, upon a pixel including no color separating filter (here, photodiode group 512) being provided, this pixel can be taken as a pixel for detecting the entire wavelength components from visible light to infrared light, and also can be used as a correction pixel as to the visible light image obtained from a pixel including another color separating filter (here, photodiode group 512).

Note that upon the scatterers 507 being disposed between the slits 503 and the light receiving face of the photodiode group 512, green light and blue light can be effectively spectrally separated. Accordingly, in addition to the photoelectric conversion device 12IR for detecting infrared light, instead of the photoelectric conversion device 12W, upon separate photoelectric conversion devices 512B, 512G, and 512R for receiving blue light and green light within a visible light band and red light being provided, a color image using visible light having an exact tone, and an image using infrared light can be captured by one image sensor simultaneously.

However, wavelength separation properties thereof are not always sufficient, the spectral performance of each of red, green, and blue is inferior to the case of the light inside of a visible light band being spectrally separated into three primary colors of red, green, and blue, and accordingly, color separating filters are preferably employed in the case of emphasis being put on color reproducibility.

However, upon three primary colors of red, green, and blue being spectrally separated even if only slightly, an advantage wherein not a complete monochrome image but a color image can be reproduced can be obtained. Accordingly, even in the case of corresponding to infrared light, upon the scatterers 507 being disposed between the sensor surface and the slits 505, and also the maximum depth of pn junction being set to an appropriate range in each Z direction which can spectrally separate and detect the three primary colors of red, green, and blue, not only infrared light and visible light are simply separated, but also the light within a visible light band can be separated into the three primary color components of red, green, and blue, and accordingly, the detection efficiency of each color improves. Spectral separation of red, green, and blue within a visible light band and spectral separation of infrared light can be realized simultaneously.

<Image Capturing Device; Third Embodiment Utilizing the Wavelength Dependency of an Absorption Coefficient in the Depth Direction>

Figure 52A:
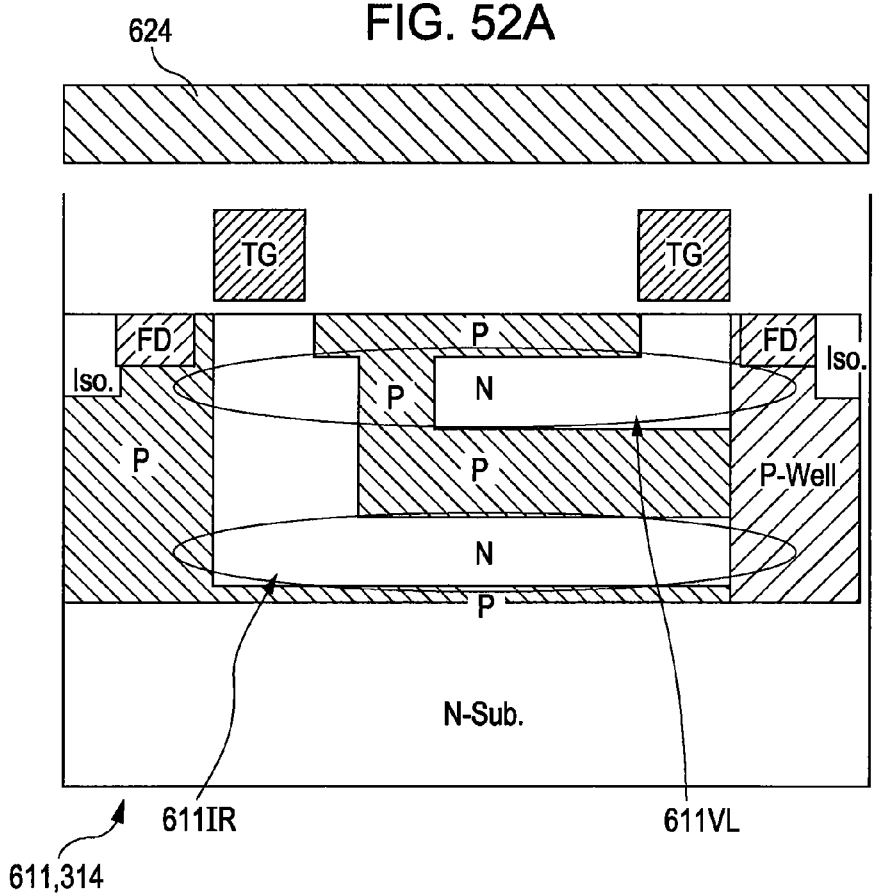
FIGS. 52A and 52B are diagrams for describing a third embodiment of a solid state image capturing device.
Figure 52B:
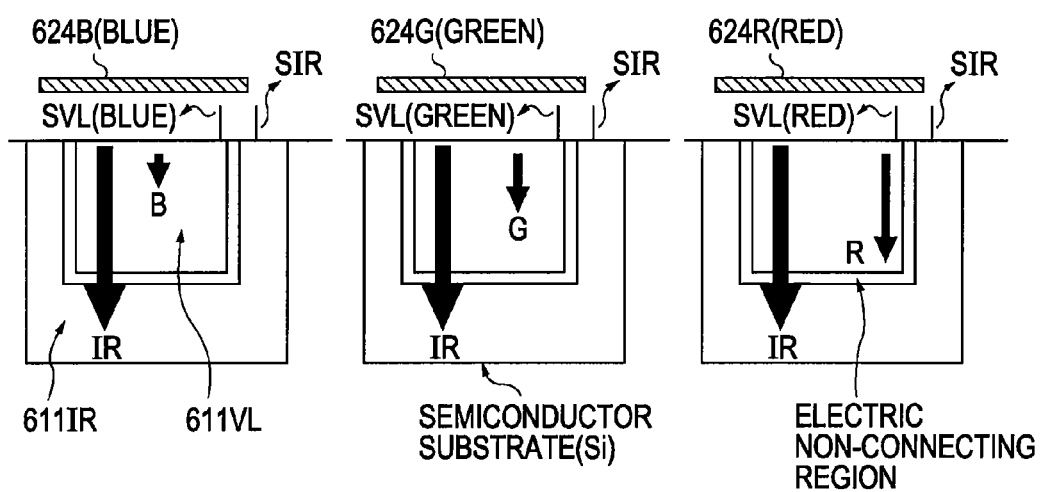

FIGS. 52A and 52B are diagrams for describing a third embodiment of the solid state image capturing device 314. The solid state image capturing device 314 according to the third embodiment is, as with the arrangements described in U.S. Pat. No. 5,965,875, and Japanese Unexamined Patent Application Publication No. 2004-103964, a single-plate type utilizing the difference of absorption coefficients based on wavelengths in the depth direction of a semiconductor.

Specifically, as the configuration of one pixel worth is illustrated in FIGS. 52A and 52B, the present embodiment employs a solid state image capturing device (image sensor) 611 having a configuration wherein a visible light image and an infrared light image are separated and obtained by utilizing the difference of absorption coefficients based on wavelengths in the depth direction of a semiconductor. That is to say, the present embodiment employs an image sensor which can detect the wavelength components which are the original detection target (infrared light IR components in the present example) while suppressing influence of the wavelength components other than the original detection target (visible light VL components in the present example) by utilizing the difference of absorption coefficients depending on a depth and a wavelength.

That is to say, in the case of employing an image sensor having a configuration utilizing the difference of absorption coefficients depending on a wavelength in the depth direction of a semiconductor substrate, as for one example, electrons subjected to photoelectric conversion using the visible light VL of less than 780 nm are absorbed at a relatively shallow portion through a depth of around 5 μm (visible light detection region 611VL) in the depth direction of the silicon (Si) substrate. Thus, upon employing an arrangement for detecting a signal obtained at the visible light detection region 611VL which is shallower than around 5 μm, an electric signal regarding visible light components can be obtained.

The remaining light components, i.e., the electrons subjected to photoelectric conversion using the infrared light IR of which wavelength is 780 nm or more are absorbed by a region (infrared light detection region 611IR) which is deeper than 5 μm. An electric non-contact region is provided at the interface portion of both detection regions. Thus, upon employing an arrangement for detecting a signal obtained at the infrared light detection region 611IR which is deeper than 5 μm, an electric signal of infrared light components can be obtained. That is to say, the signal components of the visible light VL (e.g., a wavelength of 780 nm or more) to be subjected to photoelectric conversion at a shallow region of a semiconductor layer are eliminated, and only the infrared IR (e.g., a wavelength of 780 nm or more) components to be subjected to photoelectric conversion at a deep region of the semiconductor layer are utilized, thereby obtaining the electric signal of only the incident infrared light IR components.

Thus, with the infrared light detection region 611IR, an infrared light image which receives almost no influence of the visible light VL can be obtained. Also, a signal obtained at a relatively shallow portion through a region having a depth of around 5 μm is detected, whereby the electric signal of visible light components can be obtained even at the visible light detection region 611VL.

Thus, only the photoelectrons made up of incident visible light components alone are converted into the visible light image capturing signal SVL to obtain a visible light image which receives almost no influence of the infrared light IR, and also only the photoelectrons made up of incident infrared light components alone are converted into the infrared light image capturing signal SIR to obtain an infrared light image which receives almost no influence of the visible light VL simultaneously and also independently.

Also, as illustrated in FIG. 52B, in order to capture a visible light color image, light receiving face thereof is provided with the color separating filter 624 of a predetermined color (e.g., any of 624R, 624G, and 624B) corresponding to each light receiving portion (pixel). Upon utilizing the difference of absorption coefficients depending on a wavelength in the depth direction of the semiconductor substrate, wavelength separation of R, G, and B can be performed even at a relatively shallow portion of the visible light detection region 611VL, but actually, separation performance is not so good, and in the event of emphasis being put on color reproducibility, color separating filters are preferably employed.

Thus, only the photoelectrons made up of incident visible light components alone are converted into the visible light image capturing signal SVL to obtain a visible light color image which receives almost no influence of the infrared light IR, and also only the photoelectrons made up of incident infrared light components alone are converted into the infrared light image capturing signal SIR to obtain an infrared light image which receives almost no influence of the visible light VL simultaneously and also independently.

Note that an infrared light detection region 611IR of which pixel including the color separating filter 424 is relatively deep also serves as a correction pixel as to an visible color image to be obtained from the relatively shallow visible light detection region 611Vl. Also, upon a pixel including no color separating filter 424 being provided, this pixel can be taken as a pixel for detecting the entire wavelength components from visible light to infrared light, and also can be used as a correction pixel as to the visible light image to be obtained from a pixel including another color separating filter 424.

<Issue Due to Infrared Light Mixture>

As described above, description has been made regarding a configuration example of the solid state image capturing device 314 having various types of configuration, but any of those includes a problem wherein infrared light components result in being mixed into visible light components, and being filtered in the detection portion, an infrared signal results in being added to signal intensity representing a visible light image, and consequently, the color reproducibility of a visible light color image deteriorates. For example, with the arrangement utilizing a dielectric layered film, advanced features such as high sensitivity, infrared communication function, and so forth can be realized by taking in infrared light and visible light images simultaneously, but unless infrared light is completely reflected in the case of the pixel of an RGB primary-color filter or CyMgYe complementary-color filter serving as visible light, a part of infrared light is filtered in the detection portion, and an infrared signal is added to signal intensity to deteriorate color reproducibility. Description will be made below regarding this point.

FIG. 53 illustrates the spectral image sensor 11 having the same configuration as the spectral image sensor 11 having a dielectric multi-layered film configuration illustrated in FIG. 36 (this configuration is designed such that the reflection of near-infrared light improves), but the thickness of the dielectric layer 1_k of the k'th layer is changed to 3.2 μm, and the reflected center wavelength λ0 of the infrared light IR is not set to 852 nm but is changed to 770 nm at a lower side.

Figure 54:
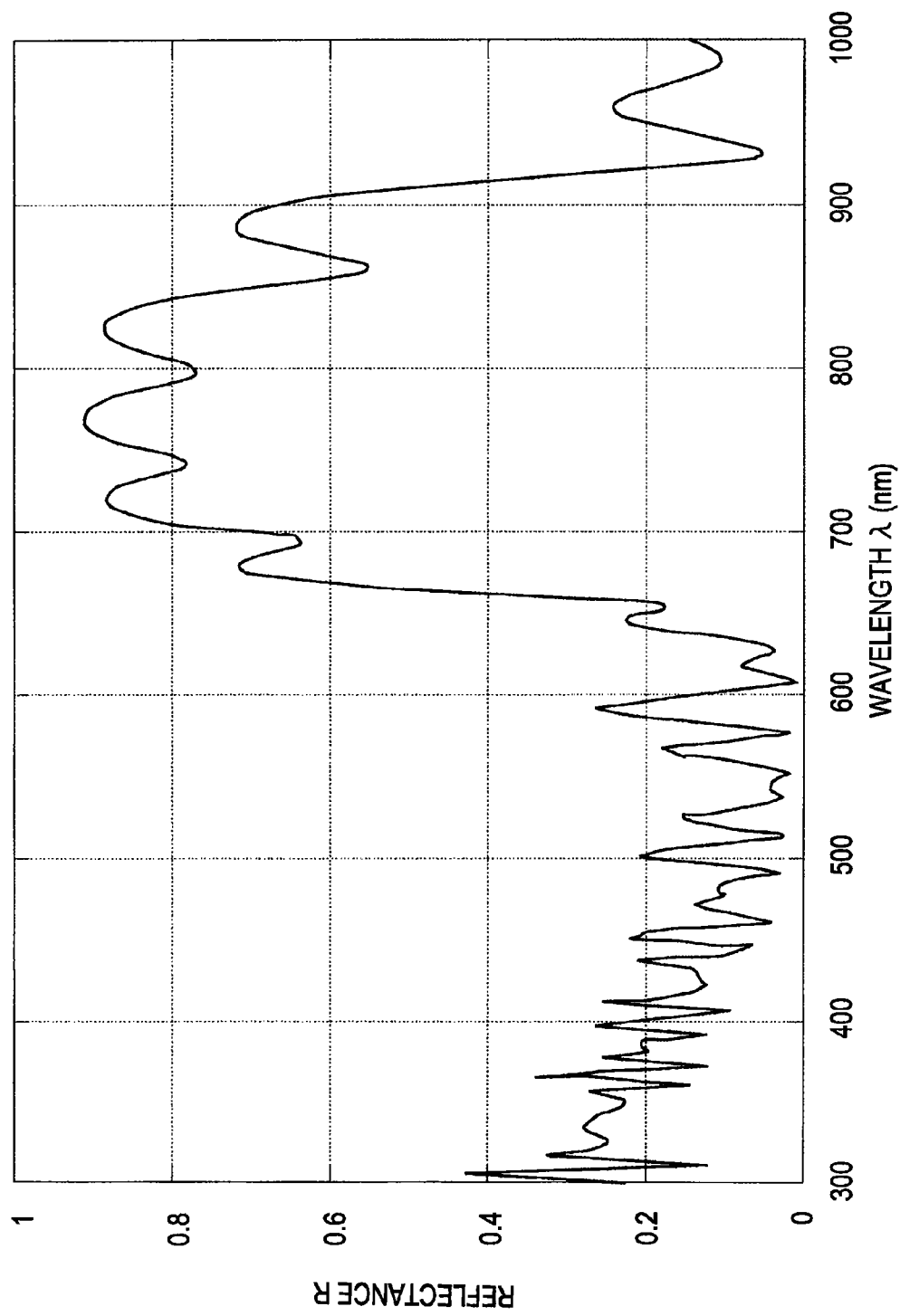
FIG. 54 is a diagram (part two) describing a problem wherein infrared light components are mixed in visible light components.

FIG. 54 is a diagram illustrating the estimation results by computing the reflectance spectrum when light is cast in from the vertical direction using the effective Fresnel-coefficient method with the spectral image sensor 11 having a dielectric multi-layered film configuration illustrated in FIG. 53. Here, the reason why a multi-layered film of SiN and SiO2 is employed is that this is a material frequently employed for a common Si family process. A transmittance spectrum is obtained by subtracting a reflectance R from 1, i.e., T=1−R.

Figure 55:
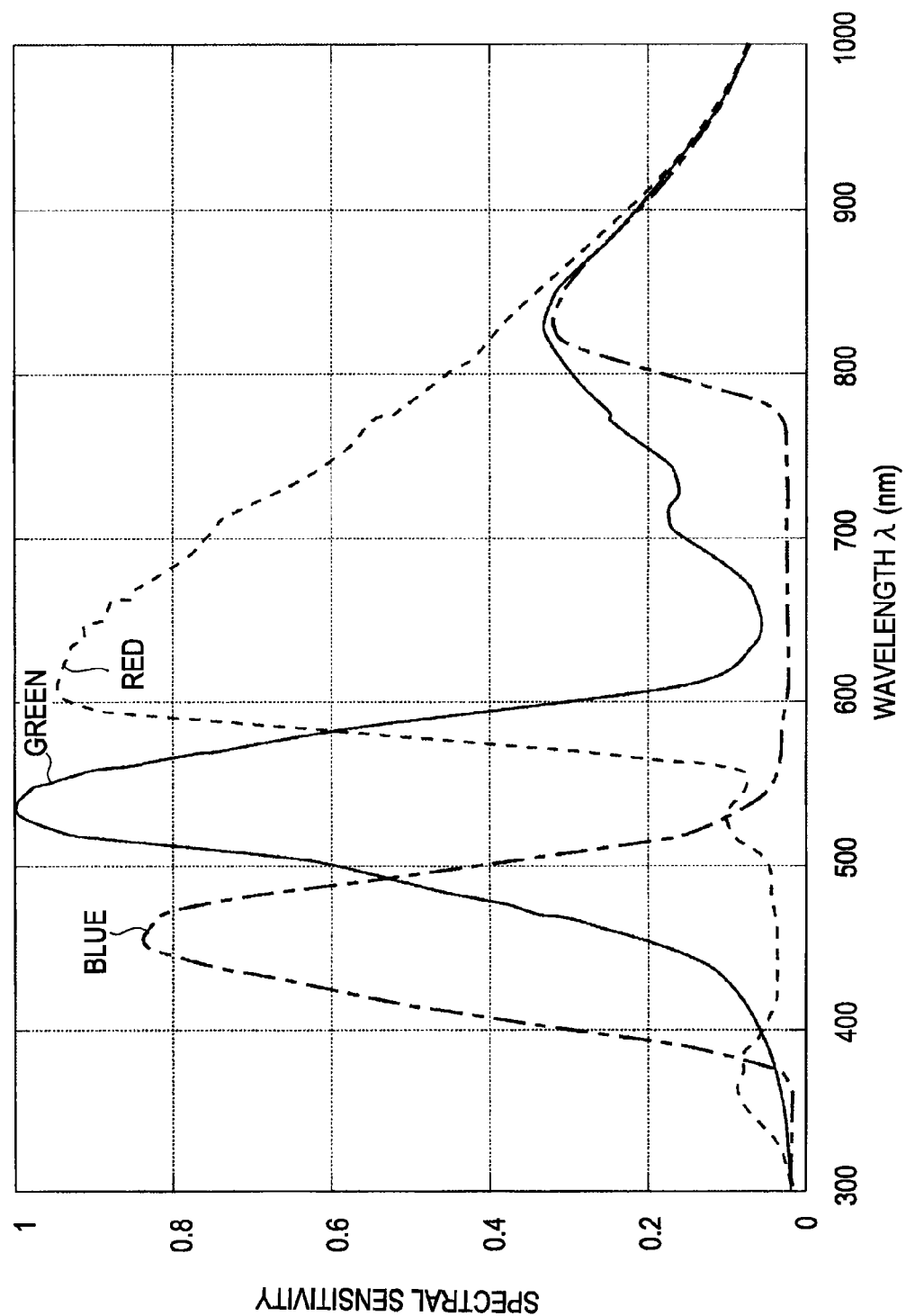
FIG. 55 is a diagram (part three) describing a problem wherein infrared light components are mixed in visible light components.
Figure 56:
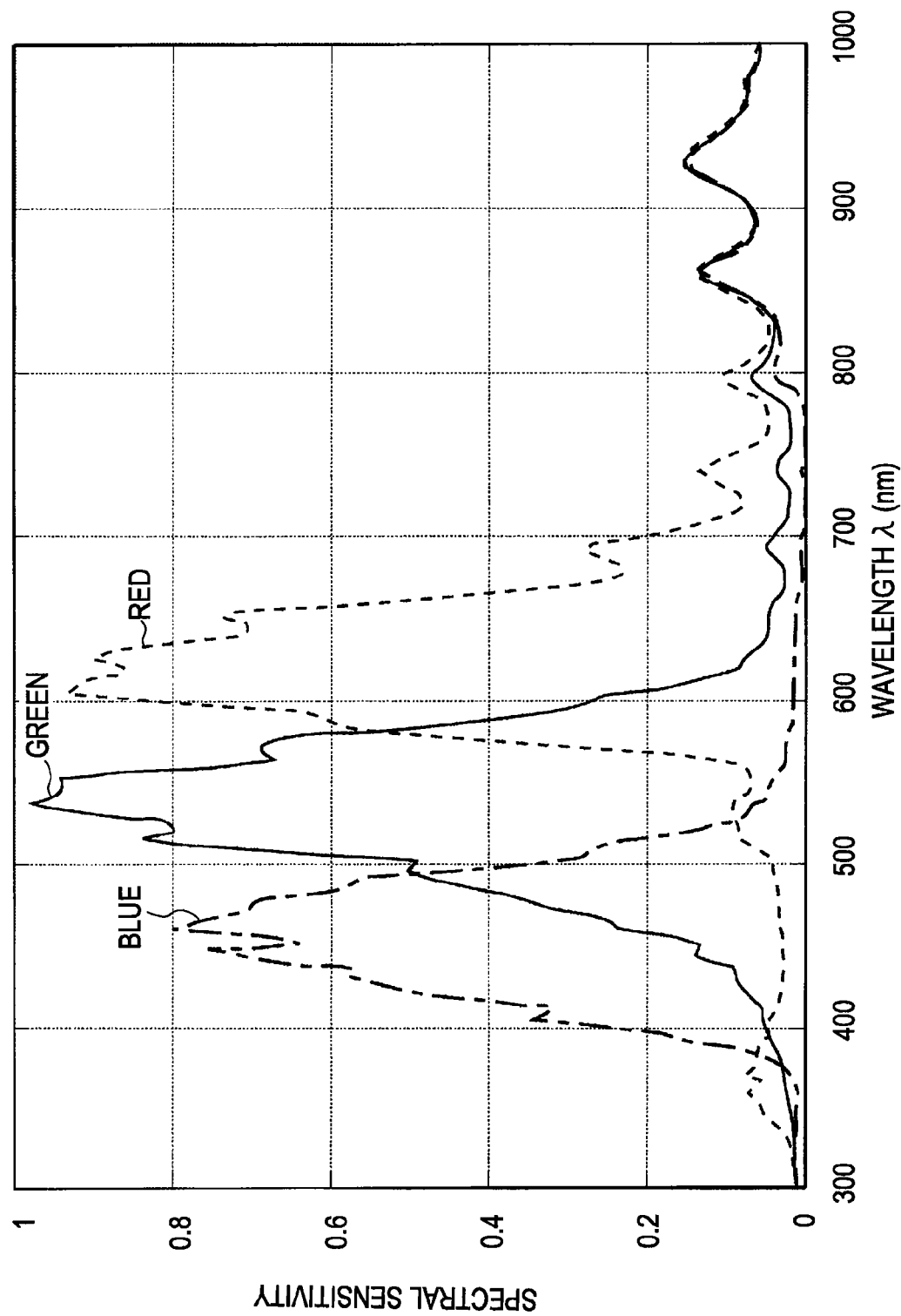
FIG. 56 is a diagram (part four) describing a problem wherein infrared light components are mixed in visible light components.

Also, FIG. 55 is a diagram illustrating the spectral sensitivity curve of a color filter commonly employed (spectral sensitivity properties diagram). FIG. 56 is a diagram illustrating one example of a spectral sensitivity curve actually obtained. The spectral sensitivity curve, which is actually obtained, illustrated in FIG. 56 is obtained by multiplying the sensitivity curve illustrated in FIG. 55 by the transmittance spectrum to be derived from the reflectance spectrum illustrated in FIG. 54. As can be understood from FIG. 56, the infrared light side of a wavelength of around 700 nm or more has spectral sensitivity of approximate 10%.

Figure 57:
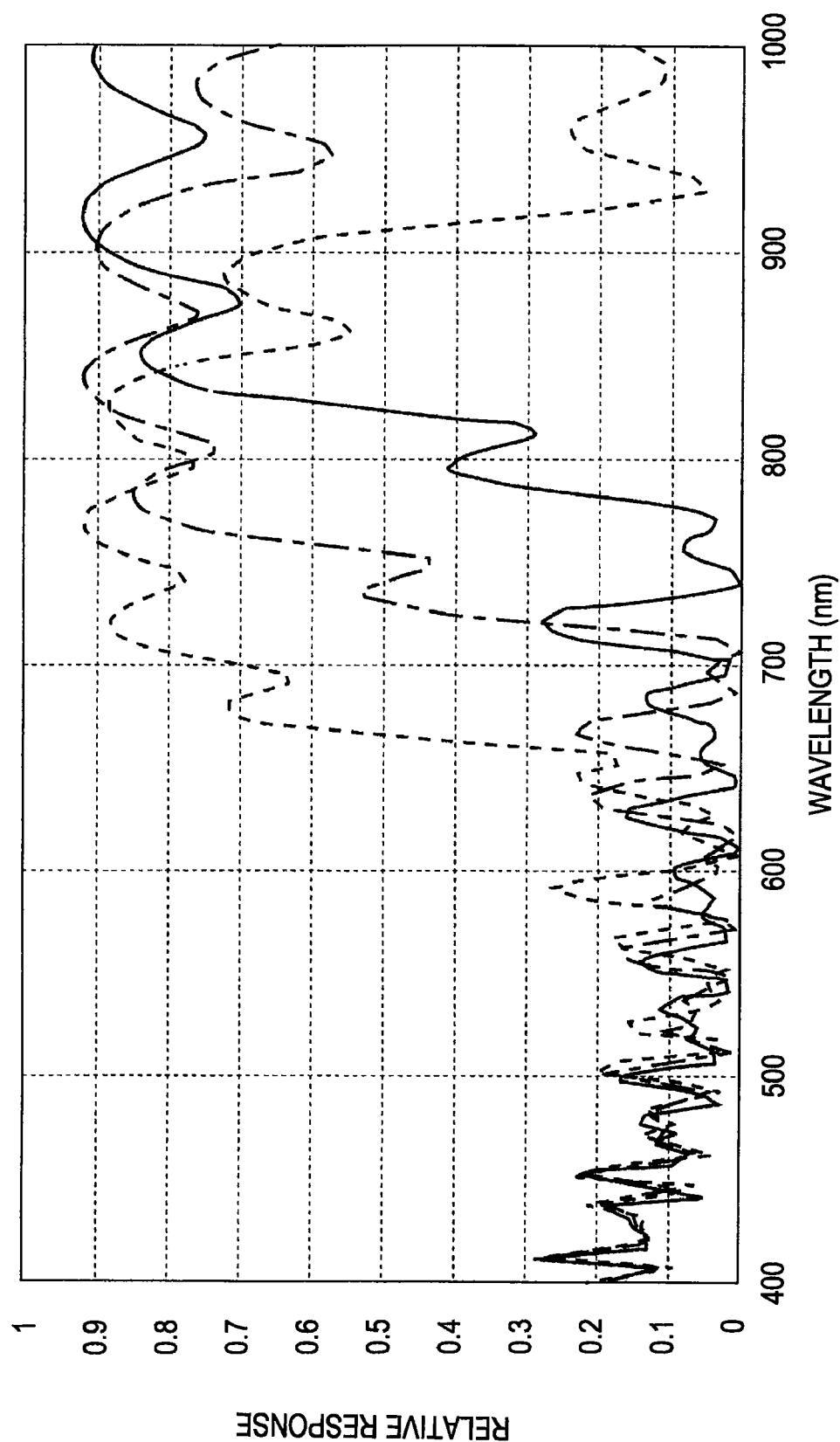
FIG. 57 is a diagram (part five) describing a problem wherein infrared light components are mixed in visible light components.

Also, FIG. 57 has the same configuration as the spectral image sensor 11 having a dielectric multi-layered film configuration (this configuration is designed so as to improve reflection of near-infrared light) illustrated in FIG. 36, as with FIG. 54, and is a diagram illustrating the results of estimating a reflectance spectrum by computation in the event that the thickness of the dielectric layer 1_k of the k'th layer is set to 3.2 μm, and the reflected center wavelength λ0 of the infrared light IR is set to 852 nm. Here, a case wherein a center condition which is a design center, and the case of the reflected center wavelength λ0 of the infrared light IR as to this center condition are set to −10% and −10%, respectively is illustrated.

Figure 58:
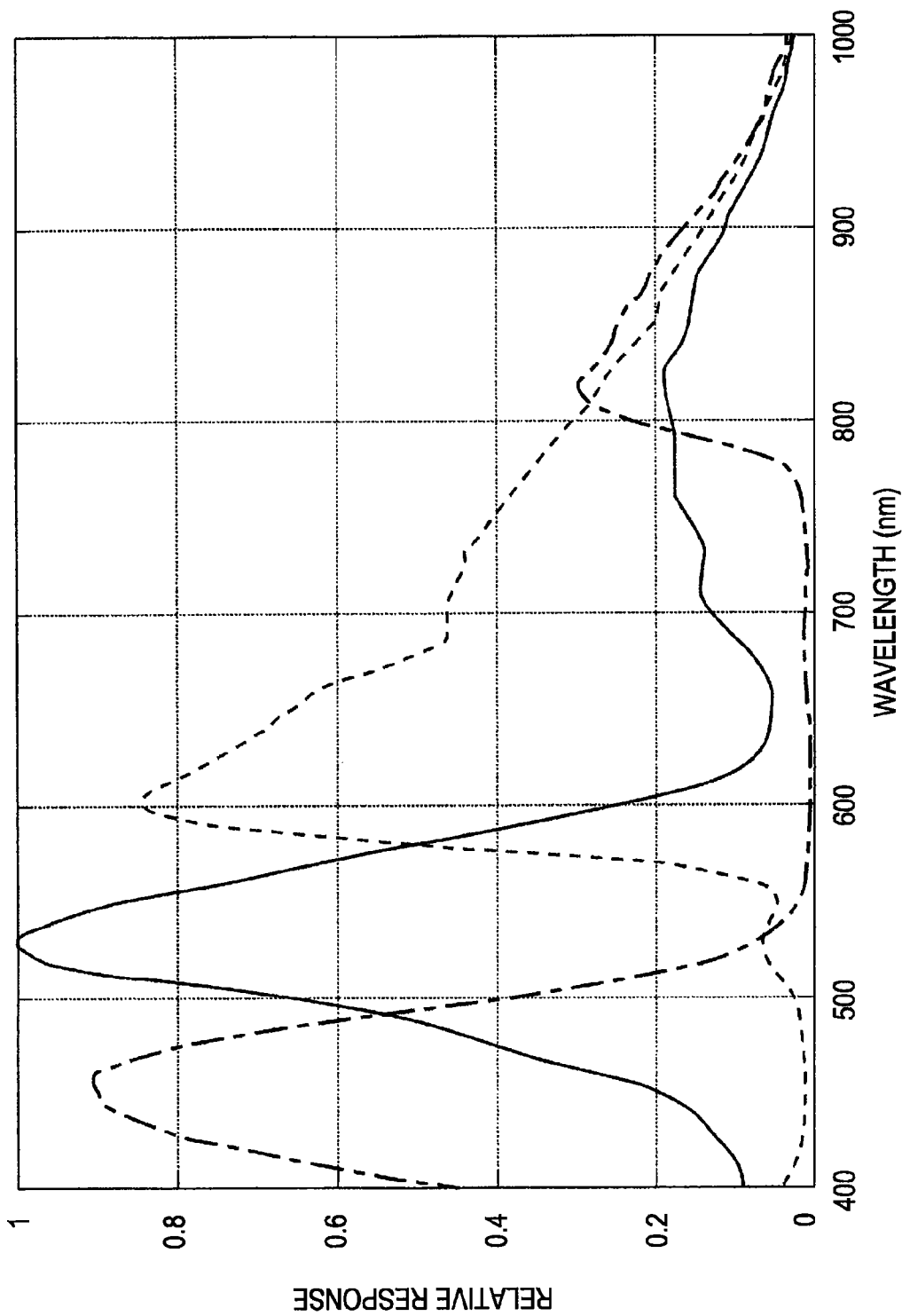
FIG. 58 is a diagram (part six) describing a problem wherein infrared light components are mixed in visible light components.
Figure 59:
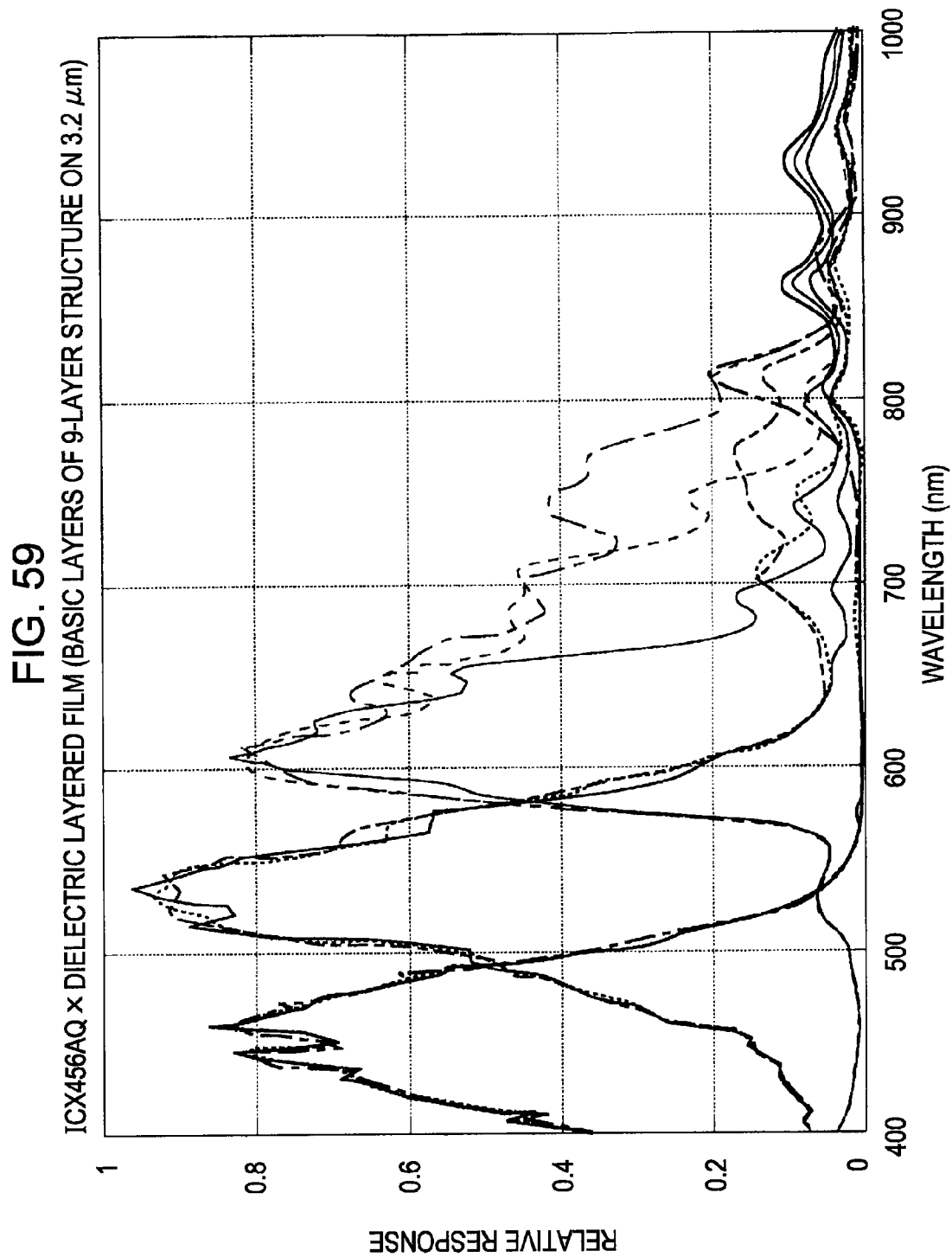
FIG. 59 is a diagram (part seven) describing a problem wherein infrared light components are mixed in visible light components.

FIG. 58 is a diagram illustrating the spectral sensitivity curve of a color filter employed for the image capturing device ICX456AQ manufactured by Sony Corporation. FIG. 59 is a diagram illustrating a spectral sensitivity curve actually obtained by ICX456AQ. Here, as illustrated in FIG. 53, the thickness of the dielectric layer 1_k of the k'th layer is set to 3.2 μm, and the basic layer having a nine-layer configuration is provided thereupon. As can be understood from comparison between FIGS. 56 and 59, in the event that the reflected center wavelength λ0 of the infrared light IR is high, the infrared light side of a wavelength of around 700 nm or more further has great spectral sensitivity.

As illustrated in FIG. 1, most semiconductors have absorption sensitivity as to infrared light. Accordingly, in the case of the infrared light side having a certain degree of spectral sensitivity, in addition to the signal of the light intensity of three primary-color or complementary-color visible light, the signal components of infrared light is added to the pixel signal to be obtained from the detection portion for receiving visible light, which differs from the actual color signal, and consequently, color reproducibility deteriorates. Particularly, such as red in the case of primary-color filters, and magenta and yellow in the case of complementary-color filters, the amount of infrared light components to be filtered in as to the pixel signal to be obtained from the detection portion relating to wavelength components close to infrared light becomes great.

Figure 60:
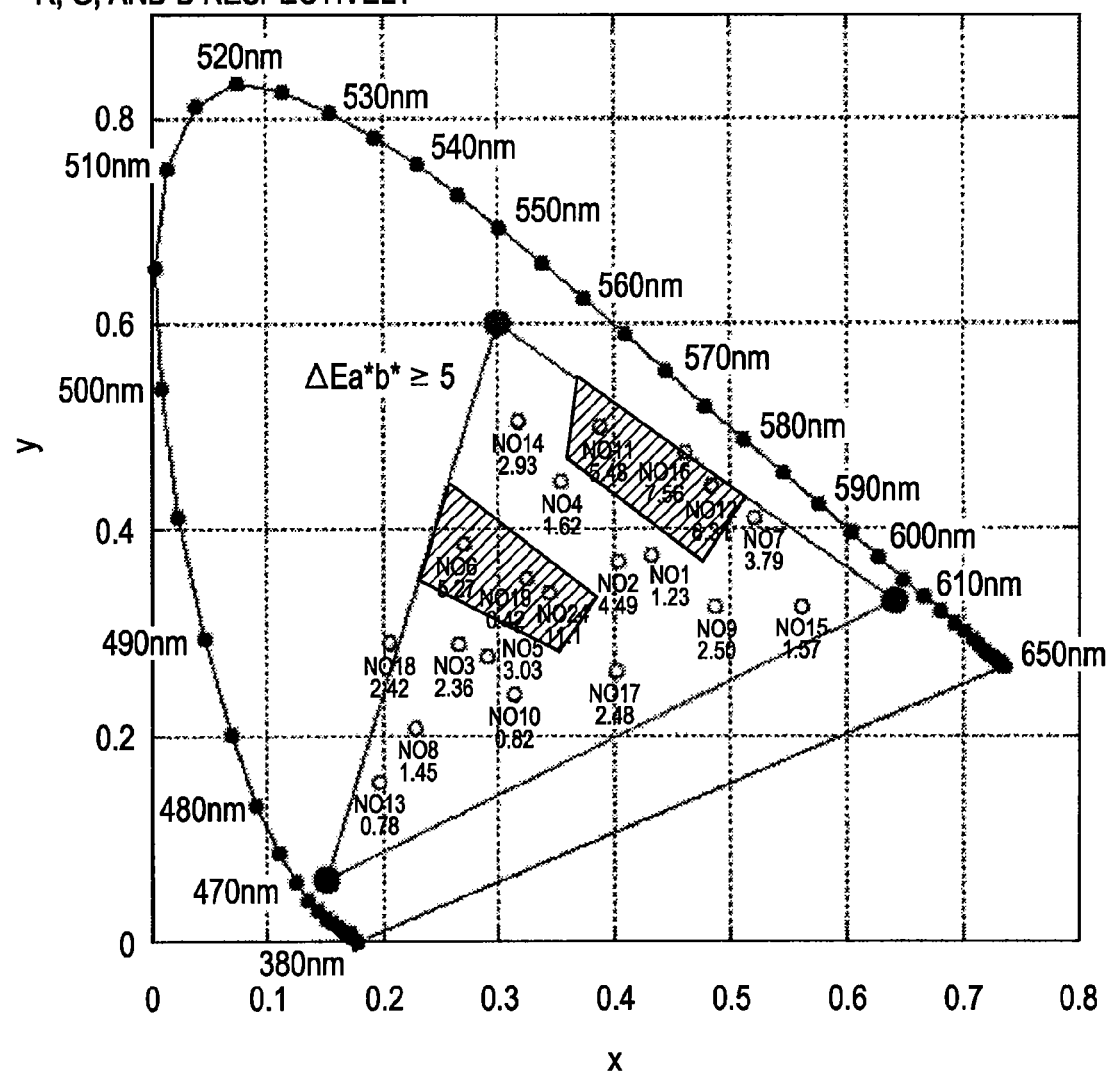
FIG. 60 is a diagram (part one) describing influence of color reproducibility caused by infrared light components being mixed in visible light components.

FIGS. 60 and 61 are diagrams describing influence as to color reproducibility caused by infrared light components being mixed in visible light components. The results obtained by computing color difference in the case of infrared light being cast into the light receiving portion of visible light simultaneously are illustrated, here. All of the results are obtained by computing color difference δEab (more accurately, δEa*b*, but "*" is omitted) in a Lab space (accurately, L*a*b*, but "*" is omitted) regarding the 24 colors of the Macbeth chart. Note that the Macbeth chart is a chart standardized by GretagMacbeth as a calibration chart of a color measuring apparatus for management use.

Here, FIG. 60 illustrates a case wherein the signal intensity of each color all increases +5% by infrared light casting into pixels simultaneously, and FIG. 61 illustrates a case wherein R increases 20.62%, G 10.4%, and B 15.3% respectively. Note that with these drawings, the calculated results are plotted on the xy chromaticity diagrams, and a region satisfying δEab≧5 is illustrated.

The Eab is obtained by computing the case of adding the amount of incident infrared light, and the case without adding that, such as the following Expression (4).

[Expression 4]

$$\Delta E_{a^*b^*} = \{(\Delta L^*)^2 + (\Delta a^*)^2 + (\Delta b^*)^2\}^{\frac{1}{2}}$$

wherein the following condition is satisfied.

$$L^* = 25\left(100\frac{Y}{Y_0}\right)^{\frac{1}{3}} - 16 \quad 1 \leq Y \leq 100$$

with $D_{55}$ light source, $$a^* = 500\left\{\left(\frac{X}{X_0}\right)^{\frac{1}{3}} - \left(\frac{Y}{Y_0}\right)^{\frac{1}{3}}\right\} \quad X_0 = 95.68$$

$$Y_0 = 100$$

$$b^* = 200\left\{\left(\frac{Y}{Y_0}\right)^{\frac{1}{3}} - \left(\frac{Z}{Z_0}\right)^{\frac{1}{3}}\right\} \quad Z_0 = 90.93$$

(4)

As can be understood from FIGS. 60 and 61, either of the cases includes a region satisfying δEab≧5 by adding the amount of incident infrared light to the visible light components. For example, with the case of FIG. 60, 6 colors of the 24 colors in the Macbeth chart satisfy δEab≧5, and further with case of FIG. 61, 17 colors of the 24 colors satisfy δEab≧5. Generally, upon satisfying δEab≧5, color difference can be detected by a human sense, and consequently, adding the amount of incident infrared light to visible light components deteriorates color reproducibility.

Accordingly, in the case of considering color reproducibility, it can be understood that employing an infrared light cut filter is effective. However, employing an infrared light cut filter results in cost increases, and sensitivity deteriorates by the light included in visible light being also cut.

As for patent documents describing employing no infrared light cut filter, with Japanese Unexamined Patent Application Publication No. 2001-69519, an arrangement for utilizing an image capturing device including a filter which transmits no near-infrared region light has been described, but the specific material and configuration of the filter has not been described. Also, an arrangement wherein the position of an infrared cut filter is switched described in Japanese Unexamined Patent Application Publication No. 2000-59798, and an arrangement wherein the sign (positive/negative) of a R-Y signal is detected, and correction is performed when the R-Y signal is positive which increases influence of infrared light described in Japanese Unexamined Patent Application Publication No. 2003-70009 have been proposed. However, these arrangements include a disadvantage wherein the scale of the device increases, or the scale of circuits increases, resulting in increase of costs, a disadvantage wherein correction accuracy is not sufficient, and so forth.

Accordingly, in order to increase the reflectance of infrared light, a method can be conceived wherein with the spectral image sensor 511 utilizing a dielectric layered film employing no infrared light cut filter, the number of layers of a multi-layered film is increased, or the refractive index difference of the respective layers of a multi-layered film is increased. However, with the method for increasing the number of layers, as illustrated in FIG. 8 for example, in the event of employing the spectral image sensor 11 made up of a combination of a SiO2 layer and a SiN layer, even when employing 6 cycles 11 layers, reflectance thereof is around 0.9 as illustrated in FIG. 9, and this means that the amount of incident infrared light is included in visible light components, which deteriorates color reproducibility. In order to have the reflectance approach 1.0, it can be conceived that the number of layers is further increased, but in this case, the thickness becomes 1 µm or more simultaneously. Employing such a thick film configuration accompanies difficulty on the manufacturing process of a multi-layered film, and consequently, which poses a problem in mass productivity.

Figure 27:
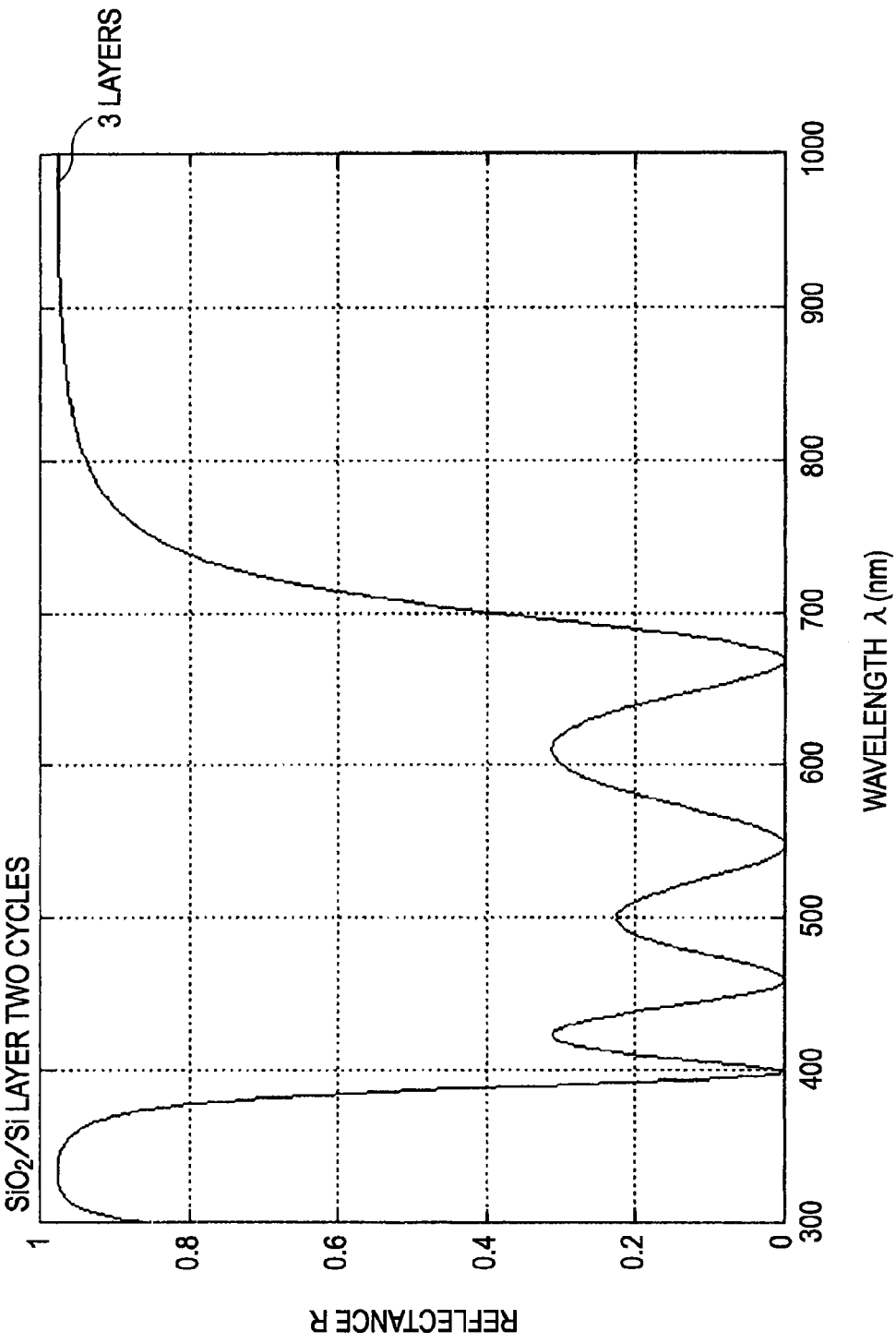
FIG. 27 is a reflectance spectrum diagram describing the fourth modification (first thereof) of a spectral image sensor corresponding to single wavelength division utilizing a layered film.
Figure 29:
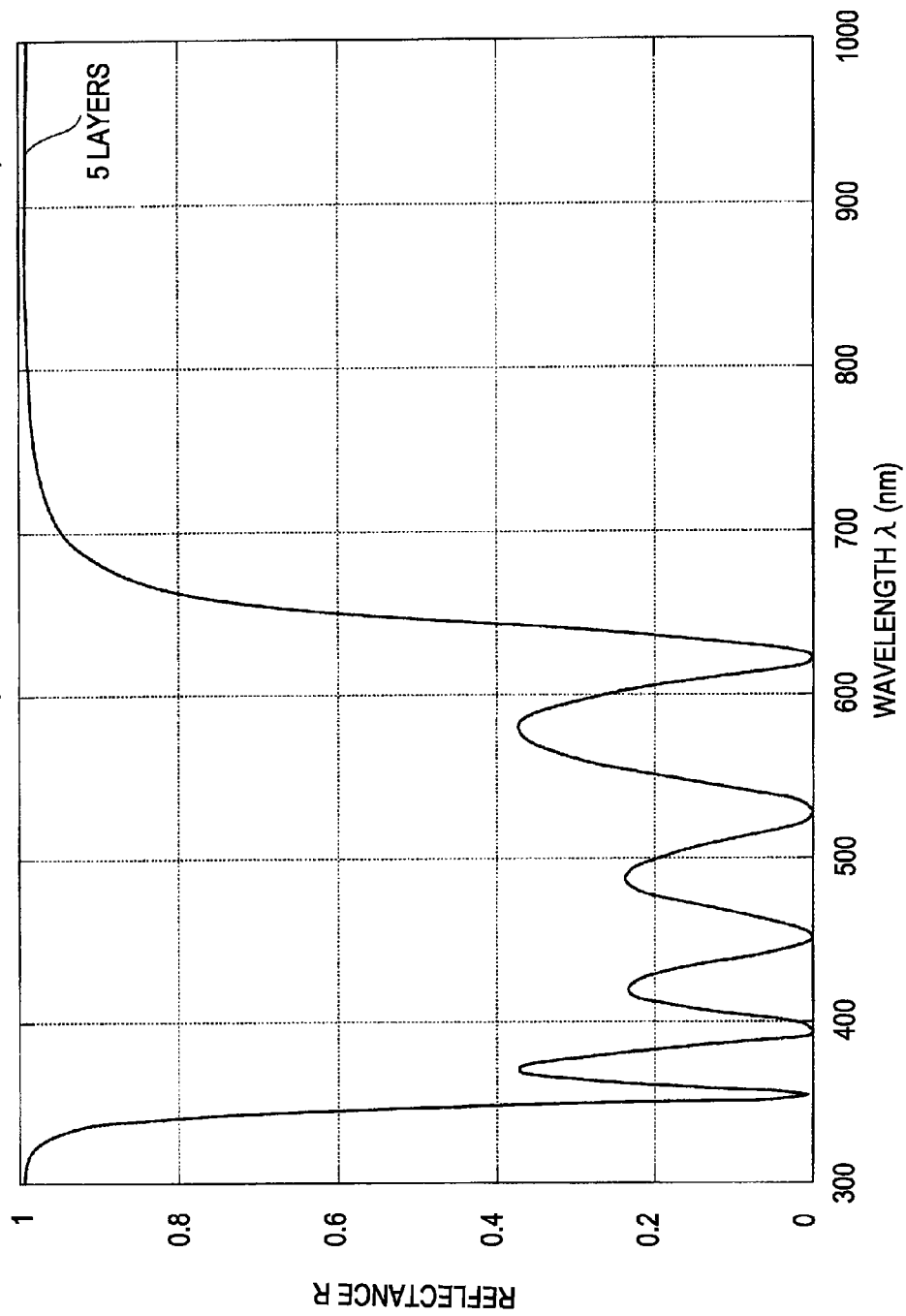
FIG. 29 is a reflectance spectrum diagram describing the fourth modification (second thereof) of a spectral image sensor corresponding to single wavelength division utilizing a layered film.

Also, in the event of employing a large refractive index difference, and employing the spectral image sensor 11 made up of a combination of a SiO2 layer and a Si layer such as the fourth modification illustrated in FIGS. 26 and 28 for example, upon employing the basic layer of a five-layer configuration, the reflectance at an infrared region can be increased up to around "1" as illustrated in FIGS. 27 and 29, but on the other hand, the reflectance at a visible light region is also increased, and the photoelectric conversion efficiency of visible light deteriorates, which becomes a factor for deterioration in sensitivity.

Also, there is concern that not a little leakage due to oblique incident light exists, influence of the other leakage components is received each other, the visible light image separated and obtained deteriorates in color reproducibility for the amount of leakage thereof, and also the visible light image components for the amount of leakage thereof appear in an infrared light image.

That is to say, in the event of employing a sensor configuration utilizing a dielectric layered film, it is difficult to optimize all of the thickness of the device, light receiving sensitivity, color reproducibility, and so forth, so there is no other choice other than a configuration for balancing the entirety, and consequently, color reproducibility due to leakage of infrared light components remains as a problem.

Also, in the case of the spectral image sensor 511 utilizing the diffraction grating 501, as can be understood from FIGS. 45 through 49, visible light and infrared light can be separated by utilizing place dependency depending on a wavelength in the width direction (X direction in the drawing), but as can be understood from FIG. 49, separation of visible light (blue light, green light, and red light) and infrared light (wavelength of 880 nm) is incomplete at near the boundary between visible light and infrared light, and consequently, color reproducibility due to leakage of infrared light components remains as a problem. Inversely, with regard to an infrared light image, there is influence due to leakage of visible light components.

Also, in the case of the solid state image capturing device 611 utilizing the difference of absorption coefficients depending on a wavelength in the depth direction of the semiconductor, the visible light components to be obtained at the visible light detection region 611VL are, as can be understood from the past technology described above, subjected to a certain degree of absorption when the infrared light IR passes through, and the infrared light IR is subjected to false detection as the visible light VL, thereby receiving influence of infrared light components.

Also, in the case of the solid state image capturing device 611 having a configuration utilizing the difference of absorption coefficients depending on a wavelength in the depth direction of the semiconductor, the wavelength of near the boundary between the infrared light IR and the infrared components within the visible light VL is subjected to a certain degree of the other absorption each other, so the infrared light image components to be obtained at an infrared light image capturing region sometimes receive influence of a visible light band, particularly, red components.

<<Solution for Infrared Light Mixture>>

In order to solve such a problem, the image capturing apparatus 300 according to the present embodiment attempts to solve a color reproducibility problem due to infrared light mixture at a detection region for receiving visible light by providing an infrared light correction processing unit 342 in the image signal processing unit 340. Thus, infrared light which is unnecessary components as to a visible light region can be suppressed and eliminated using signal processing without providing optical wavelength separating means (a typical example is an infrared light cut filter) in front of the image sensor. Even if the detection results of a visible light detection portion including leakage of infrared light, the unnecessary infrared light components can be suppressed and eliminated by signal processing, so which expands the usage range of the image sensor, when realizing an image capturing apparatus capable of obtaining a visible color image having sufficient color reproducibility. Specific description will be made below regarding method thereof.

<Color Separating Filter Array; First Example>

Figure 62A:
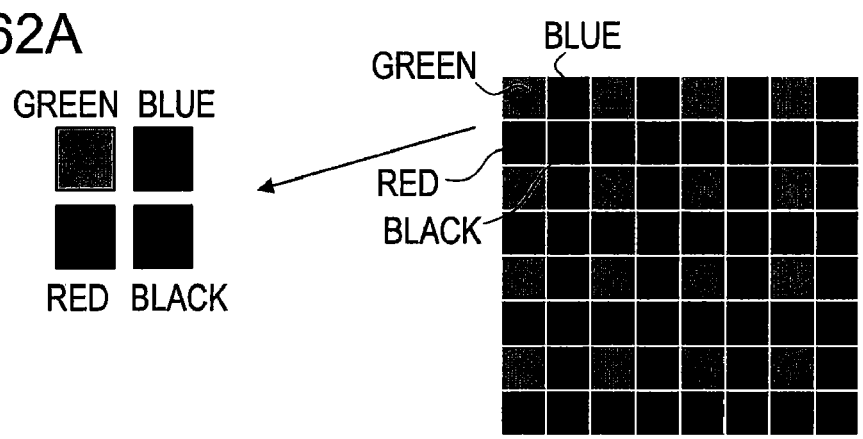
FIGS. 62A through 62C are diagrams illustrating the layout of a first specific example of a color separating filter for correction computing.
Figure 62B:
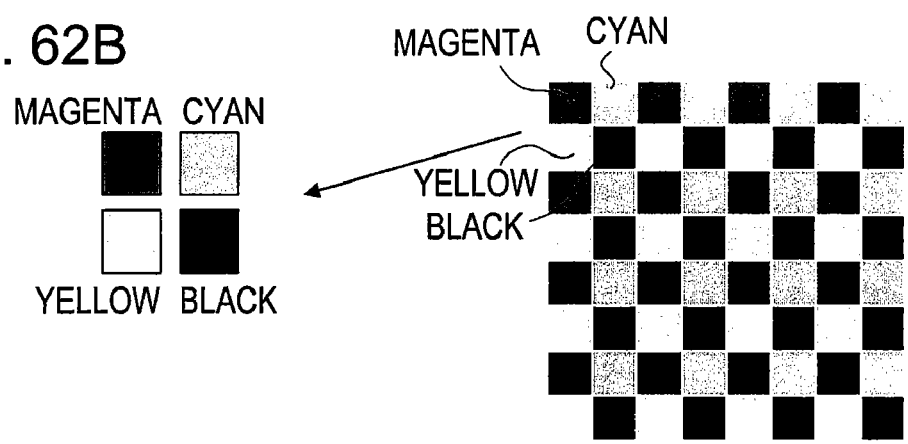
Figure 62C:
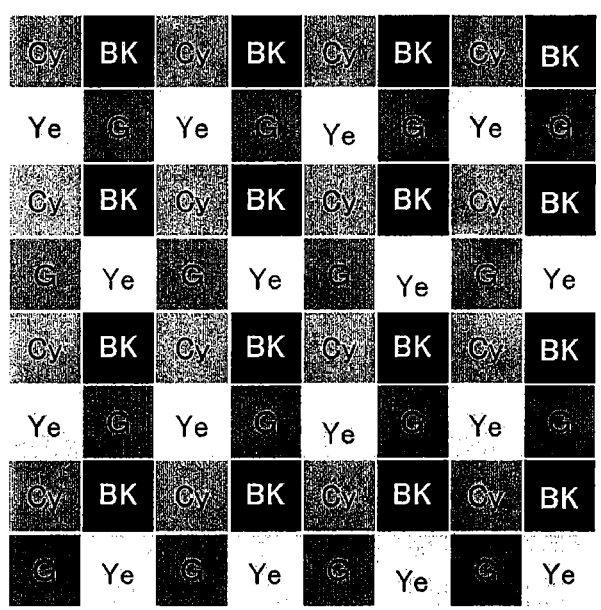

FIGS. 62A through 62C are diagrams illustrating a first specific example(hereinafter, referred to as "first specific example") of the layout of color separating filters which constantly enable a visible light color image and an infrared light image to be obtained independently using correction computing. This first specific example has features in that a detection region for eliminating visible light, and receiving and detecting infrared light alone is provided as a detection region for correction as to a visible light color image.

As illustrated in FIG. 62A, color filters having a so-called bayer array basic formation wherein the respective color filters are disposed in a mosaic shape are employed, first of all, a pixel portion is configured wherein the repetition units of the color separating filters are disposed in two pixel by two pixel such that the unit pixels disposed in a tetragonal lattice shape corresponds to the three color filters of red (R), green (G), and blue (B). Also, in order to provide a detection portion (detection region) for eliminating visible light, and receiving and detecting infrared light alone, one of the two greens (G) is substituted with a black filter BK. That is to say, filters for three wavelength regions (color components) of primary-color filters R, G, and B for visible light color images, and four types of color filters having individual filter properties such as a black filter BK for infrared light which differs from the components of the primary-color filters R, G, and B are disposed regularly.

For example, a first color pixel for detecting a first color (red; R) is disposed at an even-line odd-row, a second color pixel for detecting a second color (green; G) is disposed at an odd-line odd-row, a third color pixel for detecting a third color (blue; B) is disposed at an odd-line even-row, and a fourth color pixel (here, black correction pixel) for detecting the infrared light IR is disposed at an even-line even-row, G/B pixels or R/BK pixels, which differ for each line, are disposed in a checkered pattern shape. Such a color array of color filters having a bayer array basic formation is repeated for each two colors of G/B or R/BK regarding any of the line direction and row direction.

A visible light color image can be captured by the corresponding detection portion detecting visible light through the primary-color filters R, G, and B, and also an infrared light image can be captured by the corresponding detection portion detecting infrared light through the black filter BK independently from a visible light color image and also simultaneously with that. Also, the infrared light signal obtained from the pixel where the black filter BK is disposed is also utilized as a correction signal as to the visible light color image to be obtained from the pixels where the primary-color filters of R, G, and B are disposed.

Figure 63:
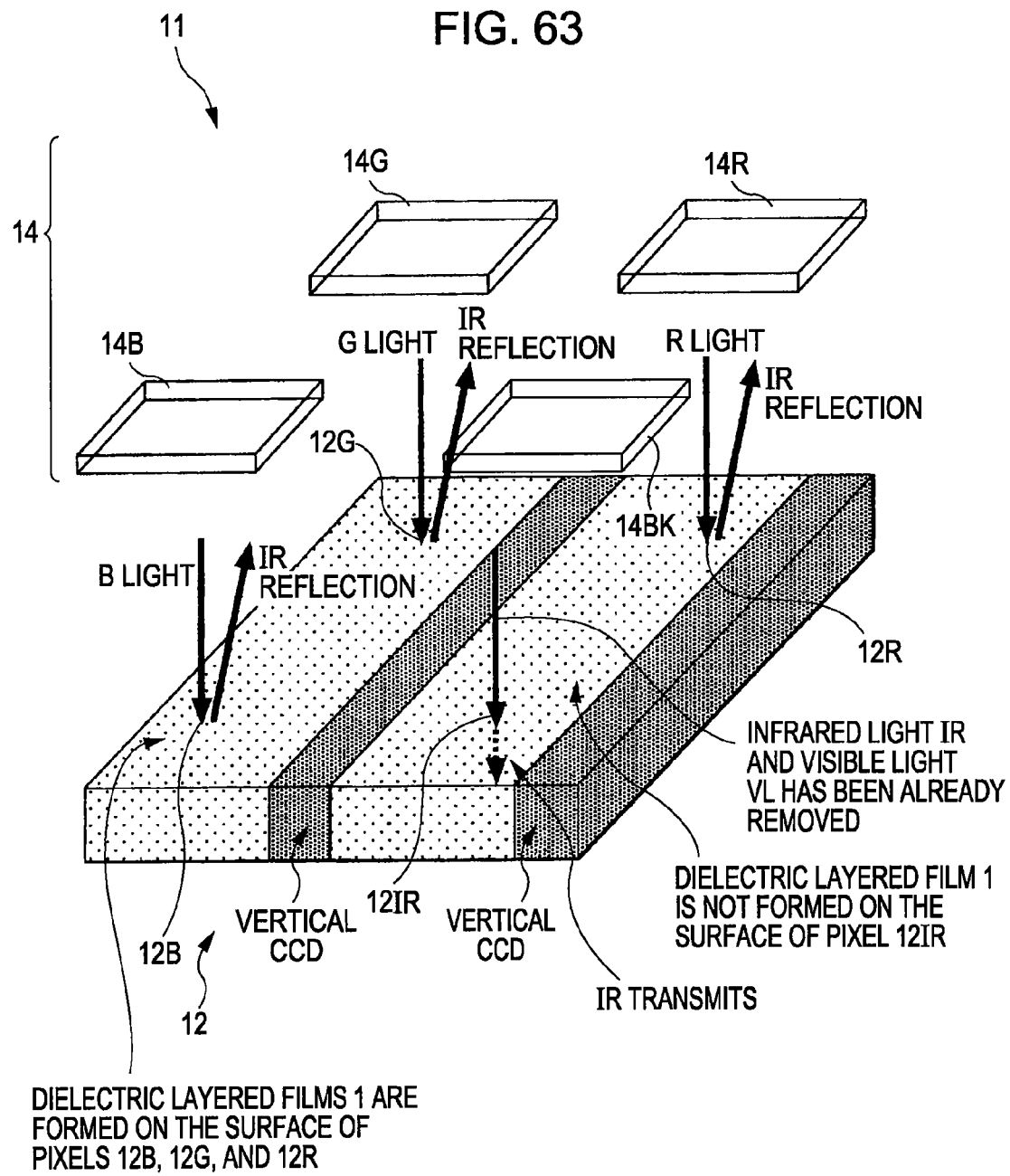
FIG. 63 is a diagram (perspective view) describing a configuration example of a CCD solid state image capturing device having the layout of the color separating filter illustrated in FIGS. 62A through 62C.
Figure 64:
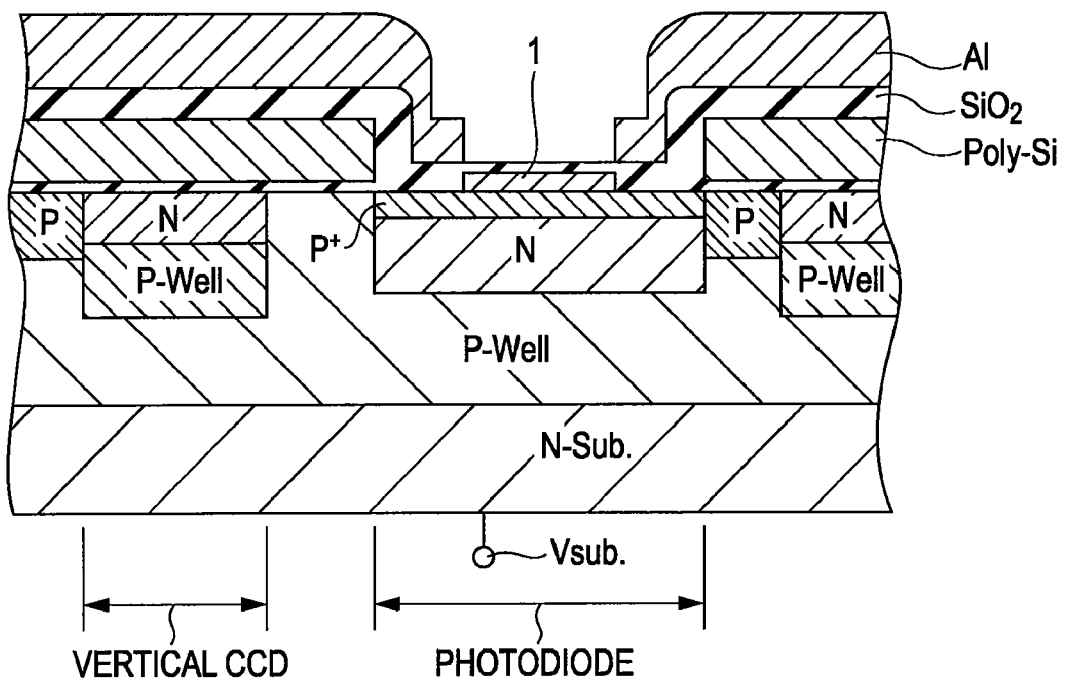
FIG. 64 is a diagram (cross-sectional configuration diagram) describing a configuration example of a CCD solid state image capturing device which is configured so as to capture two wavelength components of infrared light and visible light separately as images simultaneously.

FIGS. 63 and 64 are diagrams describing a CCD solid state image capturing device which is configured so as to have the layout of the color separating filters illustrated in FIGS. 62A through 62C, and capture the infrared light IR alone and the two wavelength components of the visible light VL separately as images at the same time. Here, FIG. 63 is a sketch (perspective view) illustrating a configuration example. Also, FIG. 64 is a cross-sectional configuration diagram of around the substrate surface. Note that here, an application example as to the CCD solid state image capturing device 101 utilizing a dielectric layered film.

With the configuration of the CCD solid state image capturing device 101 illustrated in FIG. 63, only the unit pixel matrix 12 made up of four pixels is illustrated, but the actual configuration is a configuration wherein the unit pixel matrix 12 made up of four pixels is repeated in the horizontal direction, and further is repeated in the vertical direction.

Of four pixels of a cycle array making up the unit pixel matrix 12, the black filter 14BK in which the dielectric layered film 1 is not formed is provided on one pixel 12IR, which is configured so as to receive the infrared light IR alone through this black filter 14BK. That is to say, an arrangement is made wherein the black filter 14BK is employed on the pixel 12IR of the infrared light IR as the color filter 14, whereby the visible light VL can be cut, and the infrared light IR alone can be received. The pixel 12IR to be used for correction as to a visible light color image where the black filter 14BK is provided is also referred to as a black correction pixel 12BK.

On the other hand, an arrangement is made wherein the dielectric layered film 1 is formed on the other three pixels 12B, 12G, and 12R, and the primary-color filters 14R, 14G, and 14B are provided above thereof, the corresponding three primary colors of blue B, green G, and red R within the visible light VL are received through the primary-color filters 14R, 14G, and 14B. That is to say, a function for effectively cut infrared light is realized by forming a dielectric layered film on the detection portions of pixels where three primary-color filters are provided.

Also, in FIG. 64 in which the cross-sectional configuration diagram of around the substrate surface is illustrated, a pixel for receiving the visible light VL alone is illustrated. The pixel 12IR for receiving the infrared light IR has a configuration wherein the dielectric layered film 1 and the black filter 14BK are not provided. That is to say, following dielectric layered films being layered by sequentially layering SiN layers and SiO2 layers with the configuration illustrated in FIG. 17 using the CVD method such as the manufacturing process described with FIG. 32, only the pixel for receiving the infrared light IR is removed using lithography technology and the RIE method. Subsequently, a SiO2 layer is layered again and planarized.

We have found that a visible light color image based on three primary color components, and an image made up of the infrared light IR alone can be captured simultaneously by employing an image capturing device manufactured with such a configuration. However, there is a concern wherein with a visible light color image, color reproducibility is deteriorated by leakage of infrared light. Accordingly, correction is performed as follows.

<Correction Method of First Specific Example>

Figure 65A:
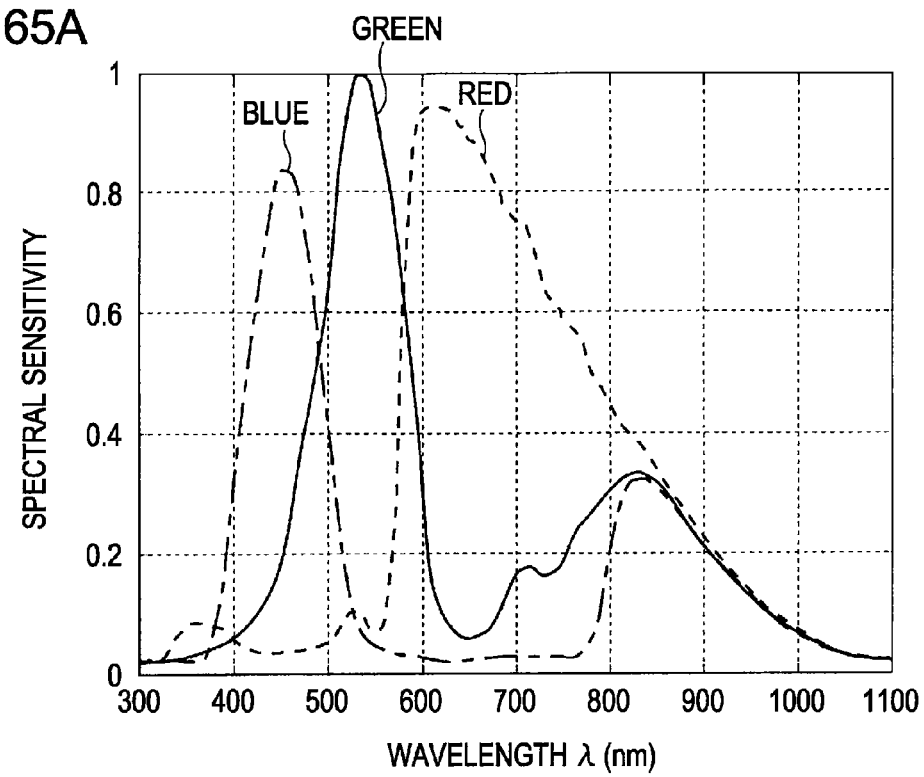
FIGS. 65A and 65B are diagrams illustrating a properties example of a color filter to be employed for the first specific example.
Figure 65B:
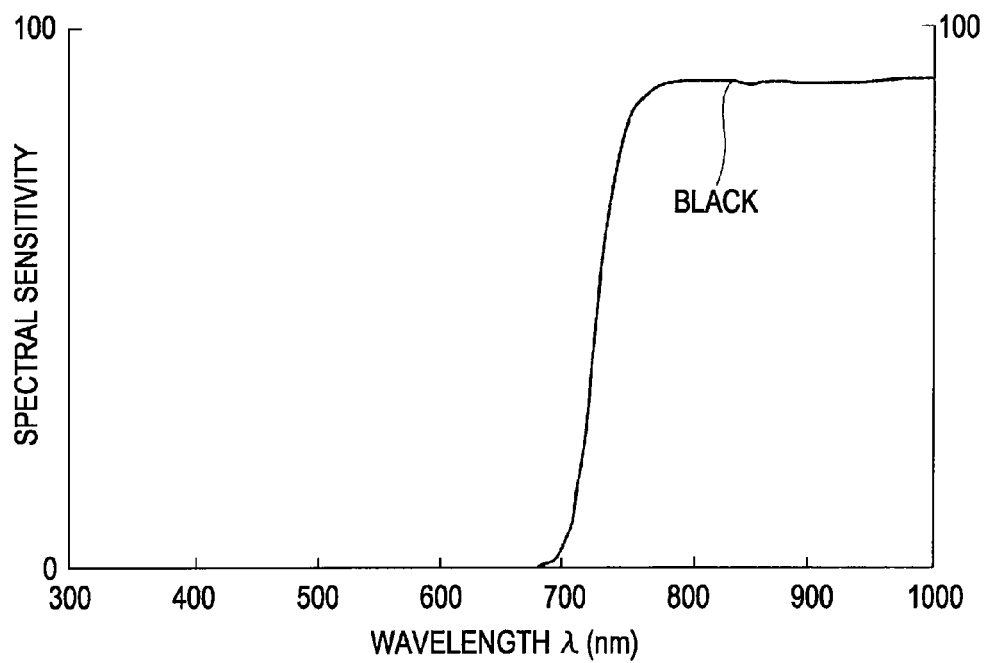

FIGS. 65A and through 68B are diagrams describing a correction method of infrared light components in the first specific example. Here, FIGS. 65A and 65B are diagrams illustrating a properties example of the color filter 14 to be employed for the first specific example. Also, FIGS. 66A through 68B are diagrams describing the setting method of a coefficient to be employed for correction calculation.

First, the primary color filters 14R, 14G, and 14B are employed as the color filters 14 for visible color image capturing with blue components B (e.g., transmittance is generally one at wavelength $\lambda$=400 through 500 nm, and generally zero at the others), green components G (e.g., transmittance is generally one at wavelength $\lambda$=500 through 600 nm, and generally zero at the others), and red components R (e.g., transmittance is generally one at wavelength $\lambda$=600 through 700 nm, and generally zero at the others), which are the three primary colors of the visible light VL (wavelength $\lambda$=380 through 780 nm), being taken as the center.

Note that transmittance of "generally one" shows an ideal state, and it is desirable that the transmittance in the wavelength region is extremely greater than that in the other wavelength regions. A part thereof may include transmittance other than "1". Similarly, transmittance of "generally zero" also shows an ideal state, and it is desirable that the transmittance in the wavelength region is extremely smaller than that in the other wavelength regions. A part thereof may include transmittance other than "zero".

Also, any filters can be employed as long as filters pass through the wavelength region components of a predetermined color within a visible light VL region (primary color or complementary color) serving as passage wavelength region components, and whether or not an infrared light IR region serving as reflected wavelength region components is passed through, i.e., transmittance as to infrared light IR can be ignored. This is because the infrared light IR components are cut by the dielectric layered film 1.

As for one example, color filters having spectral sensitivity properties such as illustrated in FIG. 65A (actually, the same as FIG. 55) are employed. This is the spectral sensitivity properties of color filters currently commonly employed. The sensitivity properties employed here are arranged wherein a wavelength of around 380 nm through 540 nm is taken as a blue wavelength region, a wavelength of around 420 nm through 620 nm is taken as a green wavelength region, and a wavelength of around 560 nm through 780 nm is taken as a red wavelength region.

As can be understood from this FIG. 65A, the sensitivity curve of the green G has sensitivity even as to long wavelength light which is longer than 640 nm. This means that color reproducibility deteriorates when long wavelength light, which is longer than 640 nm, is casts in. The same can be applied to the other colors (R, B), which has sensitivity as to the light of an infrared light region, this means that color reproducibility deteriorates when infrared light is cast in.

Also, as for the color filter 14 for capturing an infrared light image to be also used as a correction component as to a visible light color image, for an example, as illustrated in FIG. 65B, the black filter 14BK having features for principally absorbing the visible light VL, and transmitting the infrared light IR, i.e., a color filter of which transmittance is generally one at the infrared light IR (wavelength $\lambda \geq 780$ nm), and generally zero at the others is employed. Thus, the pixel 12IR is arranged to have sensitivity as to infrared light alone.

Note that transmittance of "generally one" shows an ideal state, and it is desirable that the transmittance at the infrared light IR wavelength region is extremely greater than that in the other wavelength regions. Similarly, transmittance of "generally zero" also shows an ideal state, and it is desirable that the transmittance in the wavelength region is extremely smaller than that in the other wavelength regions.

Note that the black filter 14BK mentioned here, essentially, should be a filter for transmitting the long wavelength side which is longer than a wavelength of 780 nm which is the boundary of visible light and infrared light, i.e., a black filter for exhibiting absorbability at principally a visible light wavelength region of 380 nm through 780 nm, and exhibits permeability at principally an infrared light wavelength region which is a wavelength of 780 nm or more, but as illustrated in this FIG. 65B, should be also a filter for transmitting the long wavelength side which is longer than a wavelength of 700 nm, i.e., a black filter for exhibiting absorbability at principally a visible light wavelength region of 380 nm through 700 nm, and exhibits permeability at principally a wavelength region which is a wavelength of 700 nm or more.

Also, the transmission spectrum of the most appropriate black color differs depending on the spectral sensitivity curves of the primary-color filters 14R, 14G, and 14B. For example, in the case of the spectral sensitivity curve illustrated in FIG. 55, the sensitivity curve of the green G has sensitivity as to long wavelength light which is longer than 640 nm, color reproducibility deteriorates when long wavelength light which is longer than 640 nm is cast in, so in order to correct this, as for the black color filter 14BK, it is desirable to employ a filter for transmitting the long wavelength side which is longer than a wavelength of 640 nm, i.e., a black filter for exhibiting absorbability at principally a visible light wavelength region of 380 nm through 640 nm, and exhibits permeability at principally a wavelength region which is a wavelength of 640 nm or more.

The black correction pixel 12BK where such a black filter 14BK is disposed is provided, whereby the pixel 12IR can measure the infrared light IR alone to be cast into an image capturing device as a signal value. Further, the added infrared signal (signal of infrared components) can be cut by subtracting the value obtained by multiplying the signal value by a coefficient from each of the three primary-color signals or a complementary-color signal. Thus, an image having excellent color reproducibility can be obtained even under the circumstances where infrared light exists.

Specifically, the respective primary-color signal components SR, SG, and SB representing a visible light color image are corrected using the infrared light signal components SIR (measurement signal intensity of infrared light) representing an infrared light image, thereby obtaining corrected primary-color signals SR*, SG*, and SB* for reproducing a visible light color image relating to visible light components (first wavelength region components) from which influence of infrared light (second wavelength region) components, i.e., correct color signal intensity made up of the respective color signal components alone in the original visible light wavelength region.

When performing this correction calculation, as shown in the following Expression (5-1), the corrected primary-color signals SR*, SG*, and SB* from which influence of leakage components of infrared light (second wavelength region) is eliminated are obtained by subtracting correction signal components obtained by multiplying the infrared light signal components SIR by predetermined coefficients $\alpha R$, $\alpha G$, and $\alpha B$ from the primary-color signal components SR, SG, and SB obtained by adding the leakage signal components of infrared light to the respective color components in the original visible light wavelength region.

Note that as compared with the case of providing an infrared light cut filter for reducing the second wavelength region components, in the case of providing no infrared light cut filter, the three primary-color signal components for a visible light color image are increased, so in order to obtain the equivalent signal level, as shown in the following Expression (5-2), it is desirable to further subtract nonlinear correction signal components obtained by multiplying the infrared light signal components SIR by coefficients $\epsilon R$, $\epsilon G$, and $\epsilon B$ and the primary-color signal components SR, SG, and SB. In other words, it is desirable to add the value obtained by multiplying the infrared light signal components SIR by predetermined coefficients $\epsilon R$, $\epsilon G$, and $\epsilon B$ to the color signal components SR, SG, and SB as nonlinear sensitivity correction, and then subtract the correction signal components obtained by multiplying the infrared light signal components SIR by predetermined coefficients $\alpha R$, $\alpha G$, and $\alpha B$ from the value to which this sensitivity correction is added.

Now, when assuming that the coefficients $\epsilon R$, $\epsilon G$, and $\epsilon B$ are negative, correction is actually performed by adding nonlinear signal components multiplied by the negative coefficients $\epsilon R$, $\epsilon G$, and $\epsilon B$ to the product between the infrared light components detected by the second detection portion and the original pixel signal detected by the first detection portion.

Thus, respective correction color signals SR, SG, and SB** made up of the respective color signal components alone in the original visible light wavelength region for reproducing a visible light color image relating to visible light components (first wavelength region components) from which influence of the leakage components of infrared light (second wavelength region) is eliminated can be obtained with precision. Note that this correction in accordance with Expression (5-2) need not be performed as to all of the three primary-color signal components, and may be performed particularly as to only the green signal components of which degree of influence to a luminance signal is strong.

[Expression 5]

$$SR* = SR - \alpha R \times SIR$$
$$SG* = SG - \alpha G \times SIR \quad (5-1)$$
$$SB* = SB - \alpha B \times SIR$$
$$SR** = SR(1 - \varepsilon R \times SIR)\alpha R \times SIR$$
$$SG** = SG(1 - \varepsilon G \times SIR)\alpha G \times SIR \quad (5-2)$$
$$SB** = SG(1 - \varepsilon G \times SIR)\alpha G \times SIR$$

(5)

Note that in the event of setting the coefficients αR, αG, and αB, it is necessary to set these so as to sufficiently suppress the filtering-in components of infrared light. Here, the filtering-in components of infrared light also depend on the intensity of an infrared light wavelength region included in a light source.

Figure 66:
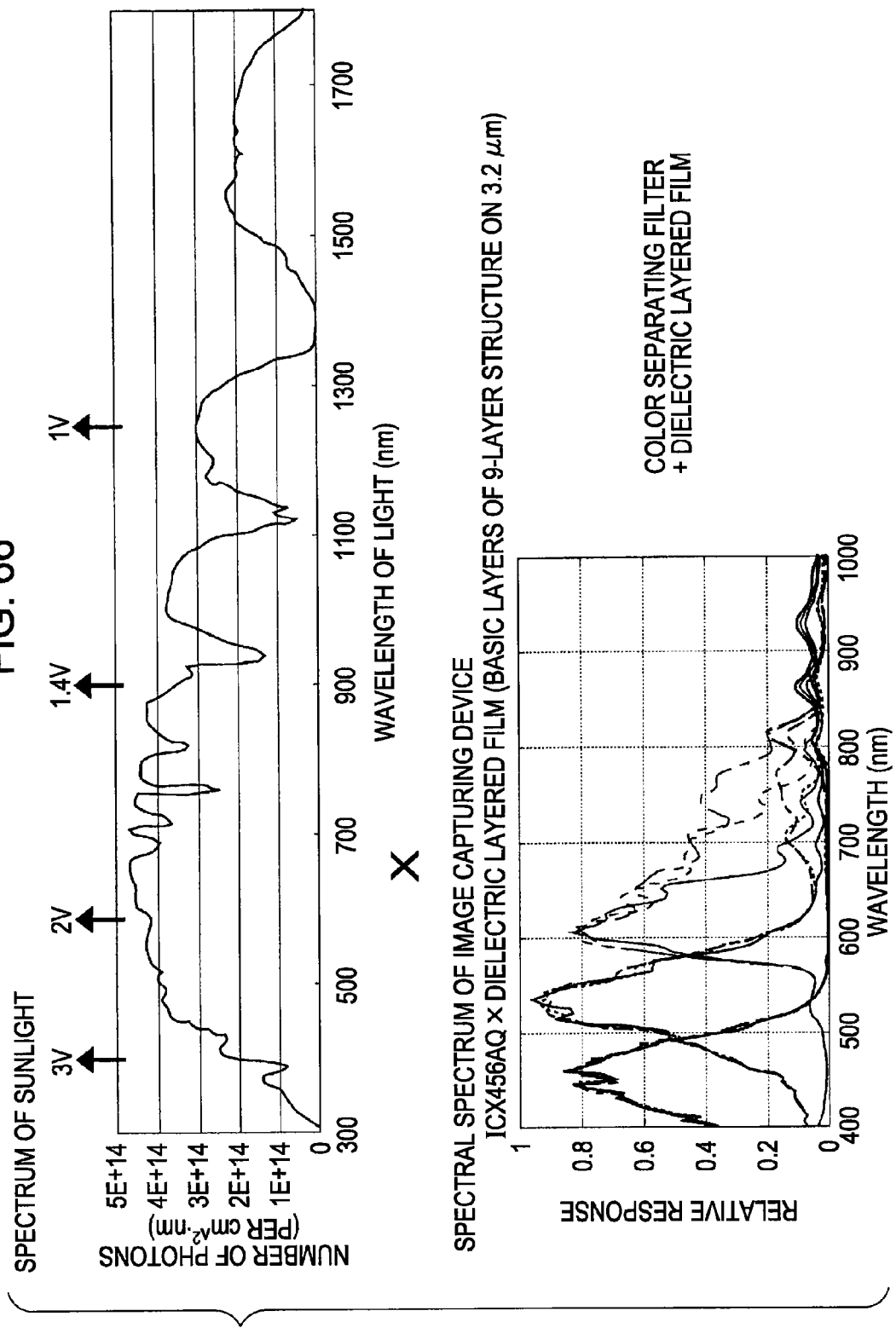
FIG. 66 is a diagram (part one) describing a setting method of a coefficient to be employed for correction computing.

For example, FIG. 66 is a diagram describing influence due to the light source of signal intensity to be detected at a visible light detection region. Now, let us see about influence of the wavelength spectrums of sunlight as one example. The intensity of a signal to be detected at a visible light detection region is obtained by further multiplying the spectral sensitivity curve illustrated in FIG. 56 to be actually obtained by multiplying the sensitivity curve illustrated in FIG. 55 by the transmission spectrum to be guided form the reflectance spectrum illustrated in FIG. 54 by the light source wavelength spectrum illustrated in FIG. 66.

FIGS. 67A through 68B are diagrams schematically illustrating the situation of influence due to light source in the case of an image capturing device wherein the spectral image sensor 11 utilizing the dielectric layered film 1 and the color filters 14 are combined.

Figure 67A:
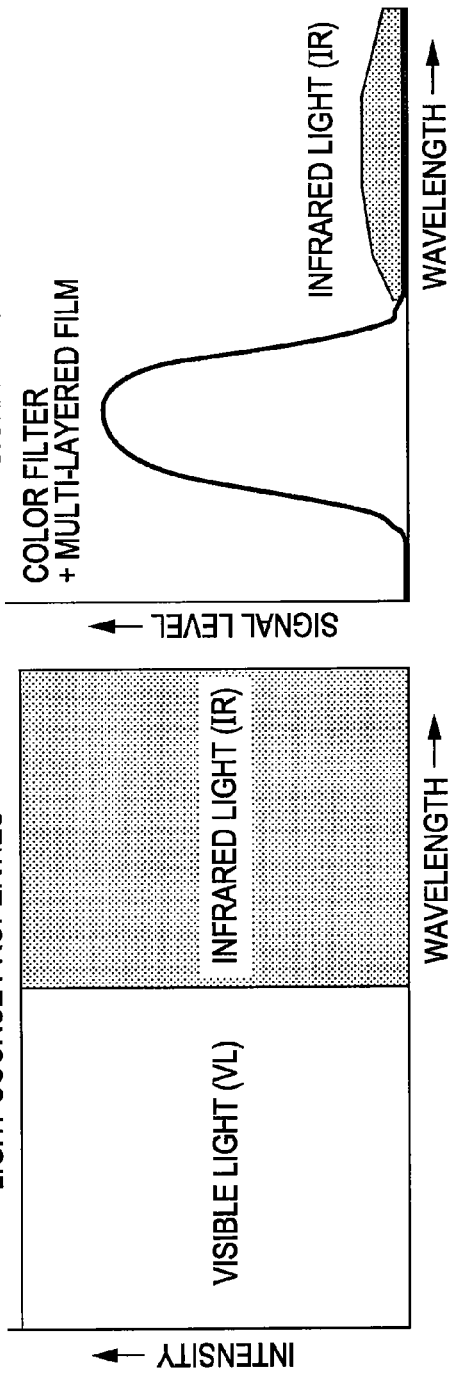
FIGS. 67A and 67B are diagrams (part two) describing a setting method of a coefficient to be employed for correction computing.
Figure 67B:
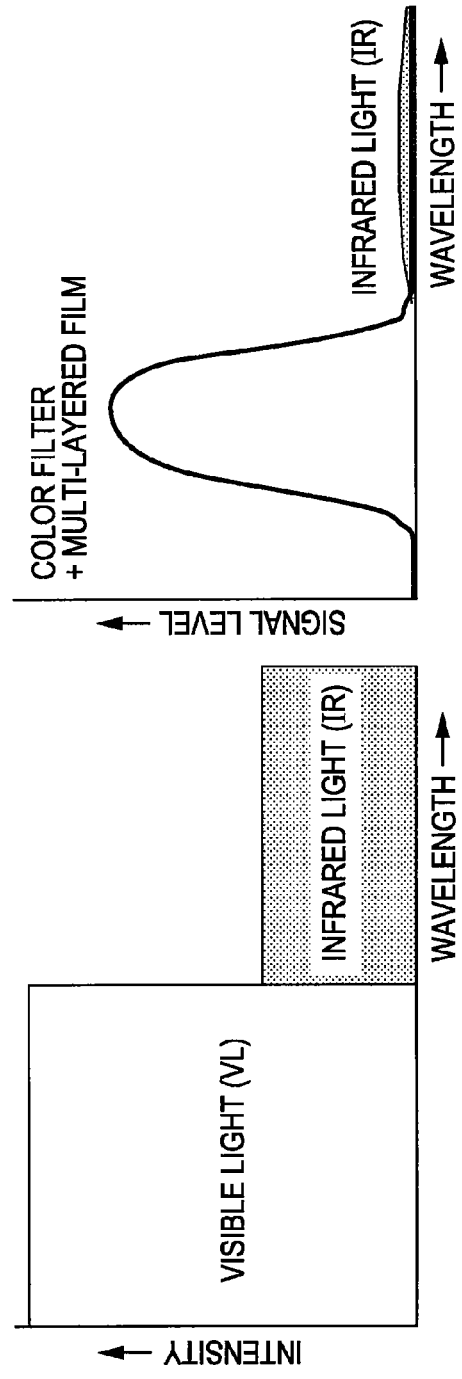
Figure 68A:
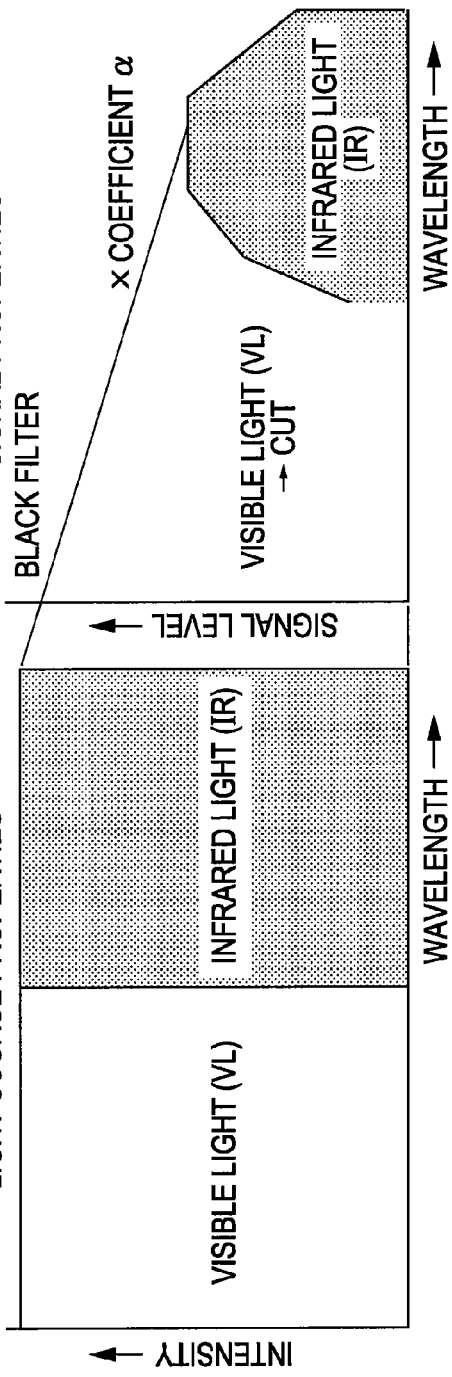
FIGS. 68A and 68B are diagrams (part three) describing a setting method of a coefficient to be employed for correction computing.
Figure 68B:
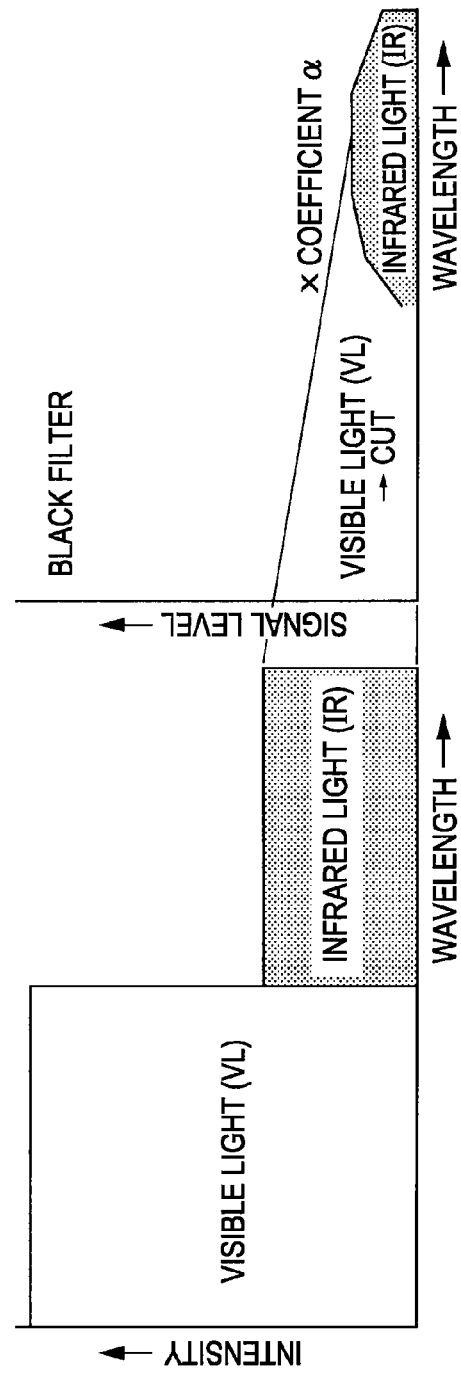

FIG. 67A illustrates a case wherein the spectral intensity of infrared light is at the same level as the spectral intensity of visible light, and FIG. 67B illustrates a case wherein the spectral intensity of infrared light is lower than the spectral intensity of visible light. As can be understood from comparison of FIGS. 67A and 67B, the infrared light components included in the signal to be obtained from the image capturing device where the color filters 14 of predetermined colors are disposed depends on (is proportional to) the spectral intensity of infrared light included in a light source.

Accordingly, in order to appropriately suppress the filtering-in components of infrared light without receiving influence of the spectral intensity of infrared light included in a light source, it is desirable not to constantly subtract a certain amount from the signal to be obtained from the image capturing device where the color filters 14 of predetermined colors are disposed, but to have the subtraction amount depend on (be proportional to) the spectral intensity of infrared light included in a light source. Infrared light components are actually measured, and the value obtained by multiplying the actual measurement information by a coefficient is subtracted from the signal to be obtained from the image capturing device where the color filters 14 of predetermined colors are disposed, whereby correction can be applied with an appropriate amount depending on the intensity of infrared light under actual image capturing environment, resulting in excellent correction accuracy.

Also, upon determining the most appropriate coefficient under a certain light source, the same coefficient can be used even if a light source condition changes, so it is unnecessary for a user to adjust the amount of correction depending on an image capturing environment, leading to ease of use.

Thus, output of each pixel where four types of color filters are disposed is subjected to matrix calculation, whereby a visible light color image and a near-infrared light image can be independently obtained. That is to say, the four types of color filters having different filter properties are disposed at the respective pixels of an image capturing device such as a photodiode, and the output of each pixel where the four types of color filters are disposed is subjected to matrix computing, whereby three primary-color output for forming a visible color image receiving almost no influence of near-infrared light, and output for forming a near-infrared light image receiving almost no influence of visible light can be obtained independently and also simultaneously.

Particularly, as for a visible light color image, deterioration in color reproducibility due to filtering of infrared light is corrected with computing processing, whereby image capturing having high sensitivity at a dark place and also excellent color reproducibility can be performed. A phenomenon wherein red signal components close to infrared light become great, and a phenomenon wherein luminance at a red portion of a picture image increases can be absorbed, and also improvement of color reproducibility and sensitivity rise at the time of low illumination can be balanced without employing a special image capturing device and mechanism. Also, the properties of the black filter 14BK are set in light of the properties of primary-color filters to be used, whereby the problem of color reproducibility due to the leakage components at lower wavelength side than infrared light can be eliminated.

Also, with the same image capturing device, a part of the dielectric layered film 1 formed integrally on a photodiode is arranged so as not to partially form the dielectric layered film 1, so the problem of positioning does not occur, which is different from the case of a separate optical member having the dielectric layered film 1 where the dielectric layered film 1 is partially not formed is disposed in front of the image capturing device.

Note that in addition to the pixels of the primary-color filters of R, G, and B, the signal of infrared light is obtained by adding the pixel of a black filter (black correction pixel 12BK), but this black correction pixel 12BK need not always be subjected to a layout form sufficient for capturing an infrared light image in that this is correction as to a visible light color image, and the layout of the black correction pixel 12BK is not restricted to the layout example illustrated in FIGS. 62A through 62C wherein the correction pixel 12IR (second detection portion) is disposed as to the pixels 12R, 12G, and 12B (first detection portion) for capturing an ordinary image one on one, and accordingly, the black correction pixel 12BK may be disposed at an arbitrary position.

For example, the black correction pixel 12BK may be disposed in places near the corner of the image capturing device. Thus, a layout form wherein one correction pixel (second detection portion) is disposed as to multiple pixels (first detection portion) for capturing an ordinary image can be realized, and a correction pixel (second detection portion) can be provided while giving almost no influence to the layout form of a pixel (first detection portion) for capturing an ordinary image. However, in this case, correction is performed as to the pixel signals of multiple pixels for capturing an ordinary image using the correction signal obtained at one correction pixel, and accordingly, it is difficult to handle the in-plane irregularities of the correction signal (infrared light signal in the present example).

In order to solve this, a correction pixel (second detection portion) may be inserted in the entire pixel array periodically with a certain numerical ratio as to the pixels (first detection portions) for capturing an ordinary image. In the event that there is in-plane irregularities wherein the reflectance of infrared light of a subject surface changes depending on a part of subject thereof, correction can be appropriately performed by inserting a correction pixel in the entire pixel array periodically. The best form for inserting a correction pixel (second detection portion) periodically is a form wherein a correction pixel (second detection portion) is disposed as to a pixel (first detection portion) for capturing an ordinary image one on one.

Thus, the black correction pixel 12BK is combined with the dielectric layered film 1, whereby an infrared light signal added to a visible light pixel signal can be removed effectively, and a visible light color image having excellent color reproducibility can be obtained without using a glass infrared light cut filter. Using no glass infrared light cut filter provides a cost advantage, high transmittance of visible light, and high sensitivity. With regard to deterioration of color reproducibility due to leakage of infrared light in the case of utilizing the dielectric layered film 1, correction is performed by computing processing using infrared light components actually measured with the black correction pixel 12BK, and accordingly, image capturing of which sensitivity at a dark place is high, and color reproducibility is good can be performed, and also a configuration for correction is simple, and correction accuracy is good.

Also, the black correction pixel 12BK is used as a correction pixel, so it is difficult for a signal to be saturated, and a dynamic range is expanded as compared with a configuration for passing though the entire wavelength components from visible light to infrared light (particularly, near-infrared light) (see a later-described second specific example utilizing white correction pixels).

Note that with the above example, the primary-color filters 14R, 14G, and 14B have been employed as the color filters 14 for capturing a visible light color image, but complementary-color filters Cy, Mg, and Ye can be also employed. In this case, as illustrated in FIG. 62B, it is desirable to employ a layout wherein the primary-color filter 14R is replaced with the complementary-color filter yellow Ye, the primary-color filter 14G with the complementary-color filter magenta Mg, and the primary-color filter 14B with the complementary-color filter cyan Cy, respectively. Subsequently, one of the complementary-color filter magenta Mg wherein the two complementary-color filters magenta Mg exists diagonally is provided with the black filter BK serving as a correction pixel.

An arrangement is made wherein the dielectric layered film 1 is formed on pixels 12Cy, 12Mg, and 12Ye except for pixels where the black filter is disposed, complementary-color filters 14Cy, 14Mg, and 14Ye are provided further above thereof, each color of the corresponding colors cyan Cy, magenta Mg, and yellow Ye within the visible light VL is received through the complementary-color filters 14Cy, 14Mg, and 14Ye. That is to say, a function for effectively cutting infrared light is realized by forming a dielectric layered film on the detection portions of pixels where three primary-color filters are provided.

Also, a combination of filters where the pixel of the black filter BK serving as a correction pixel can be provided are not restricted to a combination of the complementary-color filters of Cy, Mg, and Ye, and the pixel of the black filter BK serving as a correction pixel can be provided as to a combination of one of the primary-color filters such as the green filter G or white filter W and the complementary-color filters. For example, as illustrated in FIG. 62C, with a field accumulation frequency interleave method type wherein the two complementary-color filters Cy and Mg, and the primary-color filter of G are combined, one of the two primary-color filters G which are present within four pixels is preferably replaced with the black filter BK serving as a correction pixel.

When performing correction calculation in the case of employing these complementary-color filters, as shown in the following Expression (6), it is desirable to subtract correction signal components obtained by multiplying the infrared light signal components SIR by predetermined coefficients αCy, αMg, αYe, and αG from color signal components SCy, SMg, Sye, and SG obtained by adding the leakage signal components of infrared light to the respective color signal components in the original visible light wavelength region. Thus, respective correction color signals SCy*, SMg*, SYe*, and SG* made up of the respective signal components alone in the original visible light wavelength region for reproducing a visible light color image relating to visible light components (first wavelength region components) from which influence of the leakage components of infrared light (second wavelength region) is eliminated can be obtained.

[Expression 6]

$$\left.\begin{array}{l} \left.\begin{array}{l} SCy* = SCy - \alpha Cy \times SIR \\ SMg* = SMg - \alpha Mg \times SIR \\ SYe* = SYe - \alpha Ye \times SIR \\ SG* = SG - \alpha G \times SIR \end{array}\right\} \quad (6-1) \\ \left.\begin{array}{l} SCy = SCy(1 - \varepsilon Cy \times SIR) - \alpha Cy \times SIR \\ SMg = SMg(1 - \varepsilon Mg \times SIR) - \alpha Mg \times SIR \\ SYe** = SYe(1 - \varepsilon Ye \times SIR) - \alpha Ye \times SIR \end{array}\right\} \quad (6-2) \end{array}\right\} \quad (6)$$

<Application Example to Another Sensor Configuration According to the First Specific Example>

With the above first specific example, in the application example to the CCD solid state image capturing device 101 utilizing the dielectric layered film, one of the two greens (G) has been replaced with the black filter BK to provide a detection region for eliminating visible light, and receiving and detecting infrared light alone, but even in the solid state image capturing device 611 utilizing the difference of absorption coefficients depending on a wavelength in the depth direction of the spectral image sensor 511 utilizing the diffraction grating 501 or the semiconductor, a detection region for eliminating visible light, and receiving and detecting infrared light alone is provided, an infrared light image is obtained by using the infrared light signal to be obtained from this detection region, and also this infrared light signal can be used for correction as to a visible light color image to be obtained from the pixels where the color filters (e.g., primary-color filters R, G, and B) for capturing color images.

For example, in the event of applying to the spectral image sensor 511 utilizing the diffraction grating 501, the color filter array of the basic form of a so-called bayer array can be provided. In this case, in the plane direction, i.e., in a two-dimensional shape, a visible light image capturing region for detecting each color is formed at portions where the primary-color filters 12R, 12G, and 12B for capturing color images, and an infrared light image capturing region for detecting infrared light image capturing is formed at circumference thereof.

Also, even in the event of applying to the solid state image capturing device 611 utilizing the difference of absorption coefficients depending on a wavelength in the depth direction of the semiconductor, the color filter array of the basic form of a so-called bayer array can be provided. In this case, in the depth direction, i.e., in a three-dimensional shape, a visible light image capturing region for detecting each color is formed at a relatively shallow region of portions where the primary-color filters 12R, 12G, and 12B for capturing color images, and an infrared light image capturing region for detecting infrared light image capturing is formed at a region which is further deeper than that region.

In either case, with regard to the spectral sensitivity properties of the primary-color filters 12R, 12G, and 12B, it is desirable to use the properties of which transmittance is generally one at the wavelength region of each primary color and an infrared light region, and generally zero at the others. Using such properties is for reducing decay of infrared light components reaching the deep region of the semiconductor so as not to cause deterioration of a signal level to be obtained from the infrared light image capturing region to be used as correction components as to an infrared light image and a visible light color image.

Thus, in either case, an infrared light image which receives almost no influence of the visible light VL can be obtained independently of a visible light color image. Also, a visible light color image to be obtained at a shallow region of the semiconductor is subjected to correction calculation using infrared light image components to be obtained at a deep region of the semiconductor, thereby eliminating influence of infrared light components to be filtered in a visible light image, whereby color reproducibility can be improved.

Also, in either case, as can be understood from the features of each sensor configuration, provides a configuration wherein a detection region for obtaining visible light color images and a detection region for obtaining infrared light images are separated in the plane direction or depth direction of the semiconductor, and the color filters 14 for obtaining visible light color images are provided, whereby infrared light components can be also automatically obtained, which is different from the case of utilizing the dielectric layered film, and accordingly, when forming an infrared light image capturing region, it is unnecessary to dispose a black filter for correction aggressively, the color filter array of the basic form of a so-called bayer array can be used as it is. Thus, either case does not cause deterioration in the resolution of a visible light color image and infrared light image due to the pixel which is originally G being replaced with a black correction pixel, as described later.

<Color Separating Filter Array; Second Example>

Figure 69A:
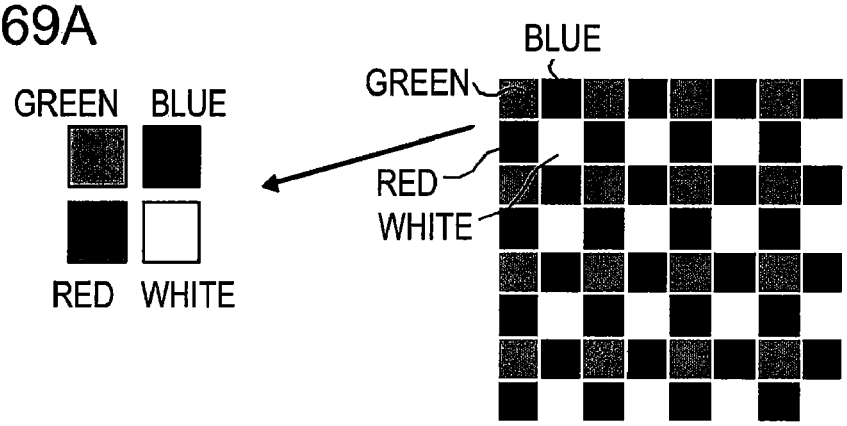
FIGS. 69A through 69C are diagrams illustrating the layout of a second specific example of a color separating filter for correction computing.
Figure 69B:
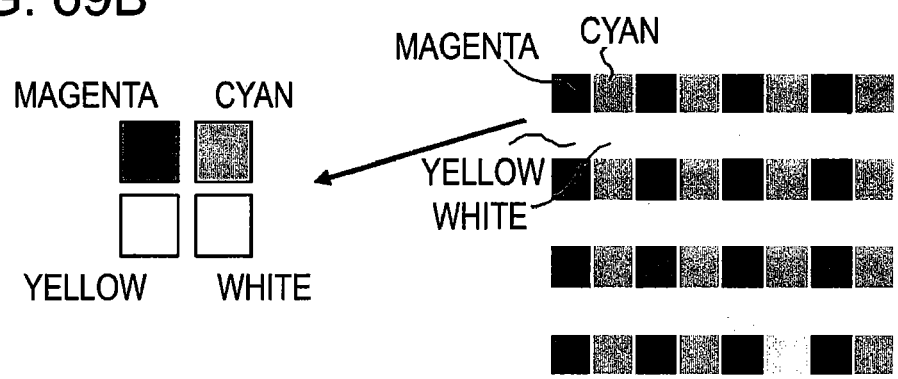
Figure 69C:
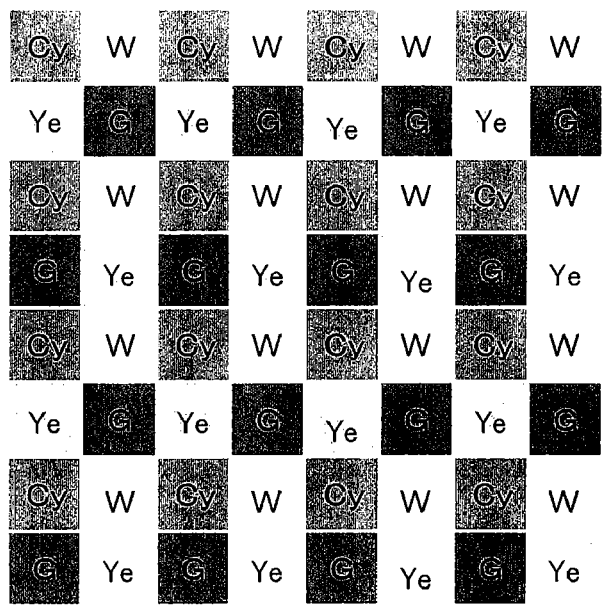

FIGS. 69A through 69C are diagrams illustrating a second specific example (hereinafter, referred to as "second specific example") of the layout of color separating filters which constantly enable a visible light color image and an infrared light image to be obtained independently using correction computing. This second specific example has features in that a detection region for receiving and detecting infrared light and also the entire wavelength components of visible light is provided as a detection region for correction as to a visible light color image.

As illustrated in FIG. 69A, color filters having a so-called bayer array basic form are employed, first of all, a pixel portion is configured wherein the repetition units of the color separating filters are disposed in two pixel by two pixel such that the unit pixels disposed in a tetragonal lattice shape corresponds to the three color filters of red (R), green (G), and blue (B). Also, in order to provide a detection portion (detection region) for receiving and detecting infrared light and also the entire wavelength regions of visible light, one of the two greens (G) is substituted with a white filter W. That is to say, filters for three wavelength regions (color components) of primary-color filters R, G, and B for visible light color images, and four types of color filters having individual filter properties such as a white filter W for infrared light which differs from the components of the primary-color filters R, G, and B are disposed regularly.

Note that a white correction pixel where the white filter W is disposed is for passing through the entire wavelength components from visible light to infrared light (particularly, near-infrared light), and effectively, a configuration where color filters are not provided can be employed in this point.

For example, a first color pixel for detecting a first color (red; R) is disposed at an even-line odd-row, a second color pixel for detecting a second color (green; G) is disposed at an odd-line odd-row, a third color pixel for detecting a third color (blue; B) is disposed at an odd-line even-row, and a fourth color pixel (here, white pixel) for detecting the infrared light IR is disposed at an even-line even-row, G/B pixels or R/W pixels, which differ for each line, are disposed in a checkered pattern shape. Such a color array of color filters having a bayer array basic form is repeated for each two colors of G/B or R/W regarding any of the line direction and row direction.

A visible light color image can be captured by the corresponding detection portion detecting visible light through the primary-color filters R, G, and B, and also an infrared light image or a mixed image of infrared light and visible light can be captured by the corresponding detection portion detecting infrared light through the white filter W independently of a visible light color image and also simultaneously with that. For example, employing the pixel data from the pixel 12IR for receiving the mixed components of the infrared light IR and the visible light VL as it is enables the image of the mixed components of the infrared light IR and the visible light VL to be obtained, whereby sensitivity can be improved. Also, the image of the visible light VL can be obtained as well as the image of the mixed components of the infrared light IR and the visible light VL, but taking the difference between both enables the image of the infrared light IR alone to be obtained. Also, the mixed image signal obtained from the pixel where the white filter W is disposed is also utilized as a correction signal as to the visible light color image to be obtained from the pixels where the primary-color filters of R, G, and B are disposed.

Figure 70:
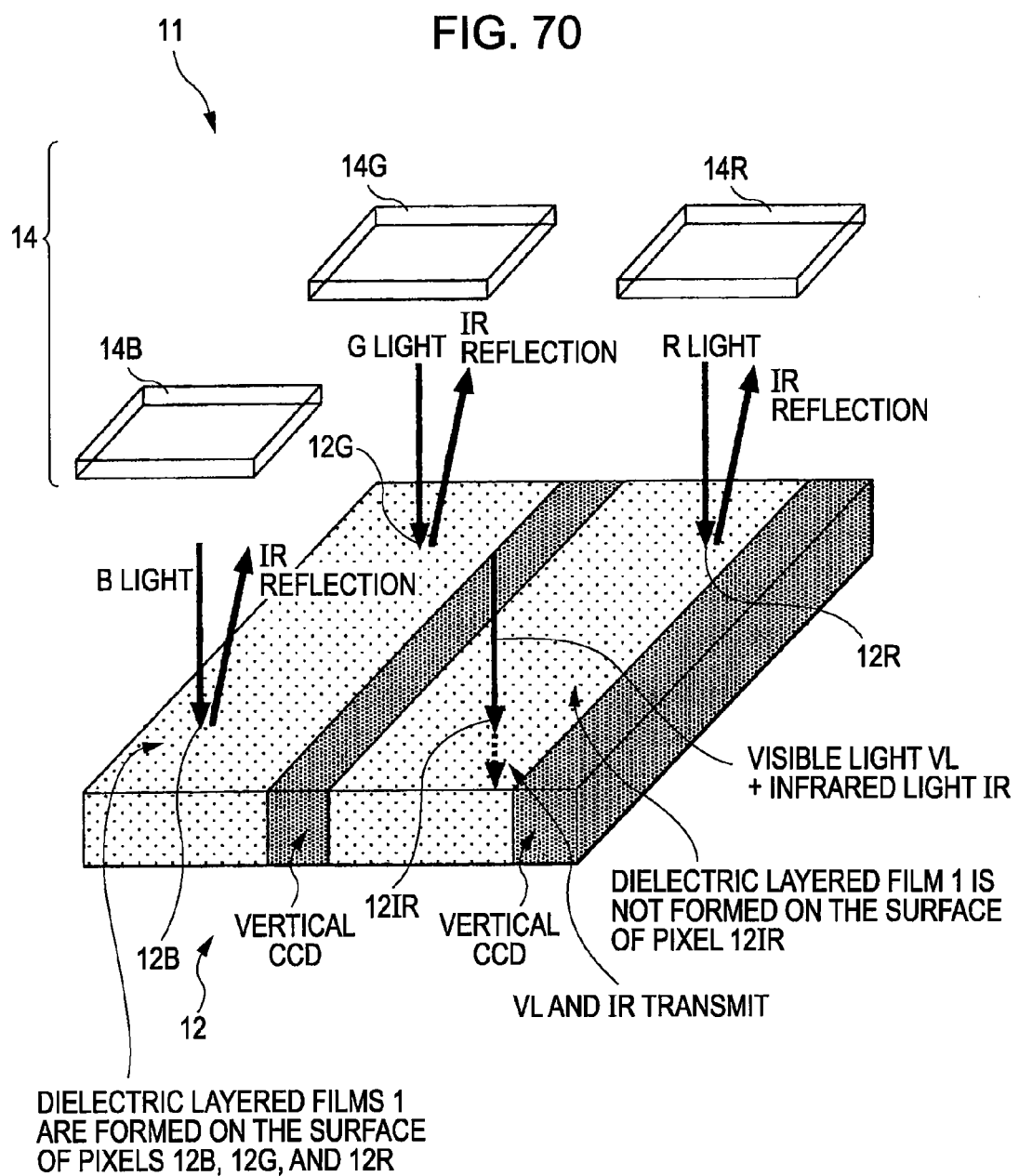
FIG. 70 is a diagram (perspective view) describing a configuration example of a CCD solid state image capturing device having the layout of the color separating filter illustrated in FIGS. 69A through 69C.

FIG. 70 is a diagram describing a CCD solid state image capturing device which is configured so as to have the layout of the color separating filters illustrated in FIGS. 69A through 69C, and capture two wavelength components of the infrared light IR and the visible light VL separately as images at the same time. Here, FIG. 70 is a sketch (perspective view) illustrating a configuration example. Note that here, an application example as to the CCD solid state image capturing device 101 utilizing a dielectric layered film. The cross-sectional configuration diagram of around the substrate surface is the same as FIG. 64.

With the configuration of the CCD solid state image capturing device 101 illustrated in FIG. 70, only the unit pixel matrix 12 made up of four pixels is illustrated, but the actual configuration is a configuration wherein the unit pixel matrix 12 made up of four pixels is repeated in the horizontal direction, and further is repeated in the vertical direction.

Of four pixels of a cycle array making up the unit pixel matrix 12, the color filter 14 in which the dielectric layered film 1 is not formed is not provided on one pixel 12IR, which is configured so as to receive the infrared light IR without passing through the color filter 14. In this case, the pixel 12IR can receive the mixed components of the infrared light IR and the visible light VL. This pixel 12IR where the color filter 14 is not disposed is referred to as a white correction pixel 12W or an entire area passage pixel.

Thus, the color filter 14 is not inserted regarding the white correction pixel 12W such that not only the infrared light IR but also the visible light contribute to a signal simultaneously at the pixel 12IR where the dielectric layered film 1 was not formed. Thus, substantially, the pixel 12IR for infrared light can be made to function not only as a pixel for the infrared light IR but also as a pixel for both of the infrared light IR and the visible light VL.

On the other hand, an arrangement is made wherein the dielectric layered film 1 is formed on the other three pixels 12B, 12G, and 12R, and the primary-color filters 14R, 14G, and 14B are provided above thereof, the corresponding three primary colors of blue B, green G, and red R within the visible light VL are received through the primary-color filters 14R, 14G, and 14B. That is to say, a function for effectively cut infrared light is realized by forming a dielectric layered film on the detection portions of pixels where three primary-color filters are provided. As for the primary-color filters 14R, 14G, and 14B to be employed in the second specific example, the same as the first specific example illustrated in FIG. 65A can be employed.

We have found that a visible light color image based on three primary color components, and an image made up of the infrared light IR alone or a mixed image of the infrared light IR and the visible light VL can be captured simultaneously by employing an image capturing device manufactured with such a configuration. However, there is a concern wherein with a visible light color image, color reproducibility is deteriorated by leakage of infrared light. Accordingly, correction is performed as follows.

<Correction Method of the Second Specific Example; First Example>

Figure 71:
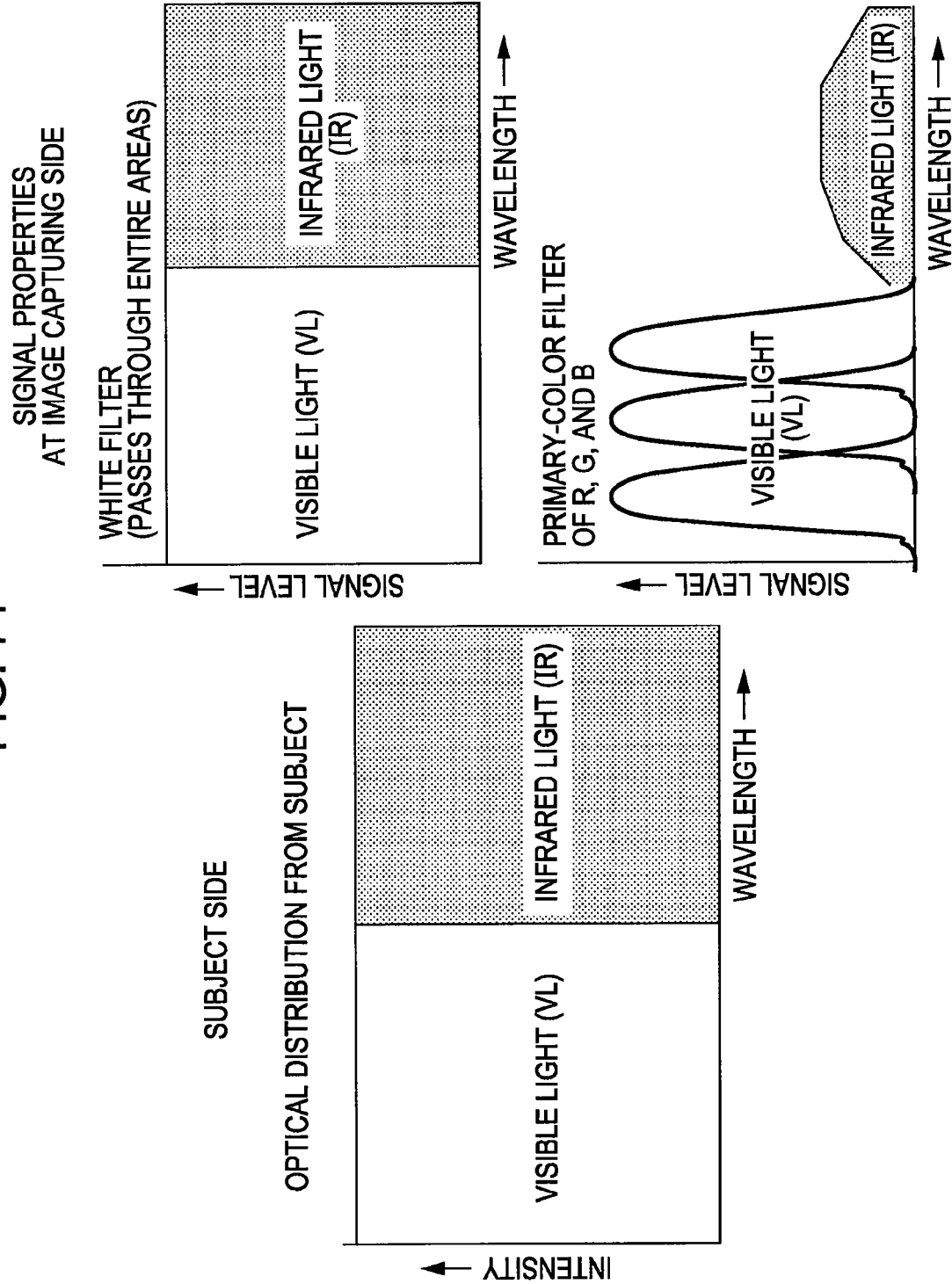
FIG. 71 is a diagram describing a correction method of infrared light components in the second specific example.

FIG. 71 is a diagram describing a correction method of infrared light components in the second specific example. The white correction pixel 12W where the color filters 14 are not disposed is provided, whereby a signal value SW which indicates the synthetic components of the infrared light IR and visible light cast into the image capturing device can be measured at the pixel 12IR.

Note that FIG. 71 illustrates assuming that the transmission properties of the white filter are equal at a visible light band and at an infrared light band, but this is not indispensable, or rather the transmission intensity of an infrared light band may be lower than that of a visible light band. It is desirable for the white filter to have properties which can transmit the entire wavelength components of a visible light band with sufficient intensity, and also can transmit an infrared light band with sufficient intensity as compared with the transmission intensity of the primary-color filters R, G, and B (see a later-described pseudo MLT filter).

Further, the added infrared signal (signal of infrared components) can be cut by subtracting the value obtained by multiplying the infrared light components to be obtained from the white correction pixel 12W by a coefficient from each of the three primary-color signals or a complementary-color signal. Thus, an image having excellent color reproducibility can be obtained even under the circumstances where infrared light exists.

However, the signal value SW to be obtained from the white correction pixel 12W includes not only the infrared light components IR but also the visible light components VL, which is different from the case of the black correction pixel, so it is necessary to estimate the signal intensity SIR of infrared light from which the signal intensity SVL of the visible light components VL is eliminated.

Specifically, the respective primary-color signal components SR, SG, and SB representing a visible light color image are corrected using the infrared light signal components SIR (measurement signal intensity of infrared light) representing an infrared light image, thereby obtaining corrected primary-color signals SR*, SG*, and SB* for reproducing a visible light color image relating to visible light components (first wavelength region components) from which influence of infrared light (second wavelength region) components is eliminated, i.e., correct color signal intensity made up of the respective color signal components alone in the original visible light wavelength region.

When performing the correction calculation of the first example of the correction method of the second specific example, as shown in the above Expression (5-1), the corrected primary-color signals SR*, SG*, and SB* from which influence of leakage components of infrared light (second wavelength region) is eliminated are obtained by subtracting correction signal components obtained by multiplying the estimated infrared light signal components SIR by predetermined coefficients αR, αG, and αB from the primary-color signal components SR, SG, and SB obtained by adding the leakage signal components of infrared light to the respective color components in the original visible light wavelength region. Of course, the above Expression (5-2) may be applied to the correction calculation of the first example of the correction method of the second specific example.

Here, as can be understood from FIG. 71, the infrared light signal components SIR represent of the signal value SW to be obtained at the white correction pixel 12W, principally the signal intensity of the infrared light components IR. Thus, the following Expression (7) holds as to the signal value SVL of the visible light components to be obtained at the white correction pixel 12W. Let us say that the term "infrared light components IR" mentioned here means principally the light of which wavelength is longer than 640 nm since it is necessary to shield the light at the wavelength side which is longer than around 640 nm of the G components from the spectral sensitivity curve of the color separating filter illustrated in FIG. 55. Generally, the definition of infrared light is invisible light, which is longer wavelength than 780 nm, but definition is made as the above, here.

[Expression 7]

$$SW = SVL + SIR \qquad (7)$$

On the other hand, the amount of light of the infrared light IR or the visible light VL has a proportional relation at the subject side and the image capturing side. That is to say, upon the amount of light increasing, the image capturing side also increases in proportion thereto. Accordingly, the relation such as in FIGS. 65A and 65B holds.

For example, it can be conceived that the amount of the visible light VL which transmitted the white filter (including the case of disposing no color filter 14) is equal to the sum of a value obtained by multiplying the amount of visible light which is transmitted at the primary-color filters 14R, 14G, and 14B by each coefficient, and accordingly, the signal intensity SVL of the visible light components VL transmitted at the white filter is generally equal to the sum of a value obtained by multiplying the corrected primary-color signal intensity SR*, SG*, and SB* of the visible light components transmitted at the primary-color filters 14R, 14G, and 14B by each of the coefficients βR, βG, and βB, which can be represented such as the following Expression (8).

[Expression 8]

$$SVL = \beta R \times SR^* + \beta G \times SG^* + \beta B \times SB \quad (8)$$

Accordingly, the signal intensity SIR of infrared light components to transmit the white filter can be represented such as the following Expression (9-1). Further, upon substituting Expression (5-1) for Expression (9-1), result thereof can be represented such as Expression (9-2). Upon further summarizing this regarding the infrared light components IR, result thereof can be represented such as Expression (9-3).

[Expression 9]

$$\begin{aligned}
SIR &= SW - SVL & (9-1) \\
&= SW - (\beta R \times SR* + \beta G \times SG* + \beta B \times SB*) \\
SIR &= SW - \{(\beta R \times (SR - \alpha R \times SIR) + \beta G \times (SG - \alpha G \times SIR + \\
&\quad \beta B \times (SB - \alpha B \times SIR)\} & (9-2) \\
SIR &= \frac{SW - (\beta R \times SR + \beta G \times SG + \beta B \times SB)}{1 - (\alpha R \times \beta R + \alpha G \times \beta G + \alpha B \times \beta B)} & (9-3)
\end{aligned}$$

(9)

Now, when paying attention to the signal components SW to be obtained at the white correction pixel, and the signal components SR, SG, and SB to be obtained at the primary-color filter pixels, and assuming that respective coefficients are γW, γR, γG, and γB, the coefficients γW, γR, γG, and γB can be represented such as the following Expressions (10-1) through (10-4), and Expression (9-3) can be rewritten to Expression (10-5) by using the coefficients γW, γR, γG, and γB. That is to say, the signal intensity SIR of the infrared light components alone included in the signal value SW to be obtained from the white correction pixel 12W can be estimated by using the signal components SR, SG, and SB to be obtained at the primary-color filter pixels.

That is to say, the image signal processing unit 340 subjects the signal value SW to be obtained from the white correction pixel 12W serving as the second detection portion to correction using the signal components SR, SG, and SB to be obtained at the primary-color filter pixels, whereby the signal intensity SIR of the infrared light components IR alone serving as the second wavelength region components from which visible light components (blue components through red components) serving as the first wavelength region components are eliminated.

[Expression 10]

$$\begin{aligned}
\gamma W &= \frac{1}{1 - (\alpha R \times \beta R + \alpha G \times \beta G + \alpha B \times \beta B)} & (10-1) \\
\gamma R &= \frac{\beta R}{1 - (\alpha R \times \beta R + \alpha G \times \beta G + \alpha B \times \beta B)} & (10-2) \\
\gamma G &= \frac{\beta G}{1 - (\alpha R \times \beta R + \alpha G \times \beta G + \alpha B \times \beta B)} & (10-3) \\
\gamma B &= \frac{\beta B}{1 - (\alpha R \times \beta R + \alpha G \times \beta G + \alpha B \times \beta B)} & (10-4) \\
SIR &= \gamma W \times SW - (\gamma R \times SR + \gamma G \times SG + \gamma B \times SB) & (10-5)
\end{aligned}$$

(10)

Note that when setting the coefficients γR, γG, and γB, the coefficients γR, γG, and γB relate to the coefficients βR, βG, and βB, and the coefficients αR, αG, and αB. The coefficients αR, αG, and αB are preferably the same as those in the case of the first specific example. The coefficients βR, βG, and βB are set based on the correspondence relation between the amount of the visible light VL which transmitted the white filter (including the case of disposing no color filters 14) and the sum of values obtained by multiplying the amount of visible light which transmitted the primary-color filters 14R, 14G, and 14B by each of the coefficients βR, βG, and βB. For example, the respective coefficients α, β, and γ are obtained by arithmetic calculation so as to reduce accident error using the Newton's method.

Generally, as illustrated in FIG. 71, in the event that the transmission properties in the visible light region of the primary-color filters 14R, 14G, and 14B have generally the same shape, the relation among the coefficients βR, βG, and βB is βR:βG:βB=3:6:1.

Thus, the output of each pixel of four-types of color filters, i.e., the output of the pixels where three-types of primary-color filters are disposed, and the output of the pixel where the white filter 14W is disposed (practically, color filters are not disposed) are subjected to matrix computing, whereby each of a visible light color image and a near-infrared light image can be independently obtained. That is to say, the four types of color filters having different wavelength passage properties (filter properties) are disposed at the respective pixels of an image capturing device such as a photodiode, and the output of each pixel where the four types of color filters are disposed is subjected to matrix computing, whereby three primary-color output for forming a visible color image receiving almost no influence of near-infrared light, a synthetic image where infrared light and visible light are mixed, or an image of infrared light alone which receives almost no influence of visible light using synthetic processing (specifically, difference processing) between mixed components and visible light components to be obtained from the white correction pixel 12W can be obtained independently and also simultaneously.

For example, employing the pixel data from the pixel 12IR for receiving the mixed components of the infrared light IR and the visible light VL as it is enables the image of the mixed components of the infrared light IR and the visible light VL to be obtained, whereby sensitivity can be improved. Also, the image of the visible light VL can be obtained as well as the image of the mixed components of the infrared light IR and the visible light VL, but taking the difference between both enables the image of the infrared light IR alone to be obtained.

Also, with the same image capturing device, a part of the dielectric layered film 1 formed integrally on a photodiode is arranged so as not to partially form the dielectric film 1, so the problem of positioning does not occur, unlike the case of a separate optical member having the dielectric layered film 1 where the dielectric layered film 1 is partially not formed being disposed in front of the image capturing device.

Particularly, as for a visible light color image, deterioration in color reproducibility due to filtering of infrared light is corrected with computing processing, whereby image capturing having high sensitivity at a dark place and also excellent color reproducibility can be performed. A phenomenon wherein red signal components close to infrared light become great, and a phenomenon wherein luminance at a red portion of a picture image increases can be absorbed, and also improvement of color reproducibility and sensitivity rise at the time of low illumination can be balanced at low cost without employing a special image capturing device and mechanism.

For example, the signal SW to be obtained from the white correction pixel 12W includes not only infrared light components but also visible light components, so a luminance signal to be obtained based on the pixels where the primary-color filters 14R, 14G, and 14B for capturing visible light color images are disposed is subjected to correction (actually, addition computing processing) using the signal SVL of the visible light components, whereby high sensitivity of a visible light color image can be realized independently of color reproducibility.

As illustrated in FIGS. 69A through 69C, an infrared light signal is obtained by adding the pixel of the white filter (white correction pixel 12W) in addition to the pixels of the primary-color filters R, G, and B, but it is not always necessary to have a sufficient layout form for capturing an infrared light image in that the white correction pixel 12W is correction as to a visible light color image, and accordingly, the layout of the white correction pixel 12W is not restricted to the layout example illustrated in FIGS. 69A through 69C, or rather may be disposed at an arbitrary position. For example, the white correction pixel 12W may be disposed in places near the corner of the image capturing device, or may be inserted in the entire pixel array periodically. Particularly, in the event that the reflectance of infrared light of a subject surface changes depending on a part of subject thereof, correction can be appropriately performed by inserting the correction pixel in the entire pixel array periodically.

Thus, the white correction pixel 12W is combined with the dielectric layered film 1, whereby an infrared light signal added to a visible light pixel signal can be removed effectively, and a visible light color image having excellent color reproducibility can be obtained without using a glass infrared light cut filter. Using no glass infrared light cut filter provides a cost advantage, high transmittance of visible light, and high sensitivity.

With regard to deterioration in color reproducibility due to leakage of infrared light in the case of utilizing the dielectric layered film 1, infrared light components are estimated from a signal including the infrared light components actually measured using the white correction pixel 12W, and this estimated infrared light components are subjected to correction by computing processing, and thus, image capturing can be performed with high sensitivity at a dark place and excellent color reproducibility, and also a configuration for correction is simple (however, more complex than the first specific example for the worth of estimating infrared light components), and further, the estimated infrared light components practically become infrared components actually measured, thereby providing excellent correction accuracy.

Incidentally, the white correction pixel 12W has sensitivity in a wide wavelength region from the visible light VL to the infrared light IR, and accordingly, a signal is readily saturated as compared with the pixels for capturing visible light color images (here, primary-color pixels where the primary-color filters are disposed), and particularly, this saturation phenomenon sometimes poses a problem in image capturing under a bright environment. Specifically, it is difficult to obtain an appropriate infrared light image under a bright environment, and also correction as to a visible light color image sometimes becomes unsuitable.

In order to eliminate this saturation problem, for example, with image capturing under a bright environment, image capturing may be performed at high speed using exposure control utilizing a shutter function (not restricted to a mechanical shutter, includes an electronic shutter). For example, an arrangement may be made wherein the image capturing device is subjected to exposure in a short cycle, a pixel signal is read out from image capturing device thereof (specifically, detection portion), and this pixel signal is sent to the pre-processing unit 332 of the image capturing signal processing unit 330.

In this case, for example, upon performing exposure and signal readout with higher a rate than 60 frames per second, an advantage as to saturation improves. Alternatively, it is desirable to be able to simply read out a signal in shorter time than 0.01667 seconds (accumulated time). In this case, accumulation of electric charge may be read out effectively in a short period of time by discharging an electric charge signal to the substrate side using overflow.

Further preferably, upon performing exposure and signal readout with higher a rate than 240 frames per second, an advantage as to saturation improves. Alternatively, it is desirable to be able to simply read out a signal in shorter time than 4.16 ms (accumulated time).

Note that pixels to read out electric charge in a short period of time (accumulated time) so as not to saturated thus may be the white correction pixel 12W alone, or may be all of the pixels including the other pixels for capturing visible light color images (here, the primary-color pixels where the primary-color filters are disposed).

Also, a weak signal at a dark place may be converted into a strong signal to improve an S/N ratio by integrating the signal read out in further a short period of time twice or more. For example, according to such an arrangement, even if image capturing is performed at a dark place or bright place, appropriate sensitivity and a high S/N ratio can be obtained, leading to expanding of the dynamic range. That is to say, performing image capturing at high speed prevents saturation at the white correction pixel 12W from occurrence, and also integrating signals enables a wide dynamic range to be obtained.

Note that with the above example, the primary-color filters 14R, 14G, and 14B have been employed as the color filters 14 for capturing a visible light color image, but complementary-color filters Cy, Mg, and Ye can be also employed. In this case, as illustrated in FIG. 67B, it is desirable to employ a layout wherein the primary-color filter 14R is replaced with the complementary-color filter yellow Ye, the primary-color filter 14G with the complementary-color filter magenta Mg, and the primary-color filter 14B with the complementary-color filter cyan Cy, respectively. Subsequently, one of the complementary-color filter magenta Mg wherein the two complementary-color filters magenta Mg exists diagonally is provided with the white filter W serving as a correction pixel.

An arrangement is made wherein the dielectric layered film 1 is formed on pixels 12Cy, 12Mg, and 12Ye except for pixels where the white filter is disposed, complementary-color filters 14Cy, 14Mg, and 14Ye are provided further above thereof, each color of the corresponding colors cyan Cy, magenta Mg, and yellow Ye within the visible light VL is received through the complementary-color filters 14Cy, 14Mg, and 14Ye. That is to say, a function for effectively cutting infrared light is realized by forming a dielectric layered film on the detection portions of pixels where complementary-color filters are provided.

Also, a combination of filters where the pixel of the white filter W serving as a correction pixel can be provided are not restricted to a combination of the complementary-color filters of Cy, Mg, and Ye, and the pixel of the white filter W serving as a correction pixel can be provided as to a combination of one of the primary-color filters, green filter G, and the complementary-color filters. For example, as illustrated in FIG. 67C, with a field accumulation frequency interleave method type wherein the two complementary-color filters Cy and Mg, and the primary-color filter of G are combined, one of the two primary-color filters G which are present within four pixels is preferably replaced with the white filter W serving as a correction pixel.

When performing correction computing in the case of employing these complementary-color filters, Expression (6) can be employed, and at that time, it is desirable to replace the infrared light components SIR such as the following Expression (11), as can be estimated from Expression (10-5). Note that of Expression (11), the respective components of Cy, Mg, Ye, and G are applied depending on a color filter to be actually used, but it is not always necessary to employ all of the color components, for example, in the case of the color filter layout illustrated in FIG. 67B, G components are set to zero, or in the case of the color filter layout illustrated in FIG. 69C, Mg components are set to zero.

[Expression 11]

$$SIR = \gamma W \times SW - (\gamma cy \times SCy + \gamma Mg \times SMg + \gamma Ye \times SYe + \gamma G \times SG) \quad (11)$$

<Correction Method of the Second Specific Example; Second Example>

As described above, description has been made regarding the correction computing of the first example in accordance with the above Expression (5-1) made up of linear terms alone as a correction method in the case of employing the white correction pixel 12W, but color difference can be further reduced by performing correction computing to which non-linear terms are added. This correction method is in common with the above Expression (5-2) in that nonlinear terms are considered, but the concept of syllabuses differs. Description will be made below in detail regarding this point.

When performing the correction computing of the second example of the correction method of the second specific example, as shown in the following Expression (12-1), it is desirable to add nonlinear correction signal components including two-dimensional signal components (S×IR) obtained by multiplying the product between the components obtained by subtracting the coefficients ηR, ηG, and ηB from the primary-color signal components S (SR, SG, and SB) and the infrared light signal components SIR by the coefficients ωR, ωG, and ωB to the components to be obtained by the above Expression (5-1). Note that if the coefficient products ωR×ηR, ωG×ηG, and ωB×ηB between the respective color components are sufficiently small, the components of the coefficient products can be ignored, and the following Expression (12-2) can also be applied. Note that the infrared light signal components SIR are the same as that shown in the above Expression (10-5).

[Expression 12]

$$\begin{aligned} SR \mathrel{*}= SR - \alpha R \times SIR + \omega R \times (SR - \eta R) \times SIR \\ SG \mathrel{*}= SG - \alpha G \times SIR + \omega G \times (SG - \eta G) \times SIR \\ SB \mathrel{*}= SB - \alpha B \times SIR + \omega B \times (SB - \eta B) \times SIR \end{aligned} \right\} (12-1)$$

$$\begin{aligned} SR \mathrel{*}= SR - \alpha R \times SIR + \omega R \times SR \times SIR \\ SG \mathrel{*}= SG - \alpha G \times SIR + \omega G \times SG \times SIR \\ SB \mathrel{*}= SB - \alpha B \times SIR + \omega B \times SB \times SIR \end{aligned} \right\} (12-2)$$

$$(12)$$

Expression (12-2) is similar to the above Expression (5-2), but Expression (5-2) aims at obtaining the equal signal level by correcting the amount of the three primary-color signal components for visible light color images to be increased in the case of providing no infrared light cut filter. On the other hand, Expression (12-1) and Expression (12-2) differs from Expression (5-2) in that Expression (12-1) and Expression (12-2) aim at obtaining correct color information with accuracy so as to reduce color difference.

Expression (12) is a syllabus example in the case of employing the primary-color filters 14R, 14G, and 14B, but the same can be applied to the case of employing the complementary-color filters Cy, Mg, and Ye, and further the case of employing a combination of the green filter G or white filter W and the complementary-color filters.

When performing correction computing in the case of employing these complementary-color filters, it is desirable to apply the following Expression instead of the above Expression (12), as one example. This point is the same concept as that in the case of applying the above Expression (6) as to the above Expression (5).

[Expression 13]

$$\begin{aligned} SCy \mathrel{*}= SCy - \alpha Cy \times SIR + \omega Cy \times (SSy - \eta Sy) \times SIR \\ SMg \mathrel{*}= SMg - \alpha Mg \times SIR + \omega Mg \times (SMg - \eta Mg) \times SIR \\ SYe \mathrel{*}= SYe - \alpha Ye \times SIR + \omega Ye \times (SYe - \eta Ye) \times SIR \\ SG \mathrel{*}= SCy - \alpha Cy \times SIR + \omega Cy \times (SSy - \eta Sy) \times SIR \end{aligned} \right\} (13-1)$$

$$\begin{aligned} SCy \mathrel{*}= SCy - \alpha Cy \times SIR + \omega Cy \times SCy \times SIR \\ SMg \mathrel{*}= SMg - \alpha Mg \times SIR + \omega Mg \times SMg \times SIR \\ SYe \mathrel{*}= SYe - \alpha Ye \times SIR + \omega Ye \times SYe \times SIR \\ SG \mathrel{*}= SG - \alpha G \times SIR + \omega G \times SG \times SIR \end{aligned} \right\} (13-2)$$

$$(13)$$

<Correction Method of the Second Specific Example; Third Example>

Figure 72:
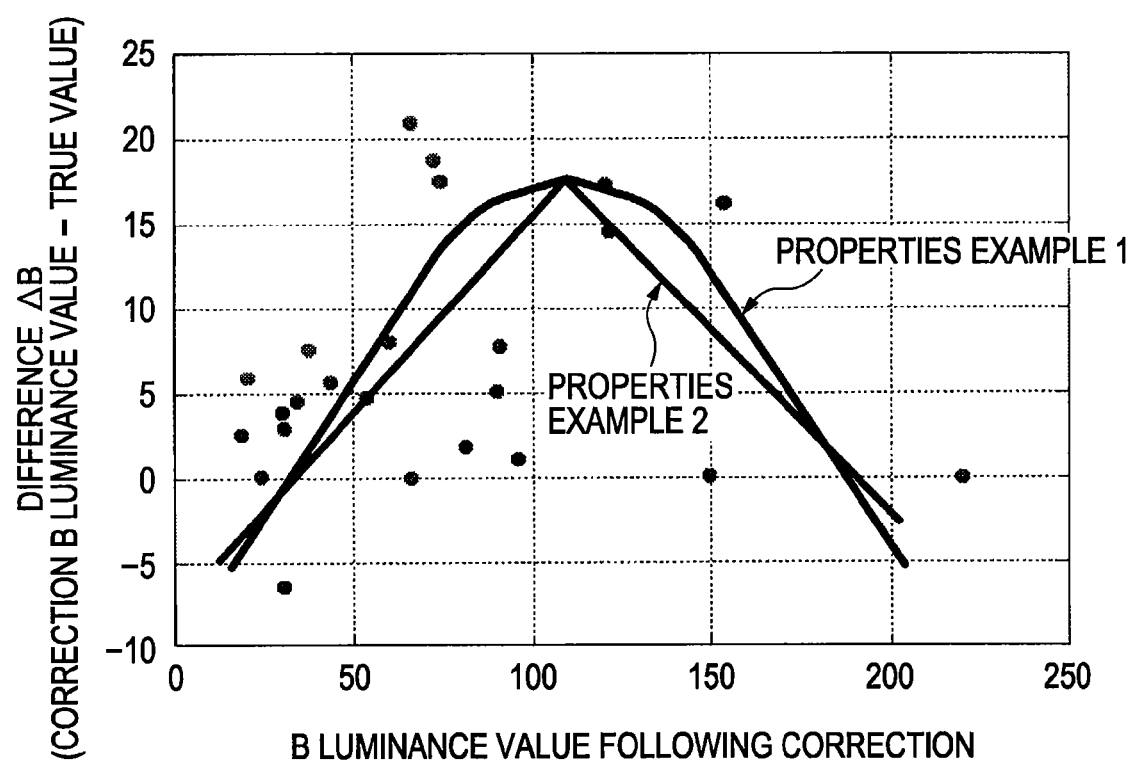
FIG. 72 is a diagram (part one) describing the correction technique of the third example of the second specific example.
Figure 74A:
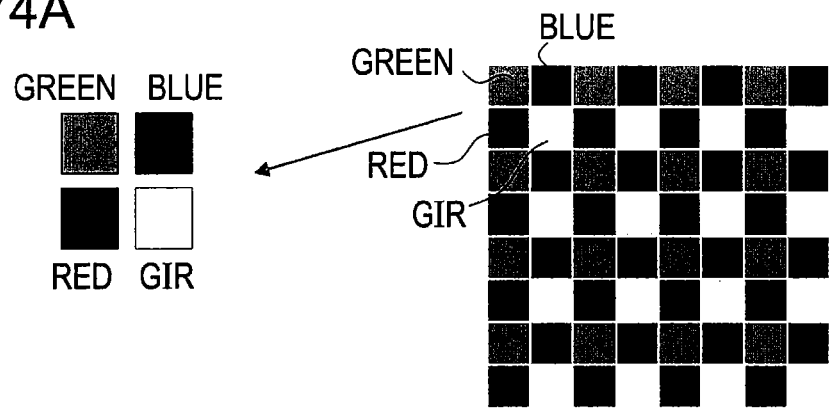
FIGS. 74A through 74C are diagrams illustrating the layout of a third specific example of a color separating filter for correction computing.
Figure 74B:
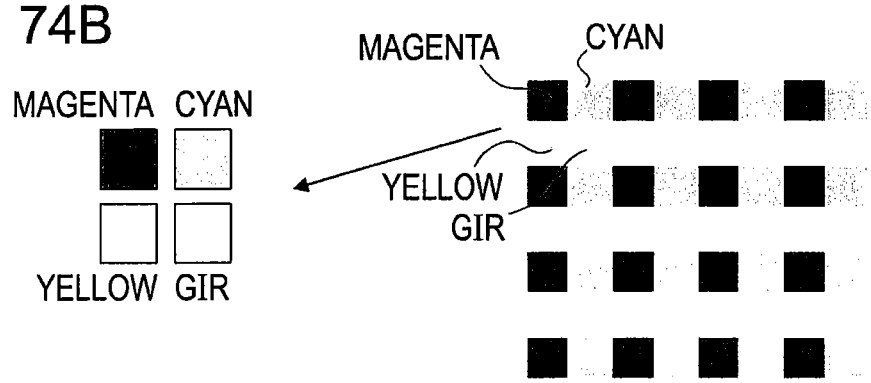
Figure 74C:
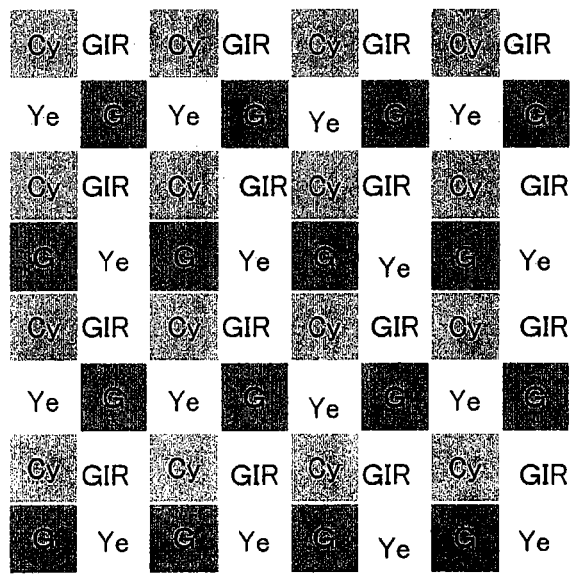
Figure 75:
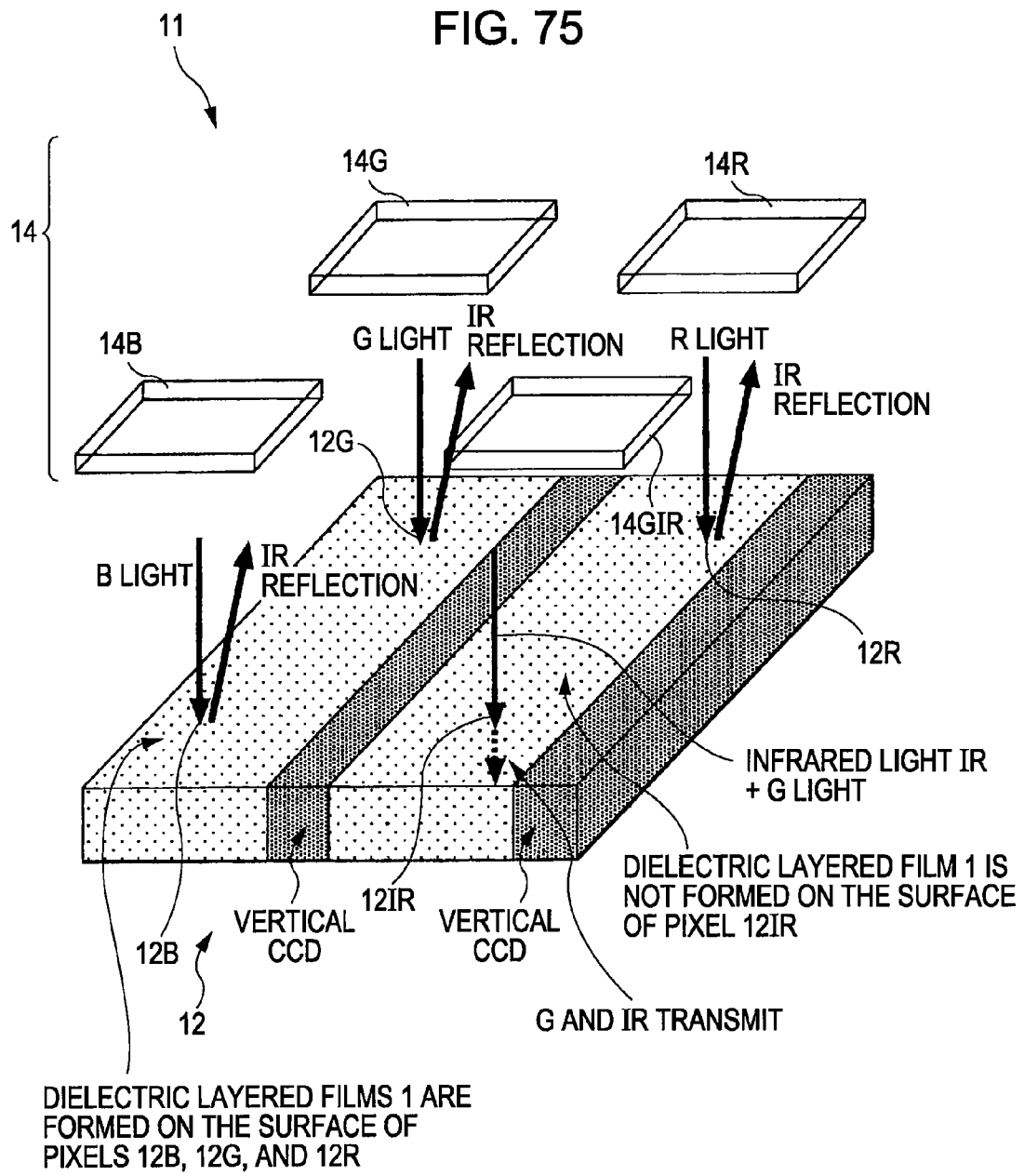
FIG. 75 is a diagram (perspective view) describing a configuration example of a CCD solid state image capturing device which is configured so as to have the layout of the color separating filter illustrated in FIGS. 74A through 74C, and capture two wavelength components of infrared light and visible light separately as images at the same time.

FIGS. 72 and 73 are diagrams describing the correction method of a third example in the second specific example.

With Expression (12) and Expression (13), nonlinear correction signal components including two-dimensional signal components obtained by multiplying the product (S×IR) between the infrared light components IR and the original signal components S by a predetermined coefficient are added so as to reduce color difference, but the correction components of a two-dimensional or more, high dimensional expression of the difference (S−η) between the color signal S an counting f can also be utilized.

For example, as shown in the following Expression (14-1), it is desirable to add nonlinear correction signal components including three-dimensional signal components (S^2×IR) obtained as a whole by multiplying the product between the square of the components obtained by subtracting the coefficients ηR, ηG, and ηB from the primary-color signal components SR, SG, and SB and the infrared light signal components SIR by the coefficients ωR, ωG, and ωB to the components to be obtained by the above Expression (5-1).

Also, it is desirable to add nonlinear correction signal components, not restricted to the multi-dimensional expression of the product between the difference (S−η) and the infrared light components SIR, an absolute value expression such as shown in the following Expression (14-2), or a correction expression for obtaining nonlinear signal components by multiplying the infrared light components SIR by a conditional expression utilizing a one-dimensional expression such as shown in the following Expression (14-3) can be applied.

[Expression 14]

$$SR \mathrel{*}= SR - \alpha R \times SIR + \omega R \times (SR - \eta R)^2 \times SIR$$
$$SG \mathrel{*}= SG - \alpha G \times SIR + \omega G \times (SG - \eta G)^2 \times SIR \quad (14\text{-}1)$$
$$SB \mathrel{*}= SB - \alpha B \times SIR + \omega B \times (SB - \eta B)^2 \times SIR$$

$$SR \mathrel{*}= SR - \alpha R \times SIR + \omega R \times |SR - \eta R| \times SIR$$
$$SG \mathrel{*}= SG - \alpha G \times SIR + \omega G \times |SG - \eta G| \times SIR \quad (14\text{-}2)$$
$$SB \mathrel{*}= SB - \alpha B \times SIR + \omega B \times |SB - \eta B| \times SIR$$

When $S \leq \eta$
$$SR \mathrel{*}= SR - \alpha R \times SIR - \omega R \times (SR - \eta R) \times SIR$$
$$SG \mathrel{*}= SG - \alpha G \times SIR - \omega G \times (SR - \eta R) \times SIR$$
$$SB \mathrel{*}= SB - \alpha B \times SIR - \omega B \times (SB - \eta B) \times SIR$$
When $S > \eta$ $\quad (14\text{-}3)$
$$SR \mathrel{*}= SR - \alpha R \times SIR + \omega R \times (SR - \eta R) \times SIR$$
$$SG \mathrel{*}= SG - \alpha G \times SIR + \omega G \times (SG - \eta G) \times SIR$$
$$SB \mathrel{*}= SB - \alpha B \times SIR + \omega B \times (SB - \eta B) \times SIR$$

(14)

For example, FIG. 72 illustrates a graph for plotting blue (B) components, taking the difference between the luminance values of the color components following correction computing using the linear expressions shown in Expression (5-1) and Expression (6-1) and the true values (the luminance values of the B components at the time of employing an IR cut filter) of color components thereof as a vertical axis, and further, taking the luminance values following correction computing as a horizontal axis. In the case of this graph, the difference exhibits convex dependency as to the luminance value following correction, and as the line segment indicating properties thereof, a form similar to a two-dimensional expression such as properties example 1, or a form wherein dependency changes depending on whether the luminance value is greater than or smaller than the value ηB such as properties example 2 can be obtained.

Accordingly, as illustrated in FIG. 73, upon adding concave dependency properties to the above dependency properties, a constant difference can be obtained. If nothing is done, a state retaining a constant difference continues, so color reproducibility poses a problem, but the entire difference can be eliminated by further taking white balance. Thus, the error of correction computing can be reduced by subjecting the changing point (equivalent to a coefficient η) of difference to computing of an expression appropriate thereto.

As for an expression indicating concave dependency, the two-dimensional expression of the difference (S−η) as shown in the above Expression (14-1), or a common nonlinear format can be applicable thereto, but this is not always a multi-dimensional expression. For example, as with Expression (14-2) or Expression (14-3), even with an expression wherein dependency changes depending on whether the luminance value is greater than or smaller than the value ηB, the same advantage can be obtained.

<Color Separating Filter Array; Third Example>

FIGS. 74A through 74C and 75 are diagrams illustrating a third example of a specific example (hereinafter, referred to as "third specific example") of a layout example of color separating filters which constantly enable a visible light color image and an infrared light image to be obtained independently using correction computing. This third specific example has features in that a detection region for receiving and detecting infrared light and also certain wavelength components within visible light is provided as a detection region for correction as to a visible light color image.

As one example, the white correction pixel 12W having the configuration of the second specific example illustrated in FIG. 70 is replaced with the pixel wherein the green filter 14GIR is disposed. In this case, the pixel 12IR can receive the mixed components with the green of the infrared light IR and the visible light VL. The pixel 12IR where the green filter 14GIR is disposed is referred to as green correction pixel 12GIR. With the pixel 12G where the green filter 14G for detecting visible light is disposed, it is unnecessary to have sensitivity as to an infrared light region, but it is necessary to pay attention in that the green correction pixel 12GIR needs to have sensitivity as to an infrared light region.

In this case, a visible light color image can be captured by the corresponding detection portion detecting visible light through the primary-color filters R, G, and B, and also an infrared light image or a mixed image of infrared light and green light can be captured by the corresponding detection portion detecting infrared light through the green filter G for correction independently of a visible light color image and also simultaneously therewith.

For example, employing the pixel data from the pixel 12IR for receiving the mixed components of the infrared light IR and the green light as it is enables the image of the mixed components of the infrared light IR and the green light to be obtained, whereby sensitivity can be improved. Also, the image of the visible light VL can be obtained as well as the image of the mixed components of the infrared light IR and the green light, but taking the difference with the green components in the visible light image VL enables the image of the infrared light IR alone to be obtained. Also, the mixed image signal obtained from the pixel where the green filter G for correction is disposed is also utilized as a correction signal as to the visible light color image to be obtained from the pixels where the primary-color filters of R, G, and B are disposed.

When performing correction computing processing, Expression (5-1) and Expression (6) can be applied as is, as with the first and second specific examples. Also, when estimating the signal SIR of infrared light components from the signal SGIR, it is desirable to replace the signal SW in the second specific example with the signal SGIR to be obtained from the green correction pixel 12GIR, and employ the signal SVL of visible light components regarding green components alone, and specifically, replace Expression (10-5) with such as Expression (15).

[Expression 15]

$$SIR=\gamma GIR \times SGIR - \gamma G \times SG \qquad (15)$$

Note that the signal SGIR to be obtained from the green correction pixel 12GIR includes not only infrared light components but also green light components, so a signal to be obtained from the pixels where the primary-color filters 14R, 14G, and 14B for capturing visible light color images are disposed is subjected to correction (actually, addition computing processing) using the green light components, whereby high sensitivity and high resolution of a visible light color image can be realized.

In this point, the case of employing the white correction pixel 12W in the second specific example is the same, the signal to be obtained from the pixels where the primary-color filters 14R, 14G, and 14B for capturing visible light color images are disposed is subjected to correction (actually, addition computing processing) using the visible light components (R, G, and B) to be detected at the white correction pixel 12W, whereby high sensitivity and high resolution of a visible light color image can be realized.

Note that with the third specific example, the primary-color filters 14R, 14G, and 14B have been employed as the color filters 14 for capturing visible light color images, but a combination with complementary-color filters Cy, Mg, or Ye, or primary-color filter G can be also employed.

Also, even with the configurations of the second specific example and the third specific example, in theory, the white correction pixel 12W or the green correction pixel 12GIR can be applied to the spectral image sensor 511 utilizing the diffraction grating 501, and the solid state image capturing device 611 utilizing the difference of absorption coefficients depending on a wavelength in the depth direction of the semiconductor by providing the white correction pixel 12W or the green correction pixel 12GIR, as with the modification in the first specific example.

However, as can be understood from the features of each sensor configuration, a configuration wherein the detection region for obtaining a visible light color image and the detection region for obtaining an infrared light image are separated in the plane direction or depth direction of the semiconductor, and infrared light components can be automatically obtained at the infrared light image detection region by providing the color filters 14 for obtaining visible light color images is provided, so it is inadvisable to provide the pixel where the white filter or green filter for correction is disposed, aggressively.

Note that with any of the first through third specific examples, the pixel where a color filter for correction is disposed can be used as a pixel for detecting infrared light, whereby advanced functions such as optical communication using infrared light, distance measurement, and so forth can be realized, and also visible light and infrared light can be detected and captured as an image simultaneously. Thus, with the same image sensor, infrared light image information, which is difficult to see by the eye, corresponding to a visible light image which can be seen by the eye, and a color image of which tone is particularly accurate (color reproducibility is good) can be received simultaneously. Thus, application is expanded as the key device of an information system such as an infrared camera and so forth.

For example, the position of the emitting light point of infrared rays is prepared beforehand to trace this, whereby the position of the emitting light point of infrared light present within a visible light image can be detected. Also, even with no visual light, e.g., even at night, a clear infrared light image can be obtained by radiating infrared light to capture an image, thereby enabling application as an image sensor for crime prevention.

<Other Layout Examples of Color Separating Filters>

FIGS. 76A through 82B are diagrams describing a pixel array in light of deterioration in resolution in the case of providing correction pixels as to a visible light color image in the spectral image sensor 11 utilizing the dielectric layered film 1.

With regard to a pixel array, in the event of applying an array configuration such as in FIGS. 62A through 62C or FIGS. 69A through 69C, a pixel for detecting infrared light (or mixture of infrared light and visible light) is to be simply added to the visible light pixels of the past RGB primary-color filters or CyMgYe complementary-color filters (or primary-color filter G).

For example, the green pixel G for capturing visible light color images and the magenta pixel Mg are originally to be replaced with the black correction pixel, white correction pixel, green correction pixel, or magenta correction pixel, and accordingly, which may cause deterioration in resolution regarding any of a visible light color image and an infrared light image. For example, upon one pixel of the past RGB bayer array being replaced with an infrared pixel, resolution deteriorates. However, the problem of deterioration in resolution can be eliminated by devising the layout form of the pixels (e.g., green pixel G) of wavelength components which greatly contribute to correction pixels and resolution.

At this time, what is important is to dispose the pixels of infrared light (or the mixture of infrared light and visible light) so as to form a mosaic pattern with a certain grating interval, and also dispose one pixel within the visible light primary-color RGB or complementary-color CyMgYe pixels so as to form a mosaic pattern with a certain grating interval, in the event of employing a color separating filter configuration where the respective color filters are disposed in a mosaic shape, as with the past.

Here, the term "so as to form a mosaic pattern" means that when paying attention to certain color pixels, these pixels are to be arrayed in a grating shape with a certain grating interval. It is not always indispensable that the color pixels are adjacent to one another. Note that as for a typical example in the case of employing a layout form where color pixels are adjacent to one another, there is a layout form wherein the squares of infrared light pixels and the other color pixels are alternately arrayed so as to form a checkered pattern. Alternatively, there is a layout form wherein the squares of one pixel within the visible light primary-color RGB or complementary-color CyMgYe pixels and the other color pixels are alternately arrayed so as to form a checkered pattern.

<Application Example to Primary-color Filters>

For example, in order to suppress deterioration in resolution of a visible light color image while employing RGB primary-color filters, it is desirable to keep the layout density of the pixels of the visible light region G, and replace the remaining R or B pixels of the visible light region with black pixels, white pixels, or green pixels for correction. For example, as illustrated in FIGS. 76A and 76B, first, the color pixels G for detecting the green components of a visible light region are disposed at odd-lines and odd-rows, and at even-lines and even-rows within the unit pixel matrix 12 of two lines by two rows, and black pixels (FIG. 76A), white pixels (FIG. 76B), or green pixels (not shown) for correction are disposed at even-lines and odd-rows.

Also, with the odd in the row direction of the unit pixel matrix 12, the color pixels B for detecting the blue components of a visible light region are disposed at odd-lines and even-rows in the unit pixel matrix 12 of at the odd-numbered in the line direction, and the color pixels R for detecting the infrared components of a visible light region are disposed at odd-lines and even-rows in the unit pixel matrix 12 at the even-numbered in the line direction. With the even-numbered in the row direction of the unit pixel matrix 12, the layout of the color pixels B and the layout of the color pixels R are inversed. As a whole, the repeated cycle of the color filters 14 is to be completed at the unit pixel matrix 12 of two by two.

Figure 76A:
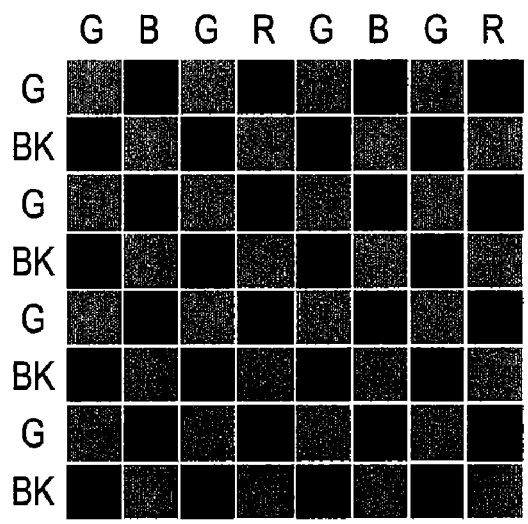
FIGS. 76A and 76B are diagrams (part one) describing a pixel array in light of deterioration in resolution.
Figure 76B:
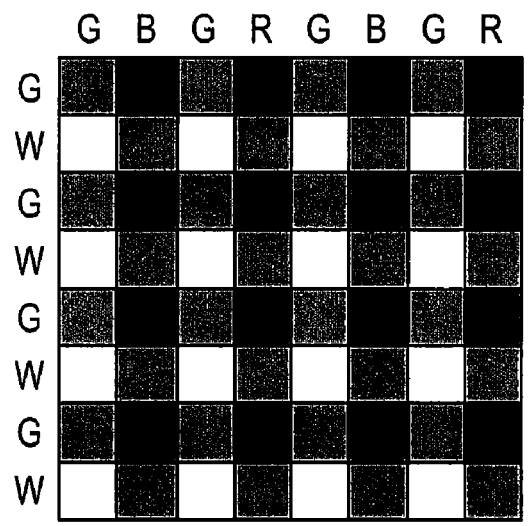

In the event of the layout form such as illustrated in FIGS. 76A and 76B, the layout form of a checkered pattern wherein the squares of one pixel G within the visible light primary-color RGB pixels and the other color pixels are alternately arrayed is employed, and the layout density of the color pixels G which greatly contribute to the resolution in a visible light color image can be set to the same as that of the bayer array, and thus, deterioration in resolution of a visible light color image is eliminated.

However, the layout density of the color pixels R and the color pixels B become ½ as to the bayer array, so that color resolution deteriorates. However, with human visibility regarding colors, red R and blue B deteriorate as compared with green G, so it may be conceived that the above problem will not become a big problem. On the other hand, with regard to infrared light images utilizing correction pixels, the layout density of the correction pixels become ½ as to the color pixels G for detecting the green components of a visible light region, so the resolution deteriorates as compared with visible light color images.

Figure 77:
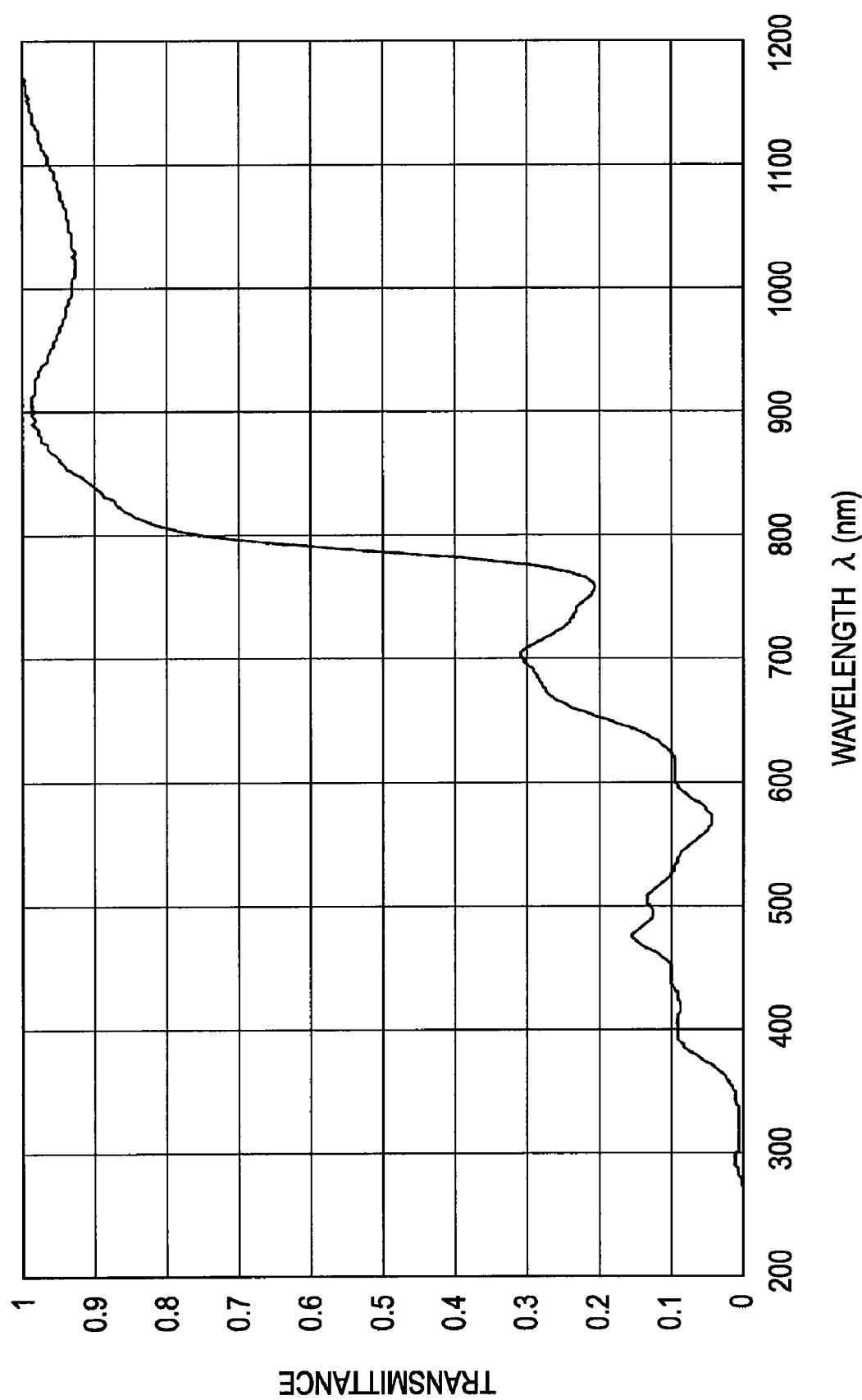
FIG. 77 is a diagram illustrating one example of the transmission spectral properties of a black filter.

For example, the CMOS solid state image capturing device (the pixel circuit configuration is FIGS. 5A and 5B) having a layer configuration (the cross-sectional configuration diagram corresponding to a pixel for receiving visible light is FIG. 34) illustrated in FIG. 53 where black correction pixels are disposed with the layout form such as illustrated in FIG. 76A using the black filter 14BK exhibiting transmission spectral properties such as illustrated in FIG. 77 was manufactured in accordance with the manufacturing process in FIG. 32, and experimented. As a result, we have found that the high-resolution color image of the three primary-color visible light, and the infrared light image which is lower resolution than a color image, but relatively high-resolution can be captured simultaneously.

As can be understood from FIG. 77, the infrared light side exhibits transmission properties. The infrared light components mixed in the three primary-color visible light pixels were corrected as with the above Expression (5-1) using the signal indicating the infrared light components to be obtained from the black correction pixels, but the problem of color reproducibility due to infrared light components was not caused. As a result, we have confirmed that an image captured even under an environment where infrared light exists has excellent color reproducibility and high sensitivity by being subjected to such correction.

Also, the CMOS solid state image capturing device (the pixel circuit configuration is FIGS. 5A and 5B) having a layer configuration (the cross-sectional configuration diagram corresponding to a pixel for receiving visible light is FIG. 34) illustrated in FIG. 53 where white correction pixels are disposed in the layout form such as illustrated in FIG. 76B was manufactured in accordance with the manufacturing process in FIG. 32, and experimented. As a result, we have found that the high-resolution color image of the three primary-color visible light, and the image where infrared light which is lower resolution than a color image, but relatively high-resolution, and visible light are mixed can be captured simultaneously, and also the image of infrared light alone can be captured simultaneously by reducing the intensity of blue, red, and green to be detected at the three primary-color visible light pixels R, G, and B.

Also, as with the above Expression (10-5), the signal indicating infrared light components was extracted from the mixed components of the visible light components and infrared light components to be obtained form the white correction pixels (estimation), and the infrared light components mixed in the three primary-color visible light pixels were subjected to correction in accordance with the above Expression (5-1) using the extracted signal indicating infrared light components, but the problem of color reproducibility due to infrared light components was not caused. As a result, we have confirmed that an image captured even under an environment where infrared light exists has excellent color reproducibility and high sensitivity by being subjected to such correction.

Also, we have confirmed that the luminance signal to be obtained based on the three primary-color visible light pixels are subjected to correction using the visible light components to be obtained from the white correction pixels, whereby high sensitivity of a visible light color image can be realized independently of color reproducibility.

Also, we have confirmed that all of the pixels are exposed in a short period of time so as not to be saturated to read out an electric charge signal, the signal read out in a short period of time is further integrated twice or more, whereby the signal can be converted into a great signal, and even if image capturing is performed under a dark environment or bright environment, appropriate sensitivity can be obtained, leading to expand a dynamic range.

Also, we have confirmed that even if a configuration wherein the black correction pixels and a multi-layered film are combined such as illustrated in FIG. 76A, or a configuration wherein the white correction pixels and a multi-layered film are combined such as illustrated in FIG. 76B is manufactured not only with a CMOS solid state image capturing device but also with a CCD configuration such as illustrated in FIG. 64, the same advantage can be obtained.

Figure 78A:
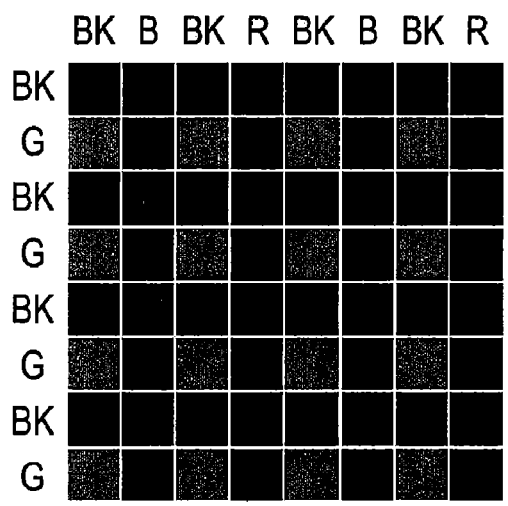
FIGS. 78A and 78B are diagrams (part two) describing a pixel array in light of deterioration in resolution.
Figure 78B:
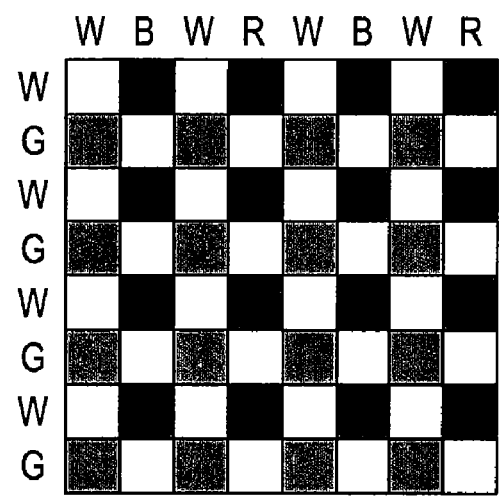

Also, in order to suppress deterioration in resolution of an infrared light image, for example, as illustrated in FIGS. 78A and 78B, it is desirable to replace the positions of the color pixels G for detecting the green components of the visible light region illustrated in FIGS. 76A and 76B with the positions of the black pixels (FIG. 78A), white pixels (FIG. 78B), or green pixels (not shown) for correction. In this case, the layout form of a checkered pattern wherein the squares of the infrared light pixels serving as correction pixels and the other color pixels are alternately arrayed is employed, the layout density of the correction pixels can be the same as the case of a bayer array, thereby eliminating deterioration in the resolution of an infrared light image. However, the layout density of the color pixels G which contribute to the resolution in a visible light color image becomes ½ as to the correction pixels, so that the resolution of a visible light color image deteriorates as compared with that of an infrared light image. Color resolution is the same as the case of FIGS. 76A and 76B.

For example, the CCD solid state image capturing device (the pixel circuit configuration is as in FIGS. 4A and 4B, the cross-sectional configuration diagram corresponding to a pixel for receiving visible light is FIG. 64) where black correction pixels are disposed with the layout form such as illustrated in FIG. 78A using the black filter 14BK exhibiting transmission spectral properties such as illustrated in FIG. 77 was manufactured and experimented. As a result, we have found that a high-resolution infrared light image, and a visible light image which is lower resolution than an infrared light image, but relatively high-resolution can be captured simultaneously.

As can be understood from FIG. 77, the infrared light side exhibits transmission properties. The infrared light components mixed in the three primary-color visible light pixels were corrected as with the above Expression (5-1) using the signal indicating the infrared light components to be obtained from the black correction pixels, but the problem of color reproducibility due to infrared light components was not caused. As a result, we have confirmed that an image captured even under an environment where infrared light exists has excellent color reproducibility and high sensitivity by being subjected to such correction.

Also, the CCD solid state image capturing device (the pixel circuit configuration is as in FIGS. 4A and 4B, the cross-sectional configuration diagram corresponding to a pixel for receiving visible light is FIG. 64) where white correction pixels are disposed in the layout form such as illustrated in FIG. 76B was manufactured and experimented. As a result, we have found that images in which high resolution infrared light and visible light are mixed can be captured simultaneously, and an image of high resolution infrared light alone can be captured by reducing the intensity of blue, red, and green to be detected at the three primary-colors R, G, and B, and simultaneously, a visible light color image of which resolution is lower than an infrared light image, but relatively high-resolution can be captured.

Also, as with the above Expression (10-5), the signal indicating infrared light components was extracted from the mixed components of the visible light components and infrared light components to be obtained form the white correction pixels (estimation), and the infrared light components mixed in the three primary-color visible light pixels were subjected to correction in accordance with the above Expression (5-1) using the extracted signal indicating infrared light components, but the problem of color reproducibility due to infrared light components was not caused. As a result, we have confirmed that an image captured even under an environment where infrared light exists has excellent color reproducibility and high sensitivity by being subjected to such correction.

Also, we have confirmed that the luminance signal to be obtained based on the three primary-color visible light pixels are subjected to correction using the visible light components to be obtained from the white correction pixels, whereby high sensitivity of a visible light color image can be realized independently of color reproducibility.

Also, we have confirmed that the electric charge of the white pixels alone is read out in a short period of time using overflow so as not to be saturated, the signal read out in a short period of time is further integrated twice or more, whereby the signal can be converted into a great signal, and even if image capturing is performed under a dark environment or bright environment, appropriate sensitivity can be obtained, leading to expansion of dynamic range.

Also, we have confirmed that even if a configuration wherein the black correction pixels and a multi-layered film are combined such as illustrated in FIG. 78A, or a configuration wherein the white correction pixels and a multi-layered film are combined such as illustrated in FIG. 78B is manufactured not only with a CCD solid state image capturing device but also with a CMOS configuration, the same advantage can be obtained.

Figure 79A:
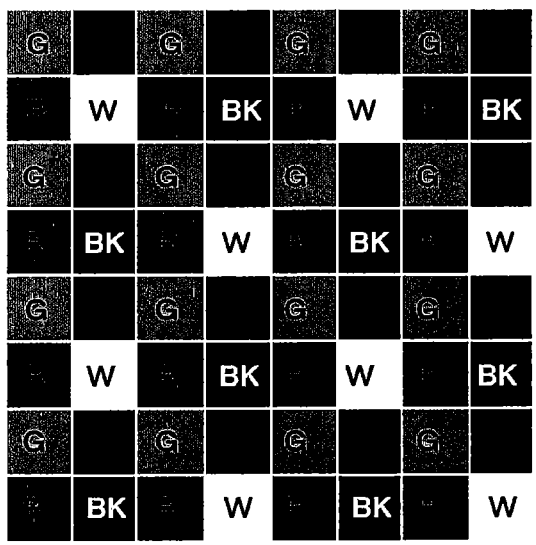
FIGS. 79A through 79C are diagrams (part three) describing a pixel array in light of deterioration in resolution.
Figure 79B:
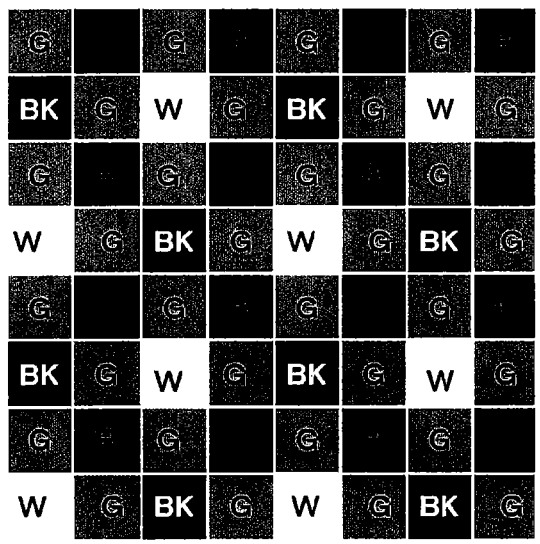
Figure 79C:
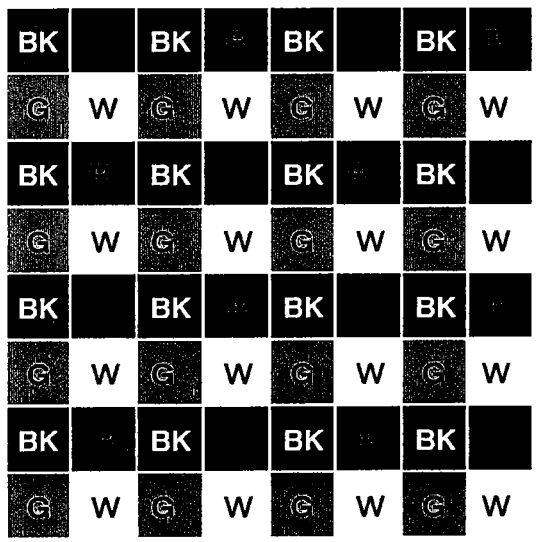

FIGS. 79A through 79C are diagrams describing another pixel array in the case of providing correction pixels as to a visible light color image. This modified form has features in that multiple colors of color filters to be disposed at correction pixels are combined. For example, with the example illustrated in FIGS. 79A through 79C, the first specific example and the second specific example are combined, the black filter 14BK and white filter 14W each serving as a correction pixel are alternately disposed at to the unit pixel matrix 12. Here, FIG. 79A is a combination of FIGS. 62A through 62C and FIGS. 69A through 69C, FIG. 79B is a combination of FIGS. 76A and 76B, and FIG. 79C is a combination of FIGS. 78A and 78B.

According to the layout form of such a combination, for example, the white correction pixel 12W can be principally used for high sensitivity, and the black correction pixel 12BK can be used for color correction. Of course, the white correction pixel 12W can be also used for color correction.

<Application Example to Complementary-Color Filters>

Figure 80A:
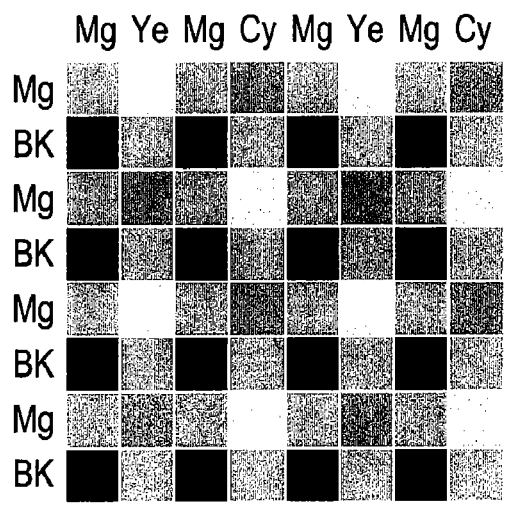
FIGS. 80A and 80B are diagrams (part four) describing a pixel array in light of deterioration in resolution.
Figure 80B:
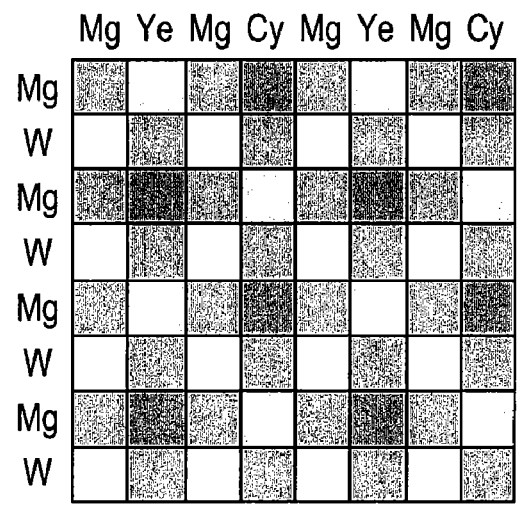

Also, in order to suppress deterioration in resolution of a visible light color image while employing CyMgYe complementary-color filters, it is desirable to keep the layout density of the pixels of the visible light region Mg, and replace the remaining R or B pixels of the visible light region with black pixels, white pixels, or green pixels for correction. For example, as illustrated in FIGS. 80A and 80B, first, the color pixels Mg for detecting the magenta components of a visible light region are disposed at odd-lines and odd-rows, and at even-lines and even-rows within the unit pixel matrix 12 of two lines by two rows, and black pixels (FIG. 80A), white pixels (FIG. 80B), or magenta pixels (not shown) for correction are disposed at even-lines and odd-rows. Note that one of the magentas Mg can be also replaced with the green G.

In this case, the layout form of a checkered pattern wherein the squares of one pixel Mg within the visible light complementary-color CyMgYe pixels and the other color pixels are alternately arrayed is employed, and the layout density of the color pixels Mg which greatly contribute to the resolution in a visible light color image can be set to the same as that of the bayer array, and thus, deterioration in resolution of a visible light color image is eliminated.

Note that the layout density of the color pixels Cy and the color pixels Ye is ½ as to the array of the color pixels Mg, so color resolution deteriorates, but human visibility regarding colors is low, and accordingly, it may be conceived that the above problem will not become a big problem. On the other hand, with regard to infrared light images utilizing correction pixels, the layout density of the correction pixels (infrared light pixels) become ½ as to the color pixels Mg for detecting the magenta components of a visible light region, so the resolution deteriorates as compared with visible light color images.

Figure 81A:
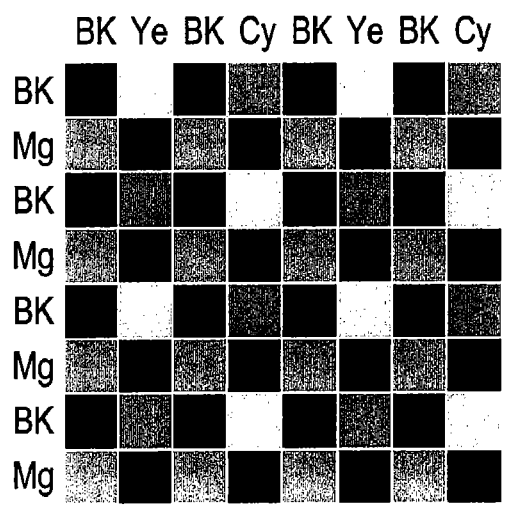
FIGS. 81A and 81B are diagrams (part five) describing a pixel array in light of deterioration in resolution.
Figure 81B:
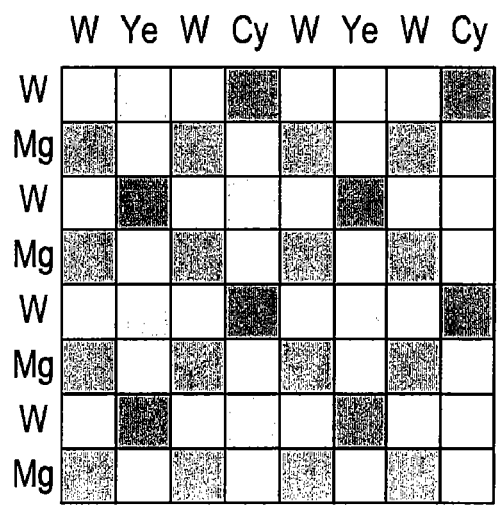

Also, in order to suppress deterioration in resolution of an infrared light image, for example, as illustrated in FIGS. 81A and 81B, it is desirable to replace the positions of the color pixels Mg for detecting the magenta components of the visible light region with the positions of the black pixels (FIG. 81A), white pixels (FIG. 81A), or magenta pixels (not shown) for correction. In this case, the layout form of a checkered pattern wherein the squares of the infrared light pixels serving as correction pixels and the other color pixels are alternately arrayed is employed, the layout density of the correction pixels can be the same as the case of a bayer array, thereby eliminating deterioration in the resolution of an infrared light image. However, the layout density of the color pixels Mg which contribute to the resolution in a visible light color image becomes ½ as to the correction pixels, so that the resolution of a visible light color image deteriorates as compared with that of an infrared light image. Color resolution is the same as the case of FIGS. 80A and 80B.

Note that with the above layout form example for suppressing deterioration in resolution, the pixels of the green G or the magenta Mg are disposed so as to form a mosaic pattern (checkered pattern serving as a standard example) with high density as much as possible, but even if the pixels of the other colors (R, B, or Cy, Ye) are disposed so as to form a checkered pattern, almost the same advantage can be obtained. Of course, in order to improve resolution and color resolution, it is desirable to dispose the color component filter of which visibility is high so as to form a mosaic pattern with high density as much as possible.

<Application Example to Oblique Layout>

Figure 82A:
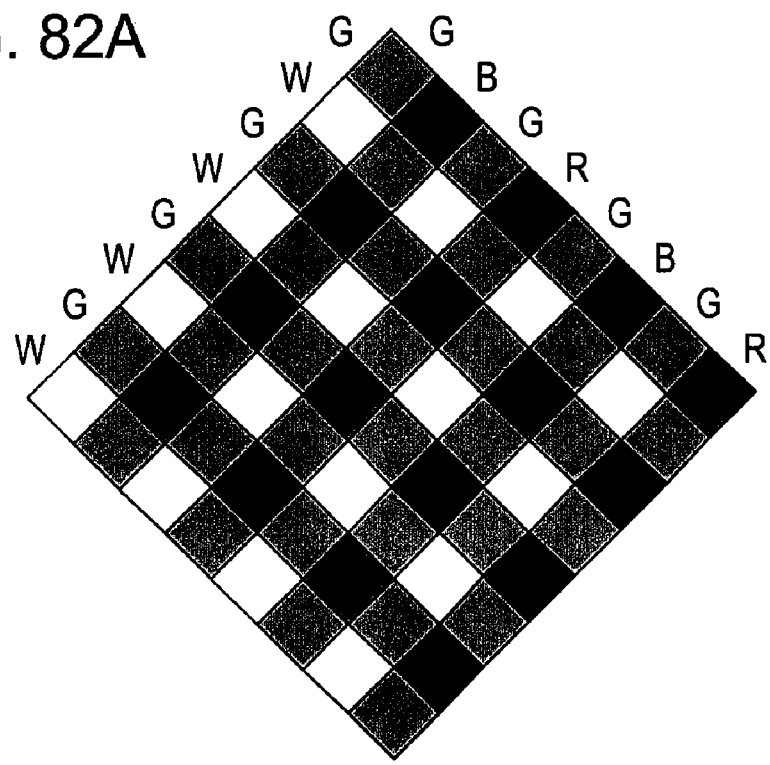
FIGS. 82A and 82B are diagrams (part six) describing a pixel array in light of deterioration in resolution.
Figure 82B:
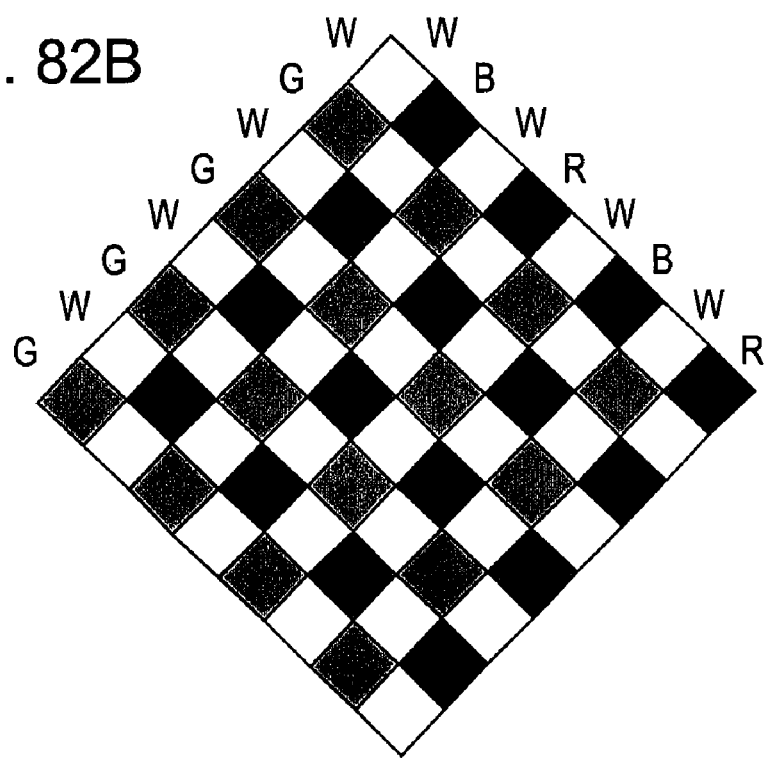

Note that with the above example, description has been made regarding an instance for disposing color filters in a tetragonal grating shape, but which can be arrayed in an oblique grating shape. For example, the layout form illustrated in FIG. 82A is a pixel array in a state in which the layout form illustrated in FIG. 76B is rotated clockwise by generally 45 degrees. Also, the layout form illustrated in FIG. 82A is a pixel array in a state in which the layout form illustrated in FIG. 78B is rotated clockwise by generally 45 degrees. Thus, upon color filters being arrayed in an oblique grating shape, each pixel density in the vertical direction and in the horizontal direction is to increase, whereby the resolution in those directions can be further improved.

<<Experimental Example; Black Correction Pixel>>

FIGS. 83 through 94 are diagrams describing the experimental example of an arrangement for correcting the color reproducibility of a visible light color image using the black correction pixels.

Figure 83:
FIG. 83 is a diagram illustrating the overview of a monochrome camera employed for an experiment.

First, FIG. 83 is a diagram illustrating the overview of the monochrome camera employed for an experiment in the case of applying black correction pixels. With this experimental example, an experiment was performed with the monochrome camera XCL-X700 manufactured by Sony Corporation serving as the base by adding color filters. The fundamental capability of the monochrome camera XCL-X700 (hereinafter, also referred to as experimental camera) is, for example, ½-inch type, all pixels readout (progressive), the effective number of pixels is 1034×779, the number of image capturing pixels is 1024×768, and the size of pixels is 6.25 µm.

Figure 84:
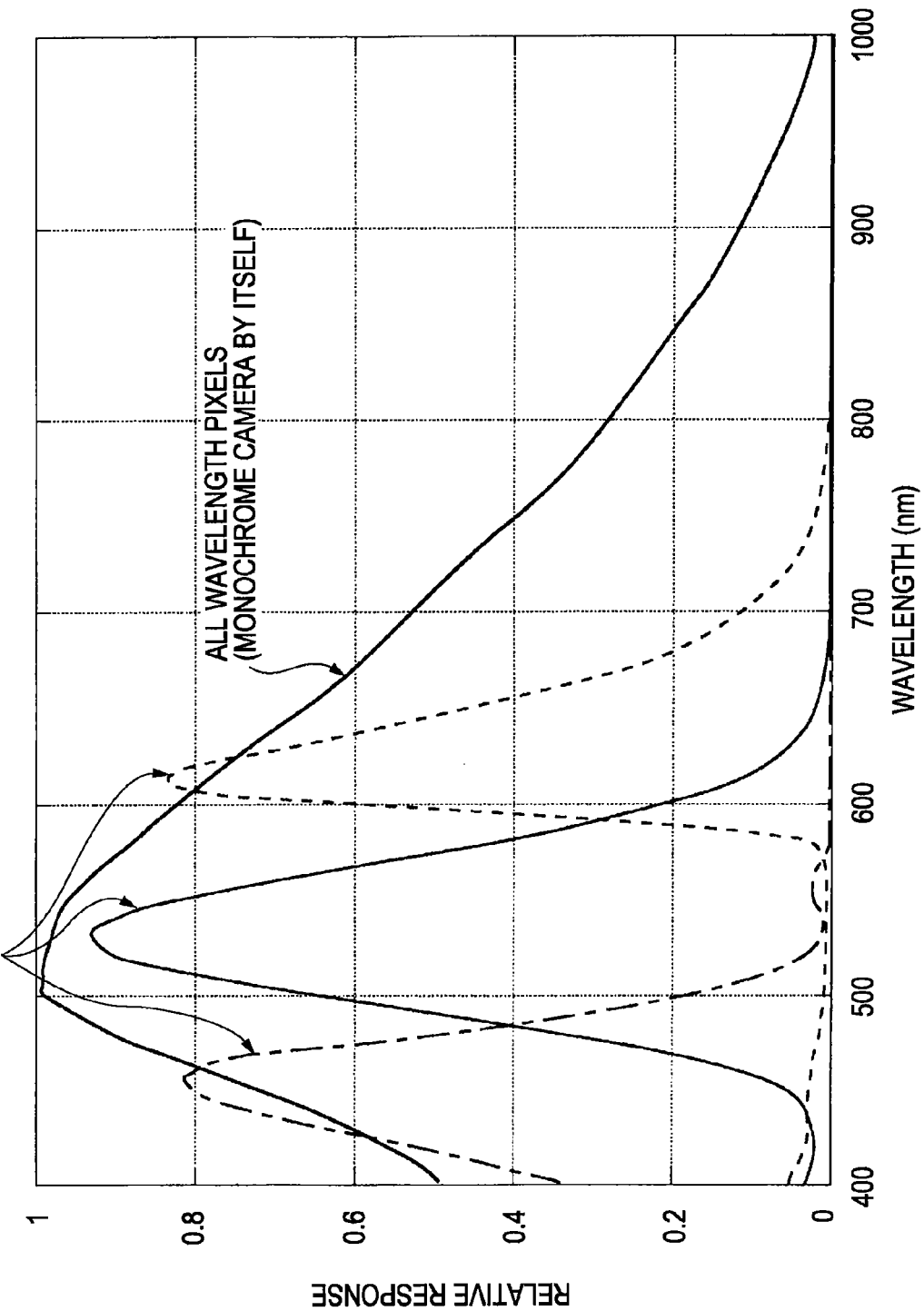
FIG. 84 is a spectral sensitivity properties diagram of the experimental camera and color filters.

FIG. 84 is a spectral sensitivity properties diagram of the experimental camera and color filters. The entire wavelength pixels in the drawing are the properties itself of the monochrome experimental camera. Also, the respective pixels of R, G, and B are in the case of the respective color filters of R, G, and B are disposed in the experimental camera, and exhibit the results of adding correction of weighting.

Figure 85:
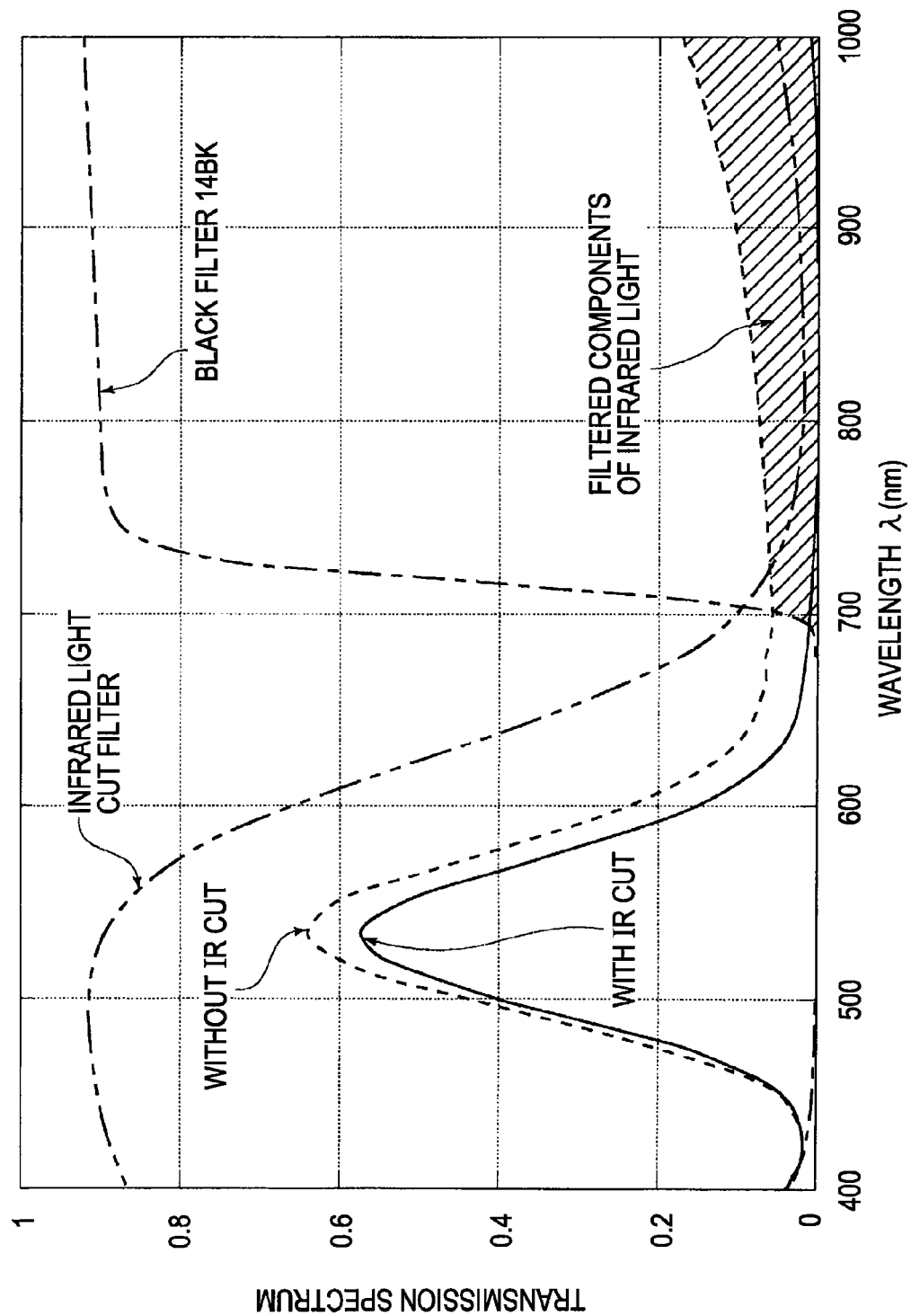
FIG. 85 is a diagram of the respective transmission spectrums of a black filter employed for G color, an infrared light cut filter, and correction pixels.

FIG. 85 is a diagram of the respective transmission spectrums of a black filter employed for G color, an infrared light cut filter, and correction pixels. The ideal transmission properties of the infrared light cut filter is "1" at a visible light region (wavelength of less than 700 nm), and "0" at an infrared light region (wavelength of 700 nm or more), but as illustrated in the drawing, there is somewhat loss at a visible light region, and also there is somewhat transmission at an infrared light region.

Accordingly, with the transmission spectrum of the G color, transmittance somewhat differs (needless to say, transmittance is high in the case of no infrared light cut filter) depending on whether or not the infrared light cut filter exits. Also, in the case of no infrared light cut filter, there is somewhat transmission at an infrared light region, i.e., there are the leakage components (IR leakage light) of infrared light. The leakage components of infrared light can be obtained separately from visible light components by using the black filter.

Figure 86:
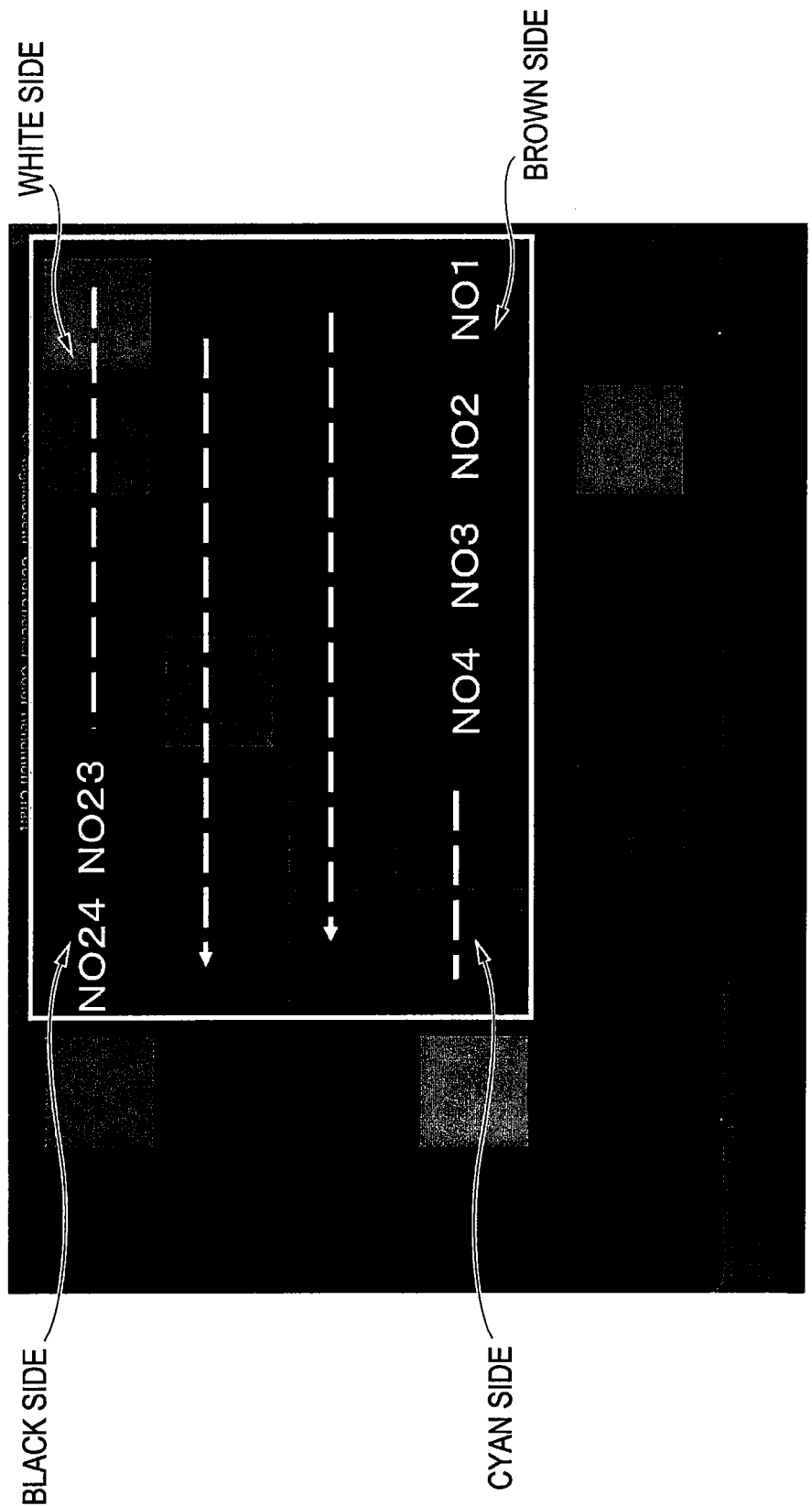
FIG. 86 is a diagram illustrating correspondence of color chip numbers (one cycle; 24 colors) in a Macbeth chart employed as the indices of colorimetry.

FIG. 86 is a diagram illustrating correspondence of color chip numbers (one cycle; 24 colors) in a Macbeth chart employed as the indices of colorimetry. FIGS. 87A through 87C are diagrams illustrating the image (raw data image) based on unfiltered image data obtained by capturing a Macbeth chart using the experimental camera and the green filter G. As for image capturing conditions, let us say that a 20-W incandescent lamp and a fluorescent light are used as a light source, diaphragm is f2.8 corresponding to the lens F2.8 of the experimental camera, and shutter speed is ½.8 second.

Here, FIG. 87A is the green image G in the case of employing no infrared light cut filter (excluding IR cut), FIG. 87B is the green image G in the case of employing an infrared light cut filter (including IR cut), and FIG. 87C is difference image thereof, i.e., the image of the infrared light leakage components of the green filter G. FIG. 88 is a diagram representing a signal level (actual value) for each color chip number of the Macbeth chart which is the image capturing result illustrated in FIGS. 87A through 87C.

As can be understood from comparison of the respective drawings in FIGS. 87A through 87C or 88, the signal level of the G color filter pixel output which captured the respective color chips of the Macbeth chart differs depending on whether or not an infrared light cut filter exists.

Figure 89A:
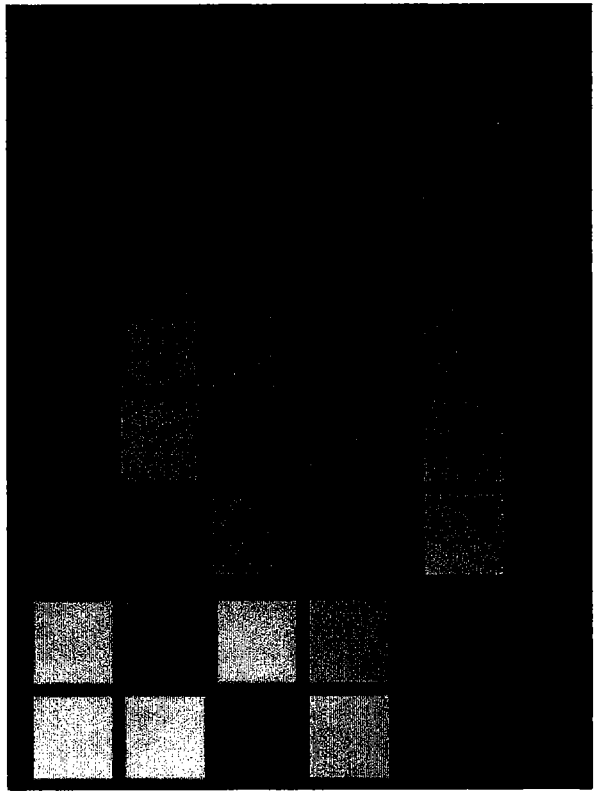
FIGS. 89A and 89B are diagrams illustrating the image based on unfiltered image data obtained by capturing a Macbeth chart using the experimental camera and a black filter BK serving as a correction pixel.
Figure 89B:

FIGS. 89A and 89B are diagrams illustrating the image (raw data image) based on unfiltered image data obtained by capturing the Macbeth chart using the experimental camera and the black filter BK serving as a correction pixel. The image capturing conditions are the same as those in FIGS. 87A through 87C. Here, FIG. 89A is the image of the black filter BK (black filter image Br), and FIG. 89B is the image of infrared light leakage components of the green filter G as a comparative example (the same as FIG. 88C).

Figure 90A:
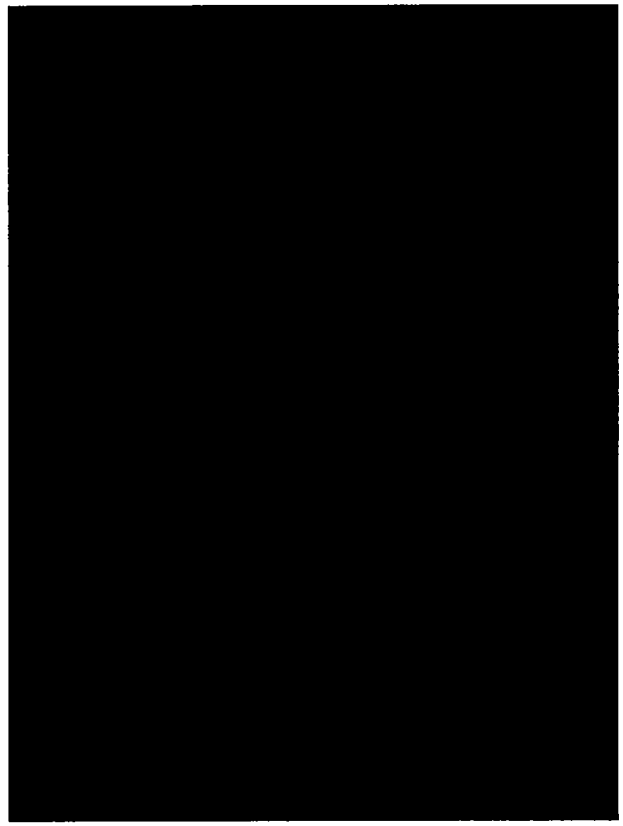
FIGS. 90A and 90B are diagrams illustrating a black correction image obtained by multiplying a black filter image by a predetermined coefficient.
Figure 90B:
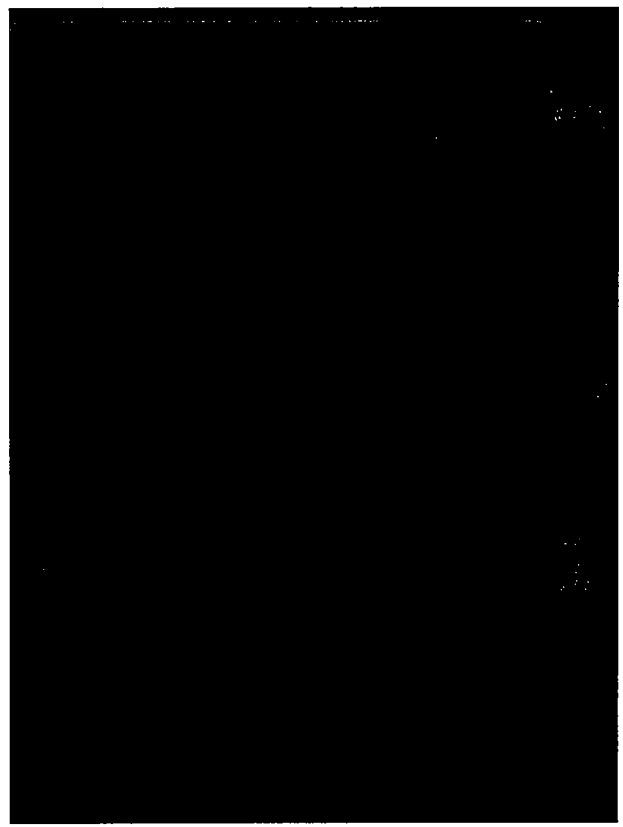

FIGS. 90A and 90B are diagrams illustrating a black correction image Brcorr obtained by multiplying the black filter image Br by a predetermined coefficient αG. The image capturing conditions are the same as those in FIGS. 87A through 87C. Here, FIG. 90A is the image of the black filter image Brcorr in the case of the coefficient αG=0.18, and FIG. 90B is the image of infrared light leakage components of the green filter G as a comparative example (the same as FIG. 87C).

As can be understood when comparing both images, any of the signal levels of the respective color chips of the Macbeth chart is generally in the same state. That is to say, the leakage components of infrared light which appear on the output of the green filter G can be obtained separately from visible light components by using the black filter BK. Accordingly, a green corrected image G* can be obtained by taking the difference between the image of the green image G (including IR cut) illustrated in FIG. 87B and the black correction image Brcorr, and the infrared light leakage components can be removed from the green image without employing an infrared light cut filter.

For example, FIGS. 91A through 91C and 92 illustrate one example of the correction effects as to the G color image employing the black correction image. Here, FIG. 91A is the green image G (excluding IR cut) (the same as FIG. 87A), FIG. 91B is the green image G (including IR cut) (the same as FIG. 87B), and FIG. 91C is the difference image between the green image G (excluding IR cut) and the black correction image Brcorr, i.e., the green corrected image G*. Also, FIG. 92 is a diagram representing a signal level (actual value) for each color chip number of the Macbeth chart which is the difference result (green corrected image) illustrated in FIG. 91C.

As can be understood from comparison between FIG. 91A and FIG. 91C, or FIG. 92, any of the signal levels of the respective color chips of the Macbeth chart is generally in the same state. That is to say, the infrared light leakage components can be almost removed from the green image without employing an infrared light cut filter. Almost the same signal as in the case of employing an infrared light cut filter can be obtained without employing an infrared light cut filter, and accordingly, almost the same visible light color image having sufficient color reproducibility as in the case of employing an infrared light cut filter can be obtained.

However, as can be understood from FIG. 92, there is somewhat difference with the case of including an infrared light cut filter. It can be conceived as illustrated in FIG. 85 that this difference is caused by the transmission spectrum at the visible light region of the G color having a difference depending on whether or not an infrared light cut filter exists. Accordingly, in order to correct this influence, it is conceived that the green image G (excluding IR cut) is preferably subjected to sensitivity correction beforehand without simply taking the difference between the green image G (excluding IR cut) and the black correction image Brcorr. When performing this sensitivity correction, it is desirable to employ the pixel signal of the black filter BK.

That is to say, when performing correction computing in this case, as shown in Expression (5-1), it is desirable to perform correction with high precision not only by subtracting the correction signal components obtained by multiplying the infrared light signal components SIR by predetermined coefficients $\alpha R$, $\alpha G$, and $\alpha B$ from the color signal components SCy, SMg, SYe, and SG obtained by adding the leakage signal components of infrared light to the respective signal components in the original visible light wavelength region, but also as shown in Expression (5-2), by subjecting the color signal components SCy, SMg, SYe, and SG to sensitivity correction beforehand using the value obtained by multiplying the infrared light signal components SIR by predetermined coefficients $\epsilon R$, $\epsilon G$, and $\epsilon B$, and subtracting the correction signal components obtained by multiplying the infrared light signal components SIR by predetermined coefficients $\alpha R$, $\alpha G$, and $\alpha B$ from the color signal components SCy, SMg, SYe, and SG subjected to this sensitivity correction.

Figure 93B:
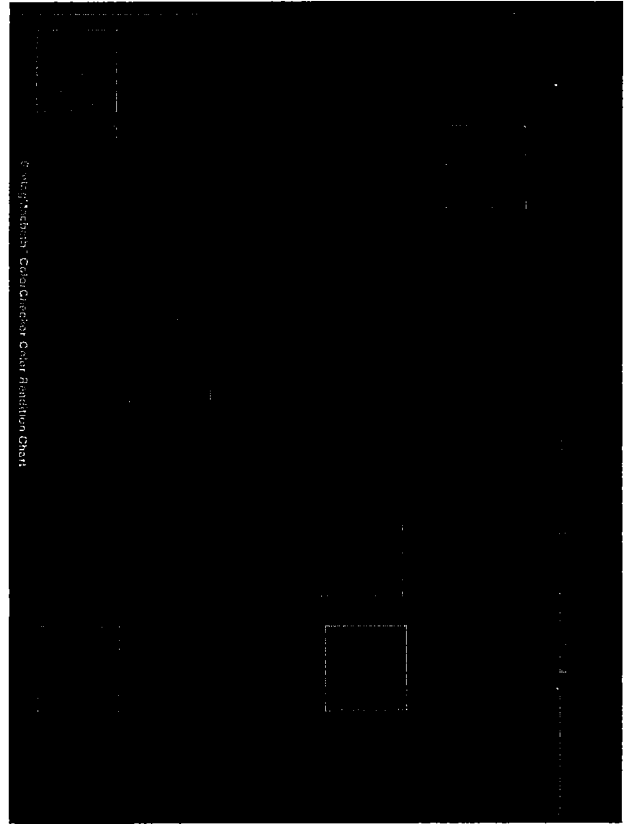
FIGS. 93A and 93B are diagrams representing an image illustrating the advantages of a high-precision correction method as to a G color image employing a black correction image.
Figure 93A:
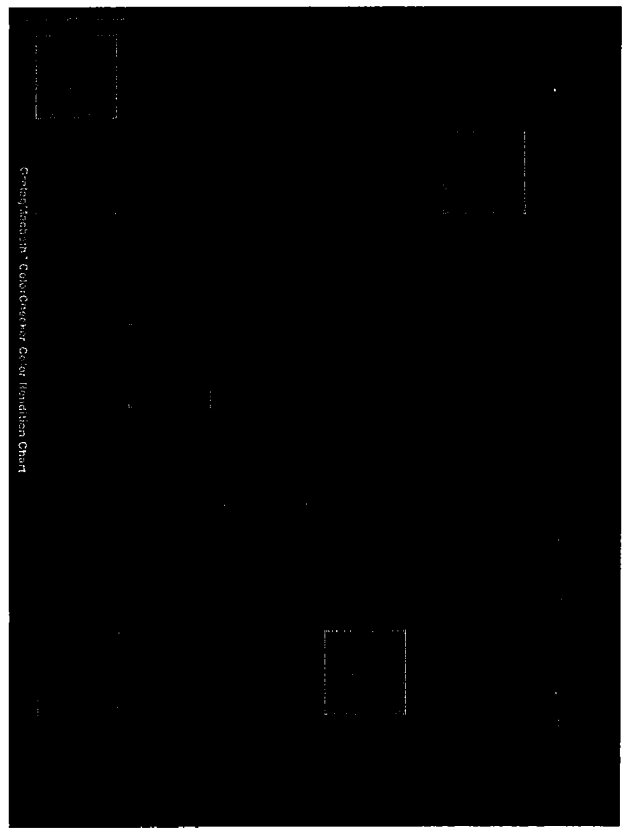

For example, FIGS. 93A through 94 illustrate one example of correction results with high precision thereof. Here, FIG. 93A is the green image G (including IR cut) (the same as FIG. 86B), and FIG. 93B is the green corrected image G in the case of performing correction with high precision assuming that coefficient $\alpha G$ is equal to 0.11, and $\epsilon G$ is generally equal to 0.0012 in accordance with Expression (5-2). Also, FIG. 94 is a diagram representing a signal level (actual value) for each color chip number of the Macbeth chart which is the difference result (green corrected image G) illustrated in FIG. 93B.

As can be understood from comparison between FIG. 93A and FIG. 93B, or FIG. 94, any of the signal levels of the respective color charts of the Macbeth chart is generally in the same state. That is to say, the infrared light leakage components can be almost removed from the green image without employing an infrared light cut filter. The infrared light leakage components can be almost completely removed from the green image without employing an infrared light cut filter. The same signal as in the case of employing an infrared light cut filter can be obtained without employing an infrared light cut filter, and accordingly, the same visible light color image having sufficient color reproducibility as in the case of employing an infrared light cut filter can be obtained.

For example, the signal SW to be obtained from the white correction pixel 12W includes not only infrared light components but also visible light components, so a luminance signal to be obtained based on the pixels where the primary-color filters 14R, 14G, and 14B for capturing visible light color images are disposed is subjected to correction (actually, addition computing processing) using the signal SVL of the visible light components, whereby high sensitivity of a visible light color image can be realized independently of color reproducibility.

<<Experimental Example; White Correction Pixel>>

FIGS. 95 through 102 are diagrams describing the experimental example of an arrangement for correcting the color reproducibility of a visible light color image using the white correction pixels.

Figure 95:
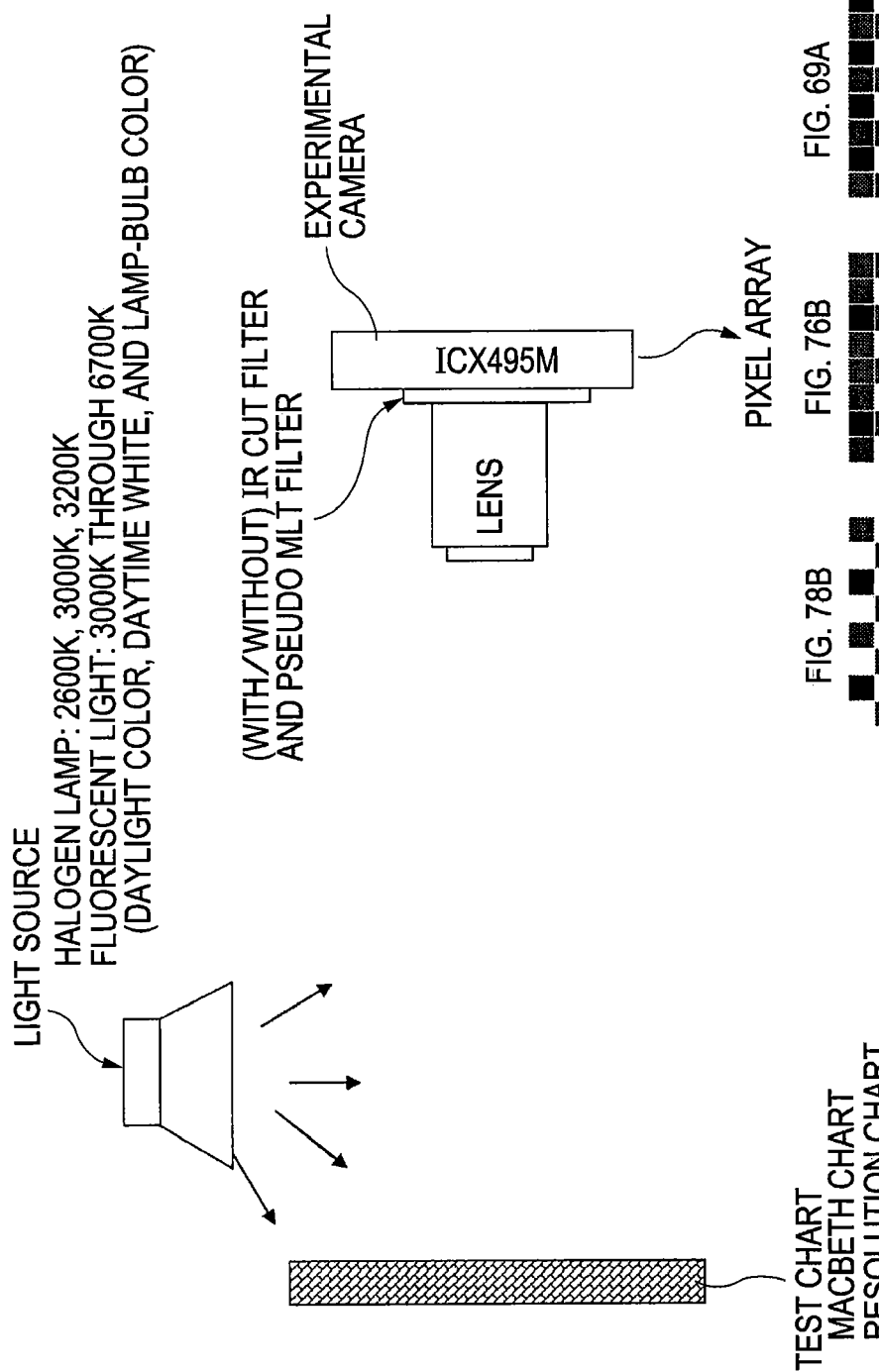
FIG. 95 is a diagram illustrating environmental conditions at the time of an experiment in the case of applying white correction pixels.

FIG. 95 is a diagram illustrating environmental conditions at the time of an experiment in the case of applying white correction pixels. With this experimental example, we have performed an experiment with the monochrome camera XCX495M manufactured by Sony Corporation (hereinafter, also referred to as experimental camera) being taken as the base, providing the primary-color pixels 12R, 12G, and 12B by adding the primary-color filters R, G, and B, and also configuring the white correction pixel 12W by providing a pseudo MLT filter. Also, in order to verify the result by providing the white correction pixel 12W, we have made an arrangement wherein it can be switched to include or exclude an IR cut filter (C5000) instead of the pseudo MLT filter.

Here, "pseudo MLT filter" is an IR cut filter which is generally equal to the transmission properties of Si3N4/SiO2 multi-layered film (5 cycles), and the thickness of this filter is 0.4 mm which is thin as compared with the thickness of 1.6 mm of the filter C5000 manufactured by Daishinku Corp.

Note that as for a pixel array in the case of providing the white correction pixel 12W, a pixel array such as the above FIGS. 69A, 76B, 78B, and so forth can be employed.

Also, three types of halogen lamp of color temperatures 2600 K, 2800 K, and 3000 K, and three types of fluorescent light ECW of color temperatures 3000 through 7000 K (specifically, each of fluorescent lights of daylight color, daytime white, lamp-bulb color) were taken as a light source condition, the Macbeth chart to be used as indices of colorimetry and a resolution chart for resolution evaluation were subjected to image capturing.

Figure 96:
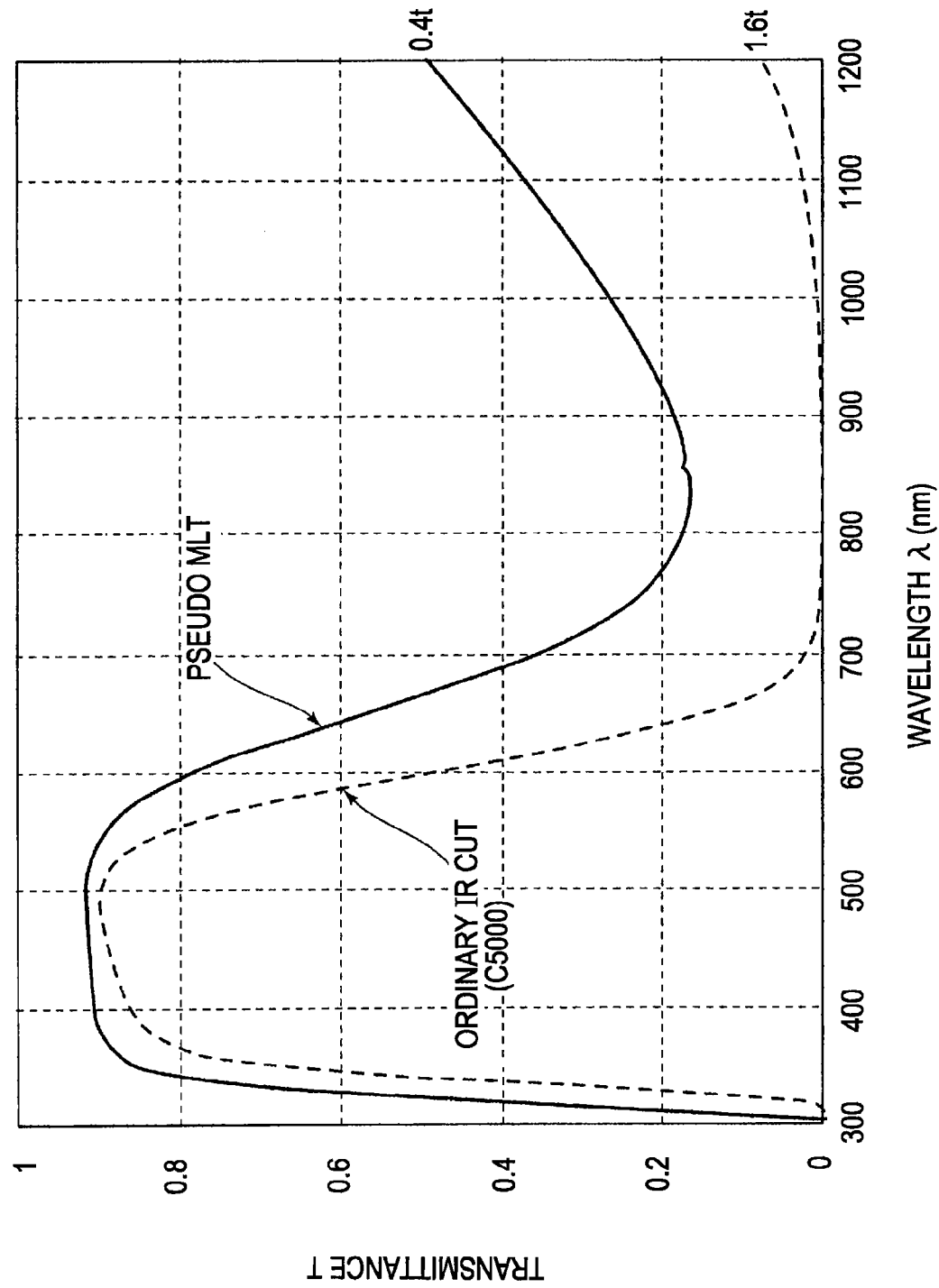
FIG. 96 is a diagram illustrating the transmission properties of an ordinary IR cut filter and a pseudo MLT filter.

FIG. 96 is a diagram illustrating the transmission properties of an ordinary IR cut filter C5000 and a pseudo MLT filter. As can be understood from the drawing, all wavelength components of a visible light band can be transmitted with sufficient intensity by employing a pseudo MLT filter instead of the IR cut filter C5000, and also with an infrared light band, properties for transmitting the components with sufficient intensity as compared with the transmission intensity of the primary-color filters R, G, and B can be obtained.

Figure 97:
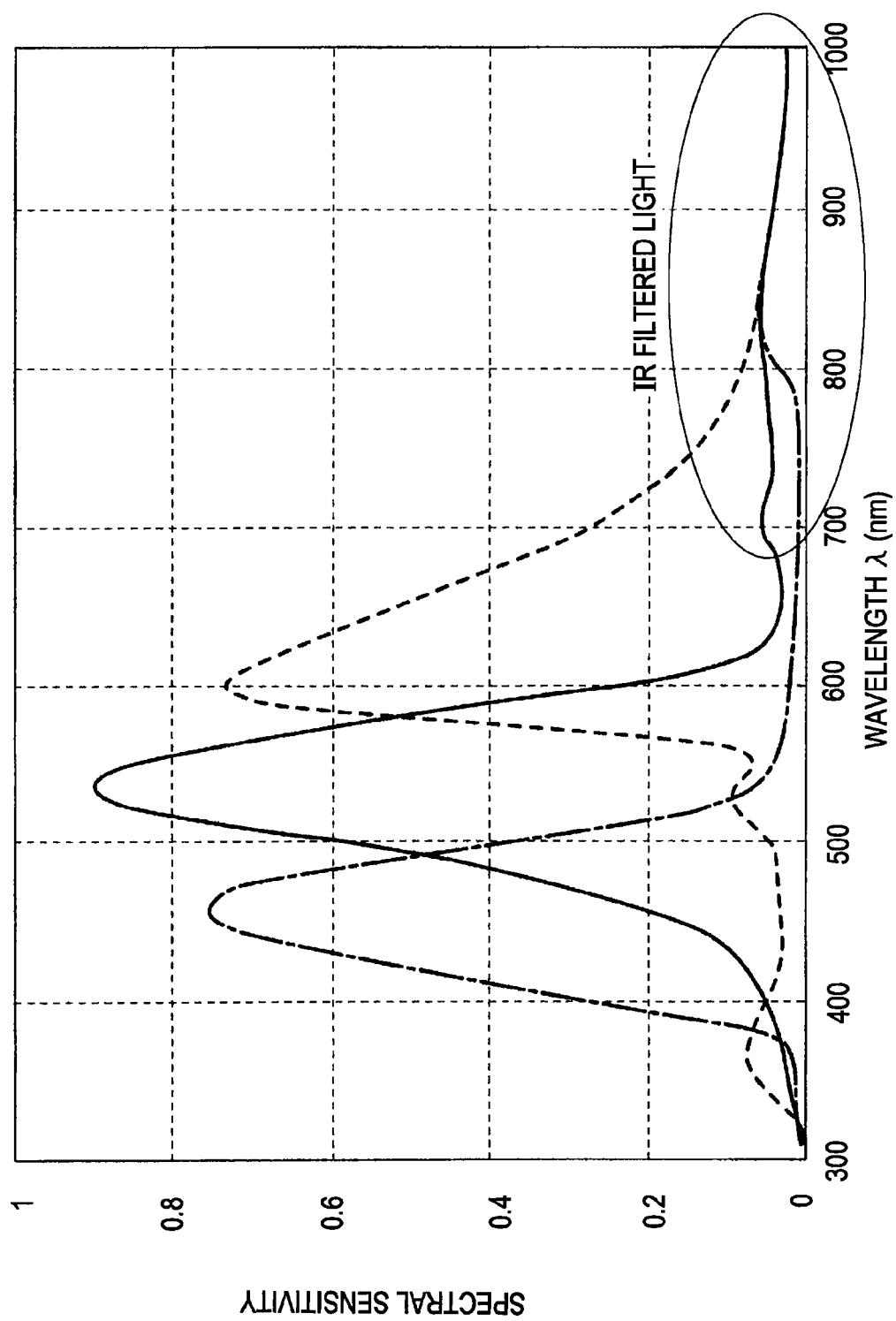
FIG. 97 is a spectral sensitivity properties diagram of color filters in the case of applying the experimental camera and the pseudo MLT filter.

FIG. 97 is a spectral sensitivity properties diagram of color filters in the case of applying the experimental camera and the pseudo MLT filter. As can be understood from the drawing, in the event of employing the pseudo MLT filter, the leakage components (IR leakage light) of infrared light (IR) exist in the primary-color filter components of R, G, and B at an infrared light region (wavelength of 700 nm or more).

Figure 98:
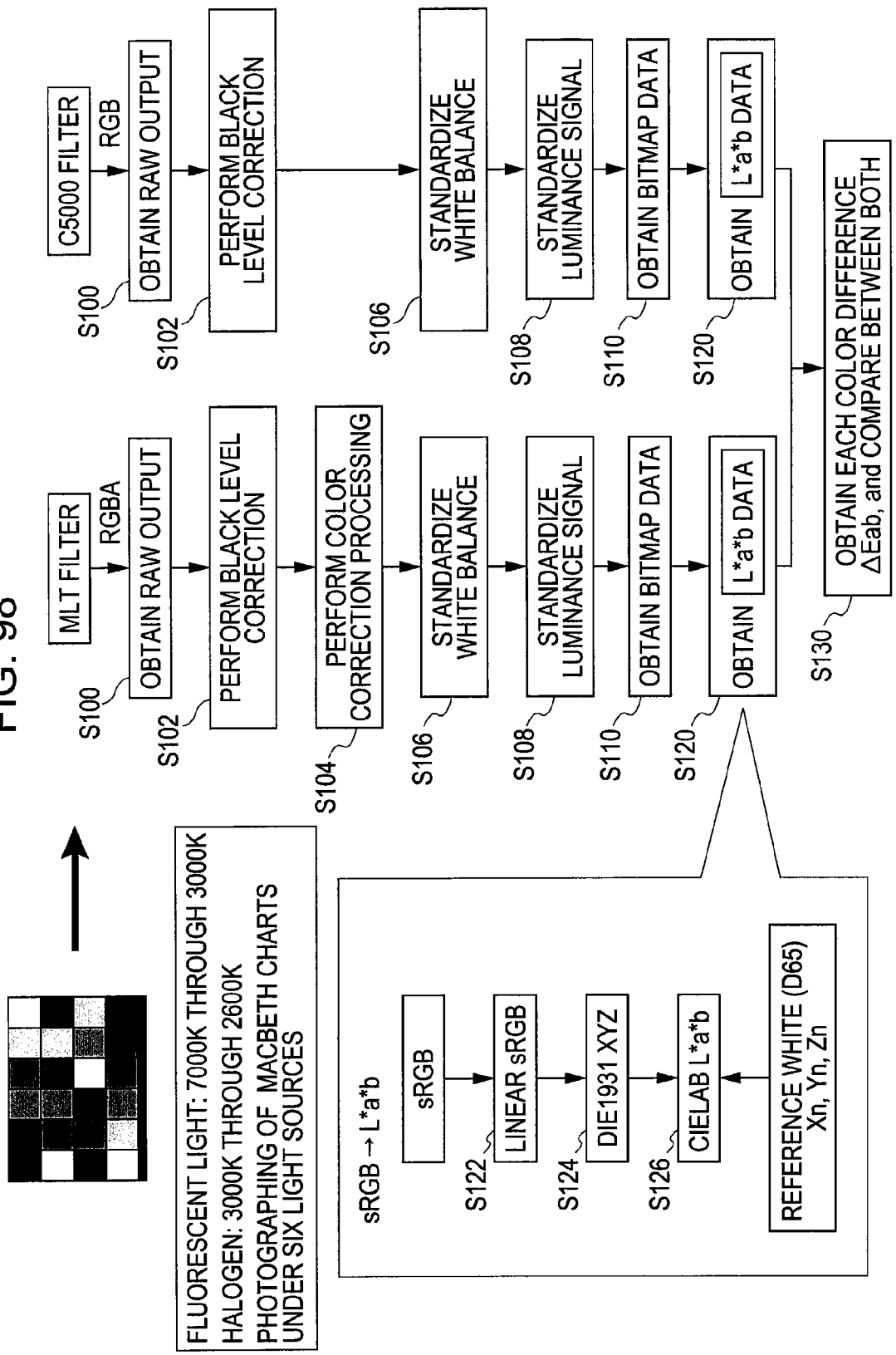
FIG. 98 is a flowchart illustrating the overall procedures.

FIG. 98 is a flowchart illustrating the overall procedures. The difference between the case of employing the IR cut filter C5000 and the case of employing the pseudo MLT filter is in whether or not the infrared light correction processing unit 342 includes color correction computing processing (S104) to which the above Expression (5) and Expression (12) are applied.

That is to say, first, the image capturing signal processing unit 330 obtains a raw image capturing signal (raw output) from the experimental camera (S100). The pre-processing unit 332 subjects the raw image capturing signal output from the experimental camera, i.e., the sensor output signal (visible light image capturing signal SVL (in detail, the respective color components SR, SG, and SB of R, G, and B) and infrared light image capturing signal SIR) to pre-processing such as black level adjustment, gain adjustment, gamma correction, or the like (S102). Subsequently, in the event of employing the pseudo MLT filter, the infrared light correction processing unit 342 of the image signal processing unit 340 executes color correction computing processing to which Expression (5) and Expression (12) are applied (S104).

Further, the image signal processing unit 340 executes standardizing processing for white balance (S106) and standardizing processing of a brightness signal (S108), thereby obtaining bitmap data (S110). Subsequently, the image signal processing unit 340 obtains color data for evaluation (S120).

When obtaining color data for evaluation (S120), first, R, G, and B signals (here, sRGB signals) are subjected to linearization processing (S122), and converted into a XYZ color-coordinate-system signal of three color coordinate system based on color-matching functions $x(\lambda)$, $y(\lambda)$, and $z(\lambda)$ adopted by the CIE (Commission Internationale d'Eclairage) in 1931 (S124). Further, the above signals are converted into the color signals of a Lab coordinate system which is one of uniform color space determined by the CIE in 1976 (S126).

Thus, upon the respective Lab signals in the case of employing the IR cut filter C5000 and in the case of employing the pseudo MLT filter being obtained, the respective color differences $\delta Eab$ are obtained in accordance with the above Expression (4), and the respective color differences are compared (S130).

The respective coefficients $\alpha$, $\beta$, and $\gamma$ in the case of applying Expression (5) and Expression (12) are obtained using arithmetical computation so as to reduce errors using the Newton method, but here, as one example, let us say that $\alpha$ and $\gamma$ are such as the following Expression (16-1). Also, let us say that the respective coefficients $\omega$, and $\eta$ in the case of applying Expression (12) are such as the following Expression (16-2).

[Expression 16]

$$\left.\begin{array}{l}\alpha R = 2.1843 \\ \alpha G = 1.0279 \\ \alpha B = 0.6065 \\ \gamma R = 0.0901 \\ \gamma G = 0.3485 \\ \gamma B = 0.0936 \\ \gamma W = 0.169\end{array}\right\} (16-1) \quad (16)$$

$$\left.\begin{array}{l}\omega R = 0 \\ \omega G = 0 \\ \omega B = 0.0087 \\ \eta R = 12 \\ \eta G = 12 \\ \eta B = 12\end{array}\right\} (16-2)$$

In Expression (16-2), the coefficients are obtained so as to reduce a color difference to the minimum based on the result of measuring the primary-color filters of the experimental camera, the values of $\omega R$ and $\omega G$ are "0", but the coefficients are inherent in a device, so the value differs depending on a device, and accordingly, in the event of another device, these values sometimes may be values other than "0".

Figure 99:
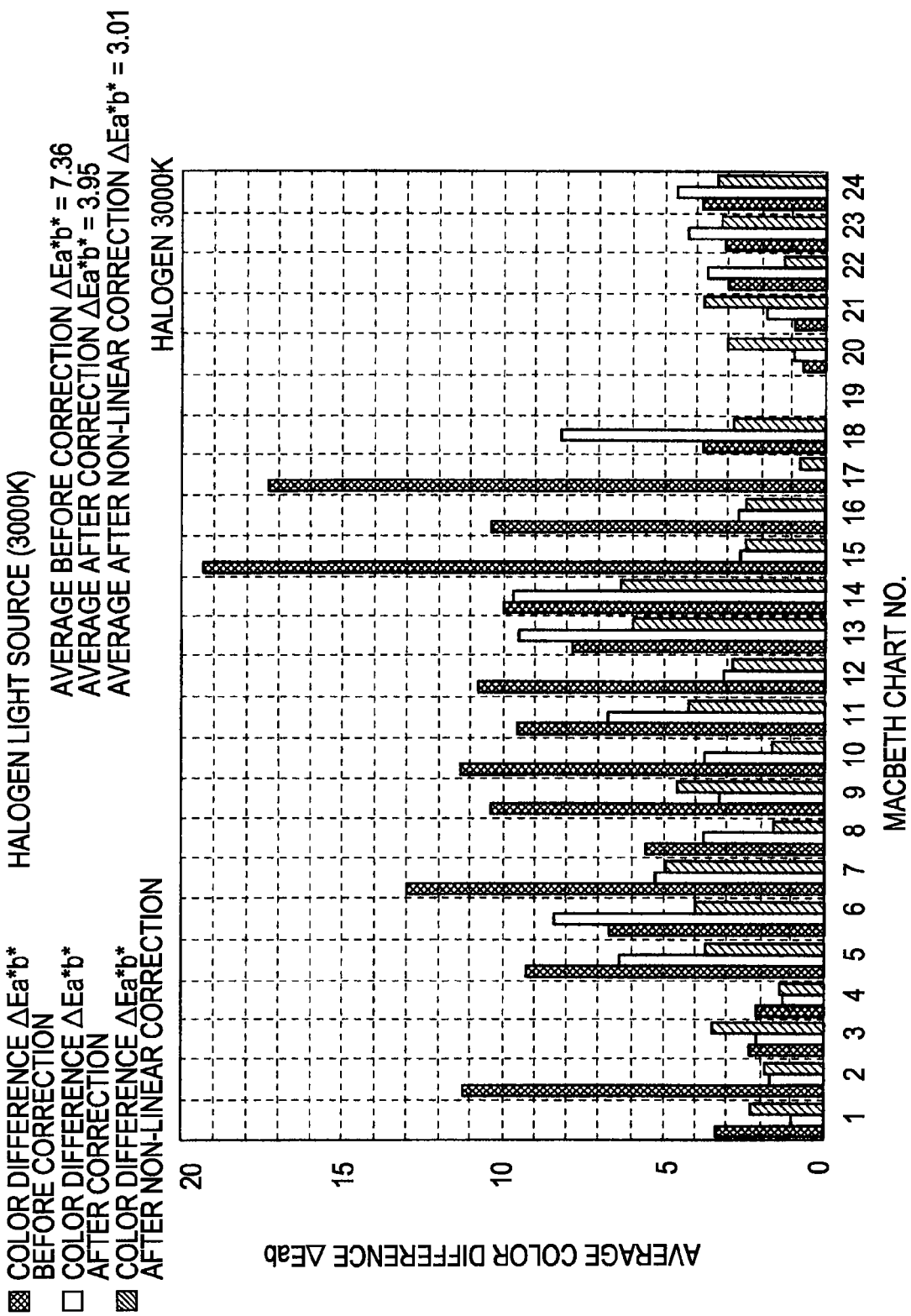
FIG. 99 is a diagram illustrating the results of capturing 24 colors of a Macbeth chart under an environment of a halogen light source (color temperature of 3000 K), and obtaining the color difference before and after correction by computing.

FIG. 99 is a diagram illustrating the results of capturing 24 colors of a Macbeth chart under an environment of a halogen light source (color temperature of 3000 K), and obtaining the color difference before and after correction by computing. This FIG. 99 is a diagram which is converted into a graph so as to compare the color difference when performing no correction, the color difference by correction computing of linear terms alone to which Expression (5) is applied, and the color difference by correction computing including nonlinear terms to which Expression (12) is applied. Here, the horizontal axis represents the number of each color of the Macbeth chart.

As can be understood from FIG. 99, the average color difference following correction is 3.95 which is the limit in the event of applying Expression (5) as to the average color difference prior to correction of 7.36. However, it can be understood that the color difference can be further reduced to 3.01 by further improving Expression (5), applying Expression (12), and being subjected to correction using nonlinear terms, and color reproducibility can be improved.

FIG. 100 is a chart summarizing the measurement results of color differences regarding two-types of halogen lamp of color temperatures 2600 K and 2800 K, and three-types of fluorescent light of daylight color, daytime white, and lamp-bulb color in addition to a halogen light source (color temperature of 3000 K). Here, the case of no correction and the case of correction applying Expression (12) are illustrated.

As can be understood from FIG. 100, even under any light source, the IR leakage light is subjected to correction applying Expression (12) and using nonlinear terms, whereby the average color difference can be sufficiently reduced as compared with prior to correction. It can be understood that even in the event of a halogen light source (color temperature of 2800 K), $\delta Eab = 4.064 < 5$ can be hold, sufficient color reproducibility can be obtained by correction to which Expression (12) is applied even if the incident amount of infrared light are mixed in visible light components. Note that in the event of a halogen light source (color temperature of 2600 K), $\delta Eab = 6.14 > 5$, and accordingly, color reproducibility is still at stake.

<Regarding Noise>

Note that when performing correction computing by applying Expression (5), Expression (12), or the like, there is concern regarding noise (S/N) deterioration accompanied with this correction computing. However, according to the experiment, we have found that there is not such a problem. Description will be made below regarding this point.

First, noise N in the case of applying Expression (5) can be obtained by geometric-mean computing of dispersion a as shown in the following Expression (17), assuming that there is no correlation between A color components (here, A color is equivalent to white), R color components, G color components, and B color components.

[Expression 17]

$$\left.\begin{array}{l}N_R^* = \sqrt{N_R^2 + \alpha_R^2(\gamma_A^2 N_A^2 + \gamma_R^2 N_R^2 + \gamma_G^2 N_G^2 + \gamma_B^2 N_B^2)} \\ N_G^* = \sqrt{N_G^2 + \alpha_G^2(\gamma_A^2 N_A^2 + \gamma_R^2 N_R^2 + \gamma_G^2 N_G^2 + \gamma_B^2 N_B^2)} \\ N_B^* = \sqrt{N_B^2 + \alpha_B^2(\gamma_A^2 N_A^2 + \gamma_R^2 N_R^2 + \gamma_G^2 N_G^2 + \gamma_B^2 N_B^2)}\end{array}\right\} \quad (17)$$

Also, in the event of applying Expression (12), when the respective coefficients ω and η are such as the above Expression (16-2), the infrared light components IR and the blue components B are such as the following Expression (18).

[Expression 18]

$$\begin{aligned}
IR &= \gamma_a \times A - (\gamma_r \times R + \gamma_g \times G + \gamma_b \times B) \\
B^* &= B - \alpha_b \times IR + \omega \times (B - \eta) \times IR \\
&= (1 + \alpha_b\gamma_b + \eta\omega\gamma_b) \times B + (\alpha_b\gamma_r + \eta\omega\gamma_r) \times \\
&\quad R + (\alpha_b\gamma_g + \eta\omega\gamma_g) \times G(\alpha_b\gamma_a + \eta\omega\gamma_a) \times \\
&\quad A + \omega\gamma_a \times AB - \omega\gamma_r \times RB - \omega\psi_g \times GB - \omega\gamma_b \times B^2
\end{aligned} \quad (18)$$

Accordingly, for example, with regard to the blue components B, the following Expression (19) is obtained, and noise NB* regarding the blue components B can be obtained by taking a root at the left side of Expression (19). Note that there are relations of σb1=NB*, σa=NA, σr=NR, σg=NG, and σb=NB between Expression (19) and Expression (17).

[Expression 19]

$$\begin{aligned}
\sigma_{b1}^2 &= (1 + \alpha_b\gamma_b + \eta\omega\gamma_b)^2 \times \sigma_b^2 + (\alpha_b\gamma_r + \eta\omega\gamma_r)^2 \times \sigma_r^2 + \\
&\quad (\alpha_b\gamma_g + \eta\omega\gamma_g)^2 \times \sigma_g^2 + (\alpha_b\gamma_a - \eta\omega\gamma_a)^2 \times \\
&\quad \sigma_a^2 + (\omega\gamma_a)^2 \times \sigma_a^2\sigma_b^2 + (\omega\gamma_r)^2 \times \sigma_r^2\sigma_b^2 + \\
&\quad (\omega\gamma_g)^2 \times \sigma_g^2\sigma_b^2 + (\omega\gamma_b)^2 \times \sigma_b^4
\end{aligned} \quad (19)$$

FIGS. 101 and 102 are charts summarizing the estimated values and actual values of noise regarding the halogen light source (color temperature of 3000 K) and fluorescent light. As can be understood from FIGS. 101 and 102, in the event of subjecting the IR leakage light to correction using nonlinear terms by applying Expression (12) as to the case of employing the ordinary IR cut filter C5000, with the halogen light source (color temperature of 3000 K), −0.530 dB (estimation), and −0.784 dB (actual measurement), and with the fluorescent light +2.854 dB (estimation), and +0.383 dB (actual measurement). As a result, we have found that even under any light source, noise deterioration is not a big problem.

It should be understood by those skilled in the art that various modifications, combinations, sub-combinations and alterations may occur depending on design requirements and other factors insofar as they are within the scope of the appended claims or the equivalents thereof.

What is claimed is:

1. A method, said method comprising:
   detecting a corresponding wavelength region of visible light with at least one visible light detection unit coupled to an image signal processing unit, each said visible light detection unit having no means for infrared light filtering and comprising a color filter adapted to transmit the corresponding wavelength region of visible light;
   detecting a wavelength region of infrared light with at least one infrared light detection unit coupled to the image signal processing unit, each said infrared light detection unit comprising a black filter, said black filter being separately disposed from each said color filter and having a transmittance of generally one for light having a wavelength of 780 nm and greater, and a transmittance of generally zero for light having a wavelength of less than 700 nm; and
   correcting, with the signal processing unit, a first signal received from the at least one visible light detection unit by subtracting a product from said first signal, said product resulting from multiplication of a second signal received from the at least one infrared light detection unit and a predetermined coefficient factor.

2. An apparatus comprising:
   at least one visible light detection unit coupled to an image signal processing unit, each said visible light detection unit having no means for infrared light filtering and comprising a color filter adapted to transmit a corresponding wavelength region of visible light;
   at least one infrared light detection unit adapted to detect a wavelength region of infrared light and coupled to said image signal processing unit, each said infrared light detection unit comprising a black filter, said black filter being separately disposed from each said color filter and having a transmittance of generally one for light having a wavelength of 780 nm and greater, and a transmittance of generally zero for light having a wavelength of less than 700 nm; wherein
   the signal processing unit corrects a first signal received from the at least one visible light detection unit by subtracting a product from said first signal, said product resulting from multiplication of a second signal received from the at least one infrared light detection unit and a predetermined coefficient factor.

3. The apparatus according to claim 2, wherein the signal processing unit corrects the first signal by adding nonlinear signal components multiplied by the predetermined coefficient.

4. The apparatus according to claim 2, further comprising a driving unit for controlling the detection time of the infrared detection unit.

5. The apparatus according to claim 2 wherein the signal processing unit integrates the unit signal of the wavelength region of infrared light multiple times, and corrects a unit signal detected by the visible light detection unit using the integrated unit signal of the wavelength region of infrared light.

6. The apparatus of claim 2, wherein the apparatus comprises a semiconductor device, the semiconductor device comprising having, on a common substrate, the at least one visible light detection unit and the at least one infrared light detection unit.

7. The apparatus according to claim 6, wherein the first detection unit and the second detection unit are disposed periodically with a certain numerical ratio.

8. The apparatus according to claim 6, wherein the first detection unit and the second detection unit are disposed one to one.

* * * * *